United States Patent
Lee et al.

(10) Patent No.: US 10,825,999 B2
(45) Date of Patent: Nov. 3, 2020

(54) ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

(71) Applicant: Samsung Electronics Co., Ltd., Suwon-si, Gyeonggi-do (KR)

(72) Inventors: Kum Hee Lee, Suwon-si (KR); Banglin Lee, Suwon-si (KR); Sungjun Kim, Seongnam-si (KR); Hwayoung Cho, Hwaseong-si (KR); Jongwon Choi, Yongin-si (KR); Whail Choi, Seoul (KR); Yoonhyun Kwak, Seoul (KR); Ohyun Kwon, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 361 days.

(21) Appl. No.: 15/913,153

(22) Filed: Mar. 6, 2018

(65) Prior Publication Data
US 2018/0261781 A1     Sep. 13, 2018

(30) Foreign Application Priority Data

Mar. 7, 2017  (KR) .................. 10-2017-0029058
Mar. 6, 2018  (KR) .................. 10-2018-0026193

(51) Int. Cl.
*C09K 11/06*     (2006.01)
*H01L 51/00*     (2006.01)
(Continued)

(52) U.S. Cl.
CPC ...... *H01L 51/0087* (2013.01); *C07F 15/0086* (2013.01); *C09K 11/06* (2013.01);
(Continued)

(58) Field of Classification Search
CPC ............ H01L 51/0087; H01L 51/5004; H01L 51/5016; H01L 51/5024; H01L 51/5056;
(Continued)

(56) References Cited

U.S. PATENT DOCUMENTS

2006/0134461 A1   6/2006   Huo et al.
2015/0115250 A1   4/2015   Ma et al.
(Continued)

FOREIGN PATENT DOCUMENTS

| KR | 10-2013-0043459 A | 4/2013 |
| KR | 10-2013-0043460 A | 4/2013 |
| KR | 10-2015-0050383 A | 5/2015 |

*Primary Examiner* — William K Cheung
(74) *Attorney, Agent, or Firm* — Cantor Colburn LLP

(57) ABSTRACT

An organometallic compound represented by Formula 1:

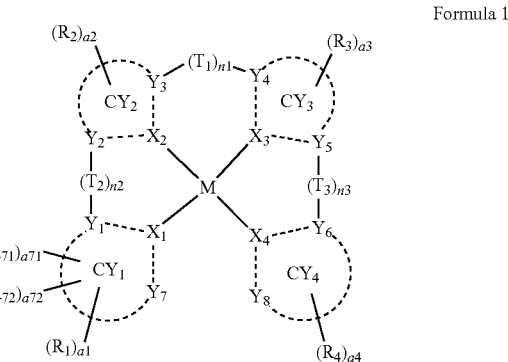

wherein, in Formula 1, groups and variables are the same as described in the specification.

21 Claims, 1 Drawing Sheet

(51) Int. Cl.
*C07F 15/00* (2006.01)
*H01L 51/50* (2006.01)

(52) U.S. Cl.
CPC .............. *C09K 2211/1029* (2013.01); *C09K 2211/185* (2013.01); *H01L 51/5004* (2013.01); *H01L 51/5016* (2013.01); *H01L 51/5024* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 2251/552* (2013.01)

(58) Field of Classification Search
CPC ............. H01L 51/5072; H01L 51/5088; H01L 51/5092; H01L 51/5096; H01L 2251/552; C07F 15/0086; C09K 11/06; C09K 2211/1029; C09K 2211/185
USPC .......................................................... 428/690
See application file for complete search history.

(56) References Cited

U.S. PATENT DOCUMENTS

2017/0040555 A1* 2/2017 Li ........................... C09K 11/06
2018/0251484 A1* 9/2018 Bae .................... C07F 15/0086

\* cited by examiner

10

| 19 |
|----|
| 15 |
| 11 |

ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

CROSS-REFERENCE TO RELATED APPLICATION

This application claims priority to Korean Patent Application No. 10-2017-0029058, filed on Mar. 7, 2017, and Korean Patent Application No. 10-2018-0026193, file on Mar. 6, 2018, in the Korean Intellectual Property Office, and all the benefits accruing therefrom under 35 U.S.C. 119, the content of which is incorporated herein in its entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices, which have superior characteristics in terms of a viewing angle, a response time, a brightness, a driving voltage, and a response speed, and produce full-color images.

A typical organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

Various types of organic light emitting devices are known. However, there still remains a need in OLEDs having low driving voltage, high efficiency, high brightness, and long lifespan.

SUMMARY

One or more embodiments include a novel organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

According to one or more embodiments, an organometallic compound is represented by Formula 1:

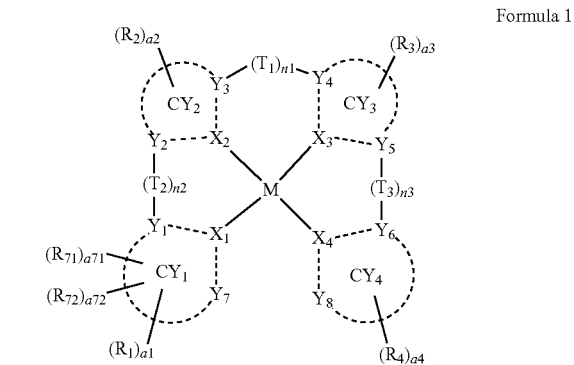

Formula 1

In Formula 1,

M may be a first-row transition metal of the Periodic Table of Elements, a second-row transition metal of the Periodic Table of Elements, or a third-row transition metal of the Periodic Table of Elements, $X_1$ may be N, $X_2$ to $X_4$ may each independently be C or N, two bonds selected from a bond between $X_1$ and M, a bond between $X_2$ and M, a bond between $X_3$ and M, and a bond between $X_4$ and M may each be a coordinate bond, and the others thereof may each be a covalent bond, $Y_1$ to $Y_6$ may each independently be C or N, $Y_7$ and $Y_8$ may each independently be C, N, O, Si, or S, $X_1$ and $Y_7$, $X_1$ and $Y_1$, $X_2$ and $Y_2$, $X_2$ and $Y_3$, $X_3$ and $Y_4$, $X_3$ and $Y_5$, $X_4$ and $Y_6$, and $X_4$ and $Y_8$ may each be linked via a chemical bond, $CY_1$ may be a $C_1$-$C_{30}$ heterocyclic group, $CY_2$ to $CY_4$ may each independently be a $C_5$-$C_{30}$ carbocyclic group or a $C_1$-$C_{30}$ heterocyclic group, $T_1$ to $T_3$ may each independently be selected from *—N[(L$_5$)$_{b5}$-(R$_5$)]—*', *—B(R$_5$)—*', *—P(R$_5$)—*', *—C(R$_5$)(R$_6$)—*', *—Si(R$_5$)(R$_6$)—*', *—Ge(R$_5$)(R$_6$)—*', *—S—*', *—Se—*', *—O—*', *—C(=O)—*', *—S(=O)—*', *—S(=O)$_2$—*', *—C(R$_5$)=, *=C(R$_5$)—*', *—C(R$_5$)=C(R$_6$)—*', *—C(=S)—*', and *—C≡C—*', $L_5$ may be selected from a single bond, a substituted or unsubstituted $C_5$-$C_{30}$ carbocyclic group, and a substituted or unsubstituted $C_1$-$C_{30}$ heterocyclic group, b5 may be selected from 1 to 3, wherein, when b5 is two or more, two or more groups $L_5$ may be identical to or different from each other, $R_5$ and $R_6$ may optionally be linked via a first linking group to form a substituted or unsubstituted $C_5$-$C_{30}$ carbocyclic group or a substituted or unsubstituted $C_1$-$C_{30}$ heterocyclic group, n1 to n3 may each independently be 0, 1, 2, or 3, wherein, when n1 is zero, *-(T$_1$)$_{n1}$—*' may be a single bond, when n2 is zero, *-(T$_2$)$_{n2}$—*' may be a single bond, and when n3 is zero, *-(T$_3$)$_{n3}$—*' may be a single bond, $R_{71}$ in Formula 1 may be a group represented by Formula 71, $$*\text{-}(L_{71})_{b71}\text{-}(T_{71})_{c71} \quad \text{Formula 71}$$

wherein, in Formula 71,
$L_{71}$ may be selected from:
a $C_2$-$C_{60}$ alkylene group; and
a $C_2$-$C_{60}$ alkylene group substituted with at least one selected from deuterium, a deuterated $C_1$-$C_{60}$ alkyl group, a $C_3$-$C_{10}$ cycloalkyl group, and a $C_3$-$C_{10}$ cycloalkenyl group,
b71 may be 0, 1, or 2,
$T_{71}$ may be selected from:
a $C_1$-$C_{60}$ alkyl group; and
a $C_1$-$C_{60}$ alkyl group substituted with at least one selected from deuterium, a deuterated $C_1$-$C_{60}$ alkyl group, a $C_3$-$C_{10}$ cycloalkyl group, and a $C_3$-$C_{10}$ cycloalkenyl group,
c71 may be an integer from 1 to 10,
$R_{72}$ in Formula 1 may be a group represented by Formula 72, $$*\text{-}(L_{72})_{b72}\text{-}(T_{72})_{c72}, \quad \text{Formula 72}$$

wherein, in Formula 72,
$L_{72}$ may be selected from:
a $C_6$-$C_{60}$ arylene group, a $C_1$-$C_{60}$ heteroarylene group, a divalent non-aromatic condensed polycyclic group, and a divalent non-aromatic condensed heteropolycyclic group; and
a $C_6$-$C_{60}$ arylene group, a $C_1$-$C_{60}$ heteroarylene group, a divalent non-aromatic condensed polycyclic group, and a divalent non-aromatic condensed heteropolycyclic group, each substituted with at least one selected from deuterium, a $C_1$-$C_{60}$ alkyl group, a deuterated $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group,
b72 may be 0, 1, or 2,
$T_{72}$ may be selected from:
a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and
a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, a $C_1$-$C_{60}$ alkyl group, a deuterated $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group,
c72 may be an integer from 1 to 10,
wherein, in Formula 1,
a71 and a72 may each independently be an integer from 1 to 5,
$R_1$ to $R_6$ may each independently be selected from hydrogen, deuterium, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), a1 to a4 may each independently be 0, 1, 2, 3, 4, or 5, Formula 1 does not include fluorine (—F), two of groups $R_1$ in the number of a1 may optionally be linked to form a substituted or unsubstituted $C_5$-$C_{30}$ carbocyclic group or a substituted or unsubstituted $C_1$-$C_{30}$ heterocyclic group, two of groups $R_2$ in the number of a2 may optionally be linked to form a substituted or unsubstituted $C_5$-$C_{30}$ carbocyclic group or a substituted or unsubstituted $C_1$-$C_{30}$ heterocyclic group, two of groups $R_3$ in the number of a3 may optionally be linked to form a substituted or unsubstituted $C_5$-$C_{30}$ carbocyclic group or a substituted or unsubstituted $C_1$-$C_{30}$ heterocyclic group, two of groups $R_4$ in the number of a4 may optionally be linked to form a substituted or unsubstituted $C_5$-$C_{30}$ carbocyclic group or a substituted or unsubstituted $C_1$-$C_{30}$ heterocyclic group, two or more neighboring groups selected from $R_1$ to $R_4$ may optionally be linked to form a substituted or unsubstituted $C_5$-$C_{30}$ carbocyclic group or a substituted or unsubstituted $C_1$-$C_{30}$ heterocyclic group, one of $R_5$ and $R_6$ and one of $R_1$ to $R_4$ may optionally be linked to form a substituted or unsubstituted $C_5$-$C_{30}$ carbocyclic group or a substituted or unsubstituted $C_1$-$C_{30}$ heterocyclic group, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —Cl, —Br, —I, —CD$_3$, —CD$_2$H, —CDH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —Cl, —Br, —I, —CD$_3$, —CD$_2$H, —CDH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —Cl, —Br, —I, —CD$_3$, —CD$_2$H, —CDH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

According to one or more embodiments, an organic light-emitting device includes:
- a first electrode;
- a second electrode; and
- an organic layer that is disposed between the first electrode and the second electrode,
- wherein the organic layer includes an emission layer and at least one of the organometallic compound.

The organometallic compound may act as a dopant in the organic layer.

According to one or more embodiments, a diagnostic composition includes at least one of the organometallic compound represented by Formula 1.

BRIEF DESCRIPTION OF THE DRAWING

These and/or other aspects will become apparent and more readily appreciated from the following description of the embodiments, taken in conjunction with the FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section.

Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound is provided. The organometallic compound according to an embodiment may be represented by Formula 1 below:

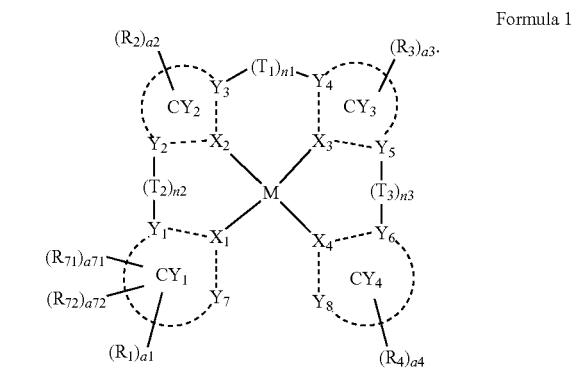

Formula 1

M in Formula 1 may be a first-row transition metal of the Periodic Table of Elements, a second-row transition metal of the Periodic Table of Elements, and a third-row transition metal of the Periodic Table of Elements.

For example, M in Formula 1 may be platinum (Pt) or palladium (Pd), but embodiments of the present disclosure are not limited thereto.

The organometallic compound represented by Formula 1 may be a neutral compound that does not consist of an ion pair of an anion and a cation.

In Formula 1, $X_1$ may be N, and $X_2$ to $X_4$ may each independently be C or N.

In Formula 1, two bonds selected from a bond between $X_1$ and M, a bond between $X_2$ and M, a bond between $X_3$ and M, and a bond between $X_4$ and M may each be a coordinate bond, and the others thereof may each be a covalent bond.

In an embodiment, in Formula 1, $X_2$ and $X_3$ may each be carbon, $X_4$ may be nitrogen, a bond between $X_2$ and M and a bond between $X_3$ and M may each be a covalent bond, and a bond between $X_1$ and M and a bond between $X_4$ and M may each be a coordinate bond, but embodiments of the present disclosure are not limited thereto.

In Formula 1, $Y_1$ to $Y_6$ may each independently be C or N, and $Y_7$ and $Y_8$ may each independently be C, N, O, Si, or S.

In an embodiment, in Formula 1, $Y_1$ to $Y_5$ may each be C, and $Y_6$ to $Y_8$ may each independently be C or N, but embodiments of the present disclosure are not limited thereto.

$X_1$ and $Y_7$, $X_1$ and $Y_1$, $X_2$ and $Y_2$, $X_2$ and $Y_3$, $X_3$ and $Y_4$, $X_3$ and $Y_5$, $X_4$ and $Y_6$, and $X_4$ and $Y_8$ in Formula 1 may each be linked via a chemical bond.

In Formula 1, $CY_1$ may be a $C_1$-$C_{30}$ heterocyclic group, and $CY_2$ to $CY_4$ may each independently be a $C_5$-$C_{30}$ carbocyclic group or a $C_1$-$C_{30}$ heterocyclic group.

For example, in Formula 1, $CY_1$ may be selected from a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, and $CY_2$ to $CY_4$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a pyrrole group, a thiophene group, a furan group, an indole group, a benzoborol group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-on group, a dibenzothiophene 5,5-dioxide group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

In an embodiment, in Formula 1, $CY_1$ and $CY_4$ may each independently be selected from a pyridine group, a pyrimidine group, a triazine group, a quinoline group, an isoquinoline group, a quinoxaline group, a quinazoline group, a pyrazole group, an imidazole group, and a triazole group, and $CY_2$ and $CY_3$ may each independently be selected from a benzene group, a naphthalene group, a 1,2,3,4-tetrahydronaphthalene group, a carbazole group, a fluorene group, a dibenzothiophene group, and a dibenzofuran group, but embodiments of the present disclosure are not limited thereto.

"An azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, and an azadibenzothiophene 5,5-dioxide group" as used herein mean hetero-rings that respectively have the same backbones as "a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-on group, and a dibenzothiophene 5,5-dioxide group", provided that at least one of carbons forming rings thereof is substituted with nitrogen.

$CY_1$ and $CY_4$ in Formula 1 may be identical to each other, but embodiments of the present disclosure are not limited thereto.

In an embodiment, $CY_2$ and $CY_3$ in Formula 1 may be identical to each other, but embodiments of the present disclosure are not limited thereto.

In an embodiment, in Formula 1, a moiety represented by

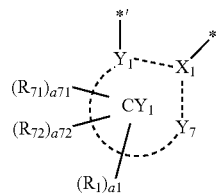

and a moiety represented by

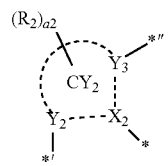

may be identical to each other, and a moiety represented by

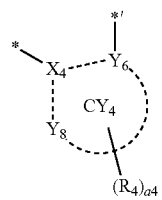

and a moiety represented by

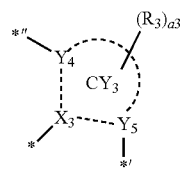

may be identical to each other.

In one or more embodiments, the organometallic compound may have a symmetrical structure with respect to an axis connecting M and $T_1$ in Formula 1.

$T_1$ to $T_3$ in Formula 1 may each independently be selected from *—N[($L_5$)$_{b5}$-($R_5$)]—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*', *—O—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', and *—C≡C—*'. $R_5$ and $R_6$ are each independently the same as described below.

$L_5$ may be selected from a single bond, a substituted or unsubstituted $C_5$-$C_{30}$ carbocyclic group, and a substituted or unsubstituted $C_1$-$C_{30}$ heterocyclic group, and b5 may be selected from 1 to 3 (for example, b5 may be 1), wherein, when b5 is two or more, two or more groups $L_5$ may be identical to or different from each other.

In an embodiment, $L_5$ may be selected from:
a single bond, a phenylene group, a naphthylene group, a fluorenylene group, a pyridinylene group, a pyrimidinylene group, and a carbazolylene group; and a phenylene group, a naphthylene group, a fluorenylene group, a pyridinylene group, a pyrimidinylene group, and a carbazolylene group, each substituted with at least one selected from deuterium, —Cl, —Br, —I, —$CD_3$, —$CD_2H$, —$CDH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a biphenyl group, and a terphenyl group, but embodiments of the present disclosure are not limited thereto.

$R_5$ and $R_6$ may optionally be linked via a first linking group to form a substituted or unsubstituted $C_5$-$C_{30}$ carbocyclic group or a substituted or unsubstituted $C_1$-$C_{30}$ heterocyclic group (a $C_5$-$C_6$ 5-membered to 7-membered cyclic group; or a $C_5$-$C_6$ 5-membered to 7-membered cyclic group substituted with at least one selected from deuterium, a cyano group, a $C_1$-$C_{10}$ alkyl group, and a $C_6$-$C_{14}$ aryl group).

In an embodiment, $T_1$ to $T_3$ in Formula 1 may each independently be selected from *—N[($L_5$)$_{b5}$-($R_5$)]—*', *—B($R_5$)—*', *—C($R_5$)($R_6$)—*', *—Si($R_5$)($R_6$)—*', *—S—*', *—O—*', and *—C(=O)—*', but embodiments of the present disclosure are not limited thereto.

In one or more embodiments, $T_1$ to $T_3$ in Formula 1 may each independently be selected from *—C($R_5$)($R_6$)—*', *—Si($R_5$)($R_6$)—*', and *—Ge($R_5$)($R_6$)—*', $R_5$ and $R_6$ may be linked via a first linking group, the first linking group may be selected from a single bond, *—N[($L_9$)$_{b9}$-($R_9$)]—*', *—B($R_9$)—*', *—P($R_9$)—*', *—C($R_9$)($R_{10}$)—*', *—Si($R_9$)($R_{10}$)—*', *—Ge($R_9$)($R_{10}$)—*', *—S—*', *—Se—*', *—O—*', *—C(=O)—*', *—S(=O)—*', *—S(=O)$_2$—*', *—C($R_9$)=C($R_{10}$)—*', *—C(=S)—*', and *—C≡C—*', $L_9$ and b9 are each independently the same as described in connection with $L_5$ and b5, $R_9$ and $R_{10}$ are each independently the same as described in connection with $R_5$, and

* and *' each indicate a binding site to a neighboring atom, but embodiments of the present disclosure are not limited thereto.

n1 to n3 in Formula 1 may each independently be 0, 1, 2, or 3, wherein, when n1 is zero, *-($T_1$)$_{n1}$—*' may be a single bond, when n2 is zero, *-($T_2$)$_{n2}$—*' may be a single bond, and when n3 is zero, *-($T_3$)$_{n3}$—*' may be a single bond. When n1 is two or more, two or more groups $T_1$ may be identical to or different from each other, when n2 is two or more, two or more groups $T_2$ may be identical to or different from each other, and when n3 is two or more, two or more groups $T_3$ may be identical to or different from each other.

In an embodiment, n1 to n3 in Formula 1 may each independently be 0 or 1.

In one or more embodiments, the sum of n1, n2, and n3 in Formula 1 may be 0 or 1.

In one or more embodiments, in Formula 1, n1 may be 1, and n2 and n3 may be 0 or 1.

$R_{71}$ in Formula 1 may be a group represented by Formula 71:

$$*\text{-}(L_{71})_{b71}\text{-}(T_{71})_{c71}. \qquad \text{Formula 71}$$

In Formula 71, $L_{71}$ may be selected from:

a $C_2$-$C_{60}$ alkylene group; and a $C_2$-$C_{60}$ alkylene group substituted with at least one selected from deuterium, a deuterated $C_1$-$C_{60}$ alkyl group, a $C_3$-$C_{10}$ cycloalkyl group, and a $C_3$-$C_{10}$ cycloalkenyl group, b71 may be 0, 1, or 2, $T_{71}$ may be selected from:

a $C_1$-$C_{60}$ alkyl group; and a $C_1$-$C_{60}$ alkyl group substituted with at least one selected from deuterium, a deuterated $C_1$-$C_{60}$ alkyl group, a $C_3$-$C_{10}$ cycloalkyl group, and a $C_3$-$C_{10}$ cycloalkenyl group, and c71 may be an integer from 1 to 10.

For example, in Formula 71, $L_{71}$ may be selected from:

a $C_2$-$C_{10}$ alkylene group; and a $C_2$-$C_{10}$ alkylene group substituted with at least one selected from deuterium, a deuterated $C_1$-$C_{20}$ alkyl group, a cyclopentyl group, a cyclohexyl group, a cycloheptyl group, a cyclooctyl group, an adamantanyl group, a norbonanyl group, a norbonenyl group, a cyclopentenyl group, a cyclohexenyl group, and a cycloheptenyl group, b71 may be 0 or 1, $T_{71}$ may be selected from:

a $C_1$-$C_{10}$ alkyl group; and a $C_1$-$C_1$ alkyl group substituted with at least one selected from deuterium, a deuterated $C_1$-$C_{20}$ alkyl group, a cyclopentyl group, a cyclohexyl group, a cycloheptyl group, a cyclooctyl group, an adamantanyl group, a norbonanyl group, a norbonenyl group, a cyclopentenyl group, a cyclohexenyl group, and a cycloheptenyl group, and c71 may be 1 or 2, but embodiments of the present disclosure are not limited thereto.

$R_{72}$ in Formula 1 may be a group represented by Formula 72:

$$*\text{-}(L_{72})_{b72}\text{-}(T_{72})_{c72}. \qquad \text{Formula 72}$$

In Formula 72, $L_{72}$ may be selected from:

a $C_6$-$C_{60}$ arylene group, a $C_1$-$C_{60}$ heteroarylene group, a divalent non-aromatic condensed polycyclic group, and a divalent non-aromatic condensed heteropolycyclic group; and a $C_6$-$C_{60}$ arylene group, a $C_1$-$C_{60}$ heteroarylene group, a divalent non-aromatic condensed polycyclic group, and a divalent non-aromatic condensed heteropolycyclic group, each substituted with at least one selected from deuterium, a $C_1$-$C_{60}$ alkyl group, a deuterated $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, b72 may be 0, 1, or 2, $T_{72}$ may be selected from:

a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, a $C_1$-$C_{60}$ alkyl group, a deuterated $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and c72 may be an integer from 1 to 10.

For example, in Formula 72, $L_{72}$ may be selected from:

a phenylene group, a naphthylene group, a pyridinylene group, a pyrimidinylene group, a triazinylene group, a quinolinylene group, an isoquinolinylene group, a quinoxalinylene group, a quinazolinylene group, a fluorenylene group, a carbazolylene group, a dibenzofuranylene group, and a dibenzothiophenylene group; and a phenylene group, a naphthylene group, a pyridinylene group, a pyrimidinylene group, a triazinylene group, a quinolinylene group, an isoquinolinylene group, a quinoxalinylene group, a quinazolinylene group, a fluorenylene group, a carbazolylene group, a dibenzofuranylene group, and a dibenzothiophenylene group, each substituted with at least one selected from deuterium, a $C_1$-$C_{20}$ alkyl group, a deuterated $C_1$-$C_{20}$ alkyl group, a phenyl group, a naphthyl group, a pyridinyl group, a pyrimidinyl group, a triazinyl group, a quinolinyl group, an isoquinolinyl group, a quinoxalinyl group, a quinazolinyl group, a fluorenyl group, a carbazolyl group, a dibenzofuranyl group, and a dibenzothiophenyl group, b72 may be 0 or 1, $T_{72}$ may be selected from:

a phenyl group, a naphthyl group, a pyridinyl group, a pyrimidinyl group, a triazinyl group, a quinolinyl group, an isoquinolinyl group, a quinoxalinyl group, a quinazolinyl group, a fluorenyl group, a carbazolyl group, a dibenzofuranyl group, and a dibenzothiophenyl group; and a phenyl group, a naphthyl group, a pyridinyl group, a pyrimidinyl group, a triazinyl group, a quinolinyl group, an isoquinolinyl group, a quinoxalinyl group, a quinazolinyl group, a fluorenyl group, a carbazolyl group, a dibenzofuranyl group, and a dibenzothiophenyl group, each substituted with at least one selected from deuterium, a $C_1$-$C_{20}$ alkyl group, a deuterated $C_1$-$C_{20}$ alkyl group, a phenyl group, a naphthyl group, a pyridinyl group, a pyrimidinyl group, a triazinyl group, a quinolinyl group, an isoquinolinyl group, a quinoxalinyl group, a quinazolinyl group, a fluorenyl group, a carbazolyl group, a dibenzofuranyl group, and a dibenzothiophenyl group, and c72 may be 1 or 2, but embodiments of the present disclosure are not limited thereto.

a71 and a72 in Formula 1 respectively indicate the number of groups $R_{71}$ and the number of groups $R_{72}$, and may each independently be an integer from 1 to 5. That is, $CY_1$ in Formula 1 is essentially substituted with at least one $R_{71}$ and at least one $R_{72}$. a71 and a72 may each independently be 1 or 2. For example, a71 and a72 may each be 1, but embodiments of the present disclosure are not limited thereto.

$R_1$ to $R_6$ in Formula 1 may each independently be selected from hydrogen, deuterium, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$). $Q_1$ to $Q_{09}$ are each independently the same as described herein.

For example, $R_1$ to $R_6$ may each independently be selected from:

hydrogen, deuterium, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —Cl, —Br, —I, —$CD_3$, —$CD_2H$, —$CDH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —Cl, —Br, —I, —CD$_3$, —CD$_2$H, —CDH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —N(Q$_{31}$)(Q$_{32}$), and —Si(Q$_{33}$)(Q$_{34}$)(Q$_{35}$); and —N(Q$_1$)(Q$_2$), —Si(Q$_3$)(Q$_4$)(Q$_5$), —B(Q$_6$)(Q$_7$), and —P(=O)(Q$_8$)(Q$_9$), and Q$_1$ to Q$_9$ and Q$_{31}$ to Q$_{35}$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

In one or more embodiments, in Formula 1, $R_1$ to $R_6$ may each independently be selected from hydrogen, deuterium, a cyano group, a nitro group, —CH$_3$, —CD$_3$, —CD$_2$H, —CDH$_2$, —OCH$_3$, groups represented by Formulae 9-1 to 9-19, groups represented by Formulae 10-1 to 10-168, —N(Q$_1$)(Q$_2$), and —Si(Q$_3$)(Q$_4$)(Q$_5$), $R_{71}$ may be selected from —CH$_3$, —CD$_3$, —CD$_2$H, —CDH$_2$, groups represented by Formulae 9-1 to 9-19, and groups represented by Formulae 10-5 to 10-8, 10-11, and 10-12, and $R_{72}$ may be selected from groups represented by Formulae 10-13 to 10-152 and 10-159 to 10-168, but embodiments of the present disclosure are not limited thereto:

Formula 9-1

Formula 9-2

Formula 9-3

Formula 9-4

Formula 9-5

Formula 9-6

Formula 9-7

Formula 9-8

Formula 9-9

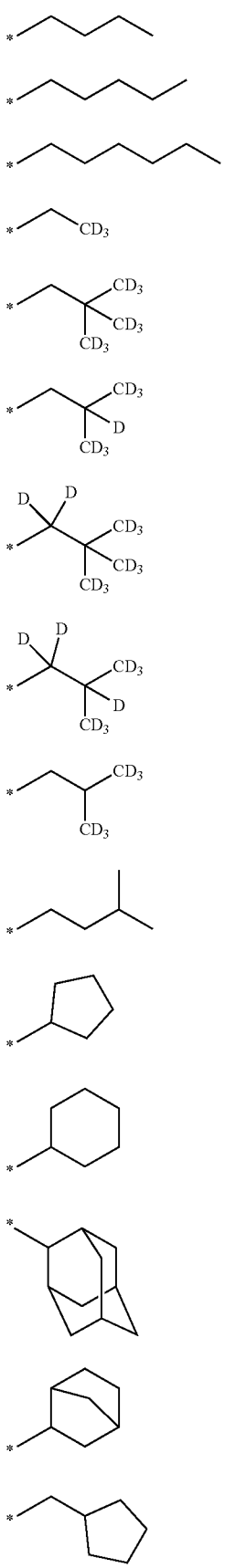
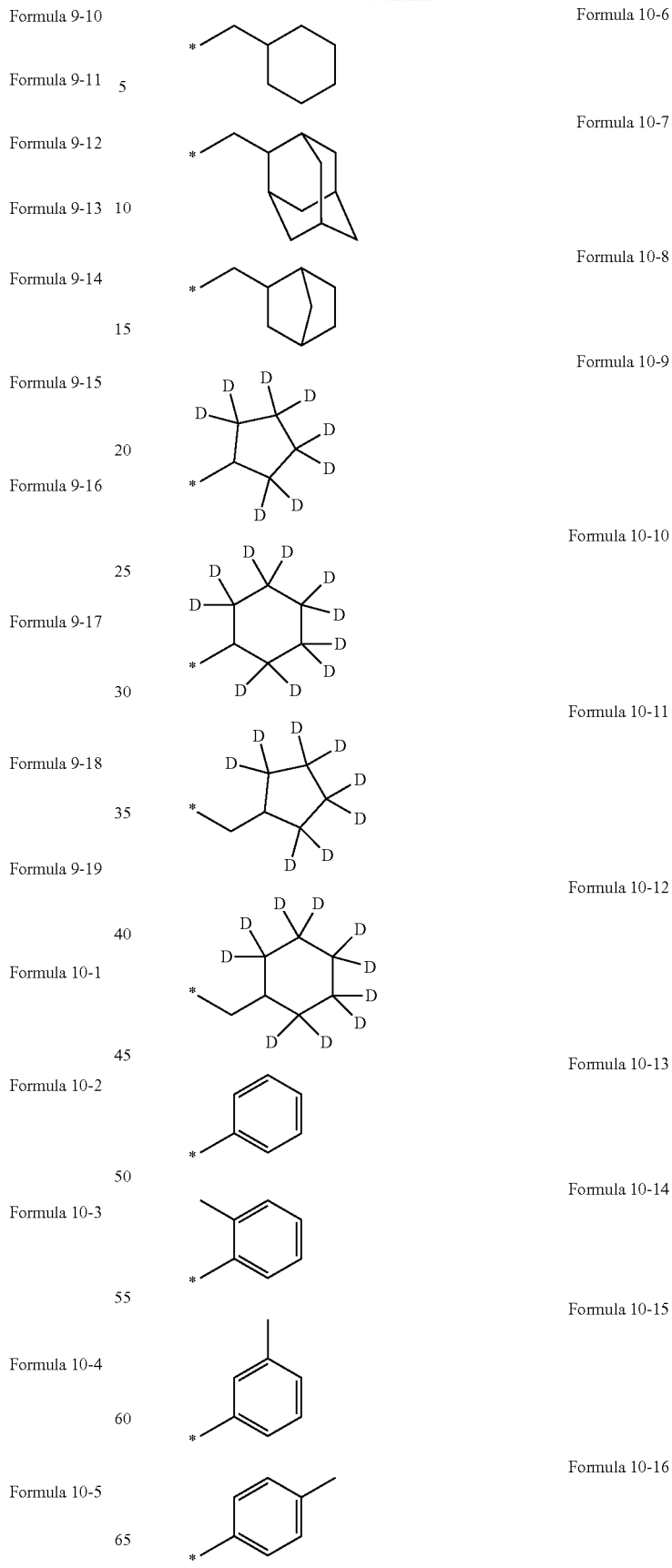

-continued
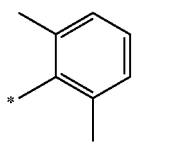
Formula 10-17
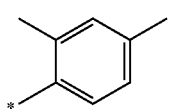
Formula 10-18
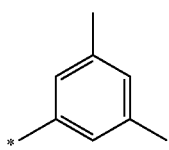
Formula 10-19
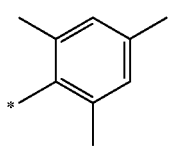
Formula 10-20
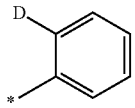
Formula 10-21
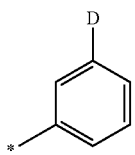
Formula 10-22
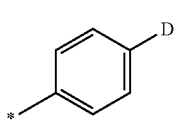
Formula 10-23
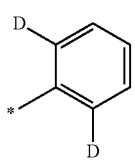
Formula 10-24
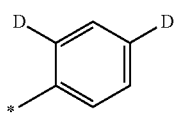
Formula 10-25
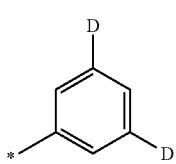
Formula 10-26
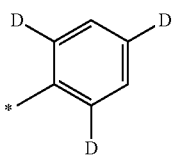
Formula 10-27
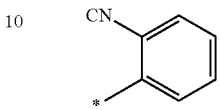
Formula 10-28
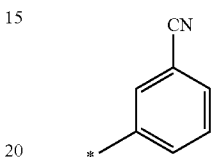
Formula 10-29
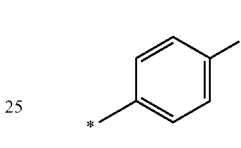
Formula 10-30
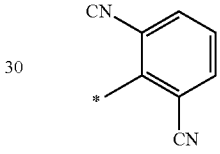
Formula 10-31
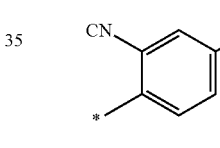
Formula 10-32
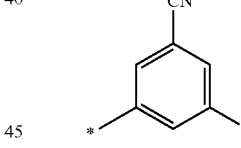
Formula 10-33
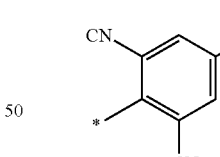
Formula 10-34
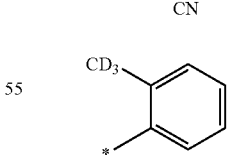
Formula 10-35
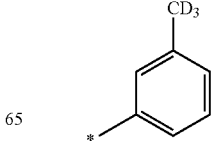
Formula 10-36

-continued
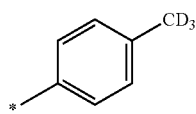
Formula 10-37
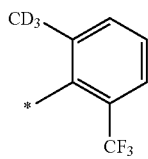
Formula 10-38
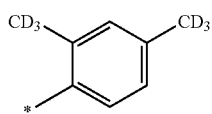
Formula 10-39
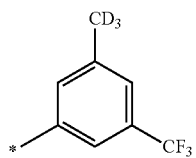
Formula 10-40
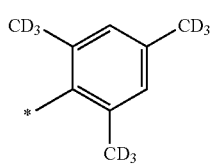
Formula 10-41
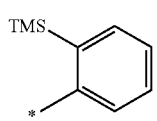
Formula 10-42
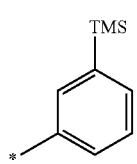
Formula 10-43
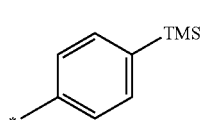
Formula 10-44
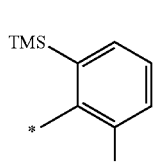
Formula 10-45
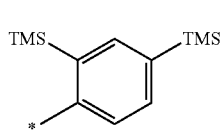
Formula 10-46
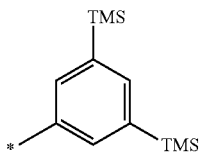
Formula 10-47
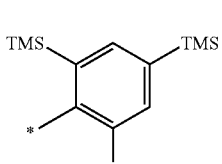
Formula 10-48
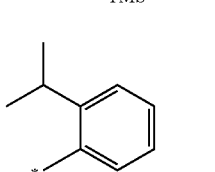
Formula 10-49
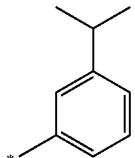
Formula 10-50
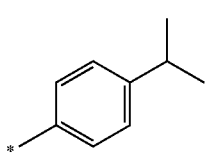
Formula 10-51
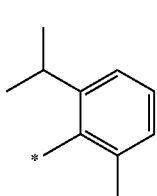
Formula 10-52
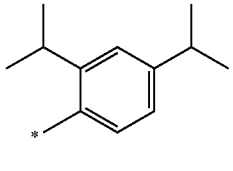
Formula 10-53
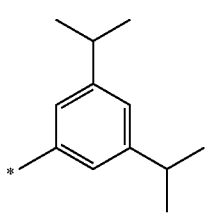
Formula 10-54

Formula 10-55
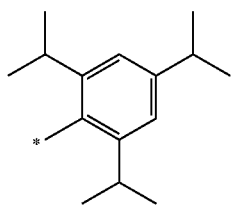
Formula 10-56
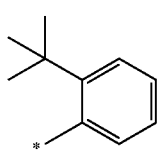
Formula 10-57
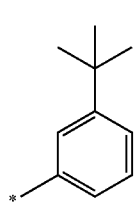
Formula 10-58
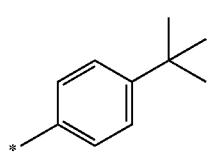
Formula 10-59
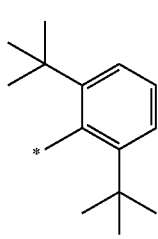
Formula 10-60
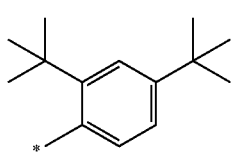
Formula 10-61
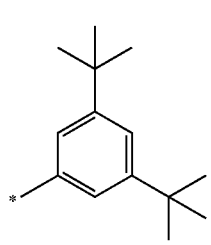
Formula 10-62
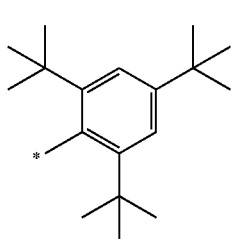
Formula 10-63
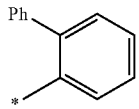
Formula 10-64
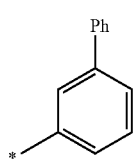
Formula 10-65
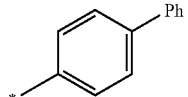
Formula 10-66
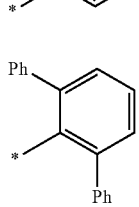
Formula 10-67
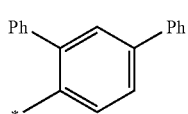
Formula 10-68
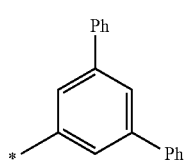
Formula 10-69
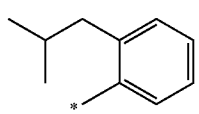
Formula 10-70
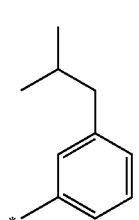
Formula 10-71
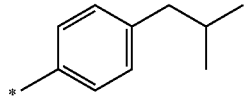
Formula 10-72

Formula 10-73
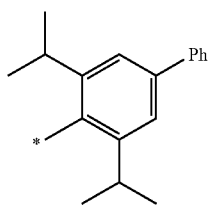
Formula 10-74
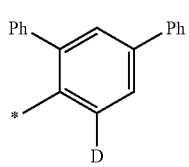
Formula 10-75
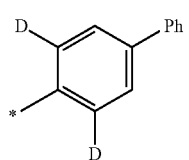
Formula 10-76
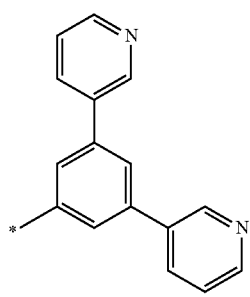
Formula 10-77
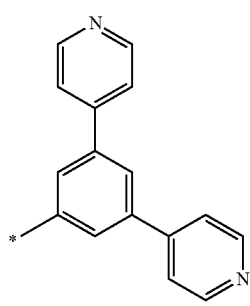
Formula 10-78
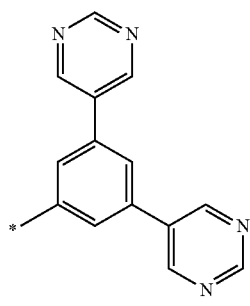
Formula 10-79
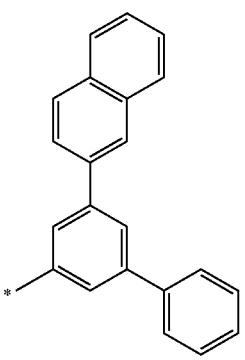
Formula 10-80
Formula 10-81
Formula 10-82
Formula 10-83
Formula 10-84
Formula 10-85
Formula 10-86

Formula 10-87
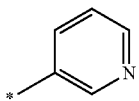
Formula 10-88
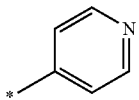
Formula 10-89
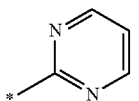
Formula 10-90
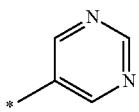
Formula 10-91
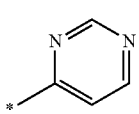
Formula 10-92
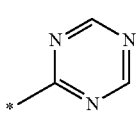
Formula 10-93
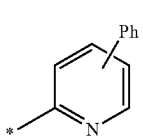
Formula 10-94
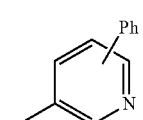
Formula 10-95
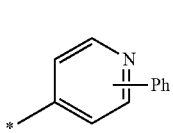
Formula 10-96
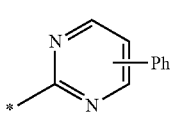
Formula 10-97
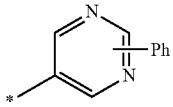
Formula 10-98
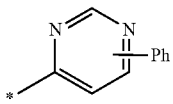
Formula 10-99
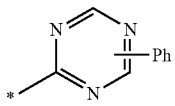
Formula 10-100
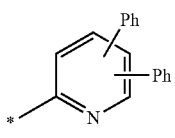
Formula 10-101
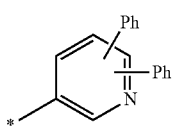
Formula 10-102
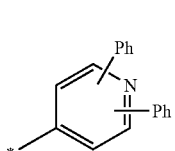
Formula 10-103
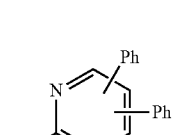
Formula 10-104
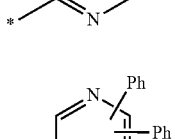
Formula 10-105
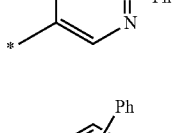
Formula 10-106
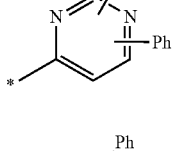
Formula 10-107
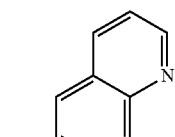
Formula 10-108
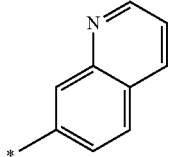

Formula 10-109
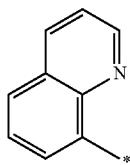
Formula 10-110
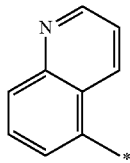
Formula 10-111
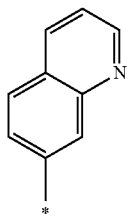
Formula 10-112
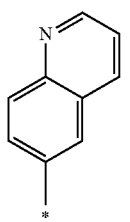
Formula 10-113
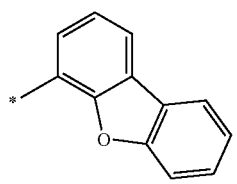
Formula 10-114
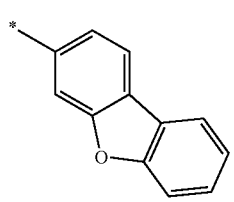
Formula 10-115
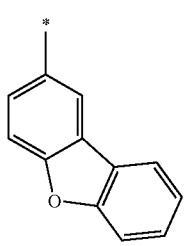
Formula 10-116
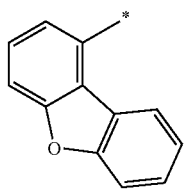
Formula 10-117
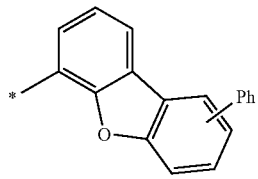
Formula 10-118
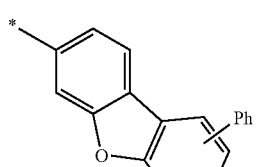
Formula 10-119
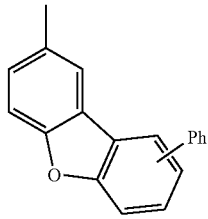
Formula 10-120
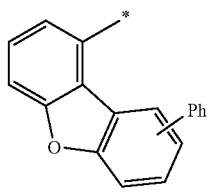
Formula 10-121
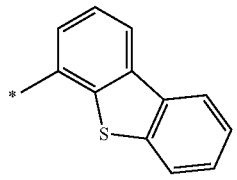
Formula 10-122
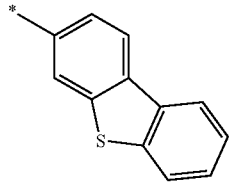

-continued
Formula 10-123
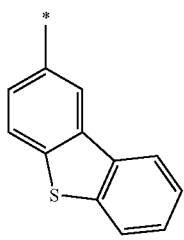
Formula 10-124
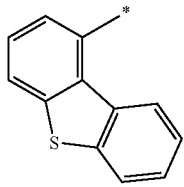
Formula 10-125
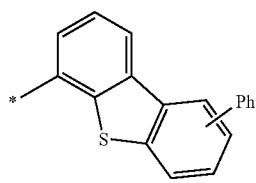
Formula 10-126
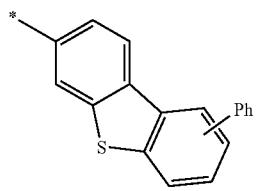
Formula 10-127
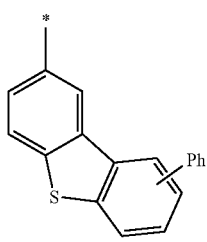
Formula 10-128
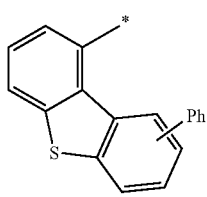
Formula 10-129
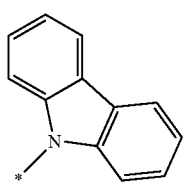
-continued
Formula 10-130
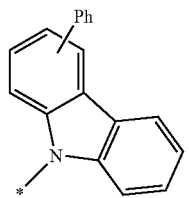
Formula 10-131
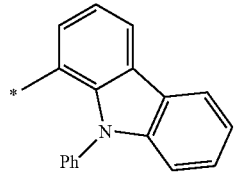
Formula 10-132
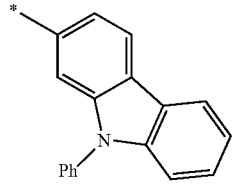
Formula 10-133
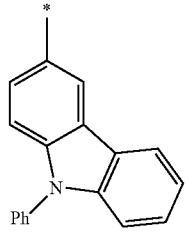
Formula 10-134
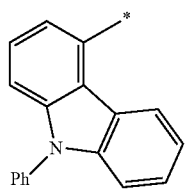
Formula 10-135
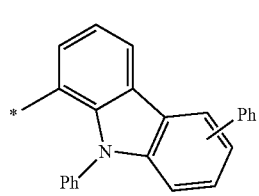
Formula 10-136
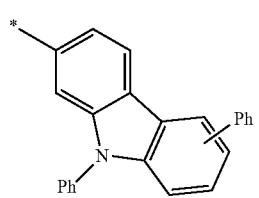

-continued
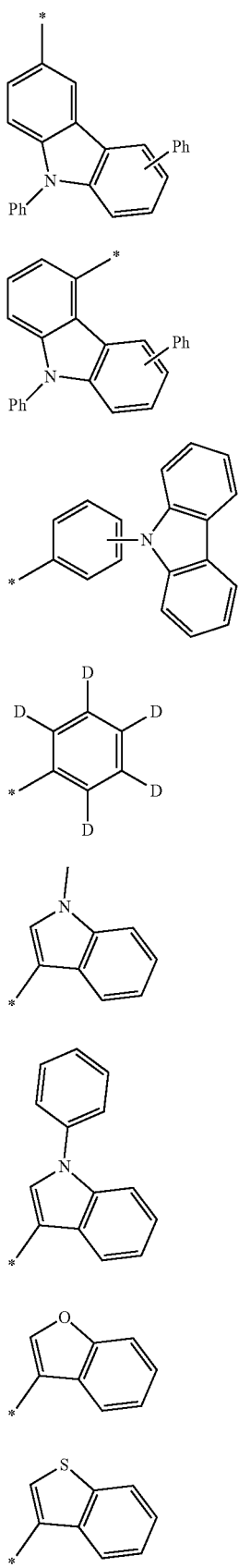
Formula 10-137
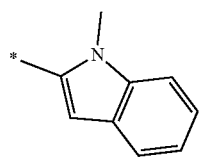
Formula 10-138
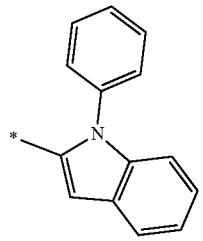
Formula 10-139
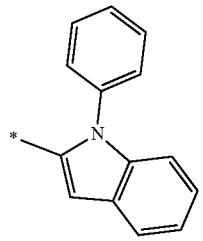
Formula 10-140
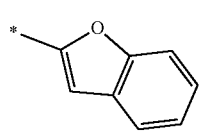
Formula 10-141
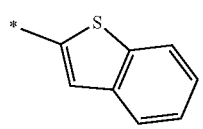
Formula 10-142
Formula 10-143
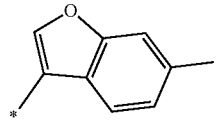
Formula 10-144
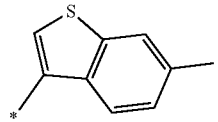
Formula 10-145
Formula 10-146
Formula 10-147
Formula 10-148
Formula 10-149
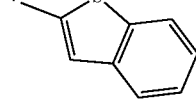
Formula 10-150
Formula 10-151
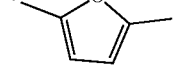
Formula 10-152
Formula 10-153
Formula 10-154
Formula 10-155
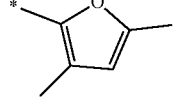

Formula 10-156 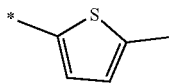

Formula 10-157 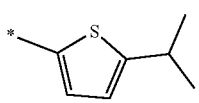

Formula 10-158 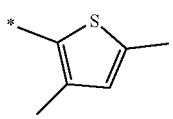

Formula 10-159 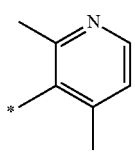

Formula 10-160 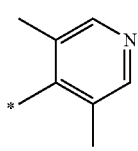

Formula 10-161 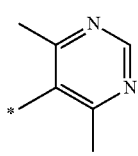

Formula 10-162 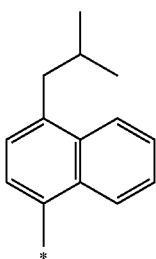

Formula 10-163 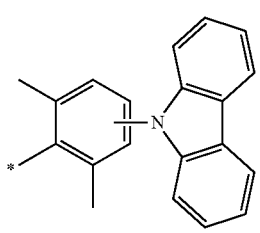

Formula 10-164 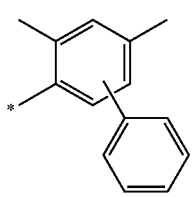

Formula 10-165 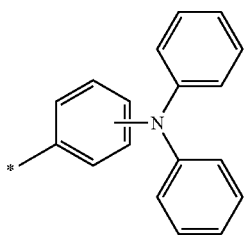

Formula 10-166 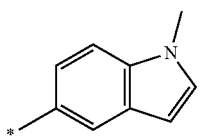

Formula 10-167 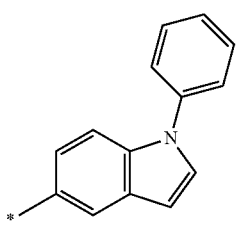

Formula 10-168 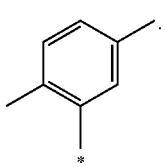

In Formulae 9-1 to 9-19 and 10-1 to 10-168, * indicates a binding site to a neighboring atom, "Ph" indicates a phenyl group, "Cz" indicates a carbazolyl group, and "TMS" indicates a trimethylsilyl group.

a1, a2, a3, and a4 in Formula 1 respectively indicate the number of groups $R_1$, the number of groups $R_2$, the number of groups $R_1$, and the number of groups $R_4$, and may each independently be 0, 1, 2, 3, 4, or 5. When a1 is two or more, two or more groups $R_1$ may be identical to or different from each other, when a2 is two or more, two or more groups $R_2$ may be identical to or different from each other, when a3 is two or more, two or more groups $R_3$ may be identical to or different from each other, and when a4 is two or more, two or more groups $R_4$ may be identical to or different from each other, but embodiments of the present disclosure are not limited thereto.

In Formula 1, two of groups $R_1$ in the number of a1 may optionally be linked to form a substituted or unsubstituted $C_5$-$C_{30}$ carbocyclic group or a substituted or unsubstituted $C_1$-$C_{30}$ heterocyclic group, two of groups $R_2$ in the number of a2 may optionally be linked to form a substituted or unsubstituted $C_5$-$C_{30}$ carbocyclic group or a substituted or unsubstituted $C_1$-$C_{30}$ heterocyclic group, when two of groups $R_3$ in the number of a3 may optionally be linked to form a substituted or unsubstituted $C_5$-$C_{30}$ carbocyclic group or a substituted or unsubstituted $C_1$-$C_{30}$ heterocyclic group, two of groups $R_4$ in the number of a4 may optionally be linked to form a substituted or unsubstituted $C_5$-$C_{30}$ carbocyclic group or a substituted or unsubstituted $C_1$-$C_{30}$ heterocyclic group, two or more neighboring groups selected from $R_1$ to $R_4$ may optionally be linked to form a substituted or unsubstituted $C_5$-$C_{30}$ carbocyclic group or a substituted or unsubstituted $C_1$-$C_{30}$ heterocyclic group, and one of $R_5$ and $R_6$ and one of $R_1$ to $R_4$ may optionally be linked to form a substituted or unsubstituted $C_5$-$C_{30}$ carbocyclic group or a substituted or unsubstituted $C_1$-$C_{30}$ heterocyclic group.

For example, i) a substituted or unsubstituted $C_5$-$C_{30}$ carbocyclic group or a substituted or unsubstituted $C_1$-$C_{30}$ heterocyclic group, formed by linking two of groups $R_1$ in the number of a1, ii) a substituted or unsubstituted $C_5$-$C_{30}$ carbocyclic group or a substituted or unsubstituted $C_1$-$C_{30}$ heterocyclic group, formed by two of groups $R_2$ in the number of a2, iii) a substituted or unsubstituted $C_5$-$C_{30}$ carbocyclic group or a substituted or unsubstituted $C_1$-$C_{30}$ heterocyclic group, formed by linking two of groups $R_3$ in the number of a3, iv) a substituted or unsubstituted $C_5$-$C_{30}$ carbocyclic group or a substituted or unsubstituted $C_1$-$C_{30}$ heterocyclic group, formed by linking two of groups $R_4$ in the number of a4, v) a substituted or unsubstituted $C_5$-$C_{30}$ carbocyclic group or a substituted or unsubstituted $C_1$-$C_{30}$ heterocyclic group, formed by linking two neighboring groups selected from $R_1$ to $R_4$, and vi) a substituted or unsubstituted $C_5$-$C_{30}$ carbocyclic group or a substituted or unsubstituted $C_1$-$C_{30}$ heterocyclic group, formed by linking one of $R_5$ and $R_6$ and one of $R_1$ to $R_4$ in Formula 1 may each independently be selected from:

a pentadiene group, a cyclohexane group, a cyclopentane group, an adamantane group, a bicycloheptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group; and a pentadiene group, a cyclohexane group, a cycloheptane group, an adamantane group, a bicycloheptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each substituted with at least one $R_{10}$, but embodiments of the present disclosure are not limited thereto.

$R_{10}$ is the same as described in connection with $R_1$.

The organometallic compound represented by Formula 1 does not include fluorine (F).

In an embodiment, a moiety represented by

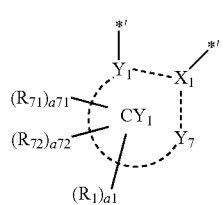

in Formula 1 may be selected from groups represented by Formulae CY1-1 to CY1-6:

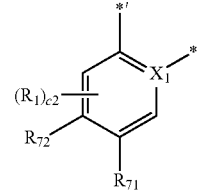

Formula CY1-1

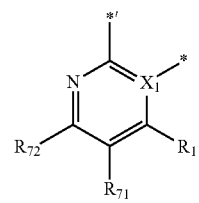

Formula CY1-2

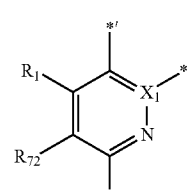

Formula CY1-3

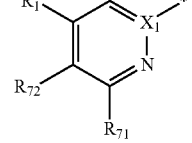

Formula CY1-4

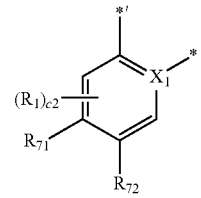

Formula CY1-5

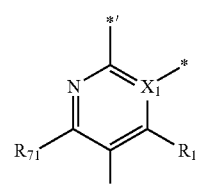

Formula CY1-6

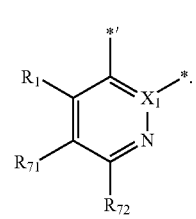

In Formulae CY1-1 to CY1-6, $X_1$, $R_{71}$, $R_{72}$, and $R_1$ are each independently the same as described herein, c2 may be an integer from 0 to 2, and \* and \*' each indicate a binding site to a neighboring atom.

In one or more embodiments, a moiety represented by
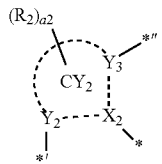
in Formula 1 may be selected from groups represented by Formulae CY2-1 to CY2-25:
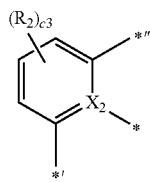
Formula CY2-1
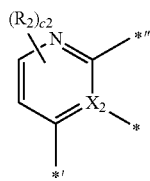
Formula CY2-2
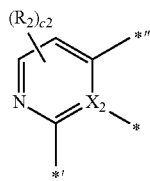
Formula CY2-3
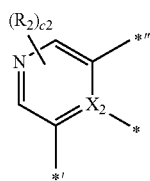
Formula CY2-4
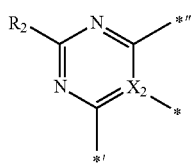
Formula CY2-5
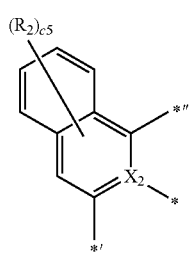
Formula CY2-6
-continued
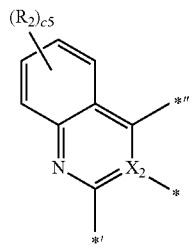
Formula CY2-7
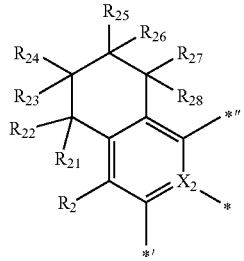
Formula CY2-8
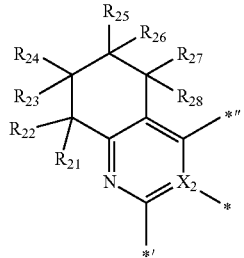
Formula CY2-9
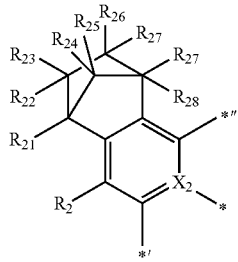
Formula CY2-10
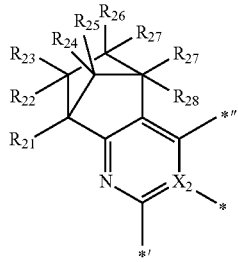
Formula CY2-11
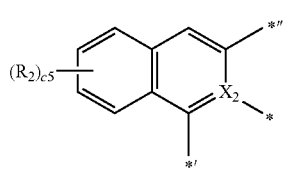
Formula CY2-12

-continued

Formula CY2-13
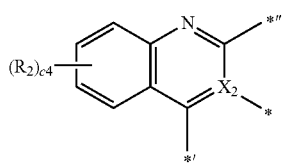

Formula CY2-14
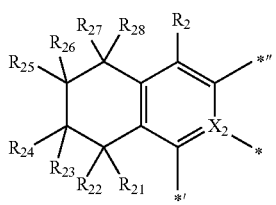

Formula CY2-15
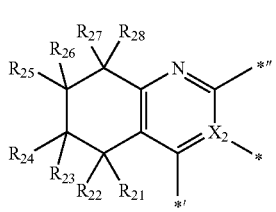

Formula CY2-16
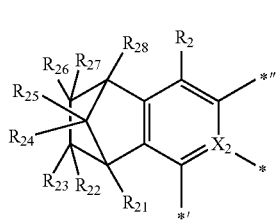

Formula CY2-17
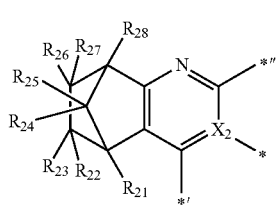

Formula CY2-18
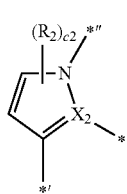

Formula CY2-19
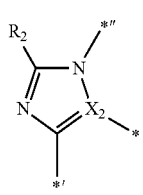

Formula CY2-20
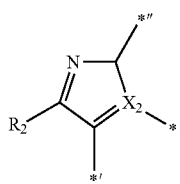

Formula CY2-21
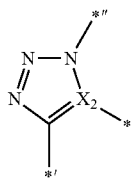

Formula CY2-22
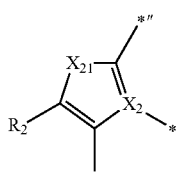

Formula CY2-23
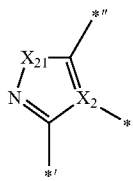

Formula CY2-24
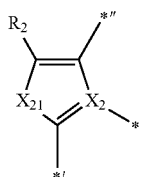

Formula CY2-25
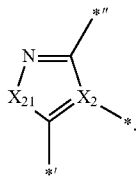

In Formulae CY2-1 to CY2-25, $X_2$ and $R_2$ are each independently the same as described herein, $X_{21}$ may be O, S, $N(R_{21})$, or $C(R_{21})(R_{22})$, $R_{21}$ to $R_{28}$ are each independently the same as described in connection with $R_2$, c5 may be an integer from 0 to 5, c4 may be an integer from 0 to 4, c3 may be an integer from 0 to 3, c2 may be an integer from 0 to 2, and

*, *', and *" each indicate a binding site to a neighboring atom.

In one or more embodiments, a moiety represented by

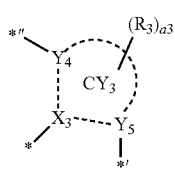

in Formula 1 may be selected from groups represented by Formulae CY3-1 to CY3-25:
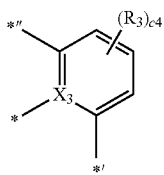
Formula CY3-1
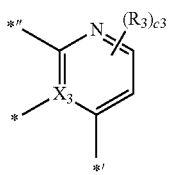
Formula CY3-2
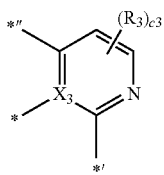
Formula CY3-3
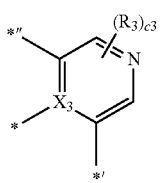
Formula CY3-4
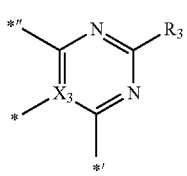
Formula CY3-5
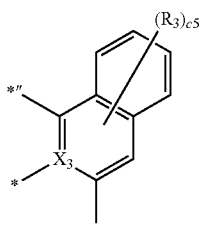
Formula CY3-6
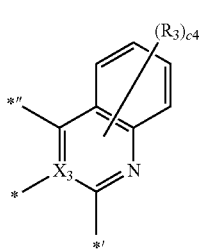
Formula CY3-7
-continued
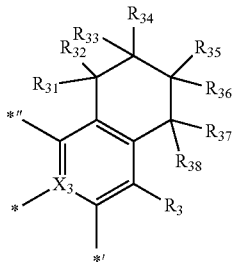
Formula CY3-8
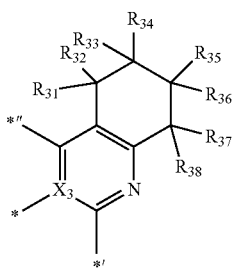
Formula CY3-9
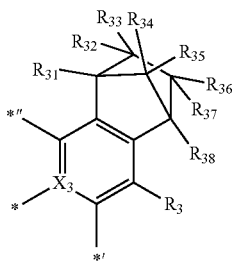
Formula CY3-10
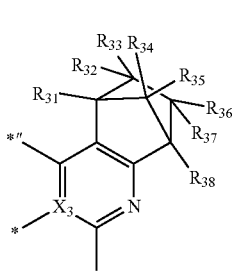
Formula CY3-11
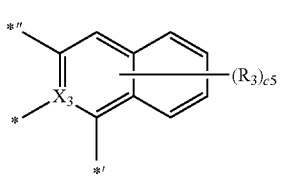
Formula CY3-12
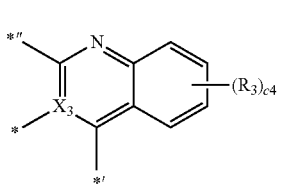
Formula CY3-13

In Formulae CY3-1 to CY3-25,
X$_3$ and R$_3$ are each independently the same as described herein,
X$_{31}$ may be O, S, N(R$_{31}$), or C(R$_{31}$)(R$_{32}$),
R$_{31}$ to R$_{38}$ are each independently the same as described in connection with R$_3$,
c5 may be an integer from 0 to 5,
c4 may be an integer from 0 to 4,
c3 may be an integer from 0 to 3,
c2 may be an integer from 0 to 2, and
*, *', and *'' each indicate a binding site to a neighboring atom.

In one or more embodiments, a moiety represented by in Formula 1 may be selected from groups represented by Formulae CY4-1 to CY4-35:
Formula CY4-1
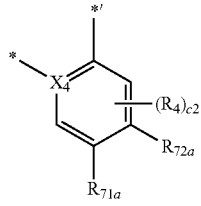
Formula CY4-2
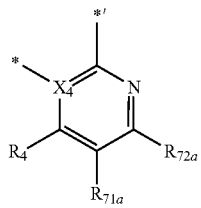
Formula CY4-3
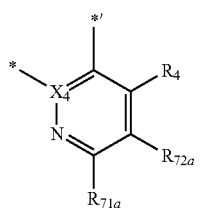
Formula CY4-4
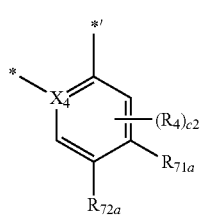
Formula CY4-5
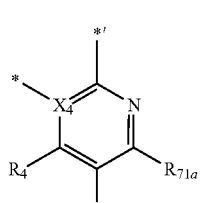
Formula CY4-6
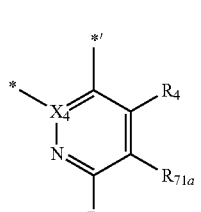
Formula CY4-7
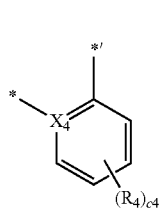
-continued
Formula CY4-8
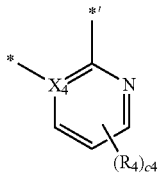
Formula CY4-9
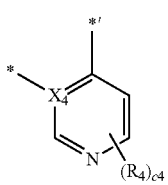
Formula CY4-10
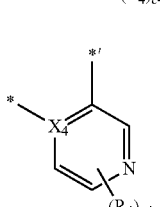
Formula CY4-11
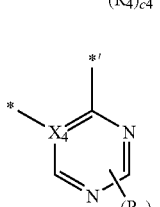
Formula CY4-12
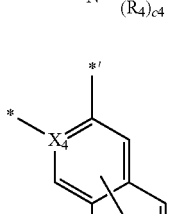
Formula CY4-13
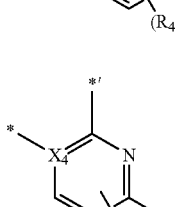
Formula CY4-14
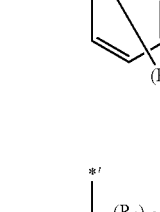
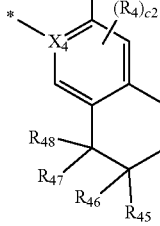

Formula CY4-15
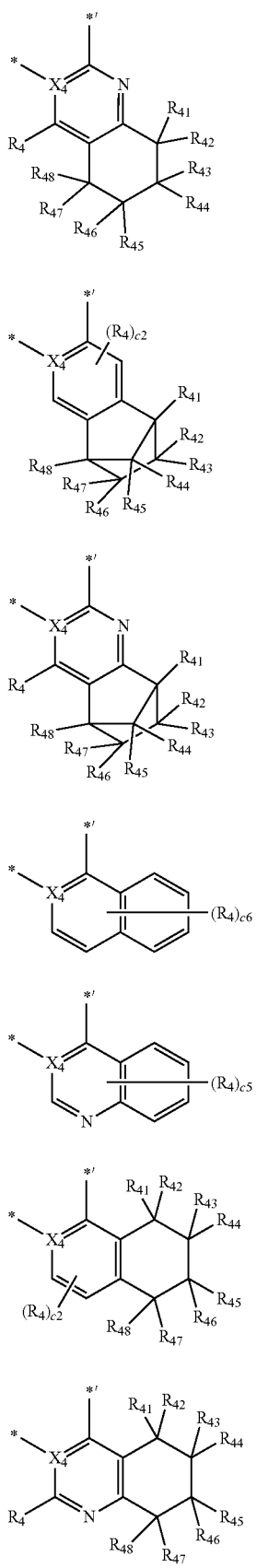
Formula CY4-16
Formula CY4-17
Formula CY4-18
Formula CY4-19
Formula CY4-20
Formula CY4-21
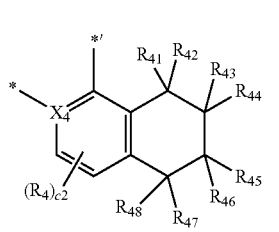
Formula CY4-22
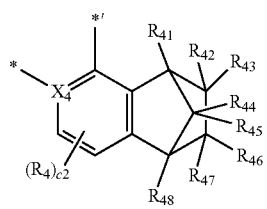
Formula CY4-23
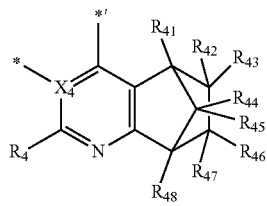
Formula CY4-24
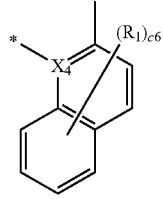
Formula CY4-25
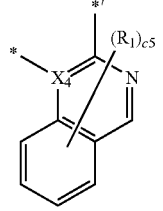
Formula CY4-26
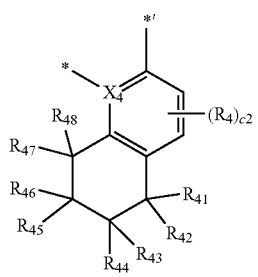
Formula CY4-27
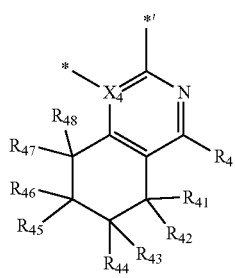

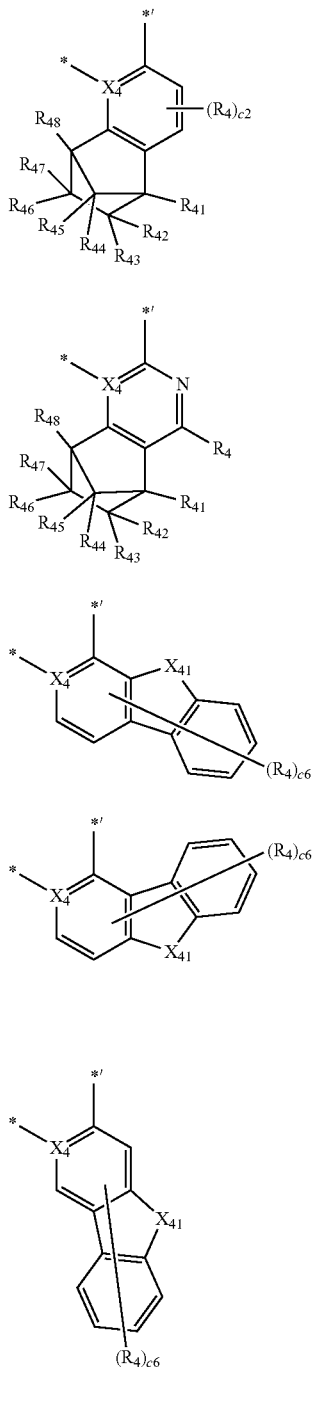

Formula CY4-28
Formula CY4-29
Formula CY4-30
Formula CY4-31
Formula CY4-32
Formula CY4-33

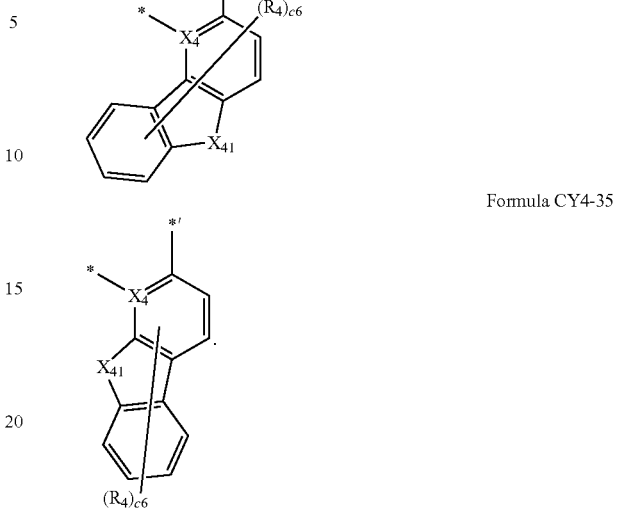

Formula CY4-34
Formula CY4-35

In Formulae CY4-1 to CY4-35,
$X_4$ and $R_4$ are each independently the same as described herein,
$X_{41}$ may be O, S, $N(R_{41})$, or $C(R_{41})(R_{42})$,
$R_{71a}$ is the same as described in connection with $R_{71}$,
$R_{72a}$ is the same as described in connection with $R_{72}$,
$R_{41}$ to $R_{48}$ are each independently the same as described in connection with $R_4$,
c6 may be an integer from 0 to 6,
c5 may be an integer from 0 to 5,
c4 may be an integer from 0 to 4,
c3 may be an integer from 0 to 3,
c2 may be an integer from 0 to 2, and
* and *' each indicate a binding site to a neighboring atom.

In one or more embodiments,
a moiety represented by

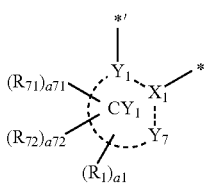

in Formula 1 may be selected from groups represented by Formulae CY1(1) and CY1(2), and/or
a moiety represented by

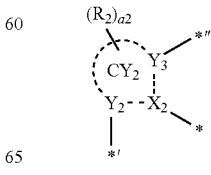

in Formula 1 may be selected from groups represented by Formulae CY2(1) to CY2(4), and/or a moiety represented by

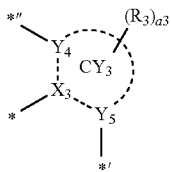

in Formula 1 may be selected from groups represented by Formulae CY3(1) to CY3(4), and/or a moiety represented by

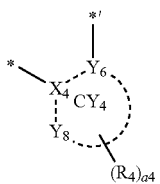

in Formula 1 may be selected from groups represented by Formulae CY4(1) to CY4(19), but embodiments of the present disclosure are not limited thereto:

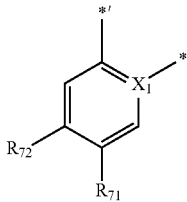

Formula CY1(1)

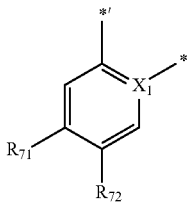

Formula CY1(2)

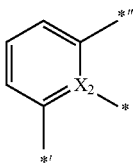

Formula CY2(1)

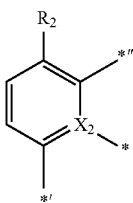

Formula CY2(2)

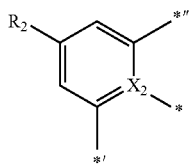

Formula CY2(3)

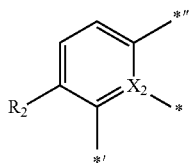

Formula CY2(4)

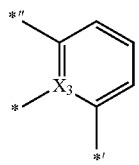

Formula CY3(1)

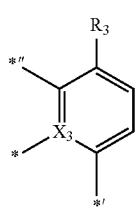

Formula CY3(2)

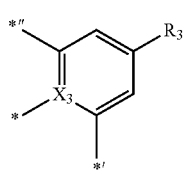

Formula CY3(3)

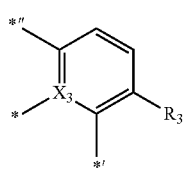

Formula CY3(4)

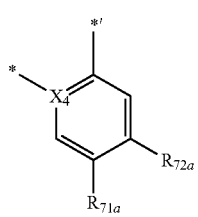

Formula CY4(1)

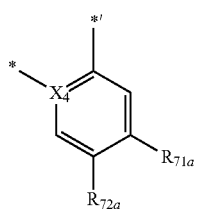

Formula CY4(2)

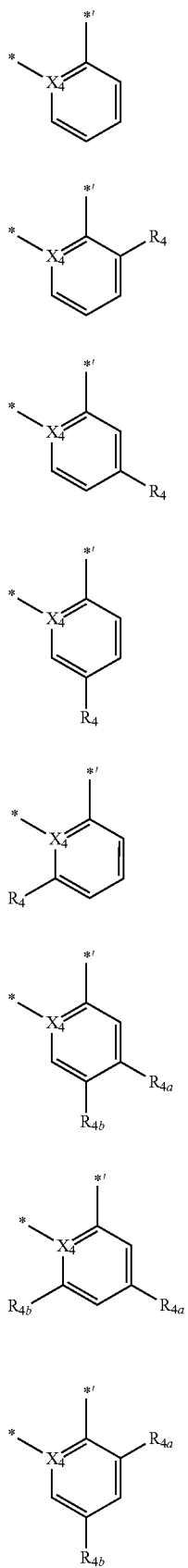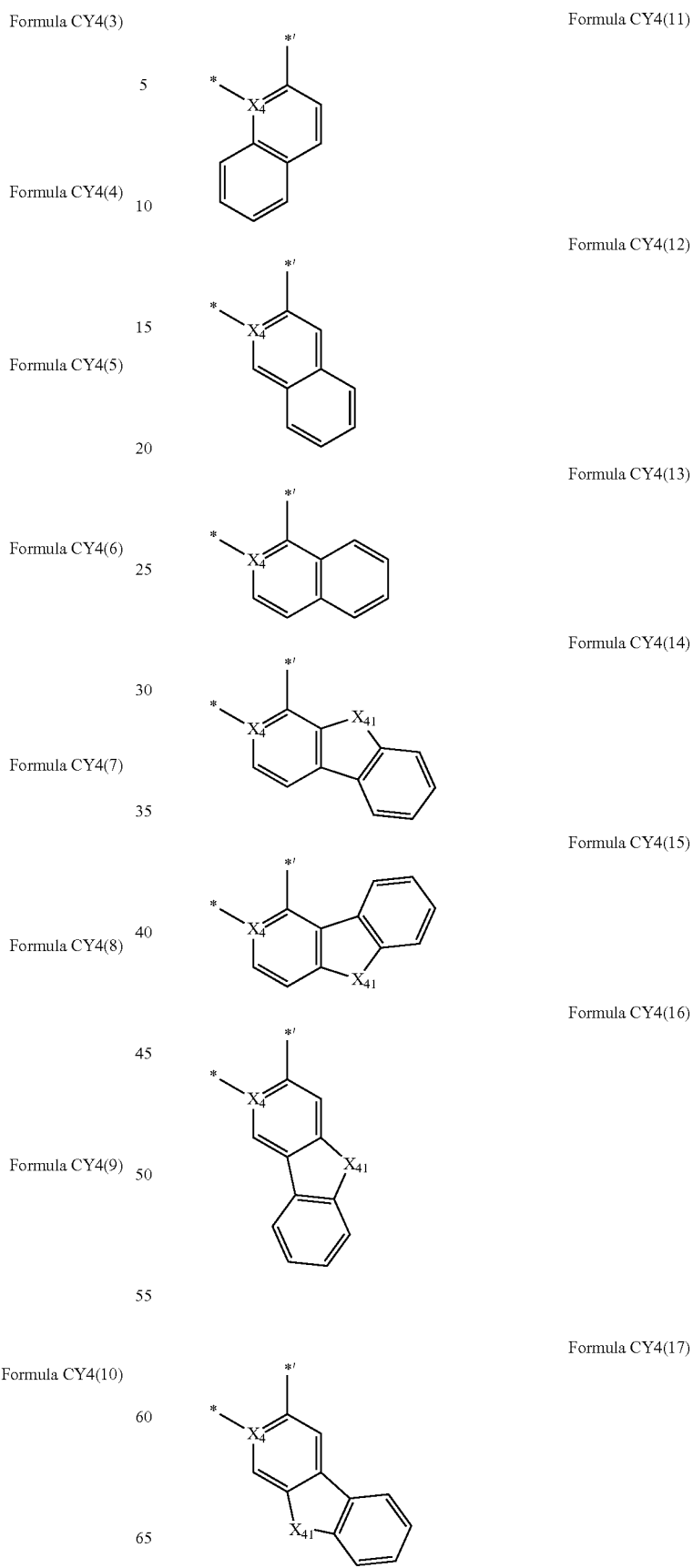

-continued

Formula CY4(18)

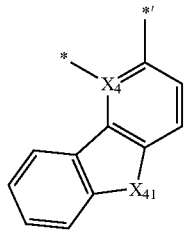

Formula CY4(19)

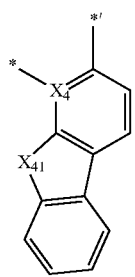

In Formulae CY1(1), CY1(2), CY2(1) to CY2(4), CY3(1) to CY3(4), and CY4(1) to CY4(19), $X_1$, $R_1$, $R_{71}$, $R_{72}$, $X_2$, $R_2$, $X_3$, $R_3$, $X_4$, and $R_4$ are each independently the same as described herein, $X_{41}$ may be O, S, $N(R_{41})$, or $C(R_{41})(R_{42})$, $R_{4a}$, $R_{4b}$, $R_{41}$, and $R_{42}$ are each independently the same as described in connection with $R_4$, $R_{71a}$ is the same as described in connection with $R_{71}$, $R_{72a}$ is the same as described in connection with $R_{72}$, and

*, *', and *" each indicate a binding site to a neighboring atom.

In one or more embodiments, the organometallic compound may be represented by Formula 1(1):

Formula 1(1)

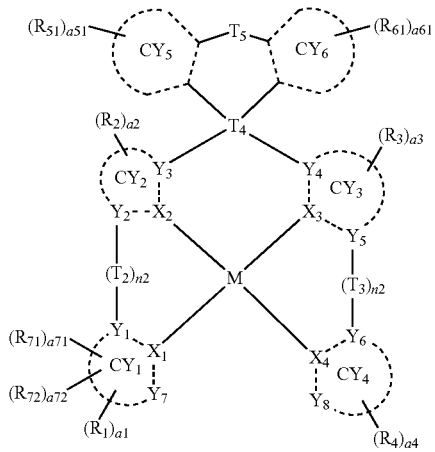

In Formula 1(1),

M, $X_1$ to $X_4$, $Y_1$ to $Y_8$, $CY_1$ to $CY_4$, $T_2$, $T_3$, b2, b3, $R_{71}$, $R_{72}$, a71, a72, $R_1$ to $R_4$, and a1 to a4 are each independently the same as described herein, $CY_5$ and $CY_6$ may each independently be a $C_5$-$C_{30}$ carbocyclic group or a $C_1$-$C_{30}$ heterocyclic group, $R_{51}$ and $R_{61}$ are each independently the same as described in connection with $R_1$, a51 and a61 may each independently be 0, 1, 2, or 3, $T_4$ may be C, Si, or Ge, $T_5$ may be selected from a single bond, *—$N[(L_7)_{b7}$-$(R_7)]$—*', *—$C(R_7)(R_8)$—*', *—$Si(R_7)(R_8)$—*', *—$Ge(R_7)(R_8)$—*', *—S—*', *—Se—*', *—O—*', *—C(=O)—*', *—S(=O)—*', *—S(=O)_2$—*', *—$C(R_7)$=$C(R_8)$—*', *—C(=S)—*', and *—C≡C—*', $L_7$ and b7 are each independently the same as described in connection with $L_5$ and b5, $R_7$ and $R_8$ are each independently the same as described in connection with $R_5$, and

* and *' each indicate a binding site to a neighboring atom.

For example, $T_5$ may be selected from a single bond, *—$N[(L_7)_{b7}$-$(R_7)]$—*', *—$C(R_7)(R_5)$—*', *—$Si(R_7)(R_5)$—*', *—S—*', *—O—*', and *—C(=O)—*'.

The organometallic compound represented by Formula 1 may be selected from Compounds 1 to 201, but embodiments of the present disclosure are not limited thereto:

1

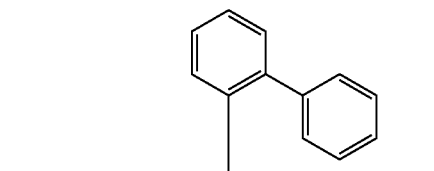
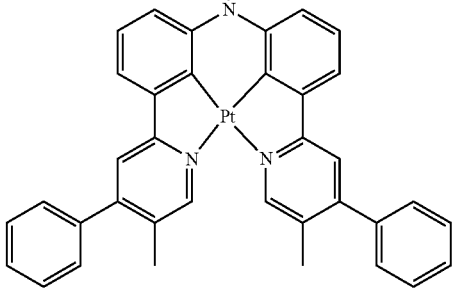

2

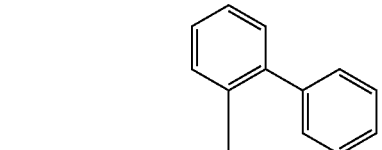
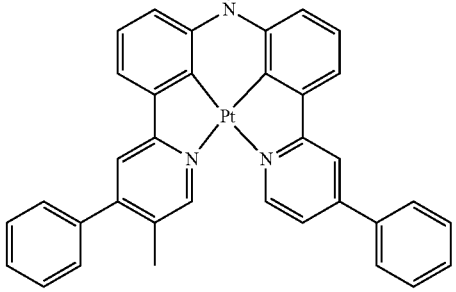

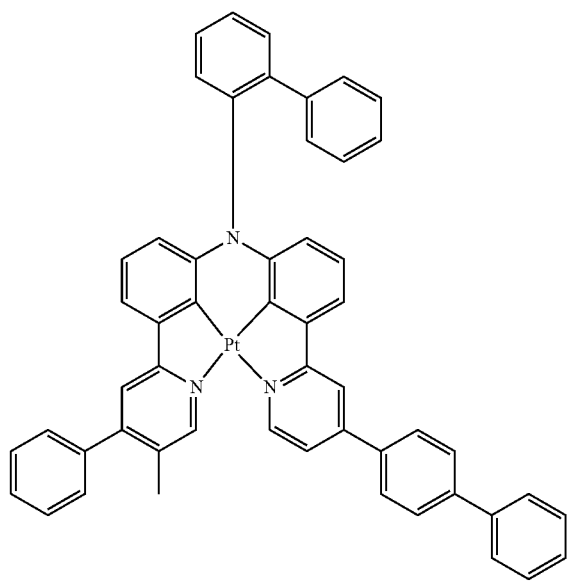
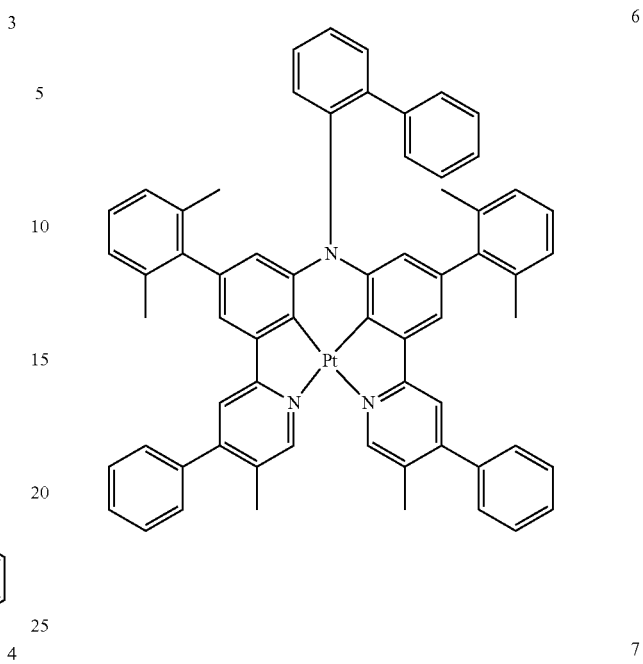
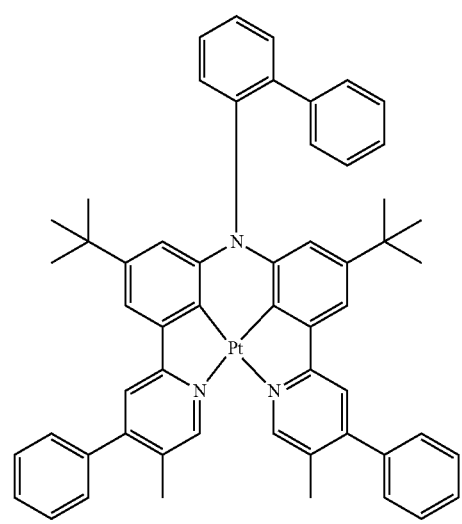
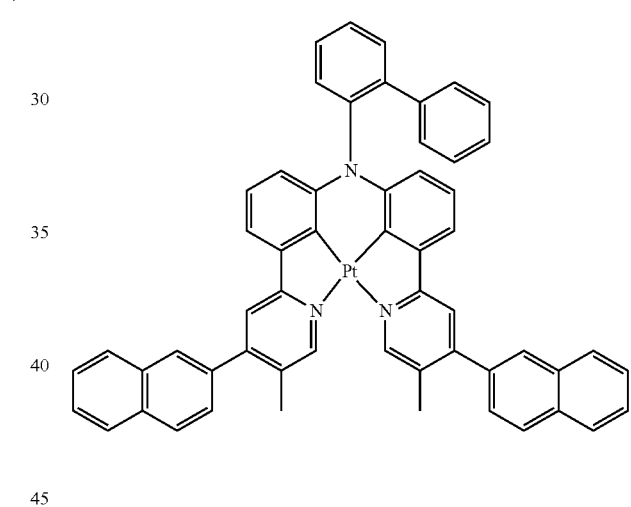
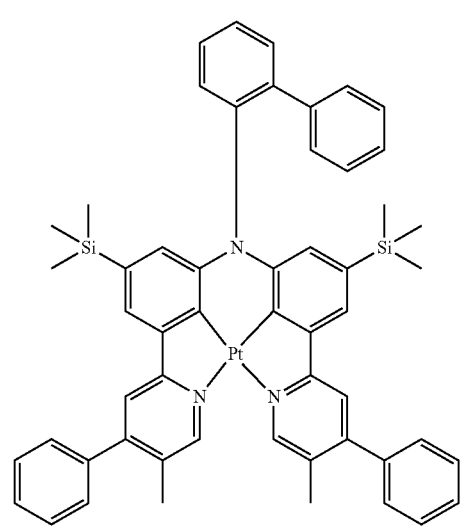
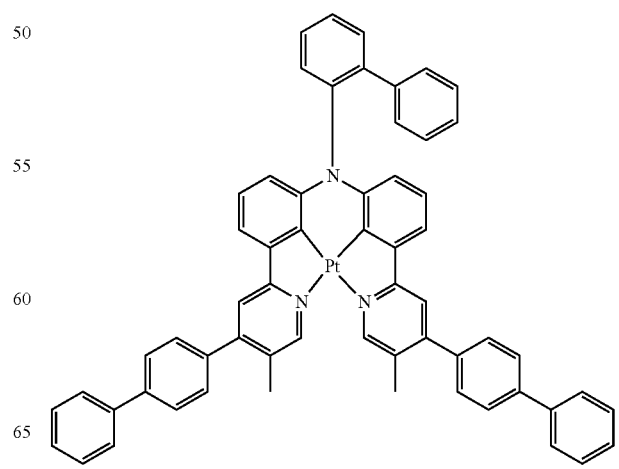

9
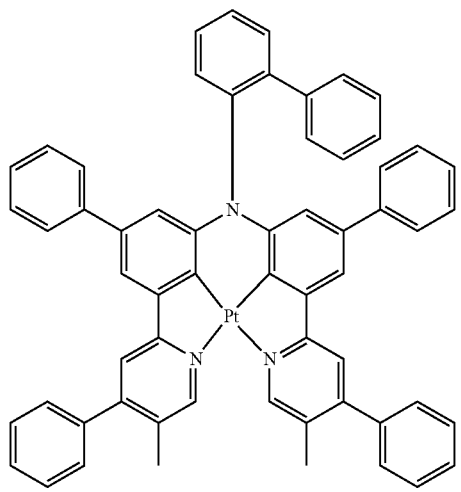
10
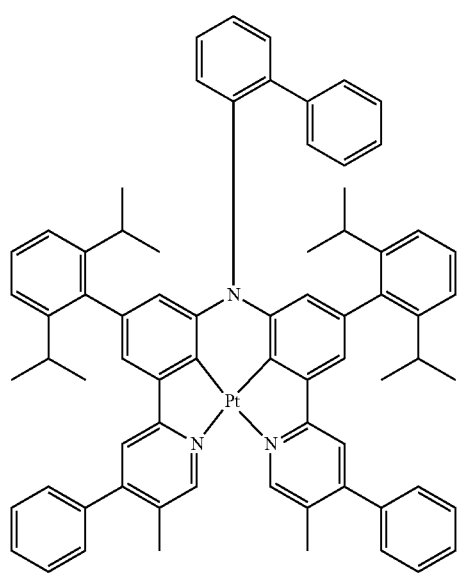
11
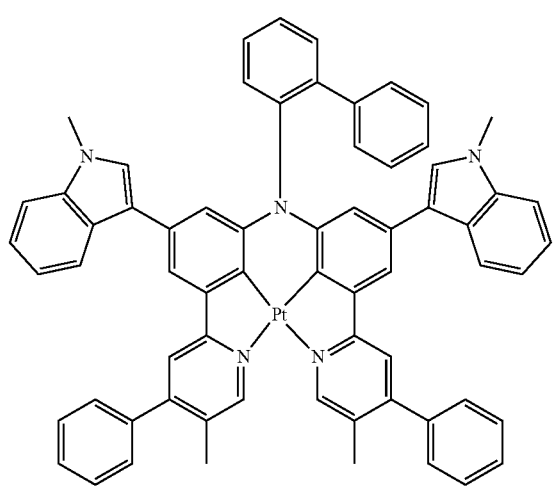
12
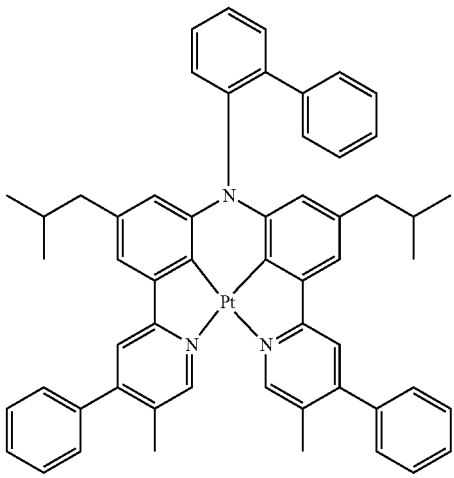
13
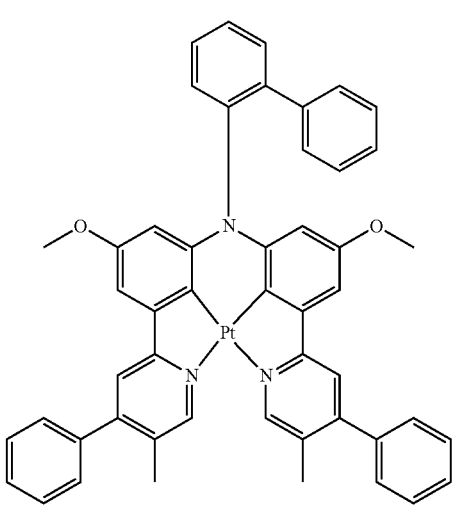
14
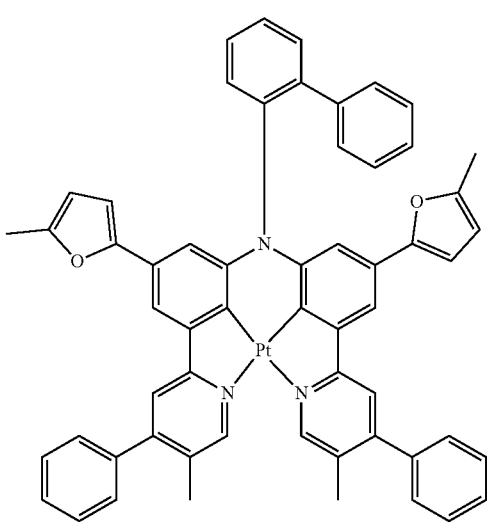

15
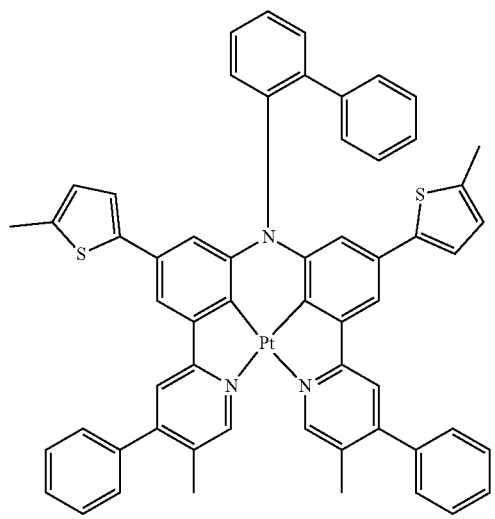
16
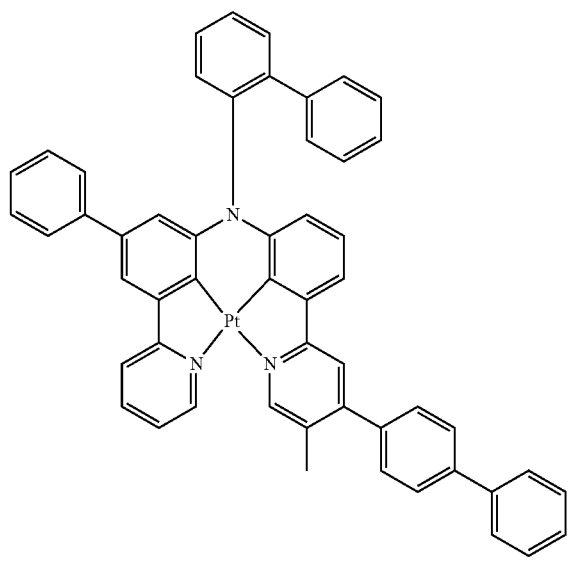
17
[structure at bottom left]
18
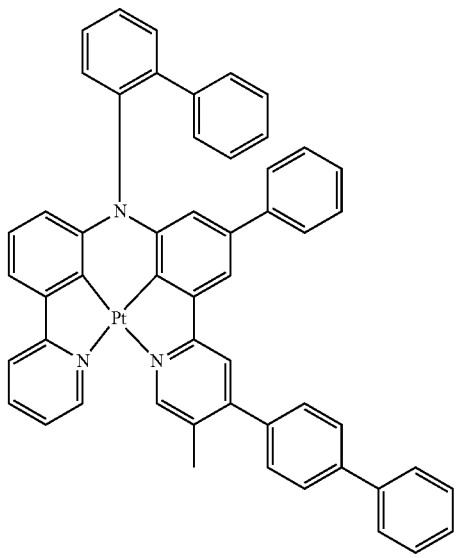
19
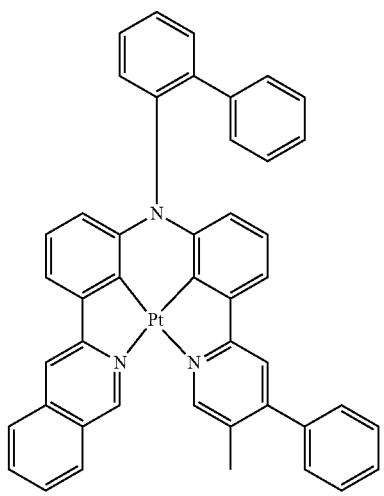
20
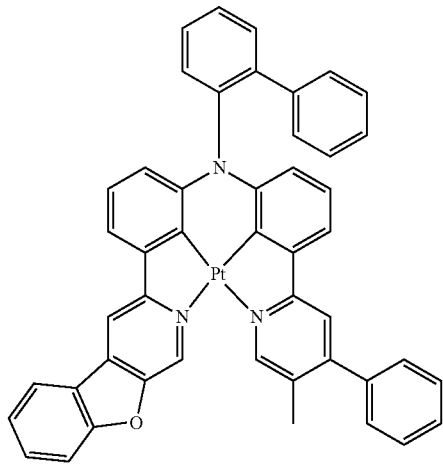

-continued
21
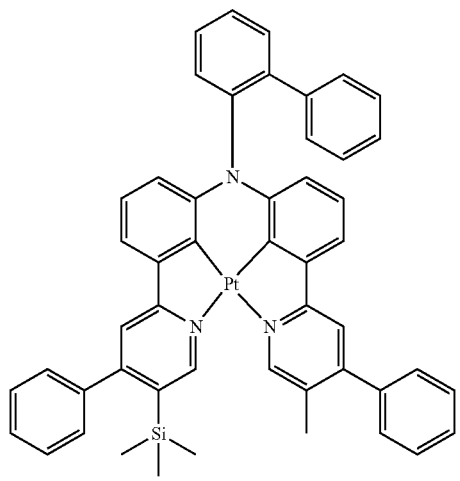
22
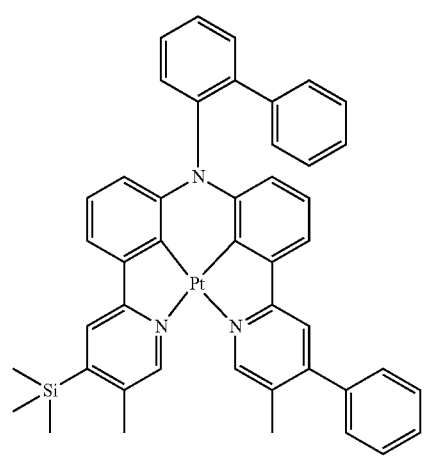
23
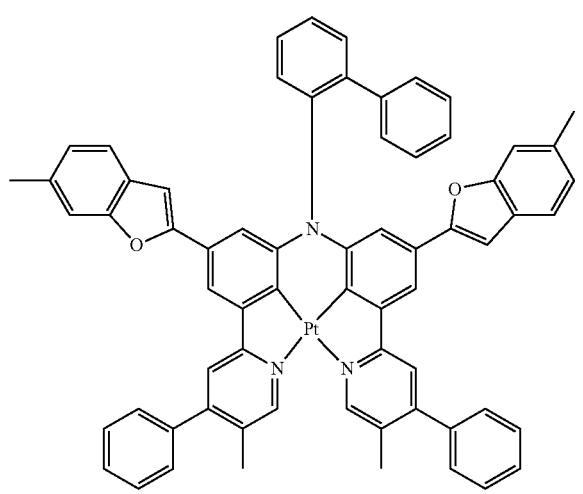
-continued
24
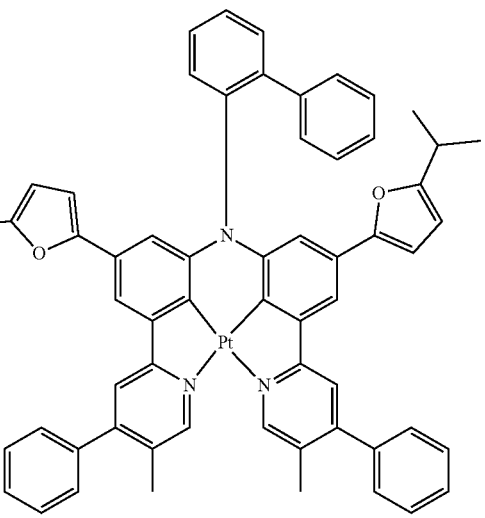
25
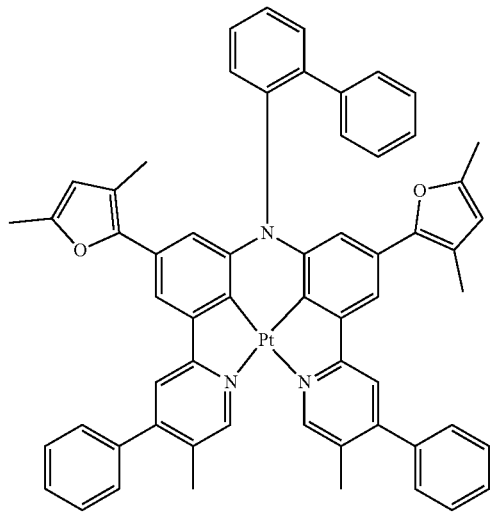
26
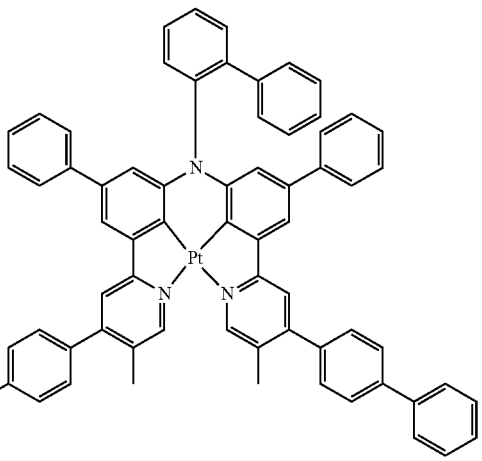

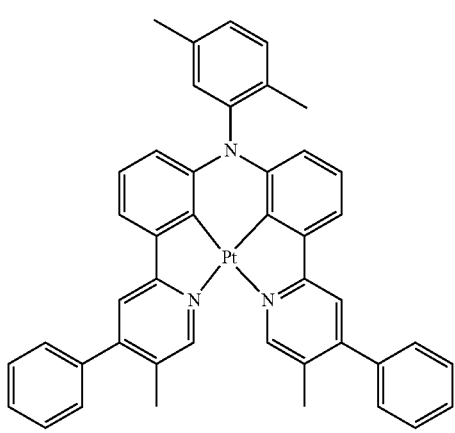
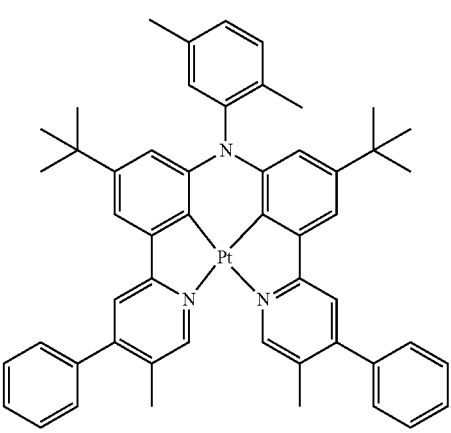

33
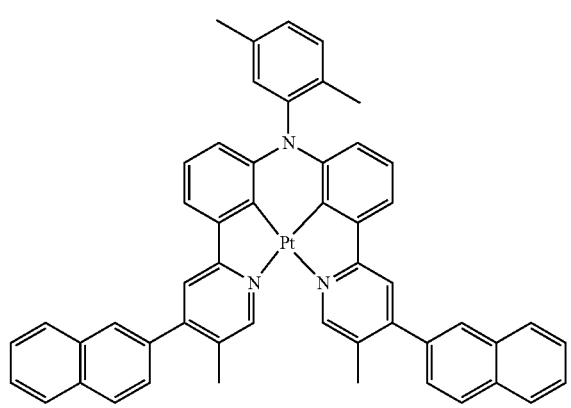
36
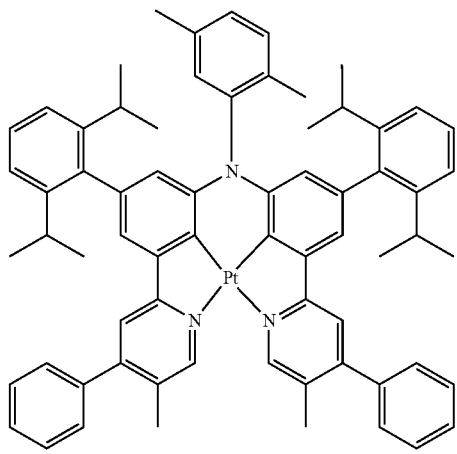
34
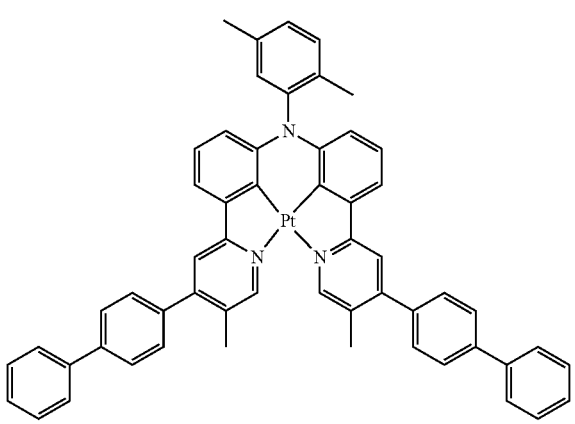
37
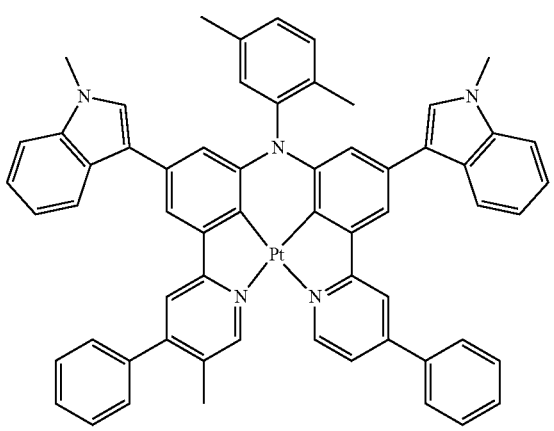
35
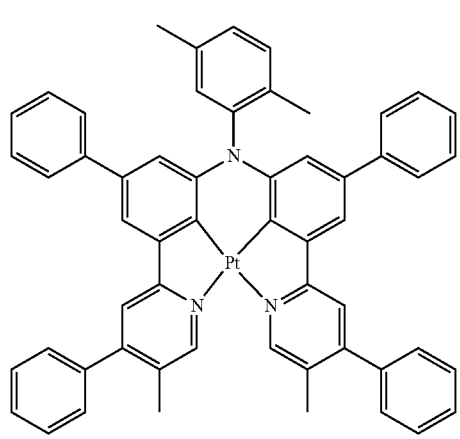
38
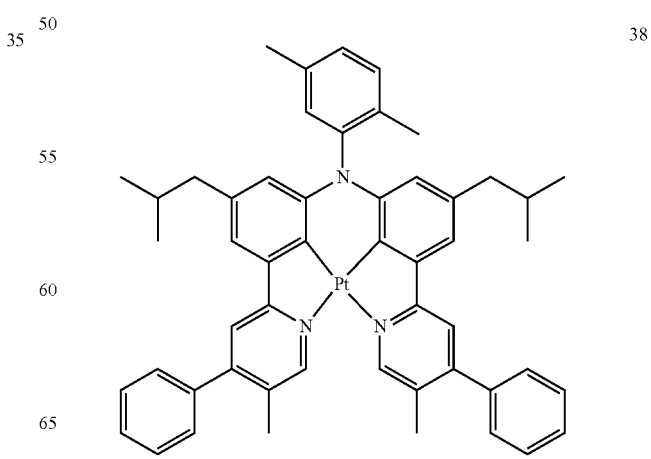

-continued
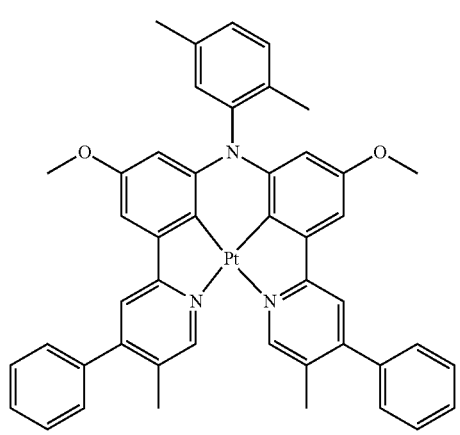
39
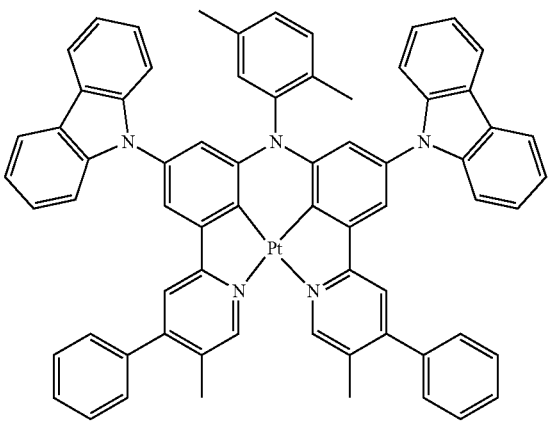
42
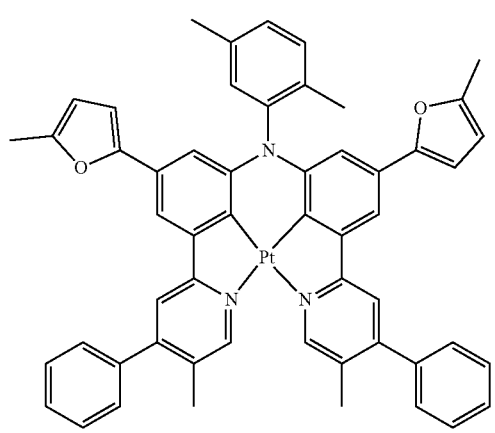
40
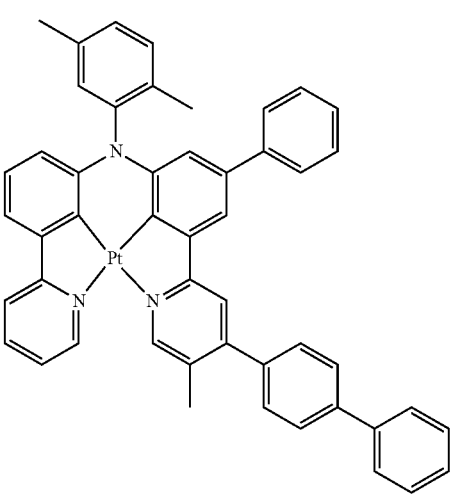
43
41
44

45
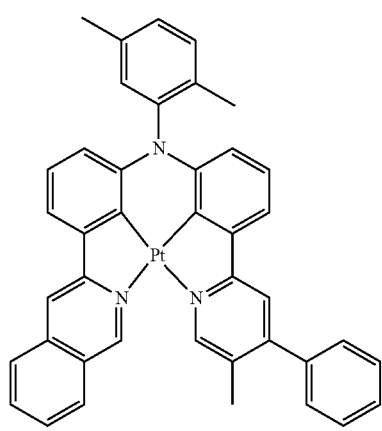
46
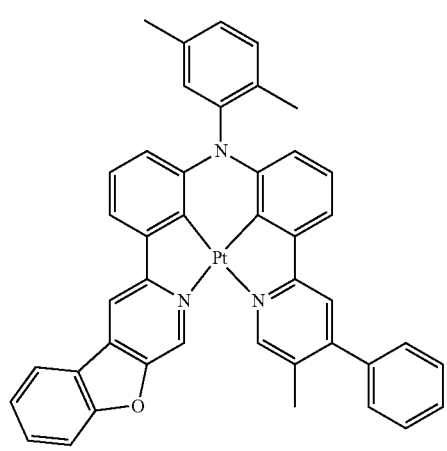
47
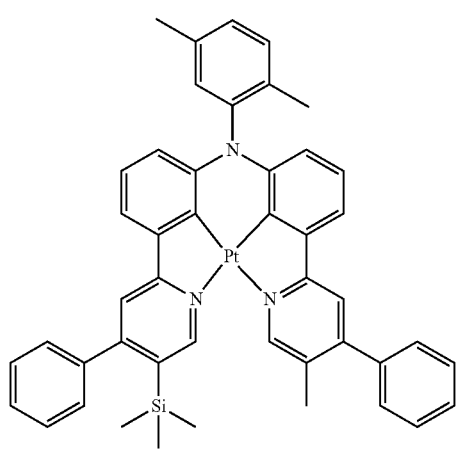
48
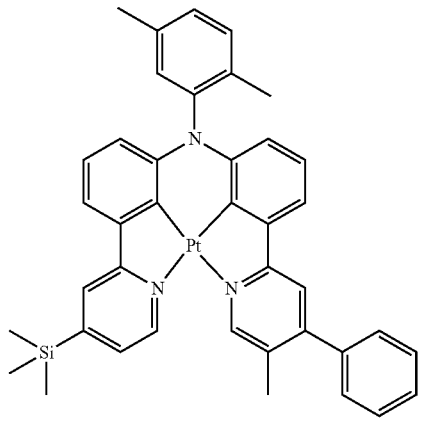
49
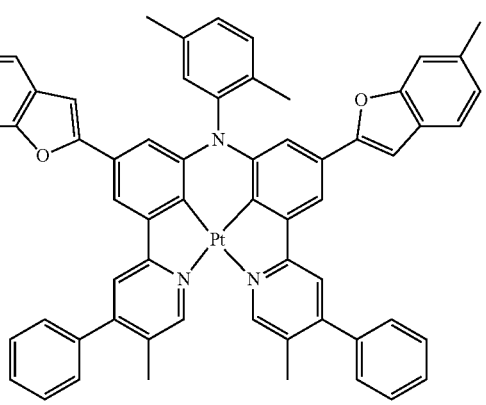
50
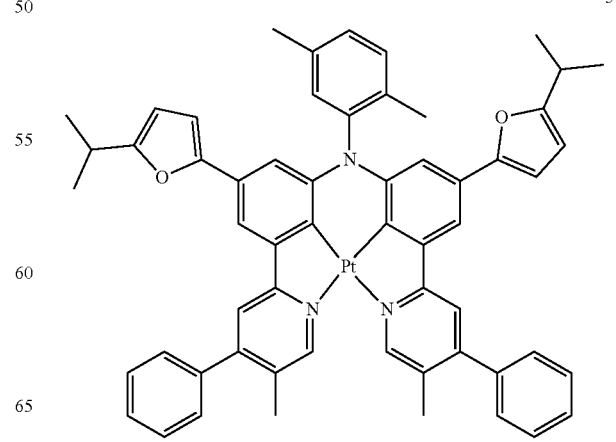

51
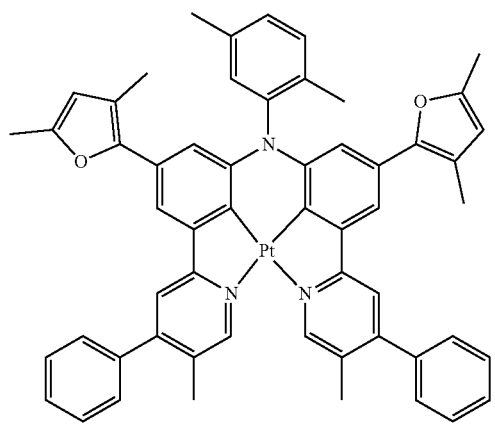
54
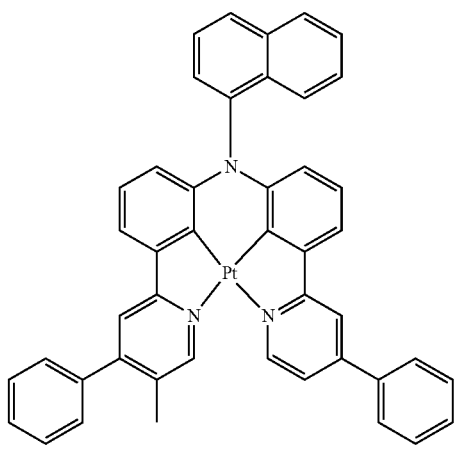
52
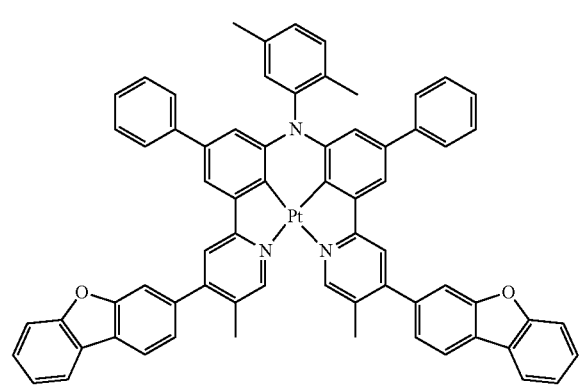
55
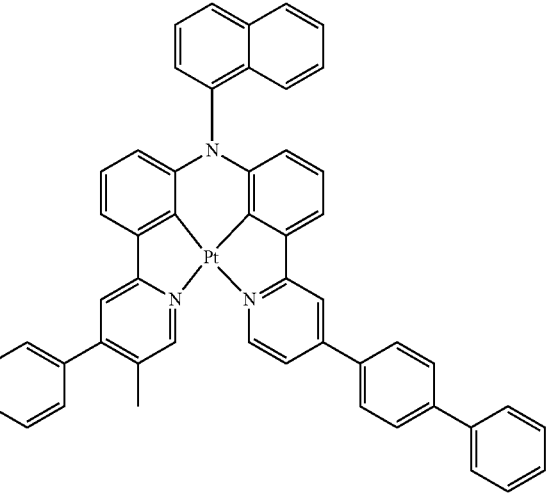
53
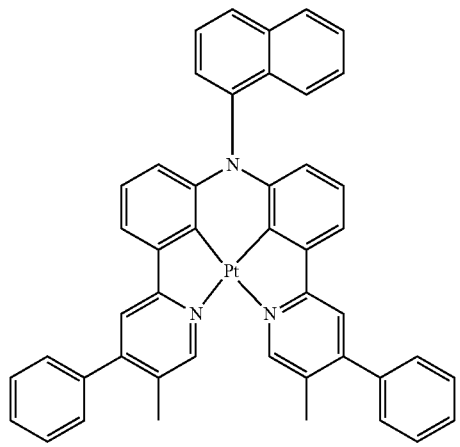
56
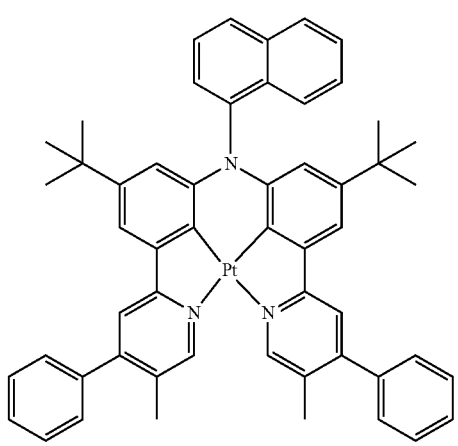

57
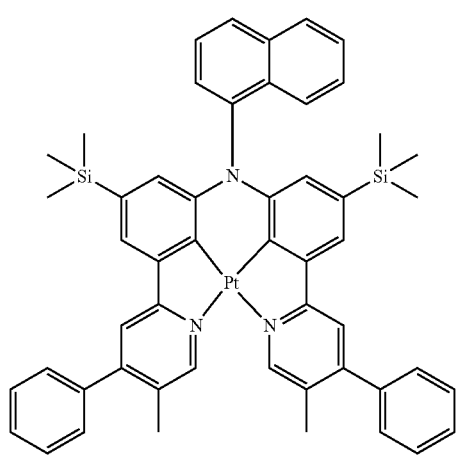
58
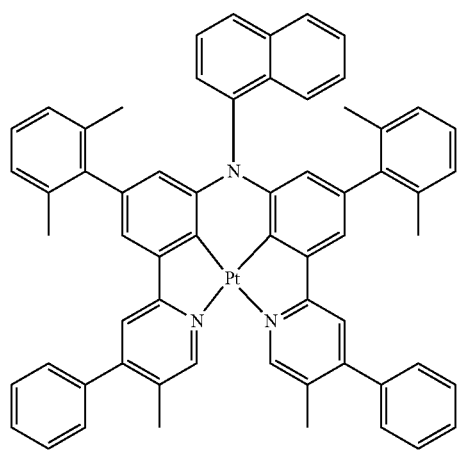
59
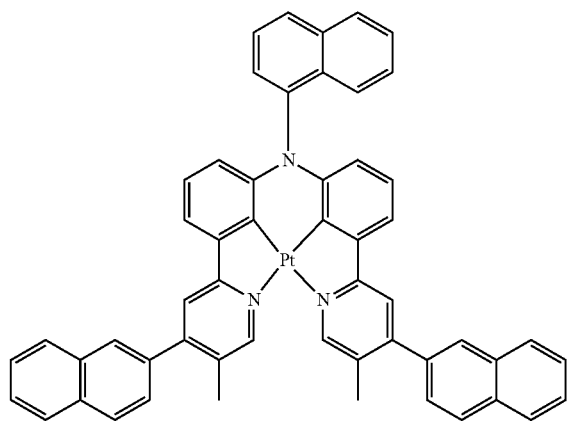
60
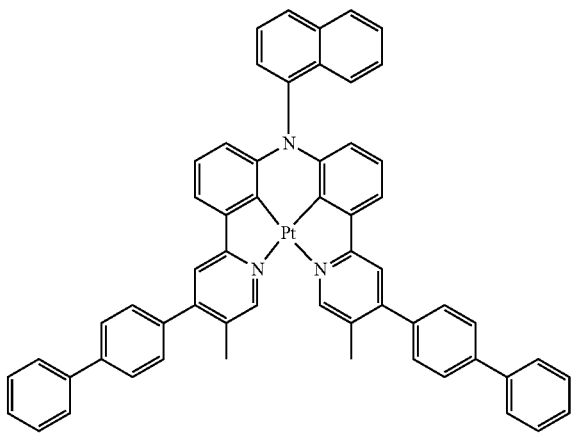
61
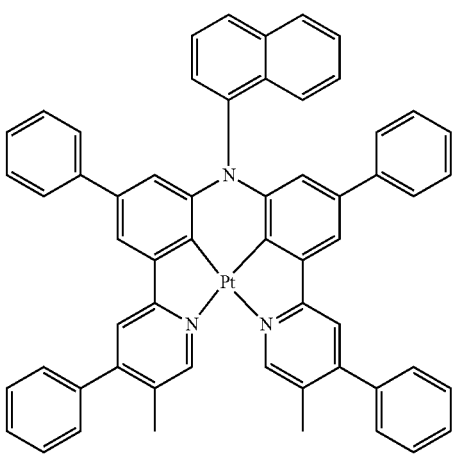
62
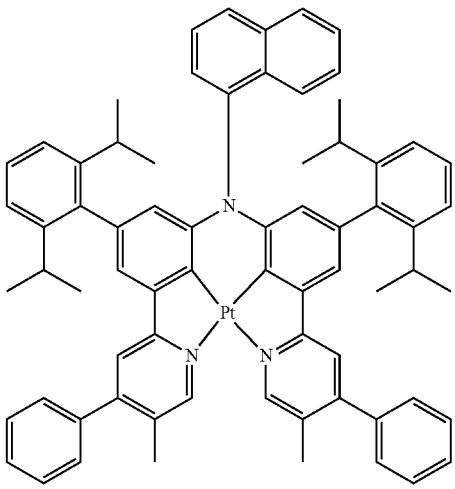

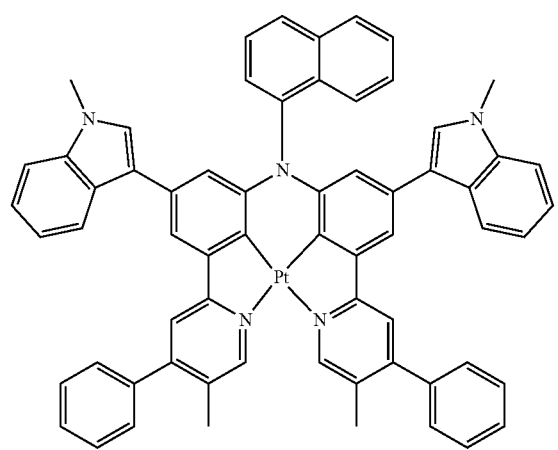
63
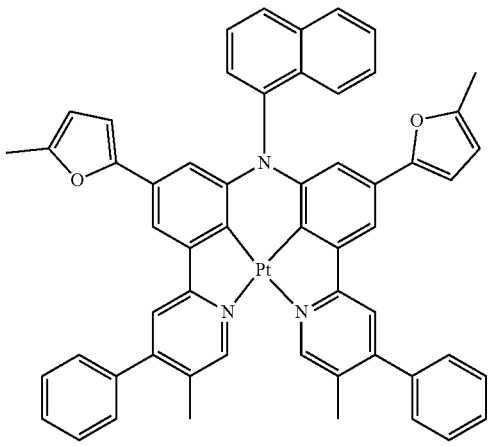
66
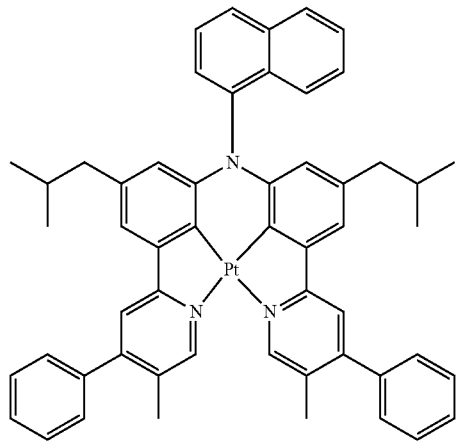
64
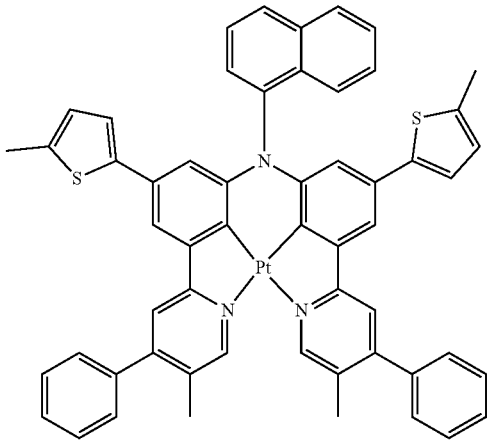
67
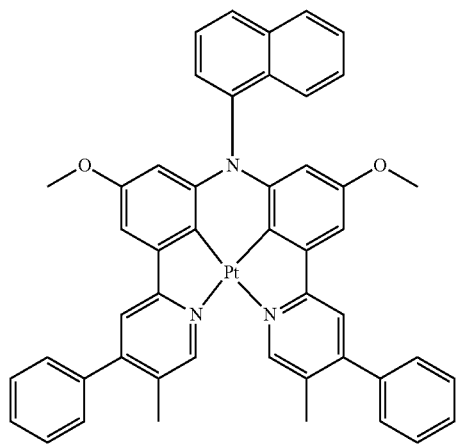
65
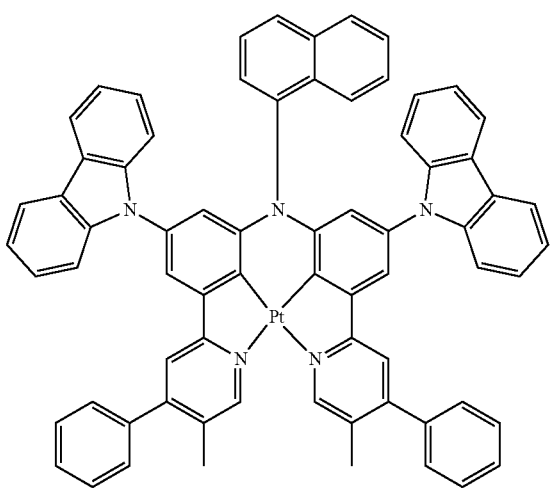
68

81
-continued
82
-continued
69
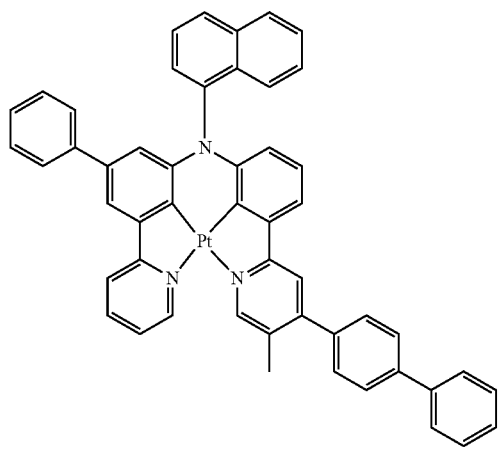
72
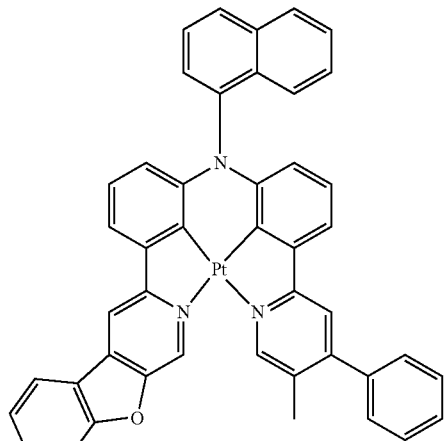
70
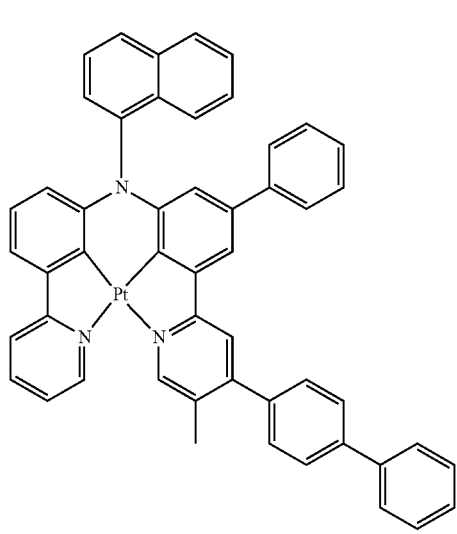
73
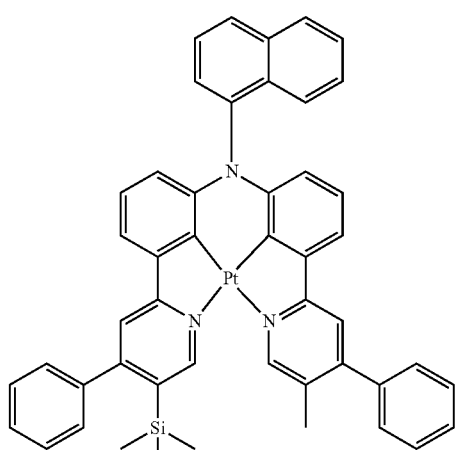
71
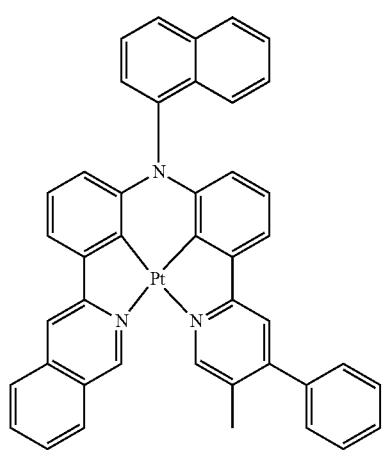
74
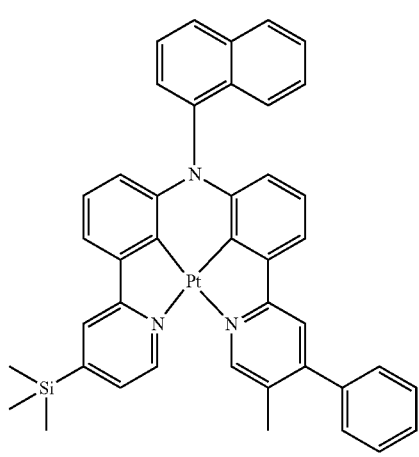

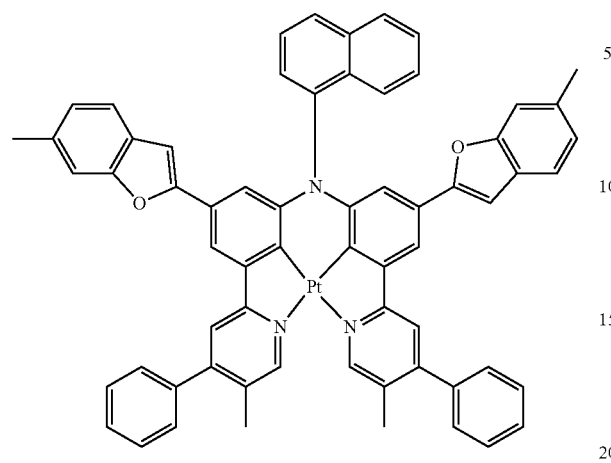
75
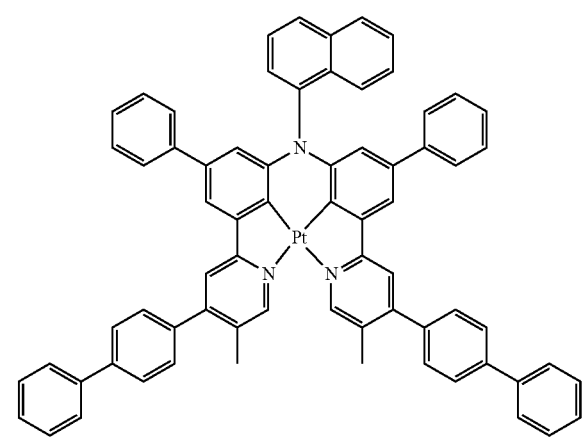
78
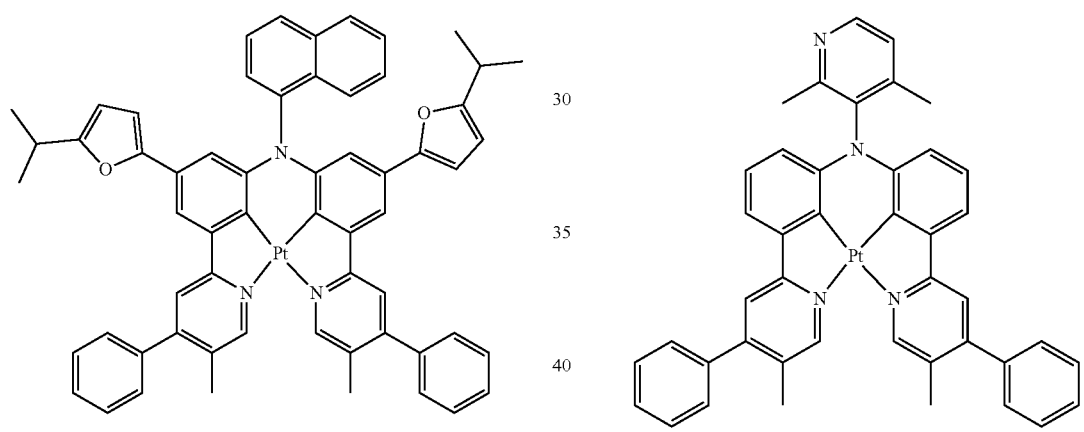
76
77
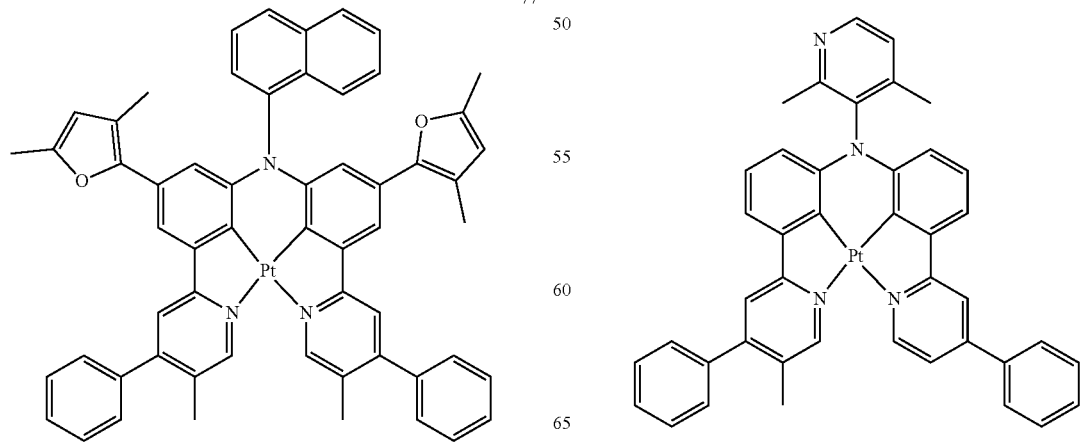
79
80

81
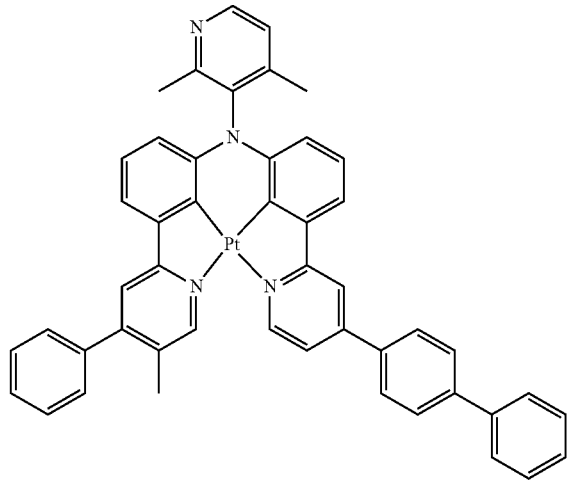
82
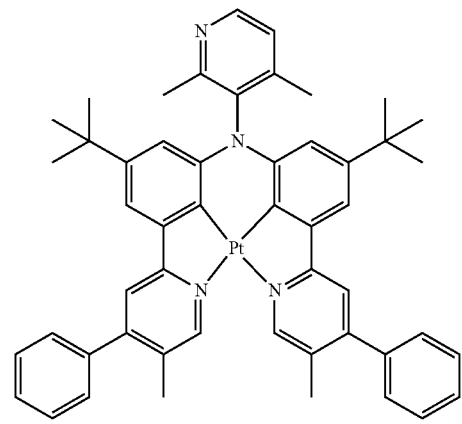
83
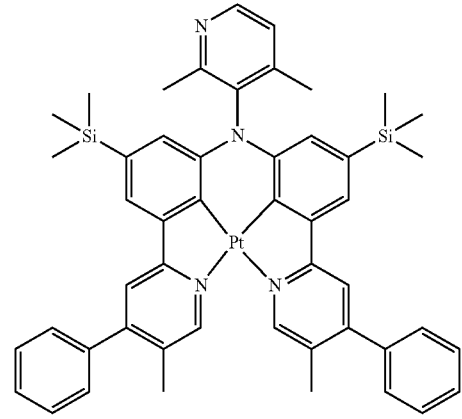
84
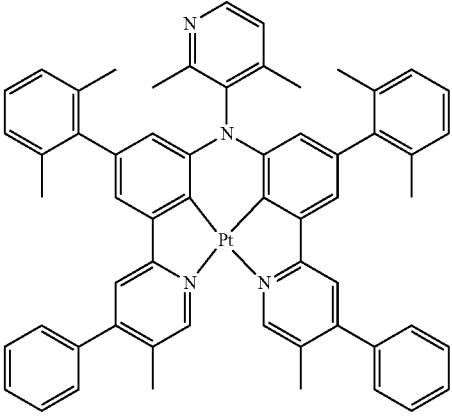
85
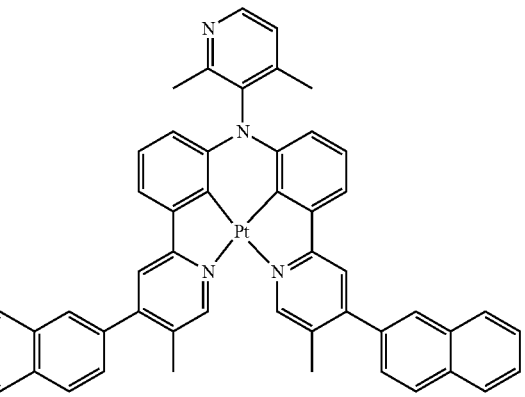
86
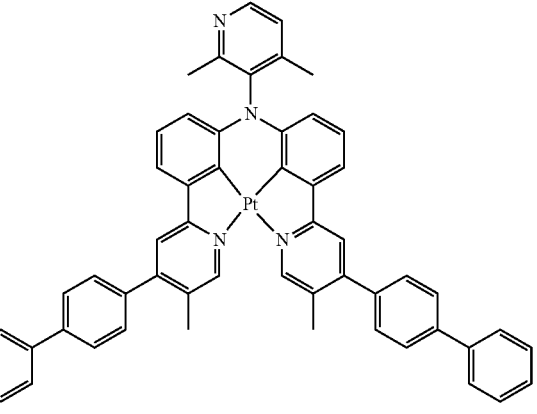

-continued
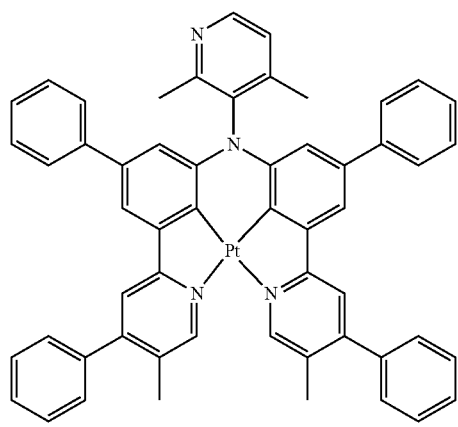
87
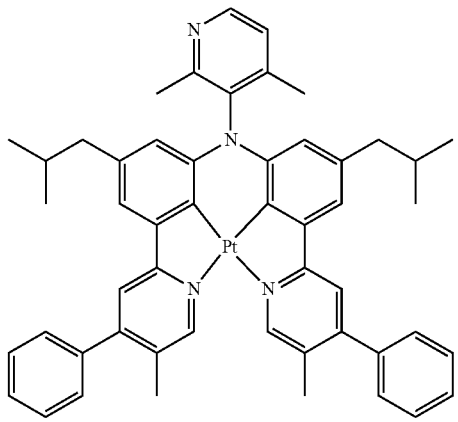
90
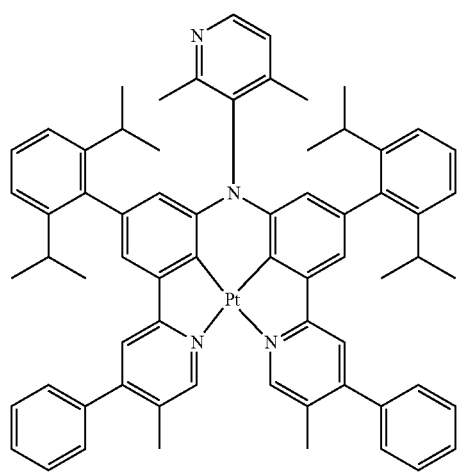
88
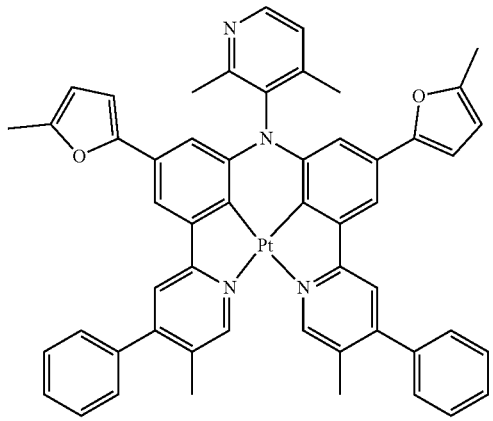
91
89
92

93
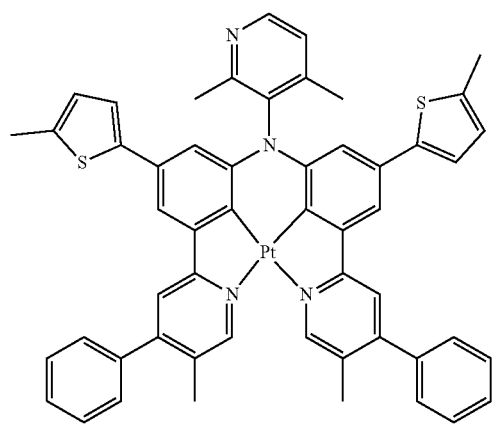
96
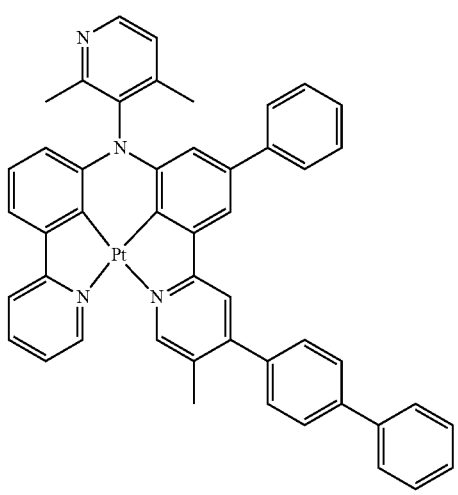
94
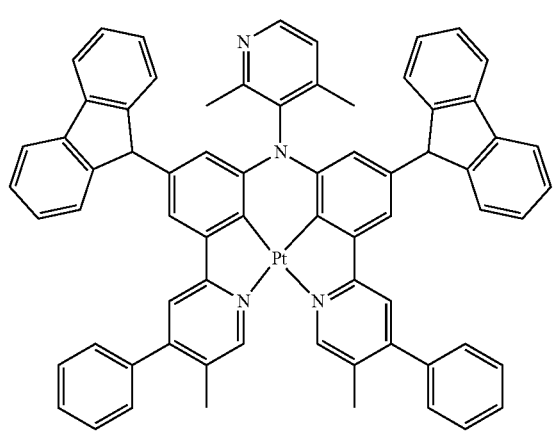
97
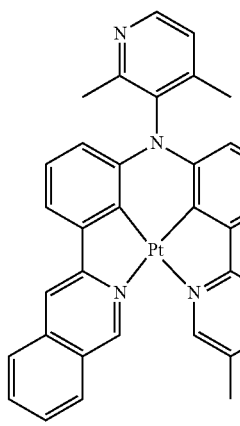
95
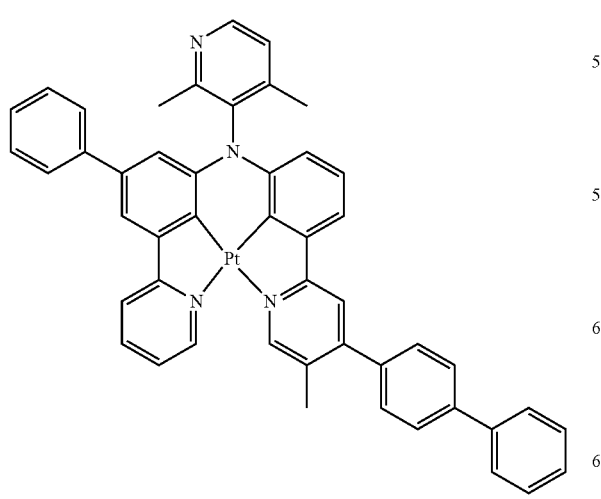
98
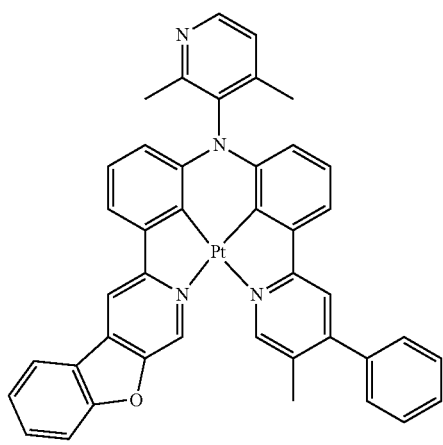

-continued
99
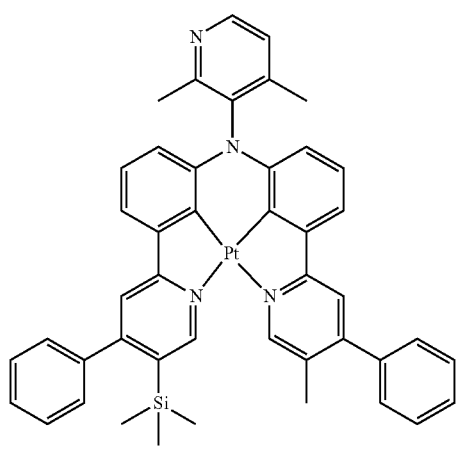
100
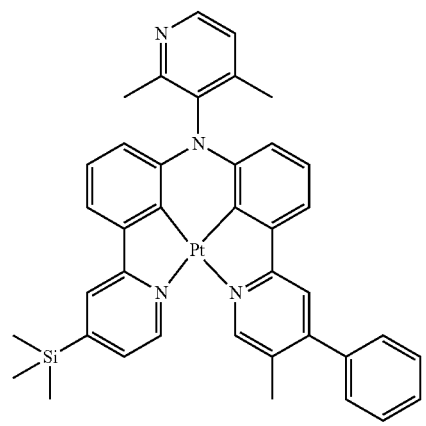
101
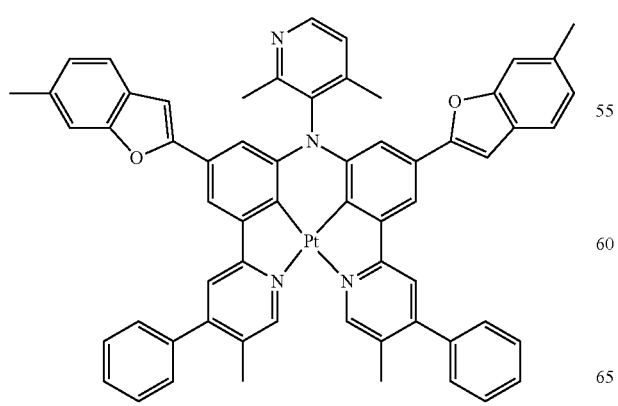
-continued
102
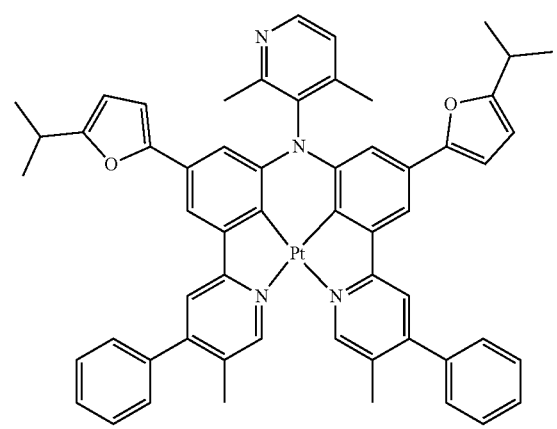
103
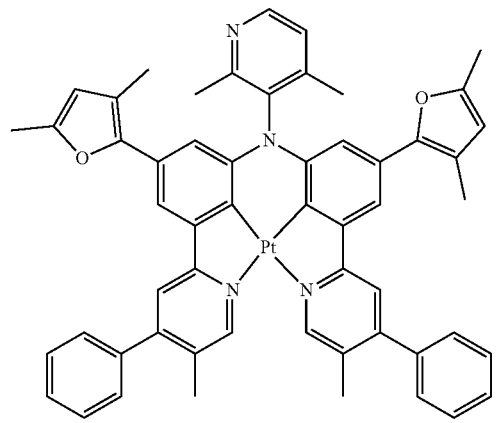
104
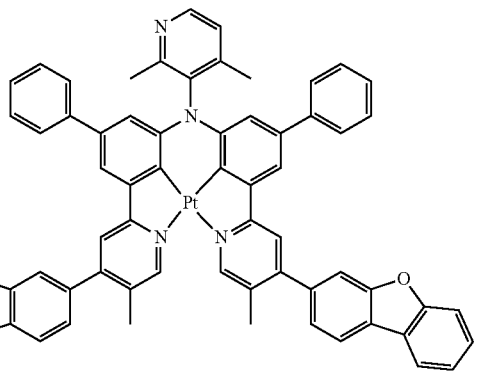

93
-continued
105
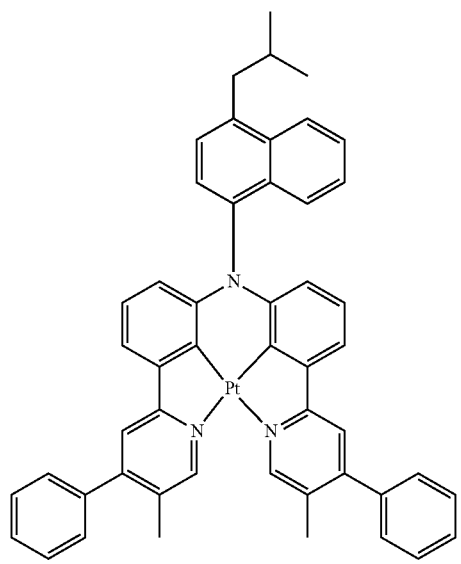
106
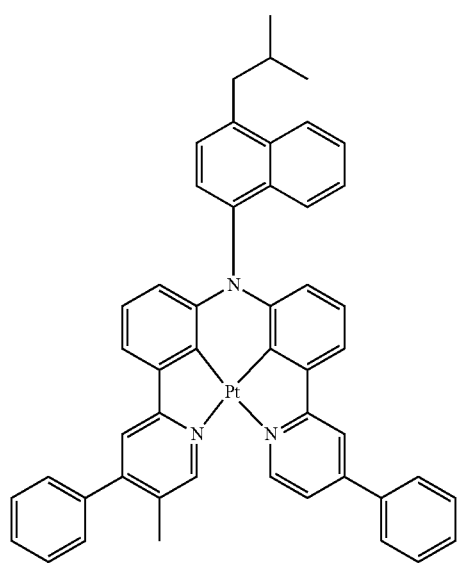
94
-continued
107
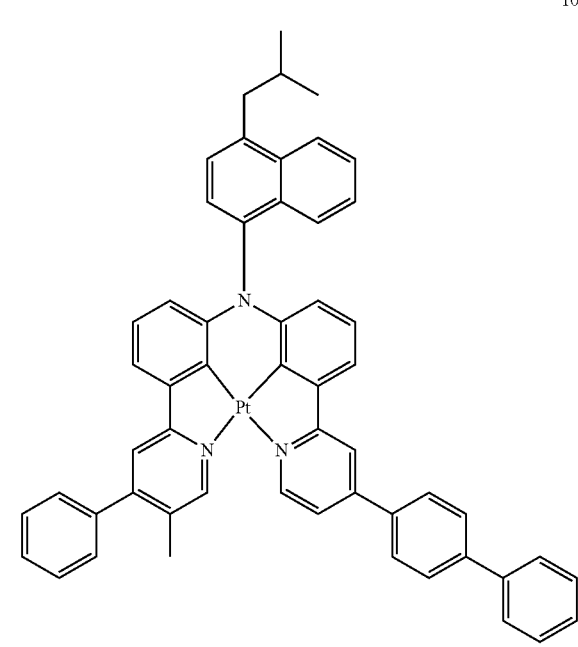
108
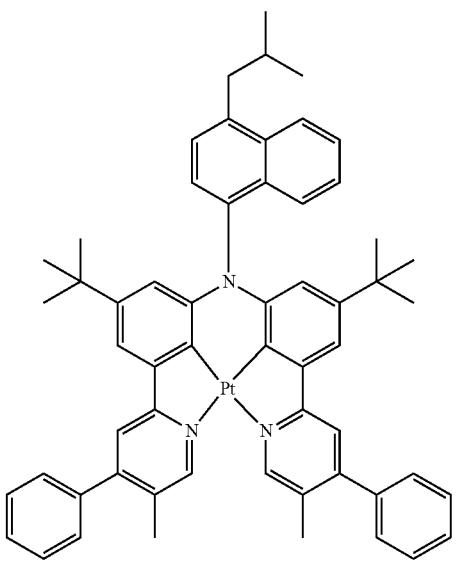

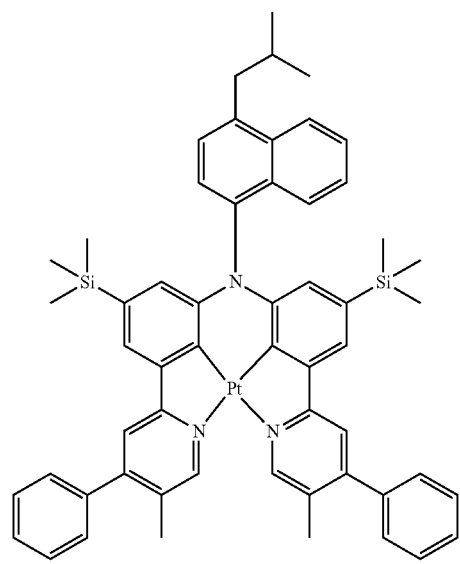
109
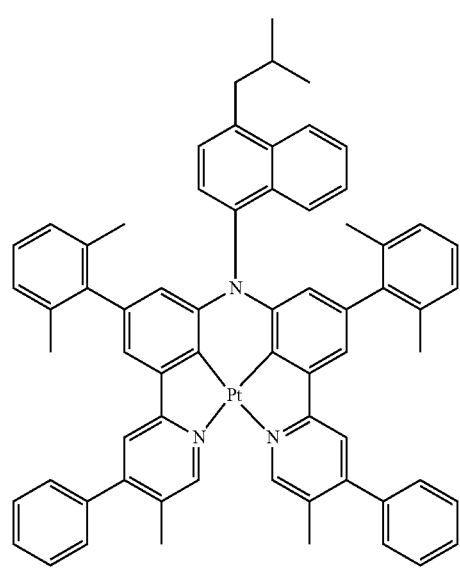
110
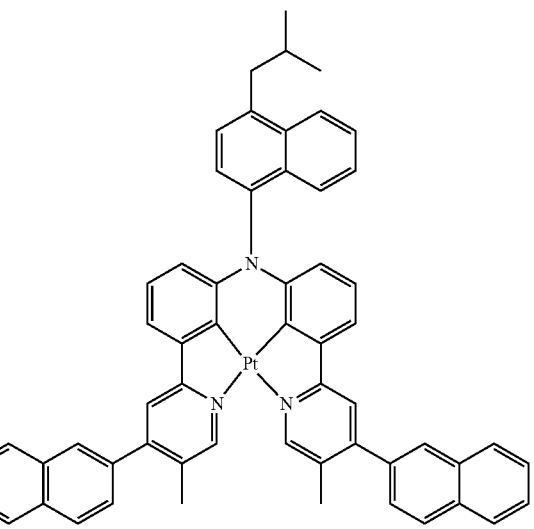
111
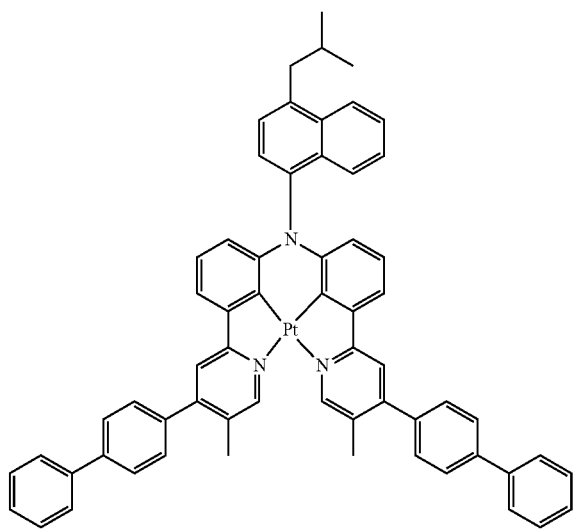
112
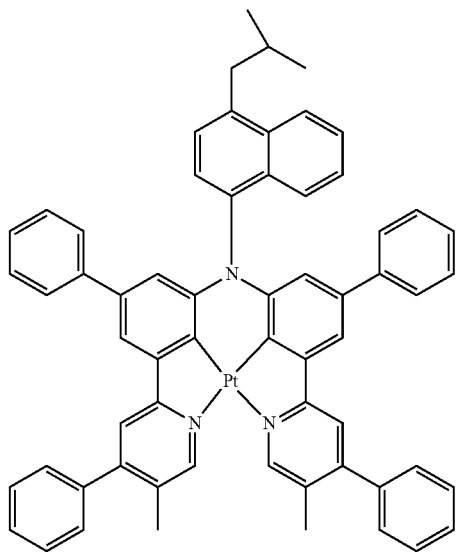
113

114
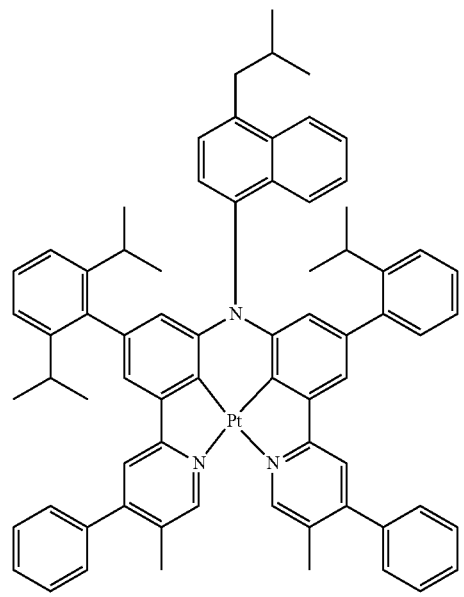
115
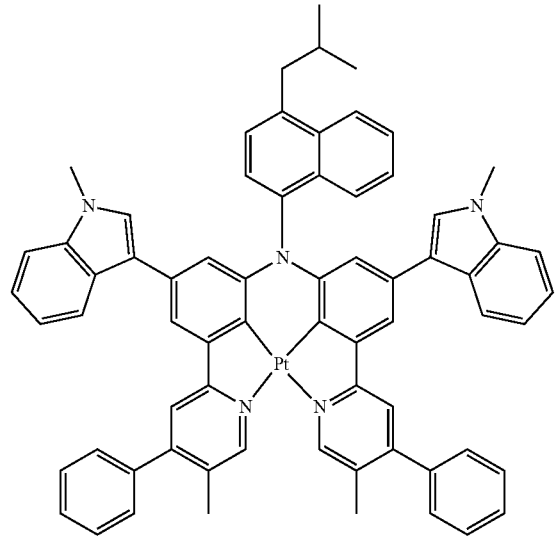
116
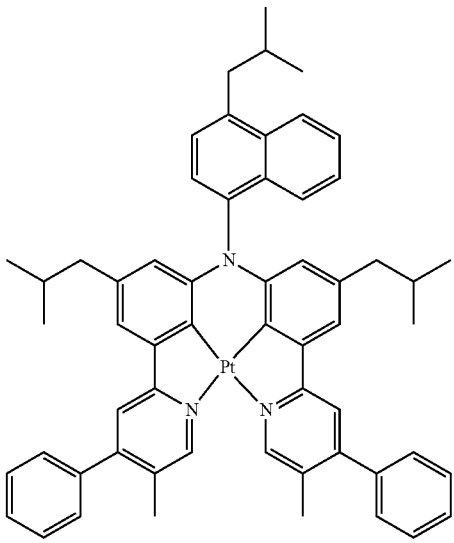
117
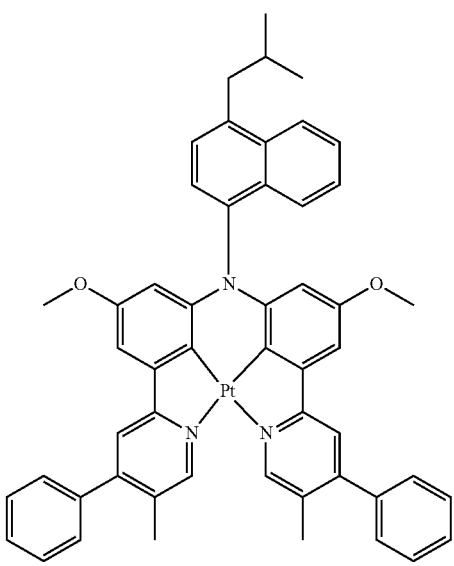

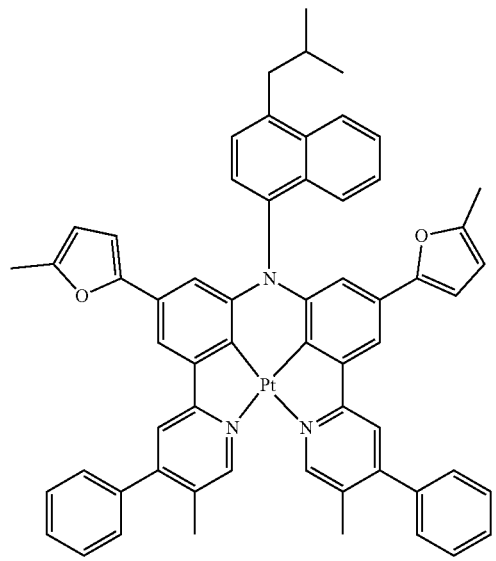
118
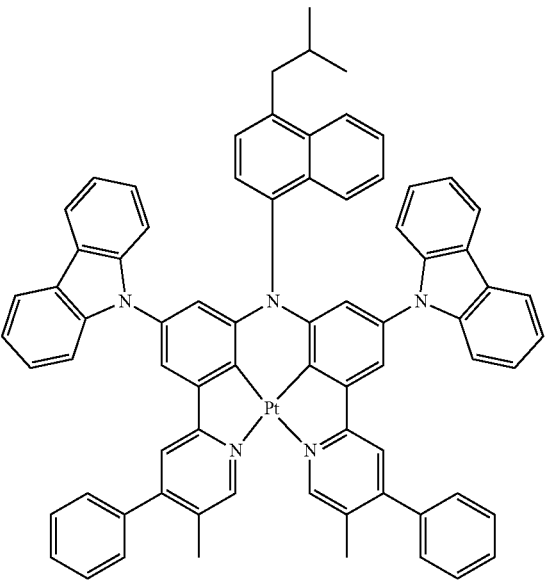
120
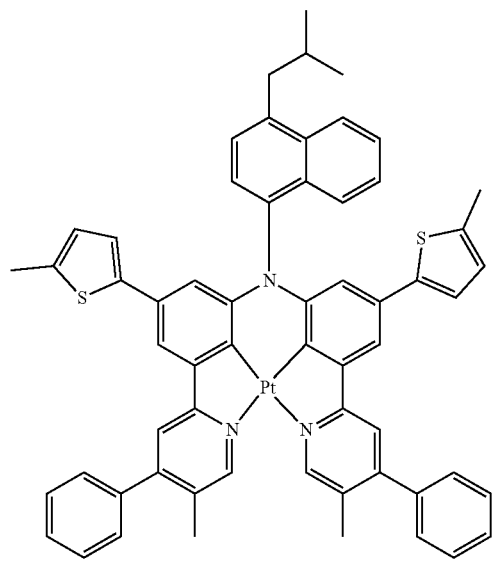
119
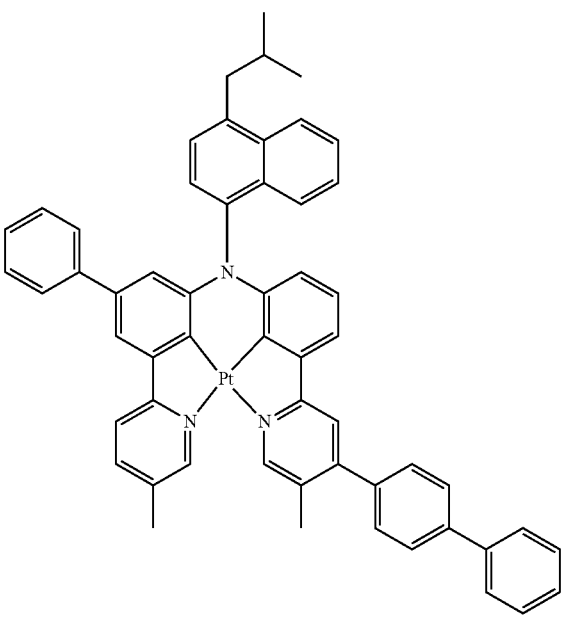
121

122
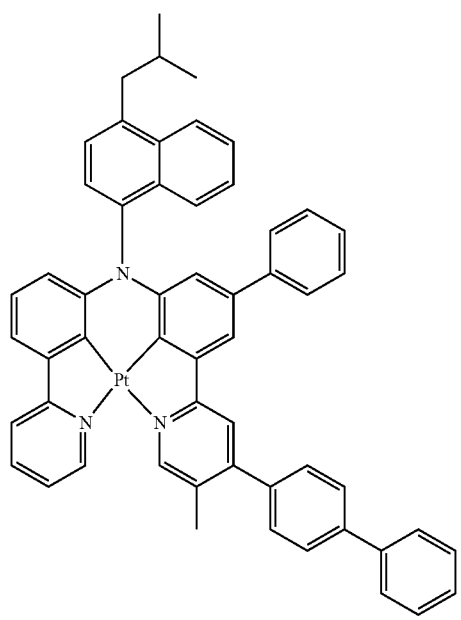
124
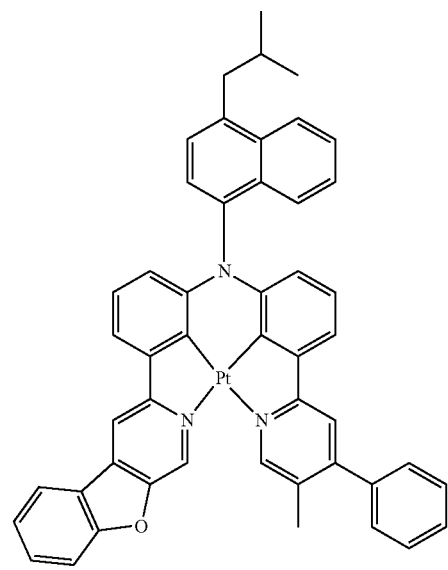
123
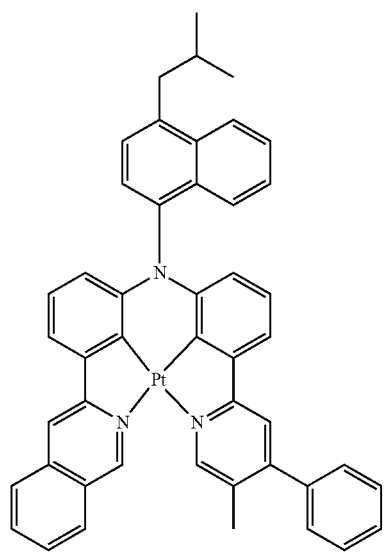
125
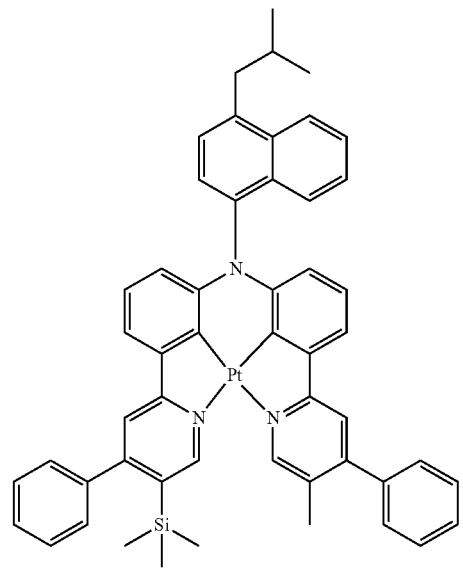

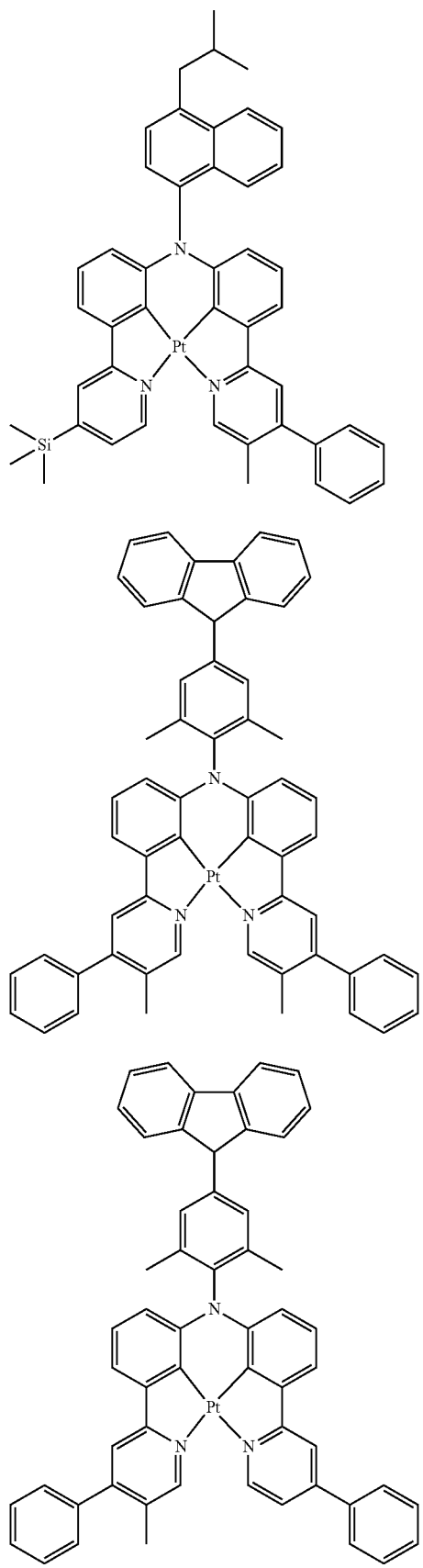
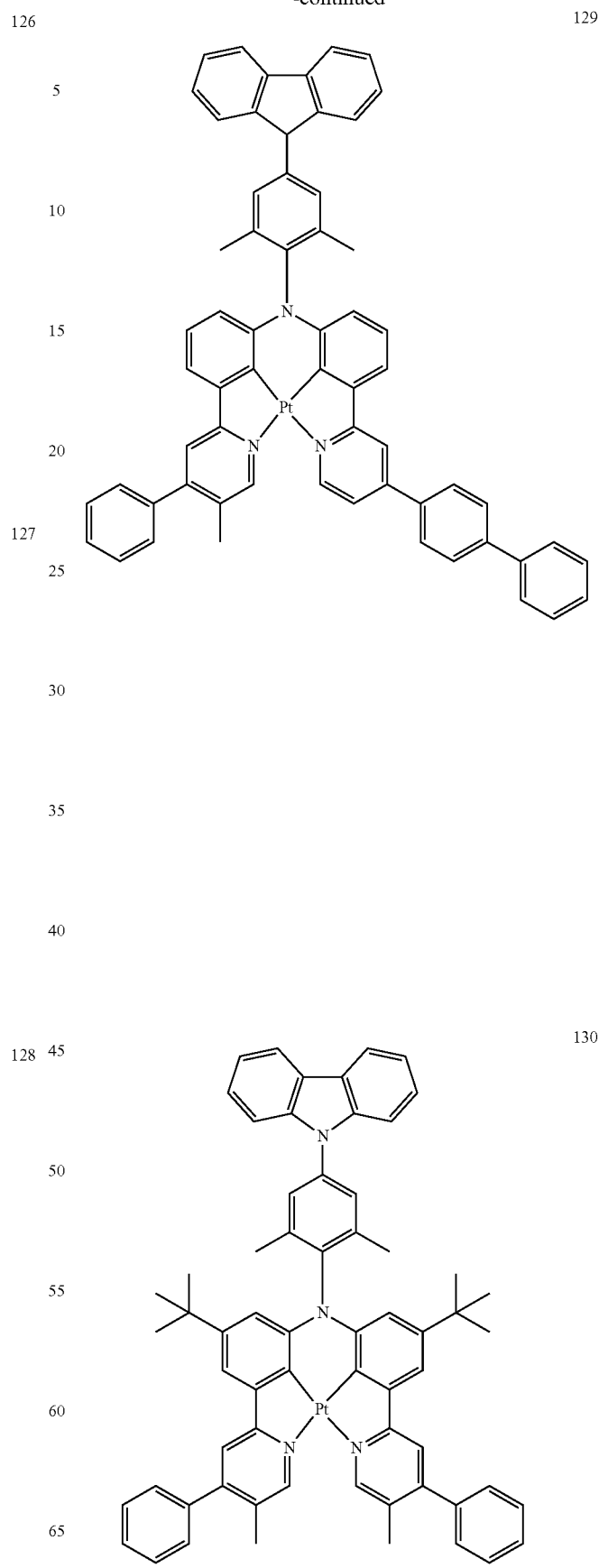

131
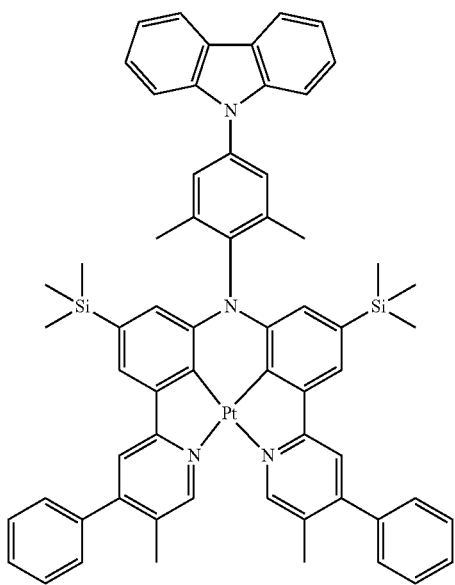
133
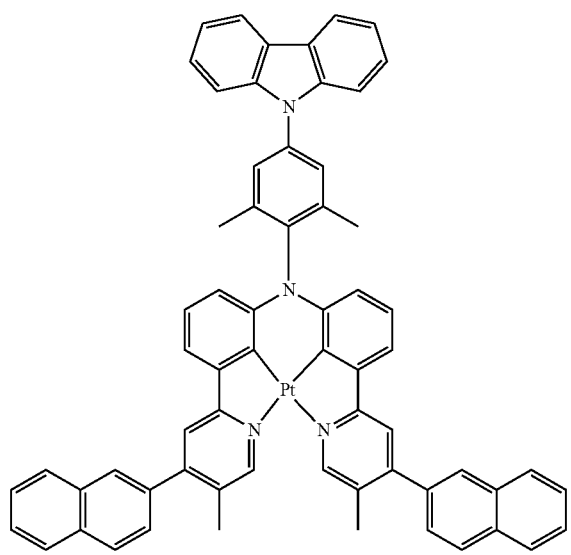
132
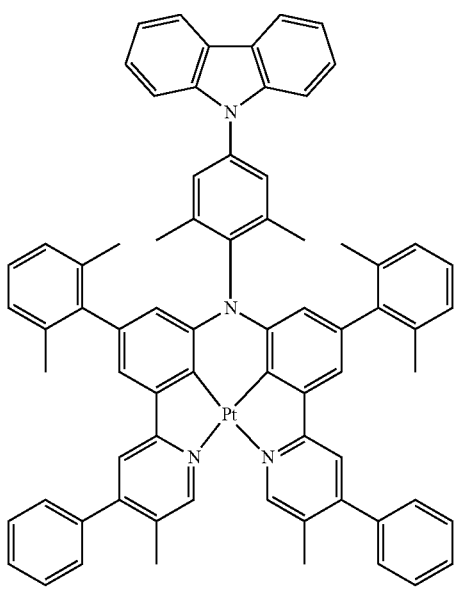
134
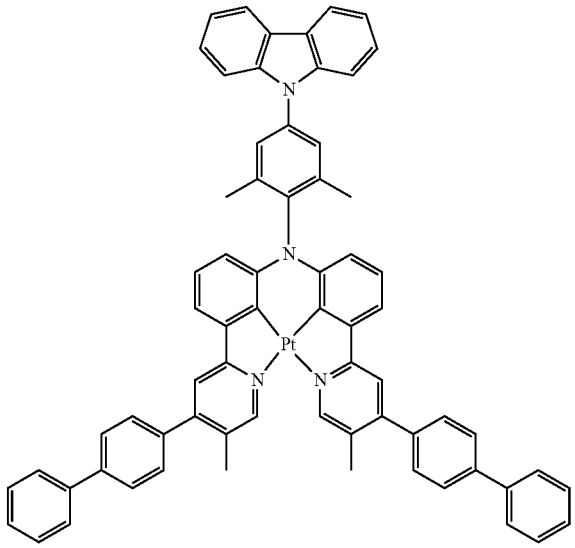

107
-continued
135
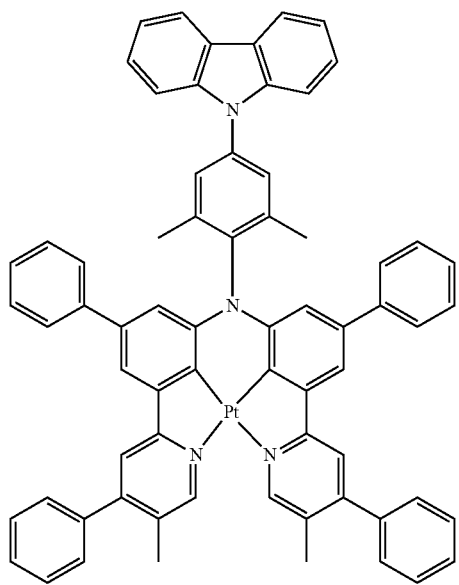
136
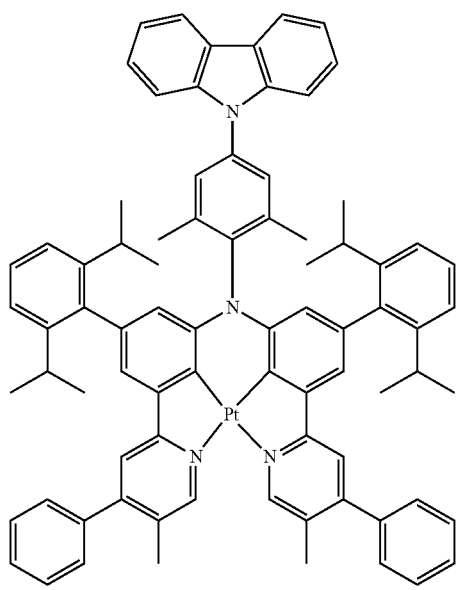
108
-continued
137
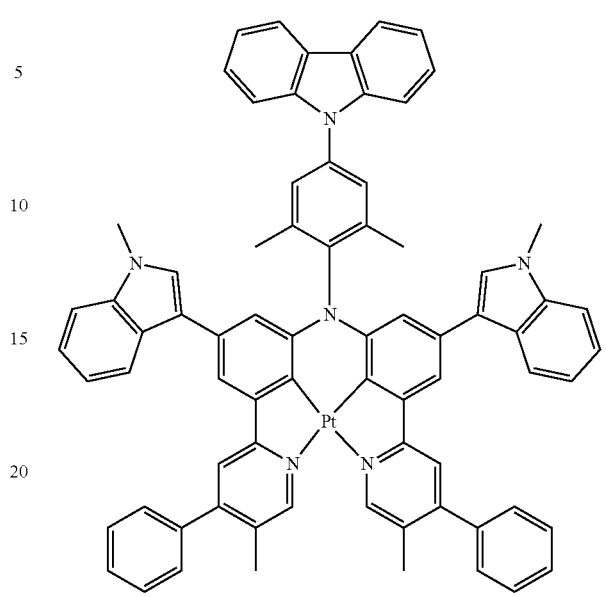
138
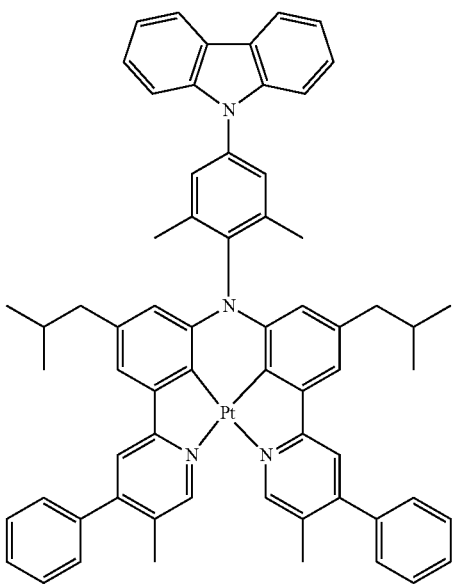

109
-continued
139
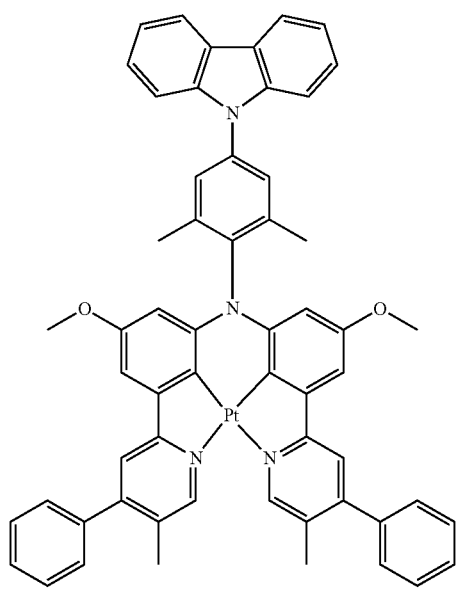
140
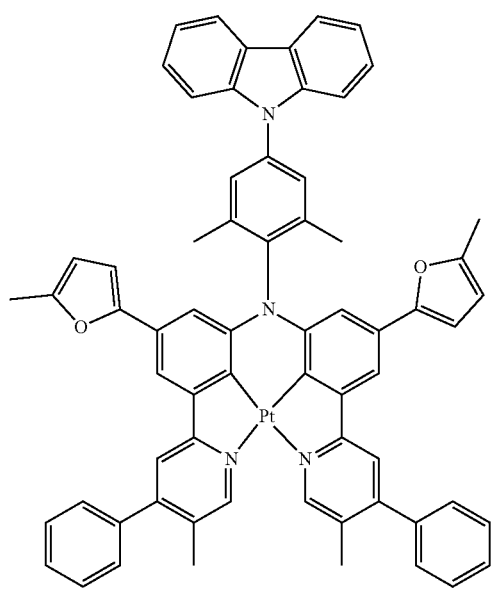
110
-continued
141
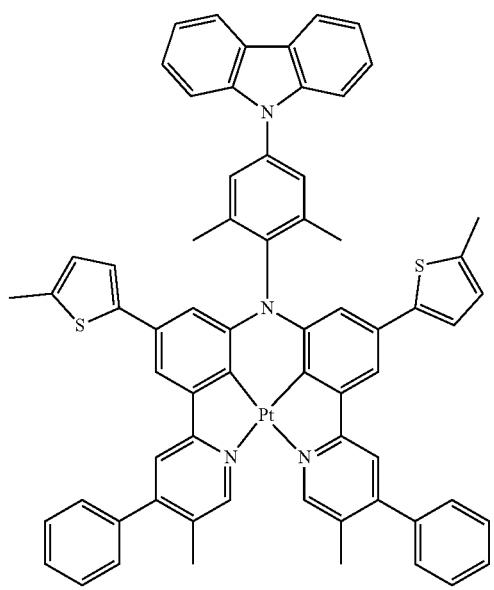
142
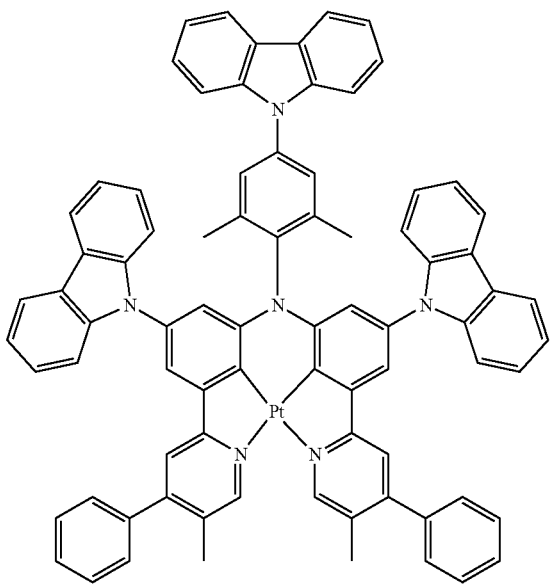

111     112
-continued     -continued
143
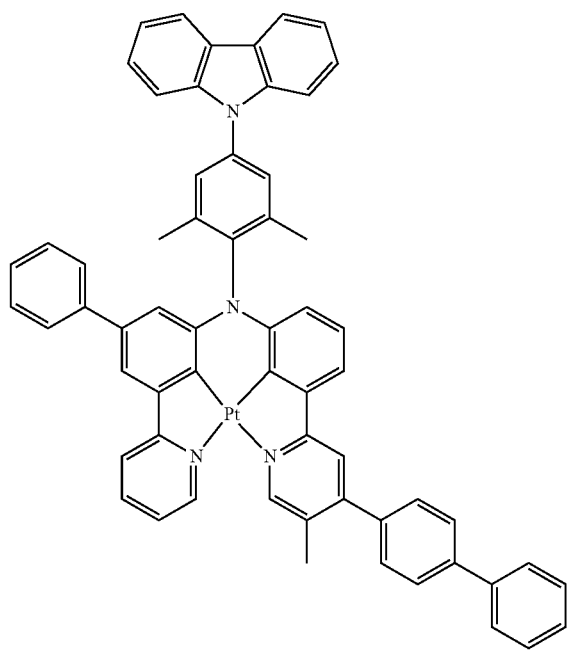
145
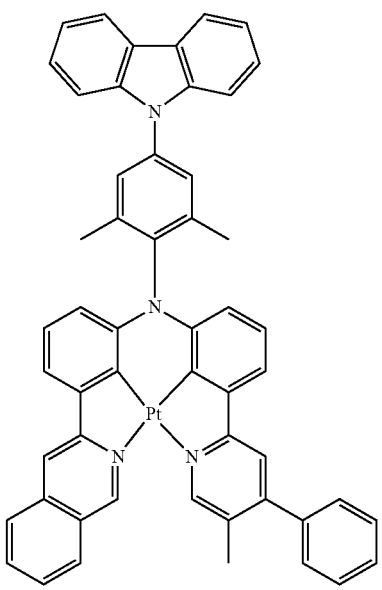
144
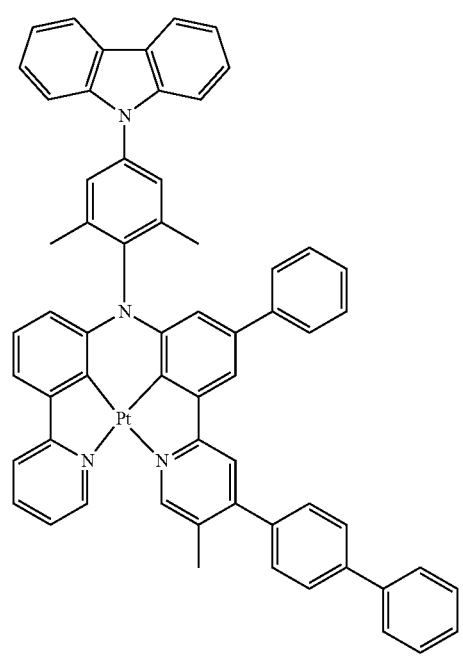
146
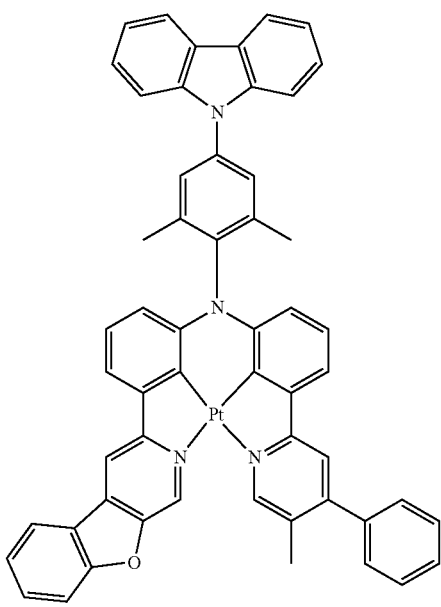

113
-continued
147
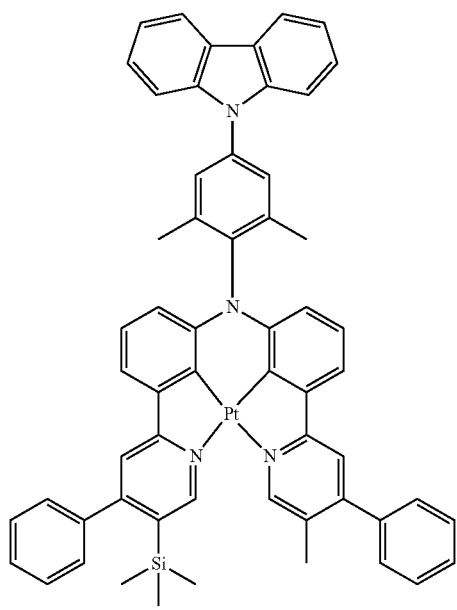
148
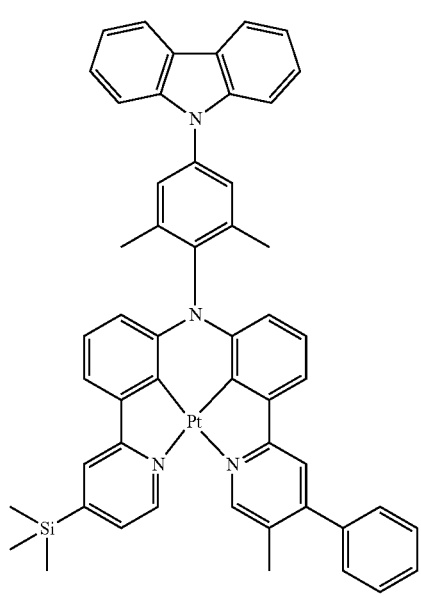
114
-continued
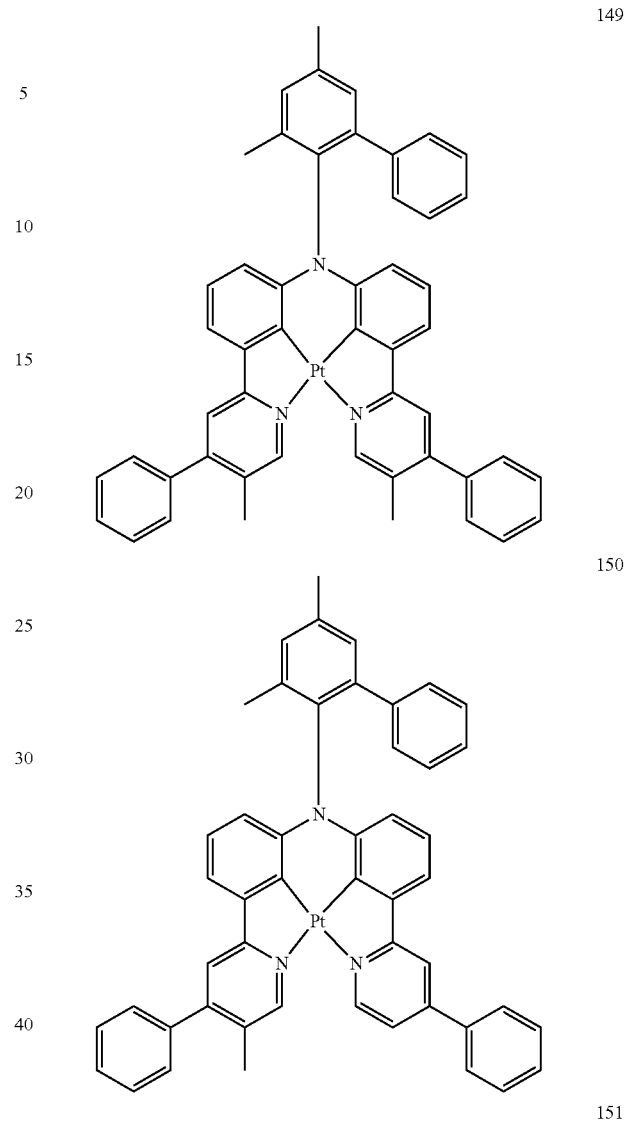
149
150
151

152
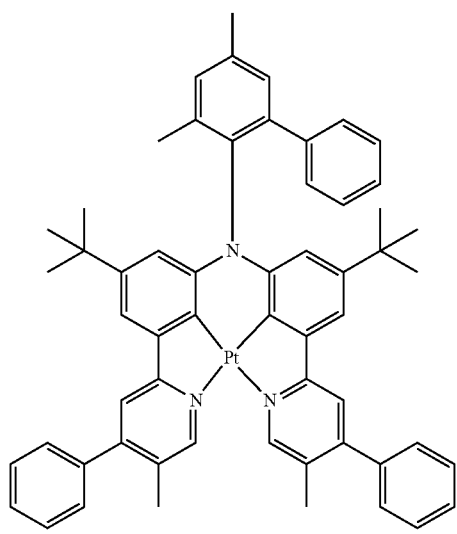
153
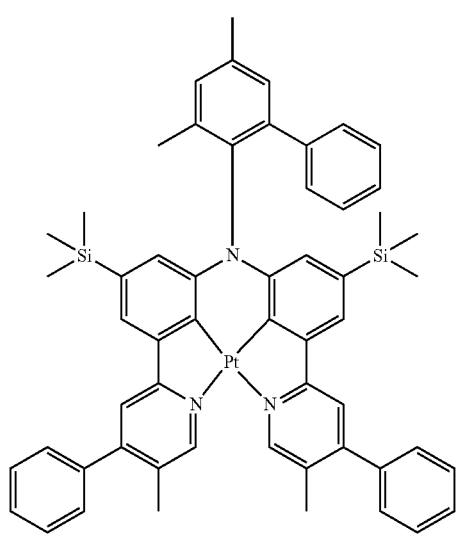
154
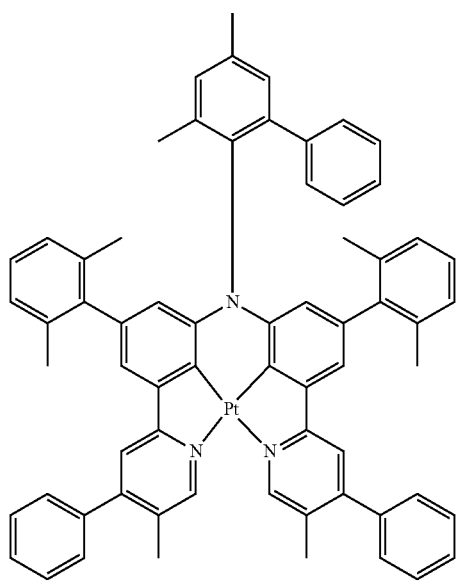
155
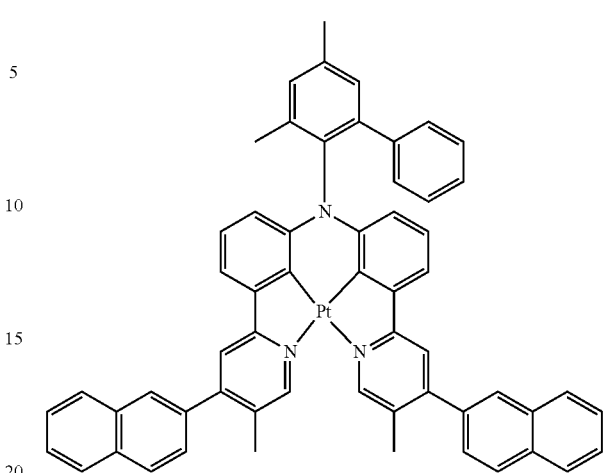
156
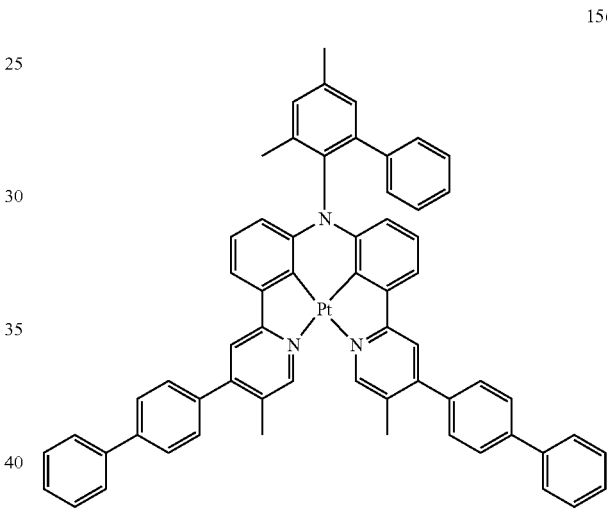
157
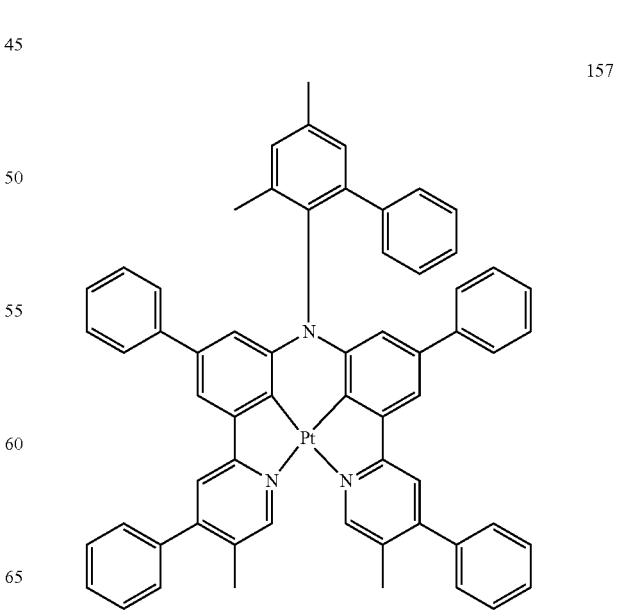

117
-continued
158
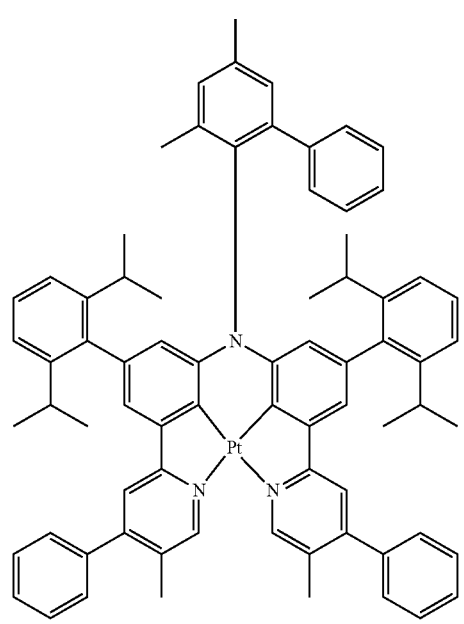
159
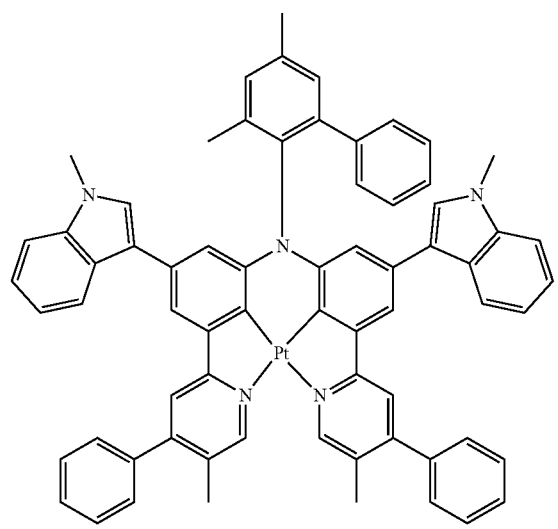
160
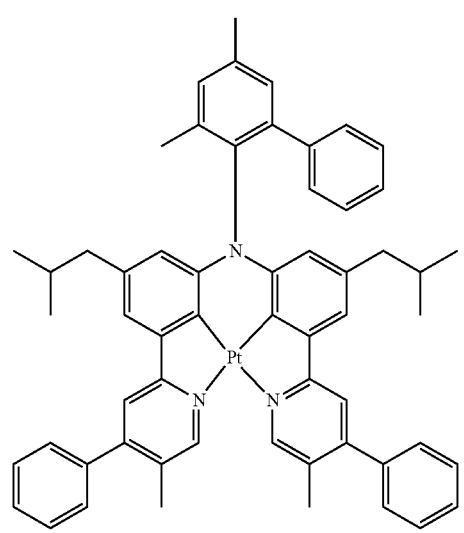
118
-continued
161
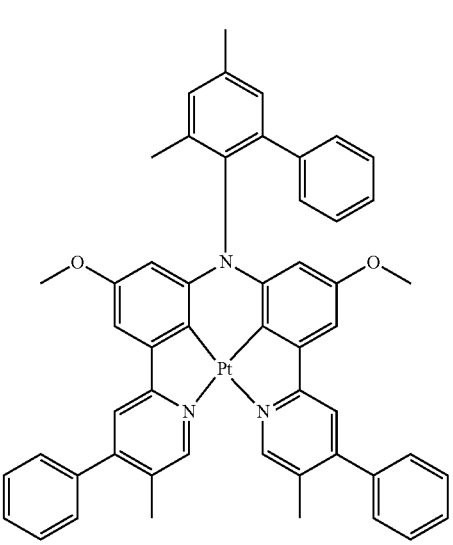
162
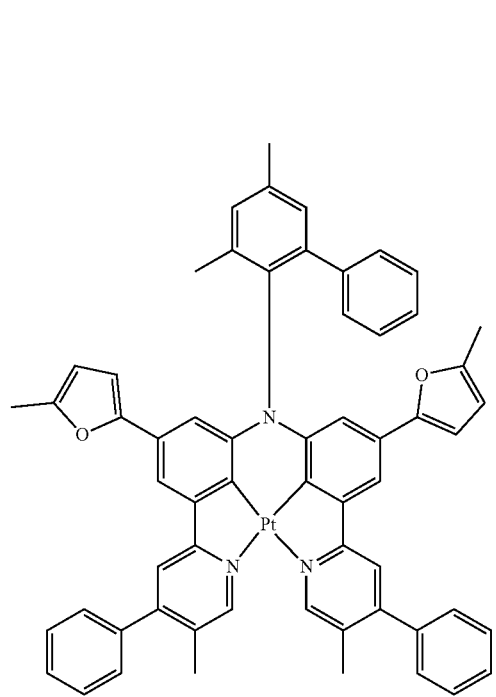

163
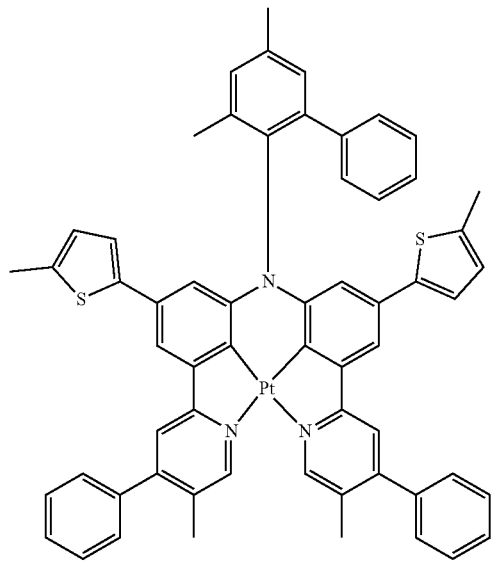
164
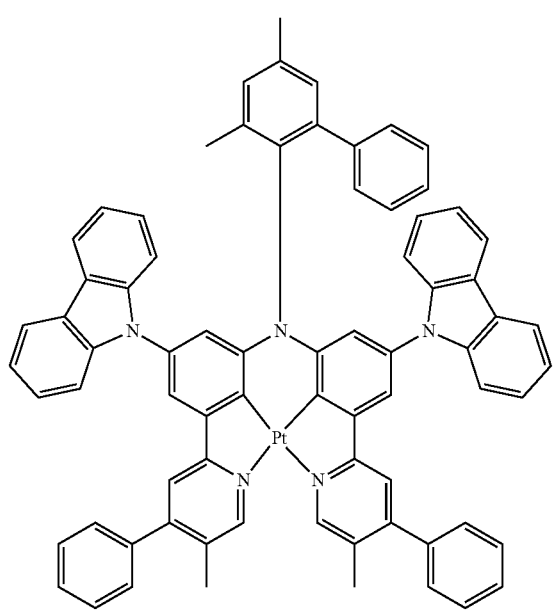
165
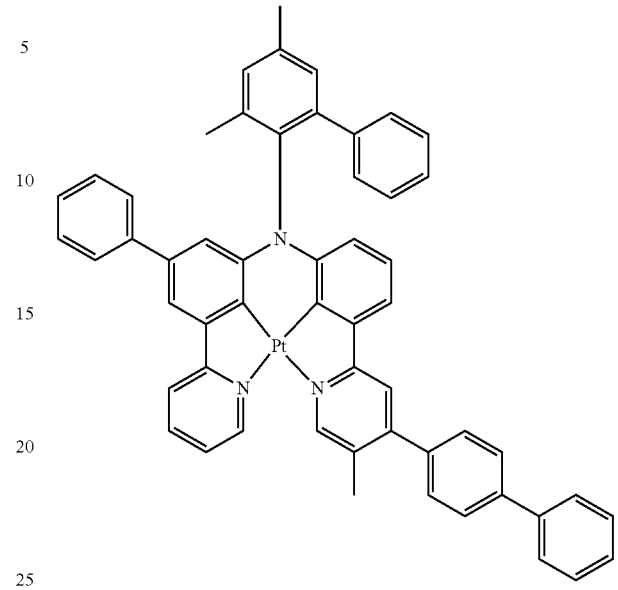
166
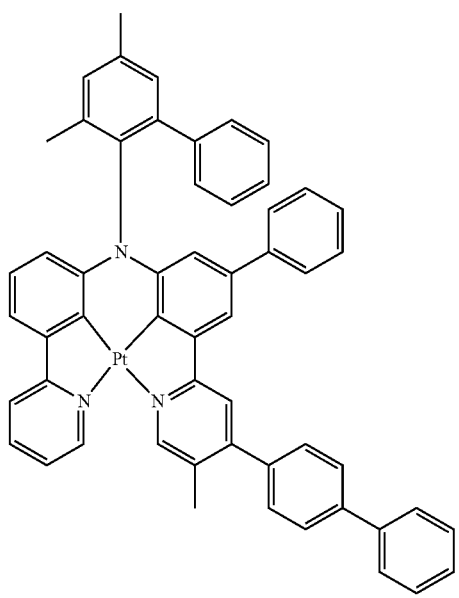

167 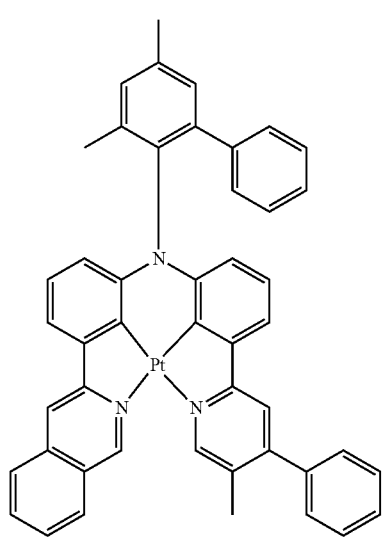
168 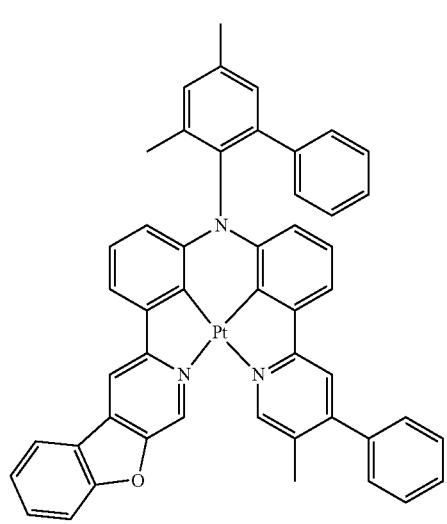
169 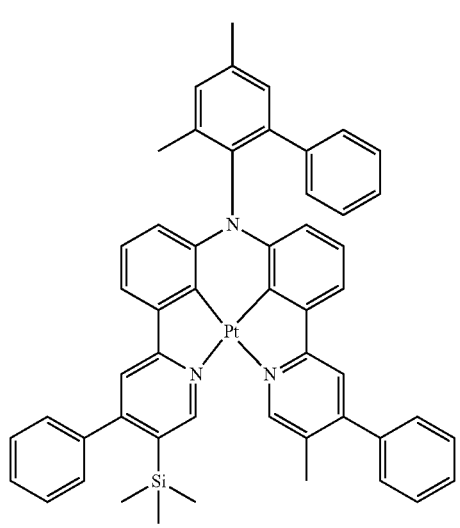
170 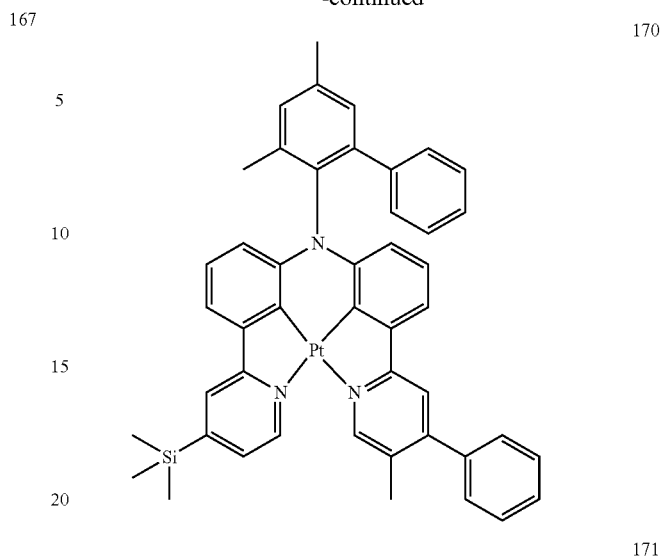
171 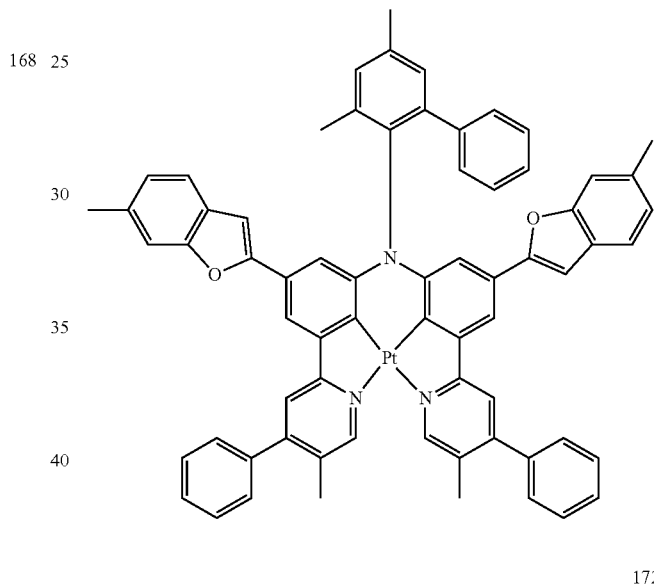
172 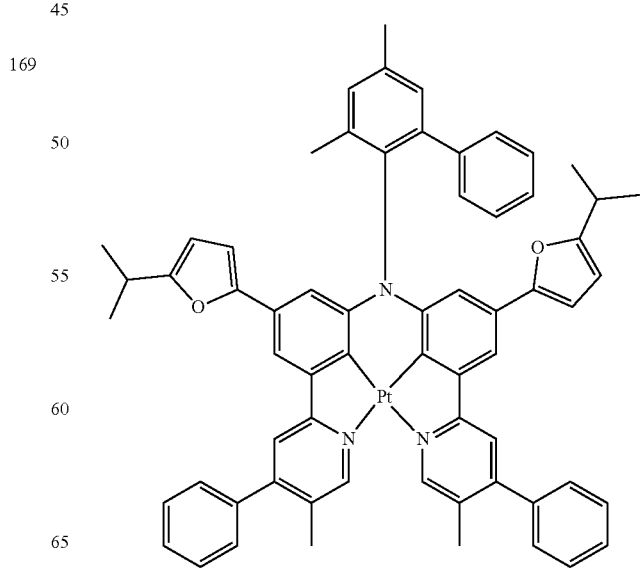

123
-continued
173
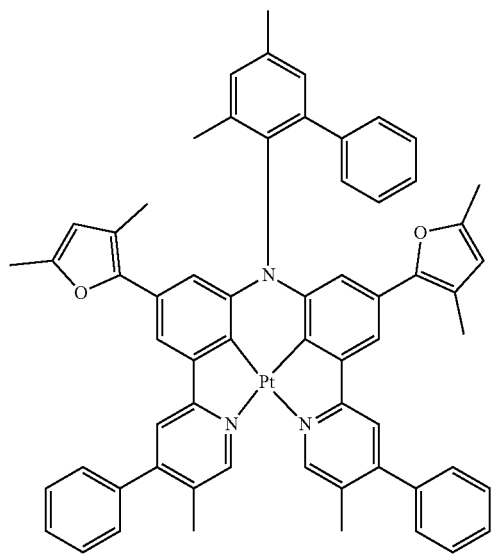
174
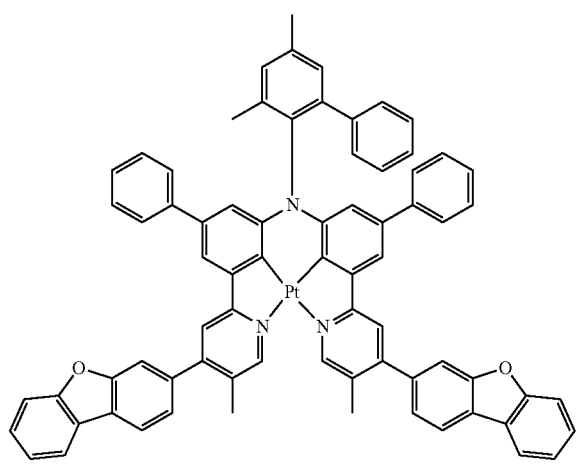
175
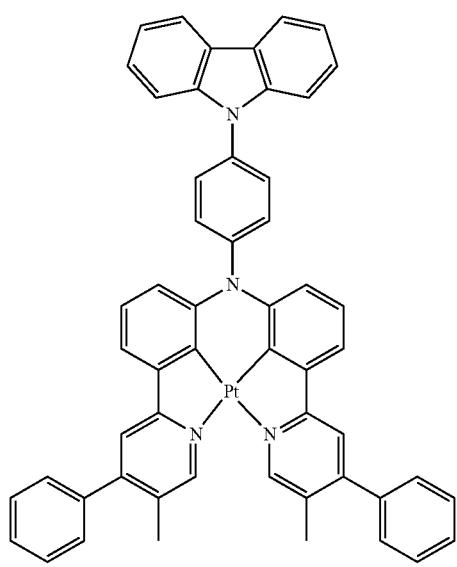
124
-continued
176
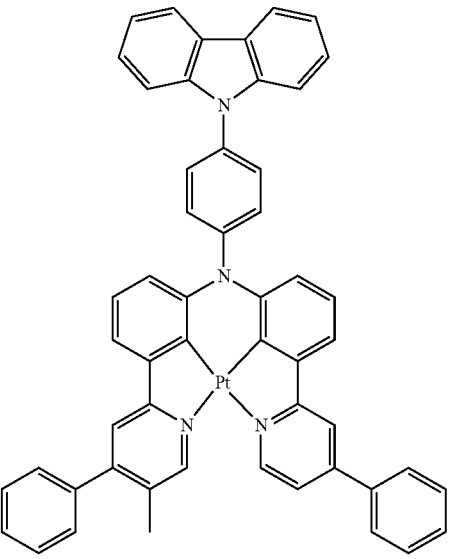
177
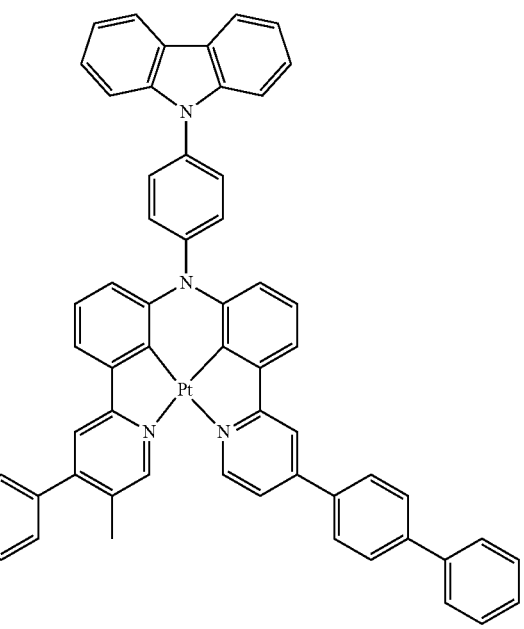

125
-continued
178
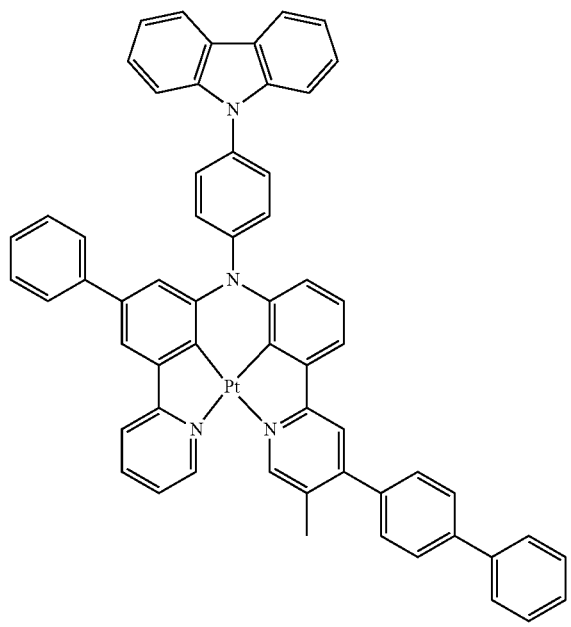
179
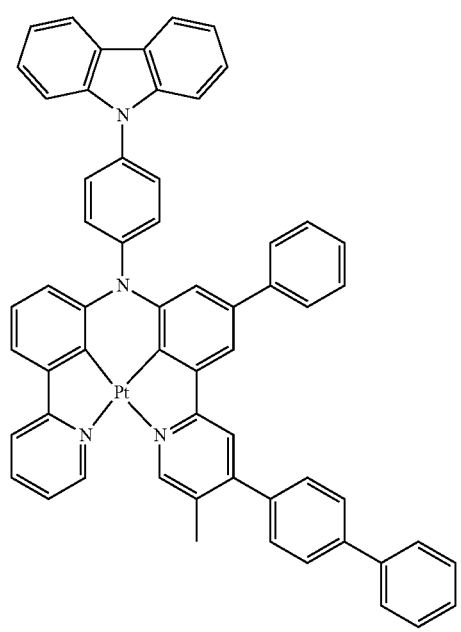
126
-continued
180
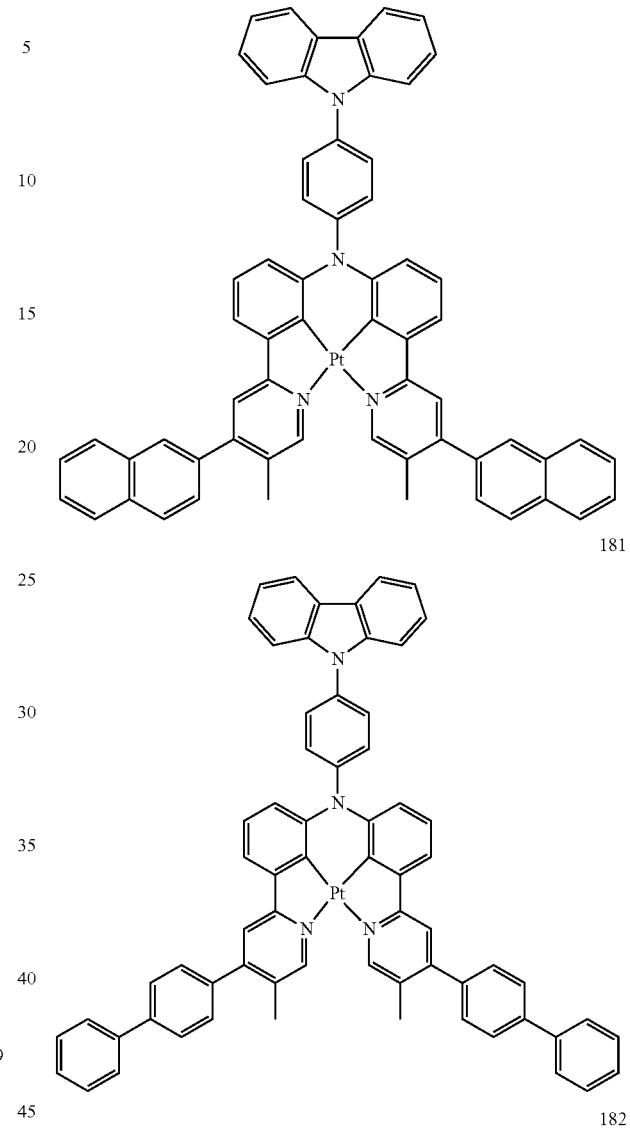
181
182
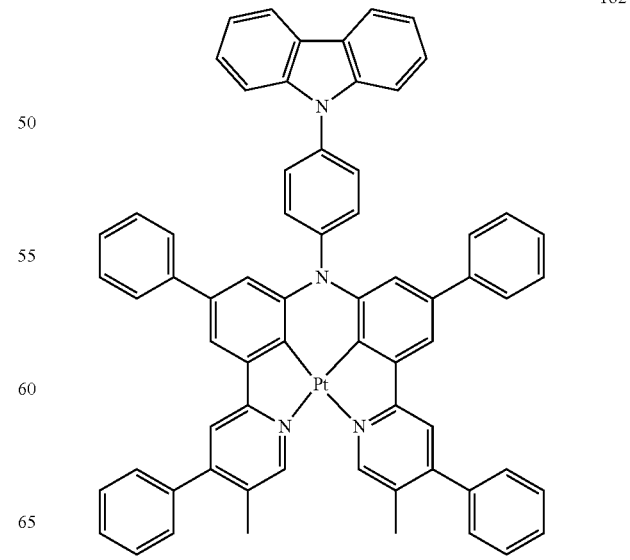

127
-continued
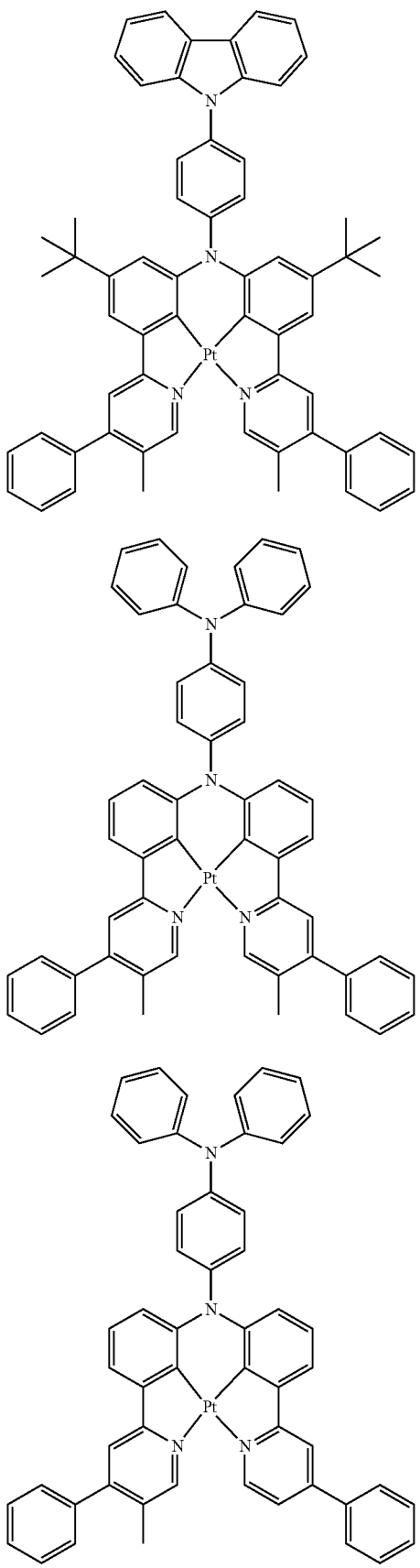
183
184
185
128
-continued
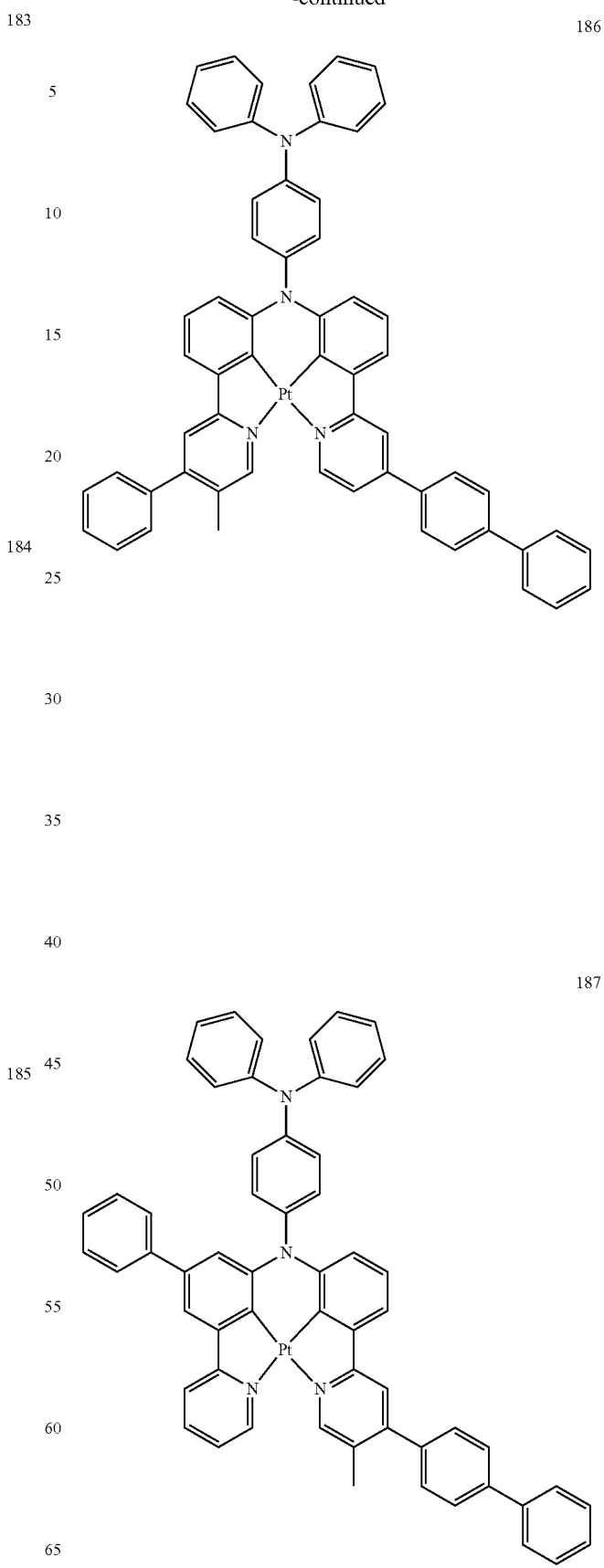
186
187

129
-continued
188
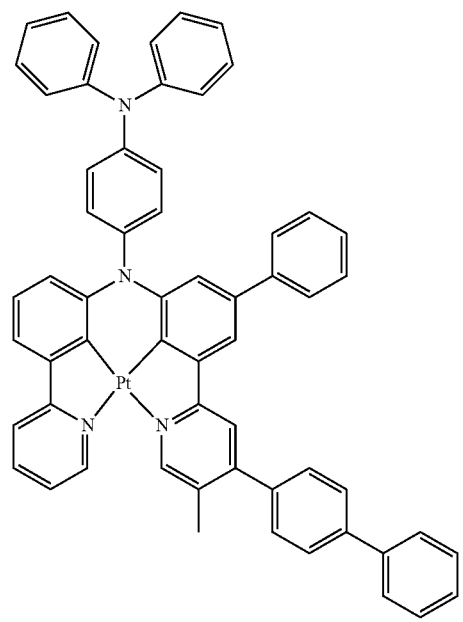
189
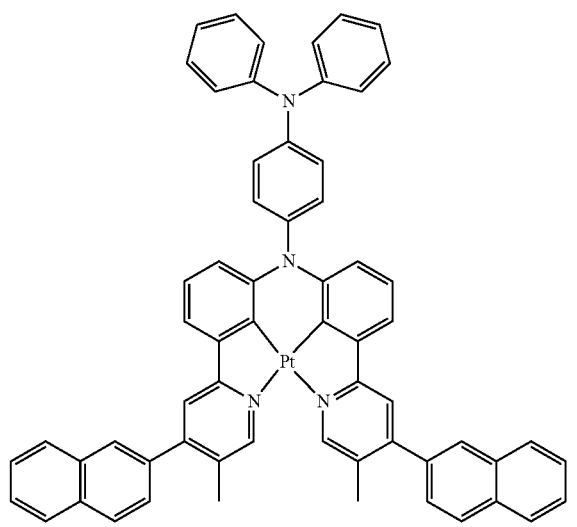
130
-continued
190
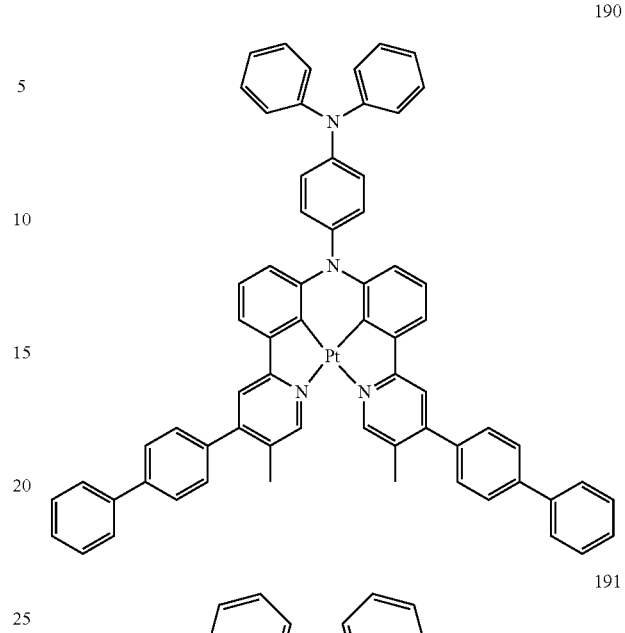
191
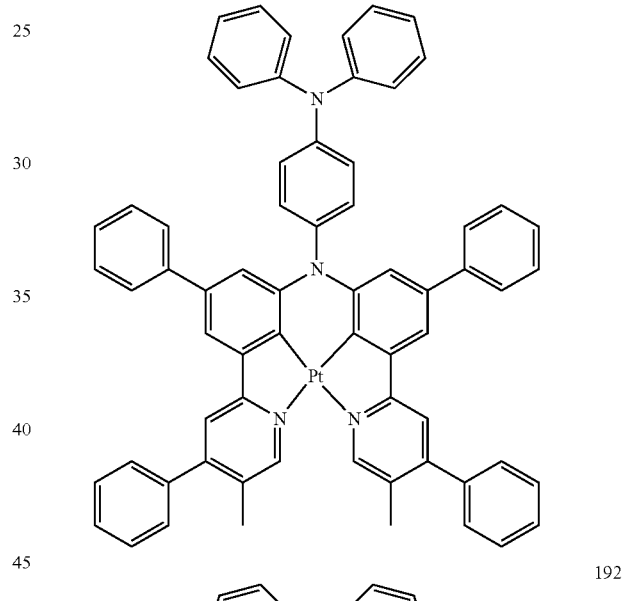
192
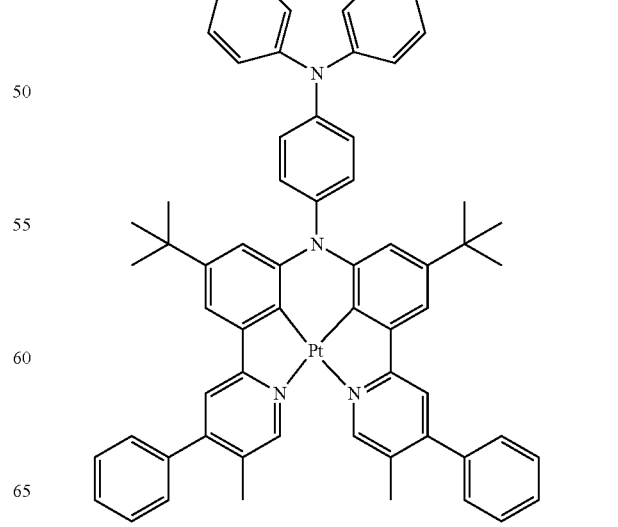

193
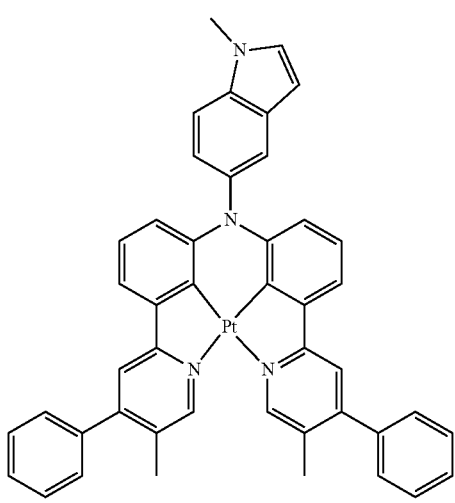
194
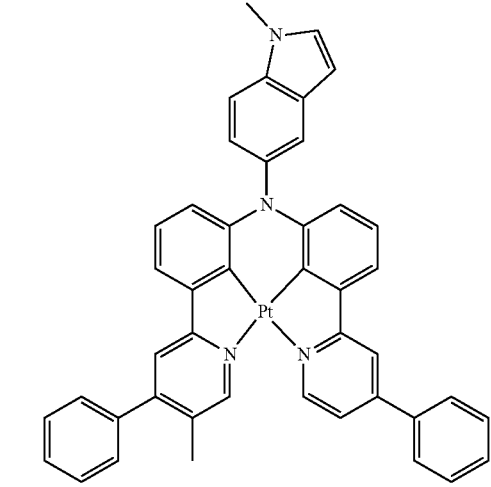
195
196
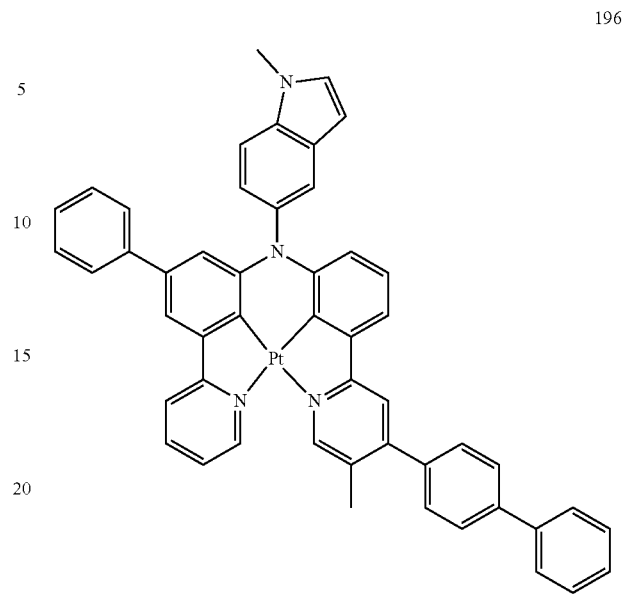
197
198
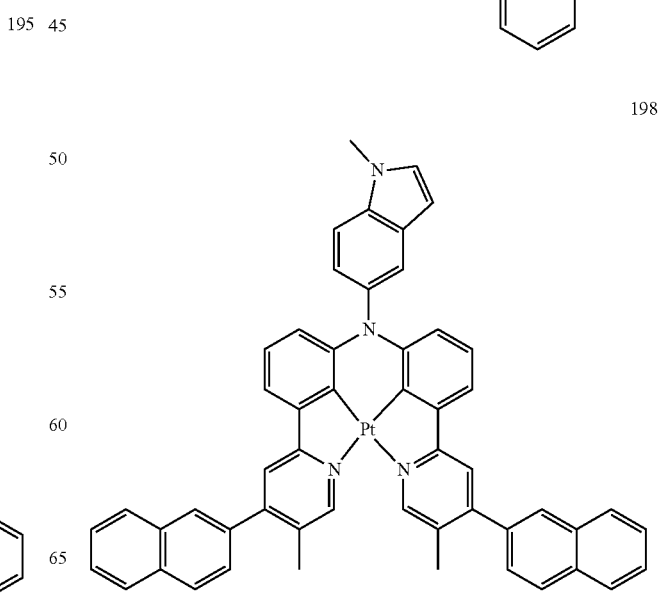

-continued

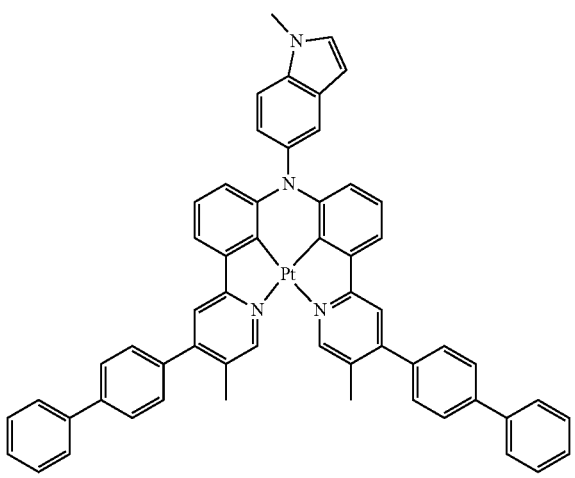

199

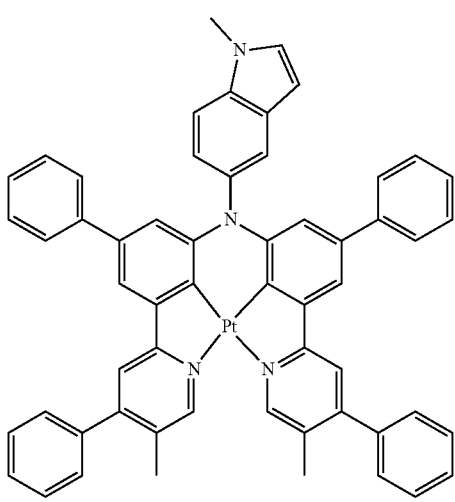

200

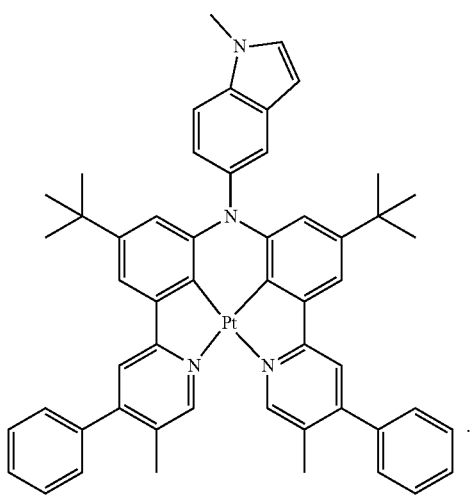

201

The organometallic compound represented by Formula 1 does not include fluorine. Accordingly, the organometallic compound represented by Formula 1 has relatively excellent metal-to-ligand charge-transfer (MLCT) and thus may have a short decay rate.

Also, since a71 and a72 in Formula 1 are not zero, $CY_1$ in Formula 1 is substituted with $R_{71}$ and $R_{72}$ "at the same time" as described herein. Accordingly, an electronic device, for example, an organic light-emitting device, which includes the organometallic compound represented by Formula 1, may achieve improvement in efficiency and lifespan "at the same time".

For example, a highest occupied molecular orbital (HOMO) energy level, a lowest unoccupied molecular orbital (LUMO) energy level, a singlet ($S_1$) energy level, and a triplet ($T_1$) energy level of some of Compounds and Compound A were evaluated by using a density functional theory (DFT) method of a Gaussian program (B3LYP, structurally optimized at a level of 6-31G(d,p)). Evaluation results thereof are shown in Table 1.

TABLE 1

| Compound No. | HOMO (eV) | LUMO (eV) | $S_1$ energy level (eV) | $T_1$ energy level (eV) |
|---|---|---|---|---|
| 1 | −4.321 | −1.591 | 2.165 | 1.951 |
| 2 | −4.349 | −1.675 | 2.121 | 1.915 |
| 4 | −4.275 | −1.566 | 2.144 | 1.932 |
| 5 | −4.352 | −1.618 | 2.176 | 1.956 |
| 7 | −4.317 | −1.672 | 2.122 | 1.924 |
| 9 | −4.395 | −1.674 | 2.153 | 1.939 |
| 17 | −4.416 | −1.687 | 2.175 | 1.956 |
| 18 | −4.408 | −1.682 | 2.726 | 1.951 |
| 21 | −4.333 | −1.603 | 2.156 | 1.931 |
| 26 | −4.392 | −1.731 | 2.119 | 1.921 |
| 55 | −4.348 | −1.734 | 2.093 | 1.899 |
| 59 | −4.320 | −1.657 | 2.131 | 1.933 |
| 78 | −4.395 | −1.725 | 2.128 | 1.938 |
| 79 | −4.431 | −1.671 | 2.191 | 1.976 |
| 87 | −4.493 | −1.744 | 2.177 | 1.960 |
| 92 | −4.360 | −1.699 | 2.100 | 1.885 |
| 101 | −4.525 | −1.826 | 2.140 | 1.914 |
| 102 | −4.368 | −1.708 | 2.099 | 1.886 |
| 103 | −4.326 | −1.671 | 2.095 | 1.886 |
| 104 | −4.406 | −1.788 | 2.095 | 1.906 |
| 127 | −4.448 | −1.683 | 2.194 | 1.977 |
| 128 | −4.478 | −1.768 | 2.151 | 1.941 |
| 148 | −4.465 | −1.677 | 2.206 | 1.982 |
| 155 | −4.310 | −1.672 | 2.113 | 1.916 |
| A | −4.419 | −1.589 | 2.236 | 1.985 |

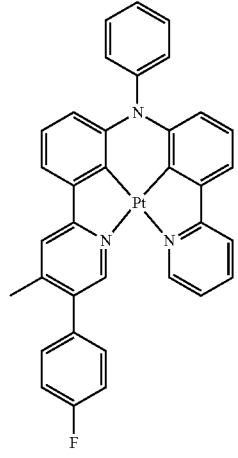

A

From Table 1, it can be determined that the organometallic compound represented by Formula 1 may be suitable for use in an electron device, for example, for use as a dopant for an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes:
a first electrode;
a second electrode; and
an organic layer that is disposed between the first electrode and the second electrode,
wherein the organic layer includes an emission layer and at least one of the organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound represented by Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression "(an organic layer) includes at least one of organometallic compounds" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include, as the organometallic compound, only Compound 1. In this embodiment, Compound 1 may be included in an emission layer of the organic light-emitting device. In one or more embodiments, the organic layer may include, as the organometallic compound, Compound 1 and Compound 2. In this embodiment, Compound 1 and Compound 2 may be included in an identical layer (for example, Compound 1 and Compound 2 may both be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, or any combination thereof, and wherein the electron transport region includes a hole blocking layer, an electron transport layer, an electron injection layer, or any combination thereof.

The term "organic layer" as used herein refers to a single layer and/or a plurality of layers disposed between the first electrode and the second electrode of the organic light-emitting device. The "organic layer" may include, in addition to an organic compound, an organometallic complex including metal.

The FIG. 1s a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Angstroms per second (A/sec) to about 100 Å/sec, but embodiments of the present disclosure are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

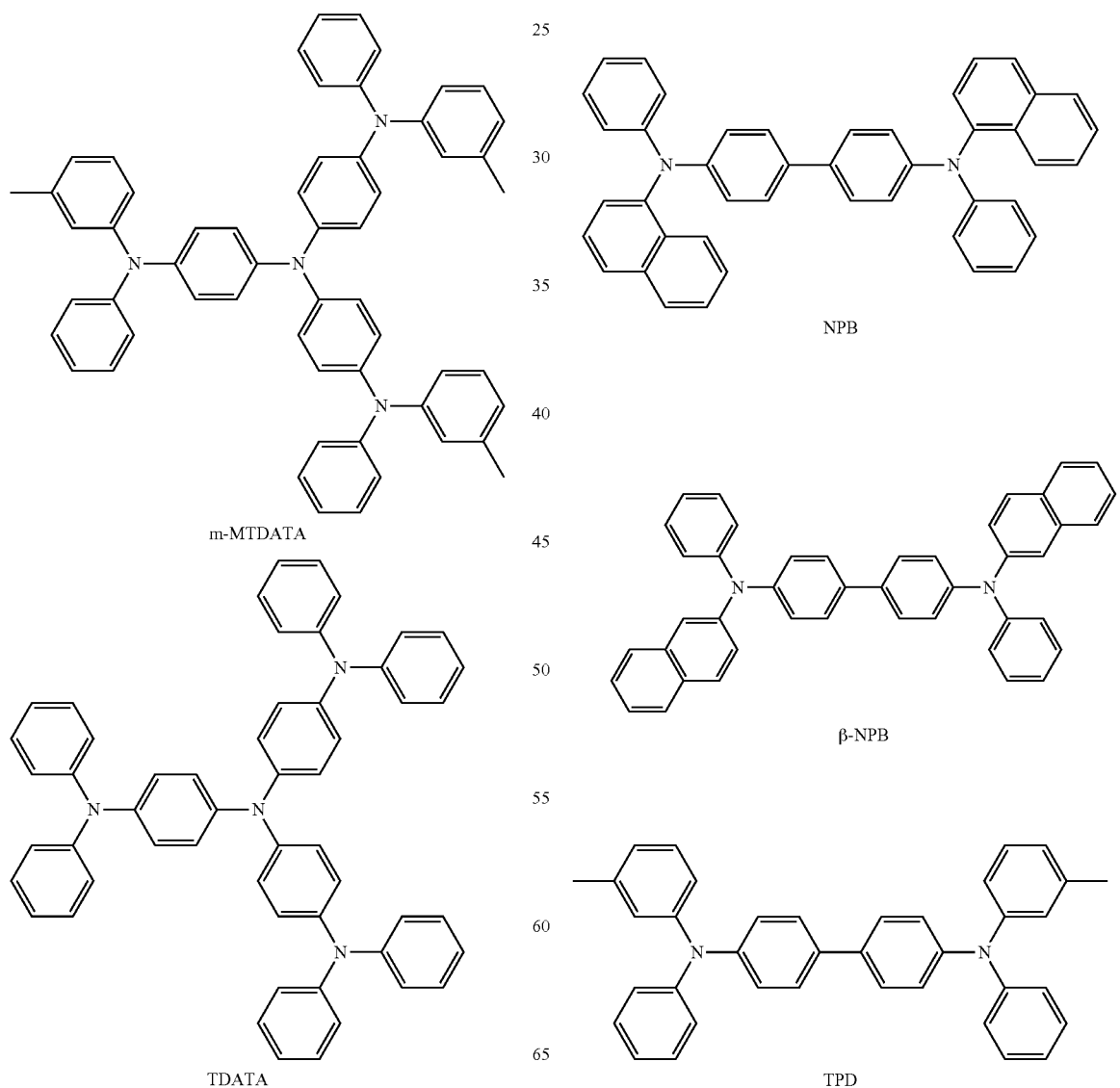

-continued

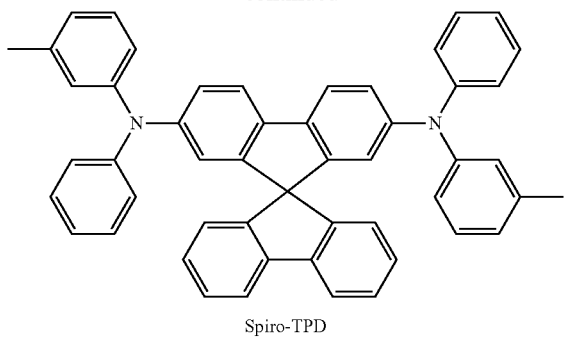
Spiro-TPD

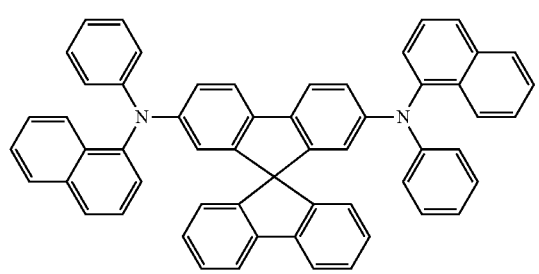
Spiro-NPB

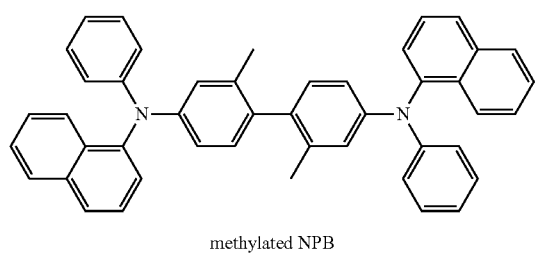
methylated NPB

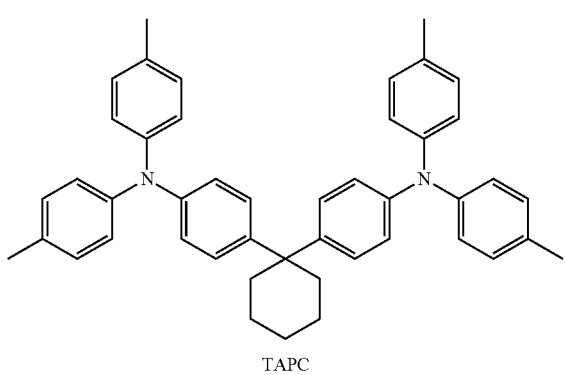
TAPC

-continued

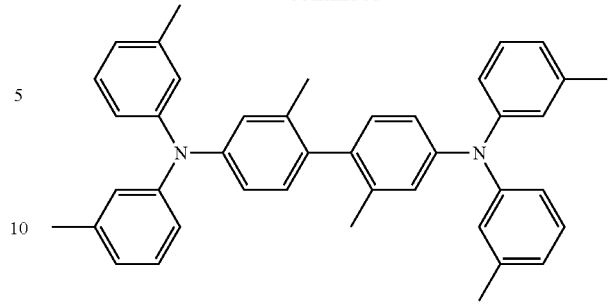
HMTPD

Formula 201

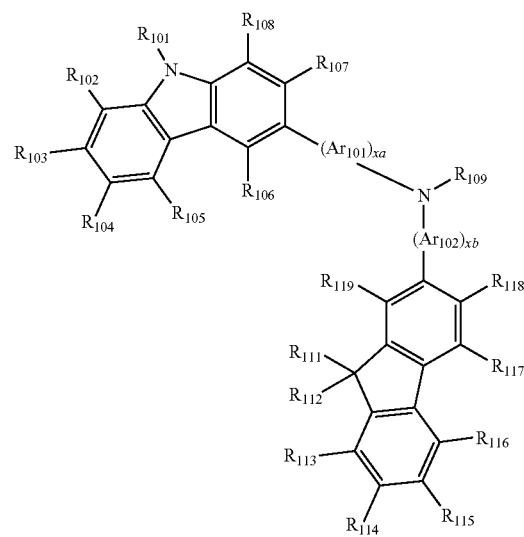

Formula 202

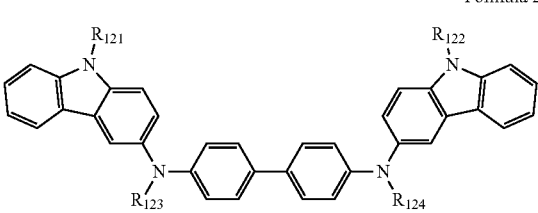

$Ar_{101}$ and $Ar_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

In Formula 201, xa and xb may each independently be an integer from 0 to 5, or 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

$R_{109}$ in Formula 201 may be selected from:
a phenyl group, a naphthyl group, an anthracenyl group, and a pyridinyl group; and
a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A

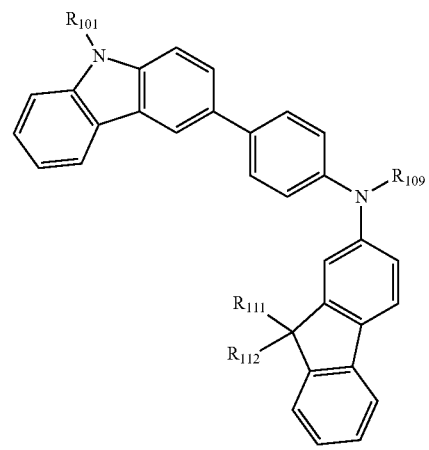

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto.

HT1

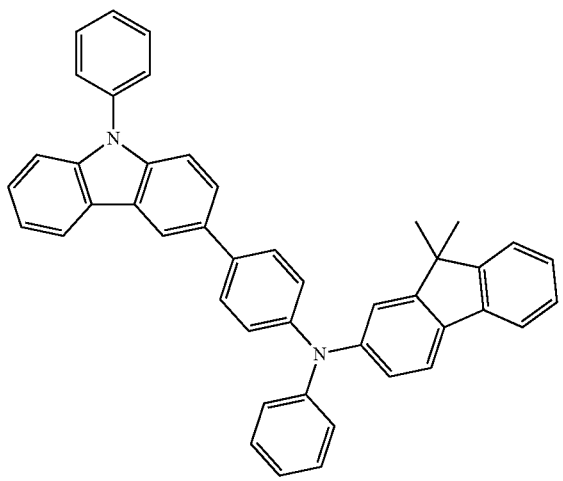

143
-continued
HT2
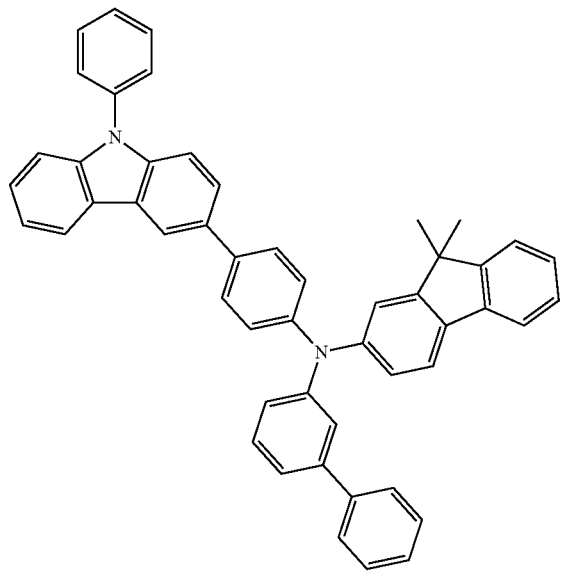
HT3
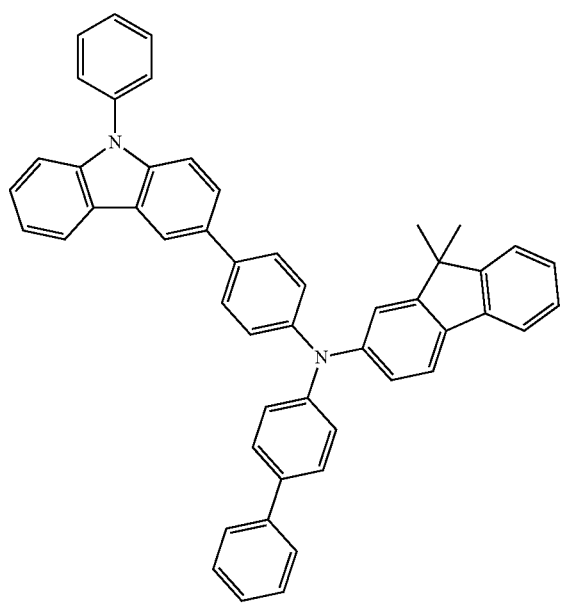
144
-continued
HT4
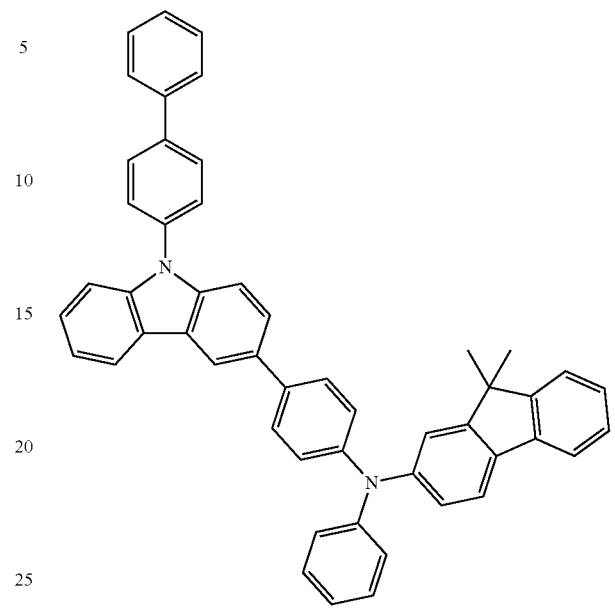
HT5
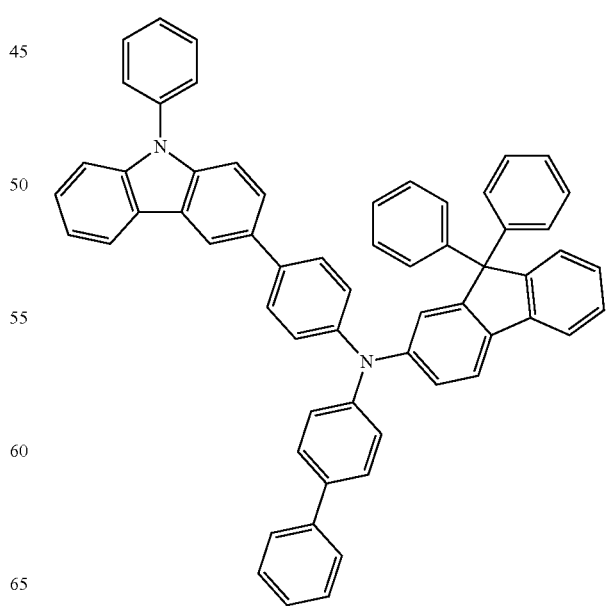

HT6
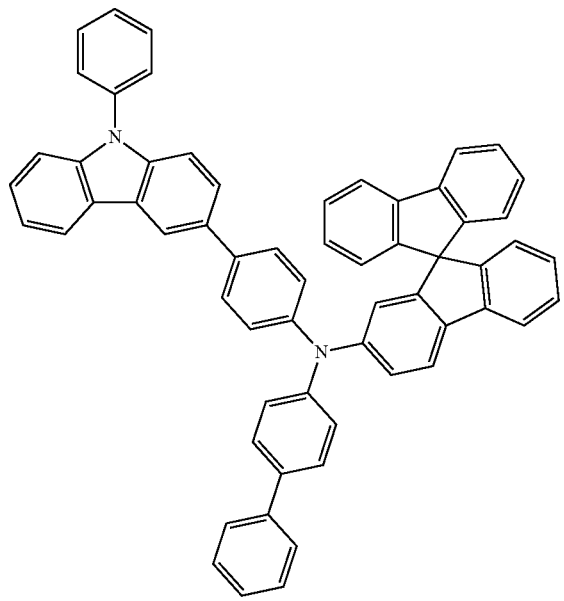
HT7
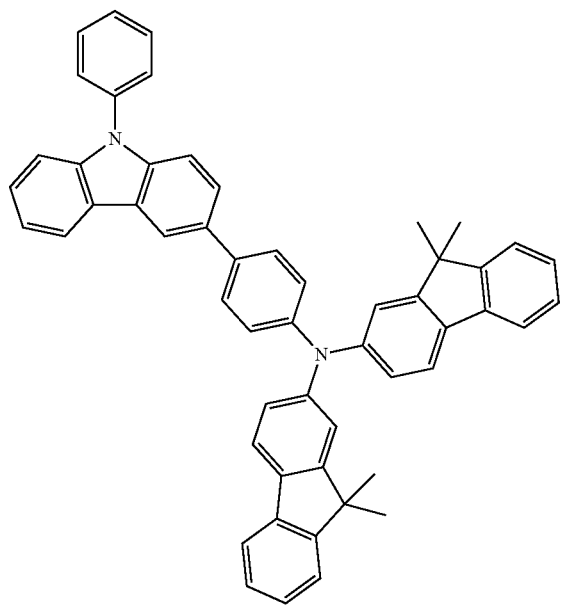
HT8
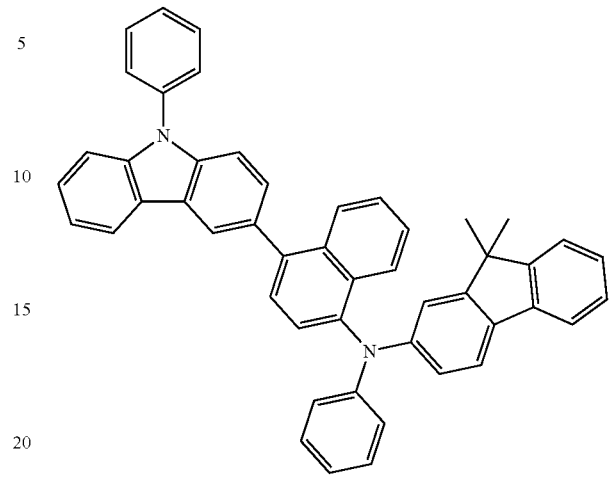
HT9
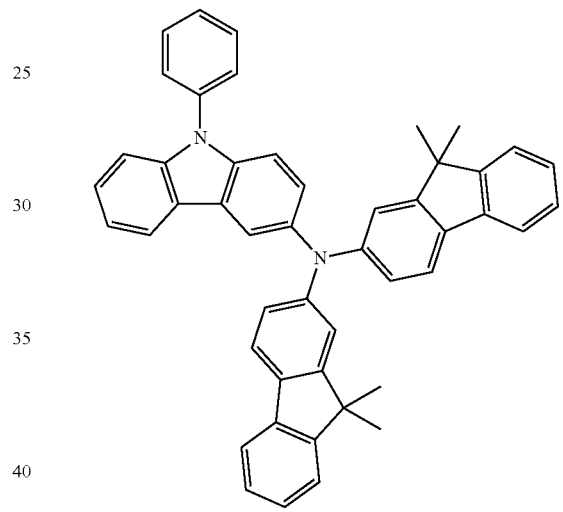
HT10
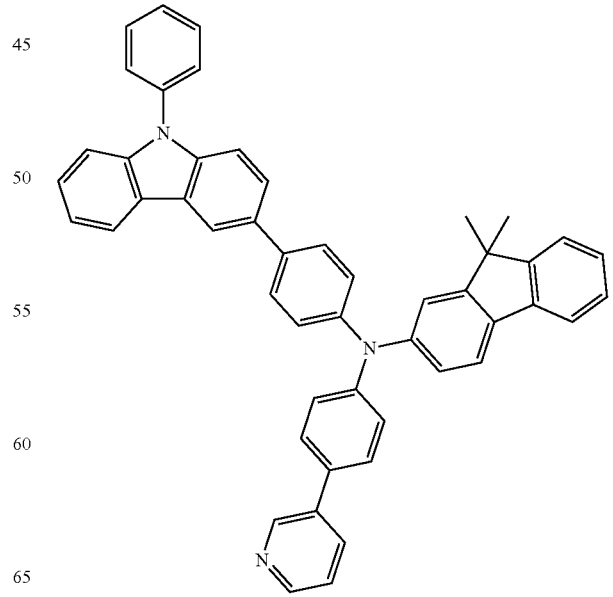

HT11
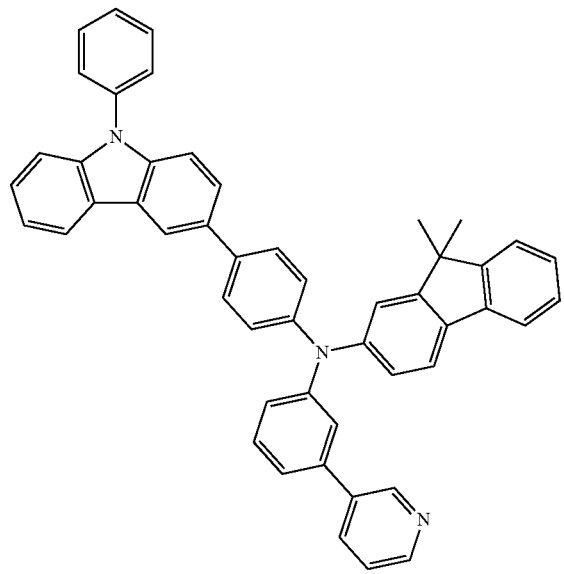
HT14
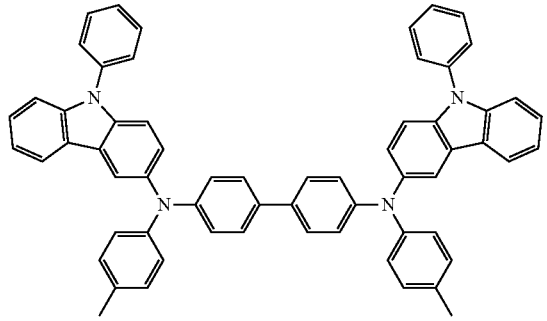
HT15
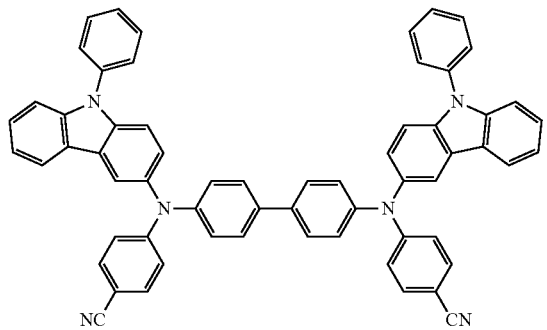
HT12
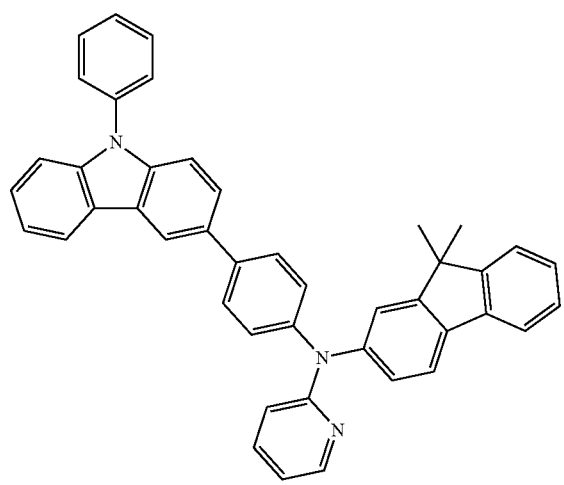
HT16
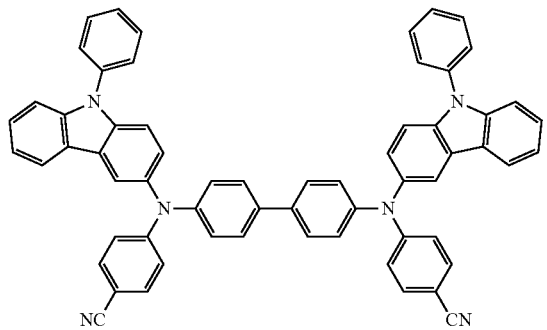
HT13
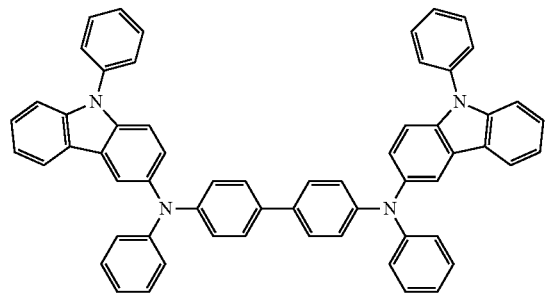
HT17
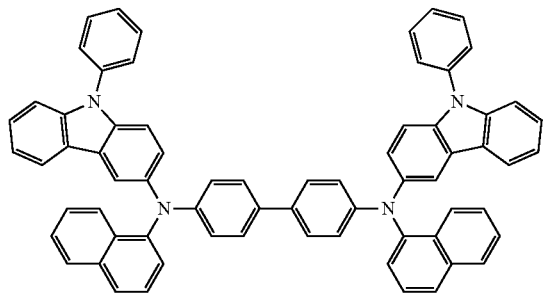

-continued

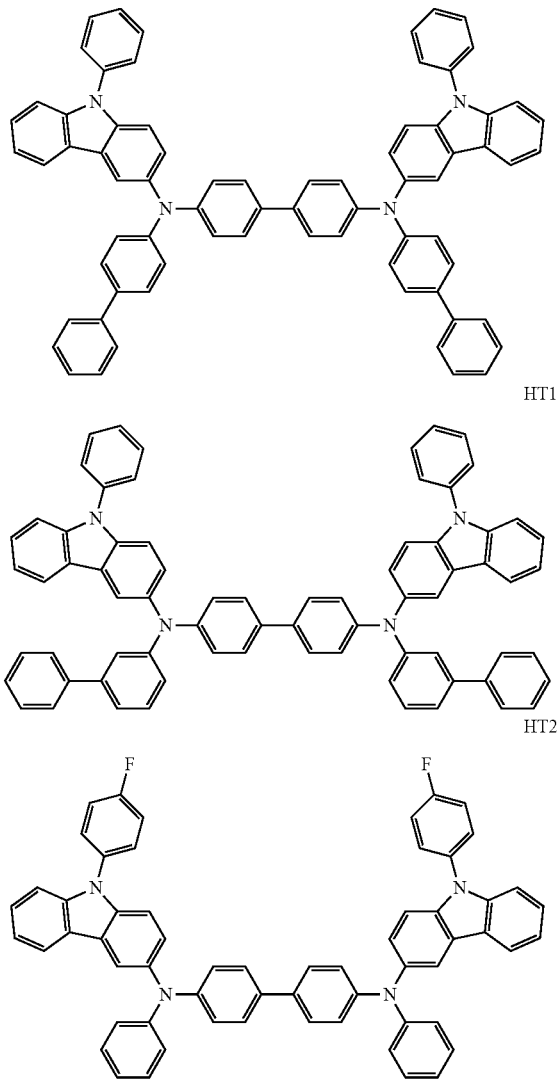

HT18

HT19

HT20

A thickness of the hole transport region may be in a range of about 100 Angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a compound including a cyano group, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a compound including a cyano group, such as Compound HT-D1 below, but are not limited thereto.

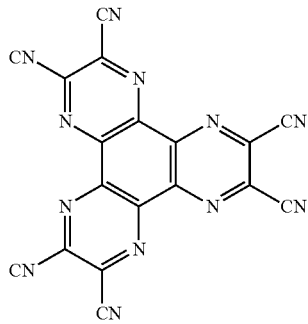

HT-D1

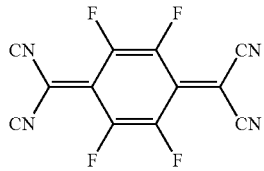

F4-TCNQ

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:
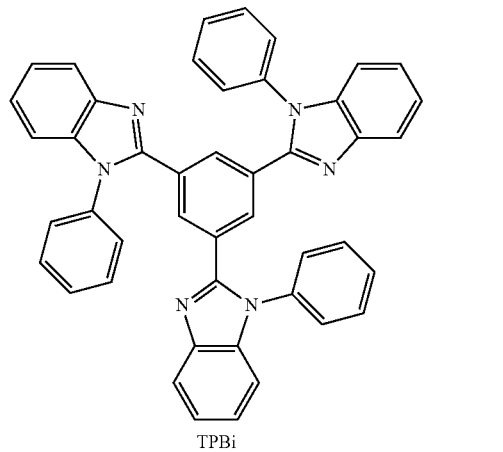
TPBi
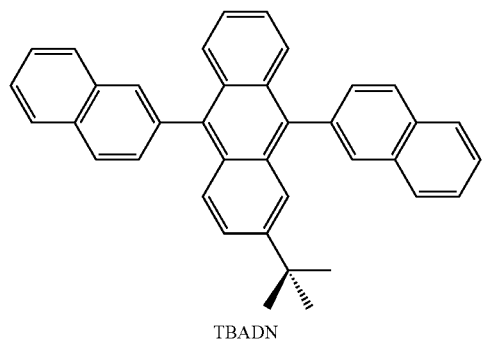
TBADN
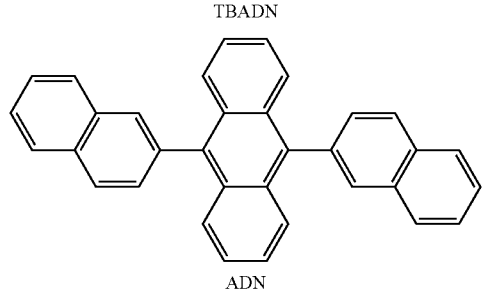
ADN
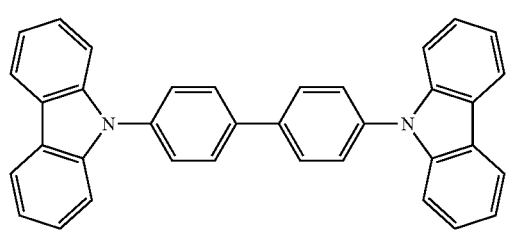
CBP
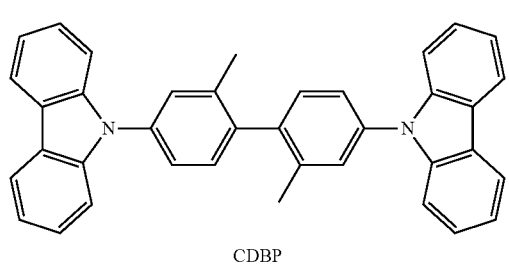
CDBP
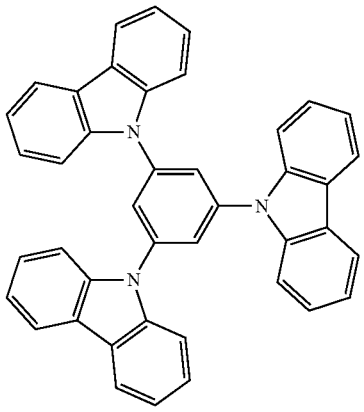
TCP
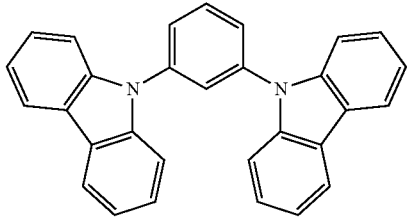
mCP
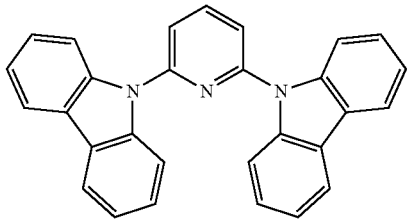
H50
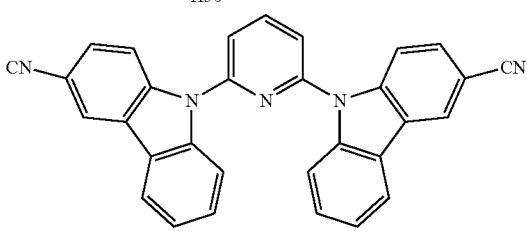
H51
In one or more embodiments, the host may further include a compound represented by Formula 301 below.
Formula 301
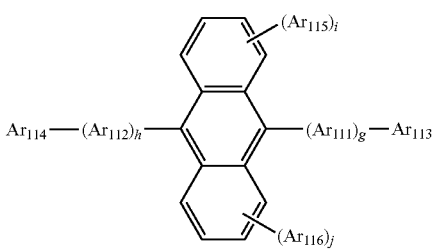
Formula 301

$Ar_{111}$ and $Ar_{112}$ in Formula 301 may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i, and j in Formula 301 may each independently be an integer from 0 to 4, and may be, for example, 0, 1, or 2.

$Ar_{113}$ to $Ar_{116}$ in Formula 301 may each independently be selected from a $C_1$-$C_{10}$ alkyl group, substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

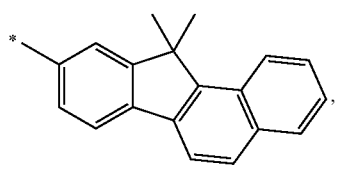 [SMILES: Cc1ccc2c(c1)C(C)(C)c1c-2ccc2ccccc12]

but embodiments of the present disclosure are not limited thereto.

In one or more embodiments, the host may include a compound represented by Formula 302 below:

Formula 302

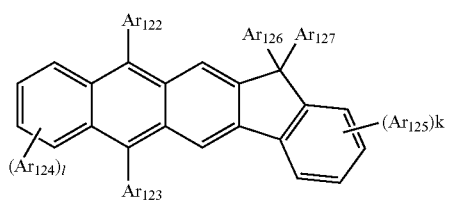

$Ar_{122}$ to $Ar_{125}$ in Formula 302 are the same as described in detail in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

The compound represented by Formula 301 and the compound represented by Formula 302 may include Compounds H1 to H42 illustrated below, but are not limited thereto.

H1

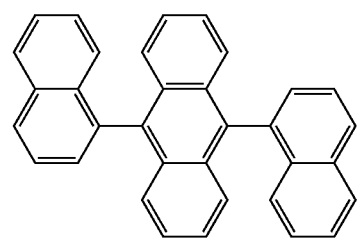

H2

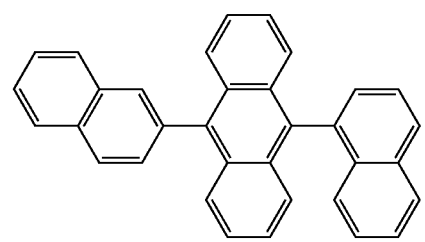

H3

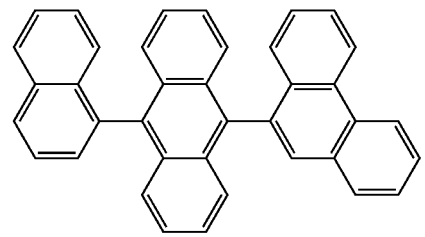

H4

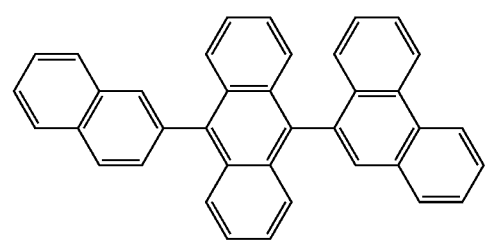

H5

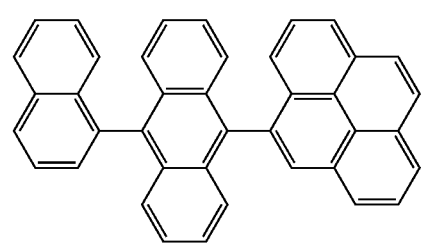

H6

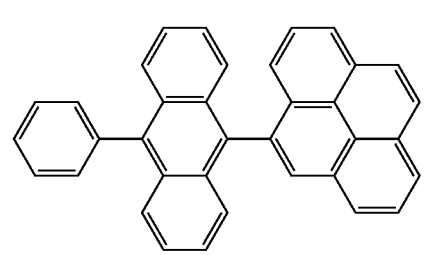

H7
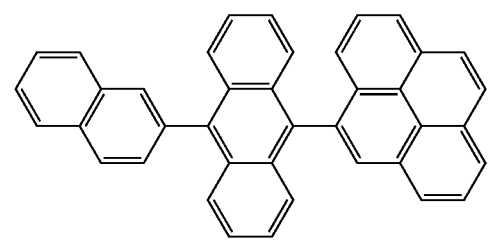
H8
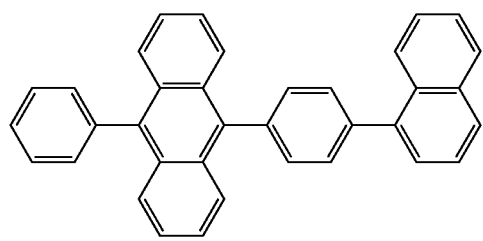
H9
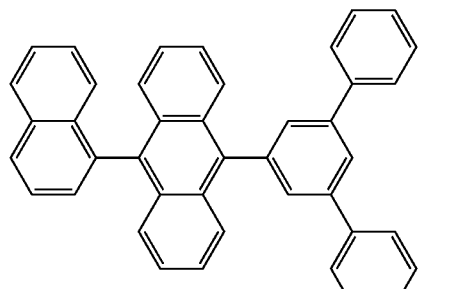
H10
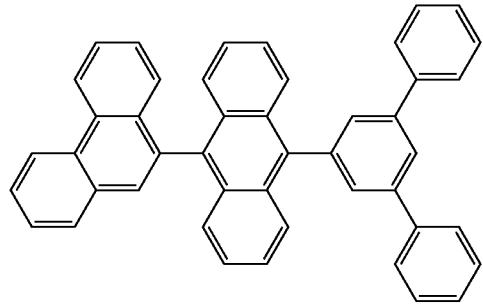
H11
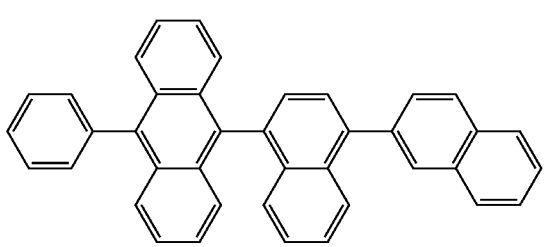
H12
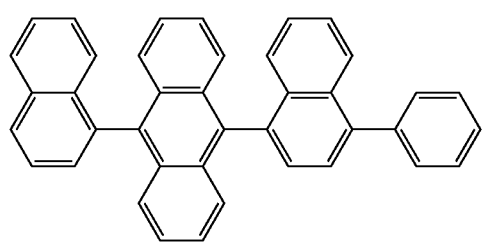
H13
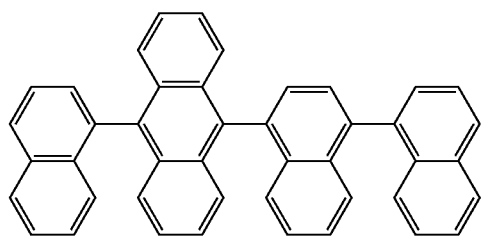
H14
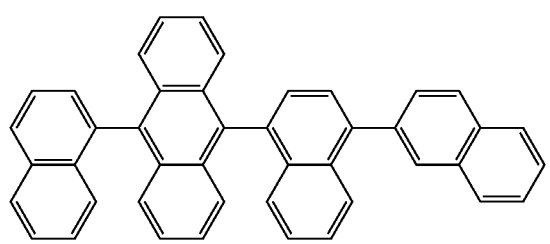
H15
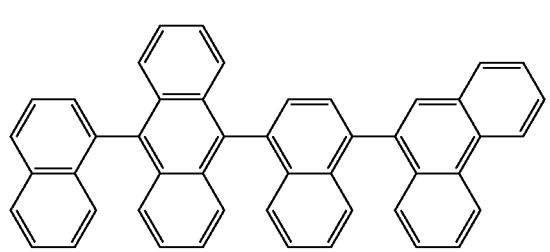
H16
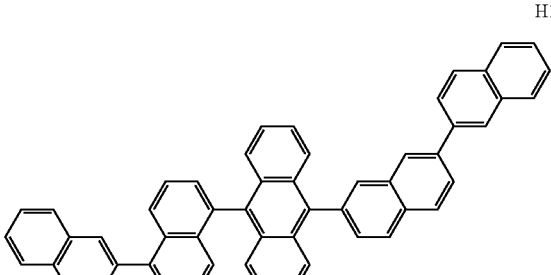
H17
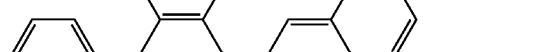

H18
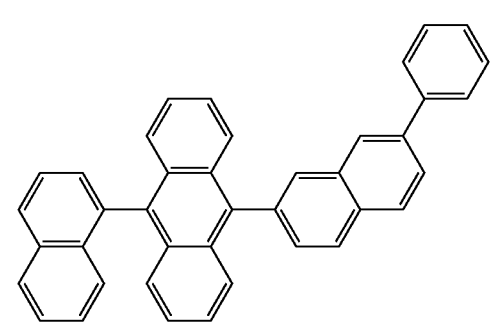
H19
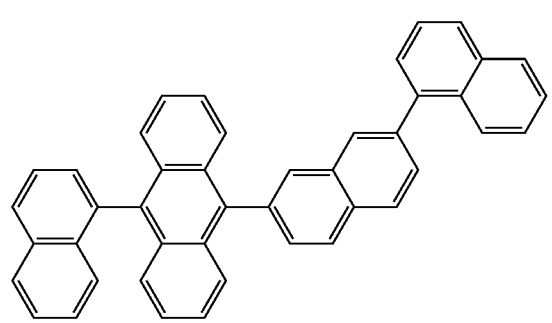
H20
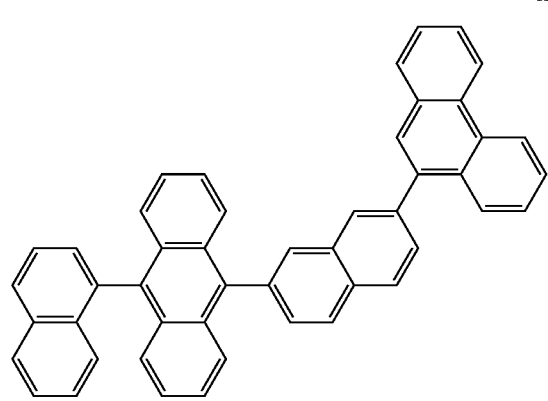
H21
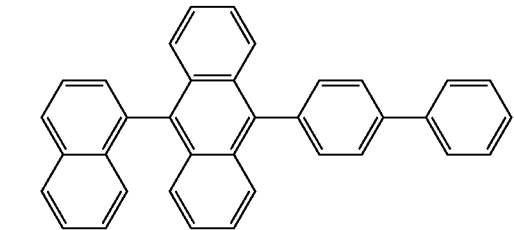
H22
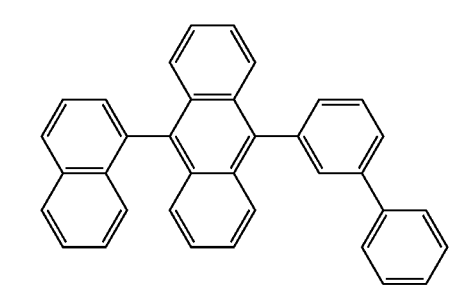
H23
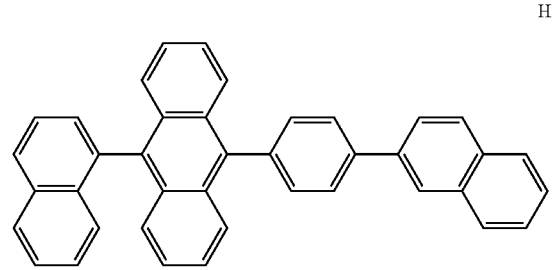
H24
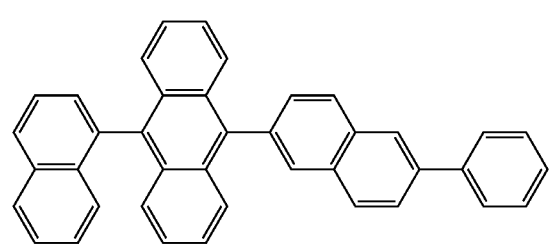
H25
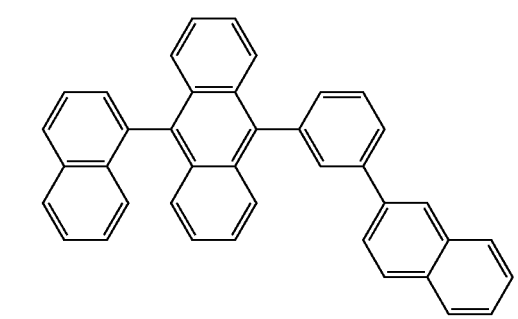
H26
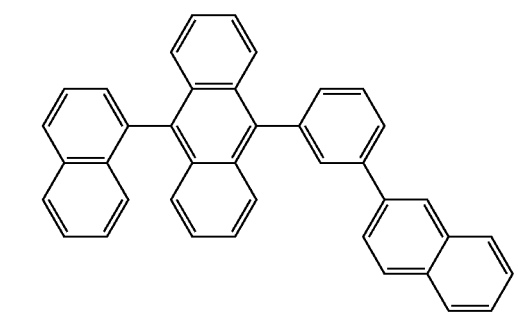
H27
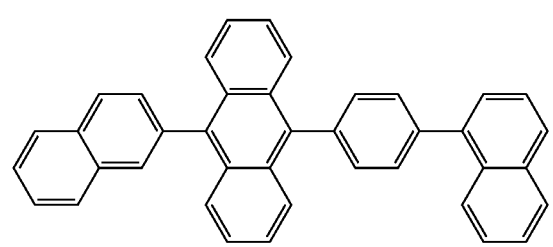

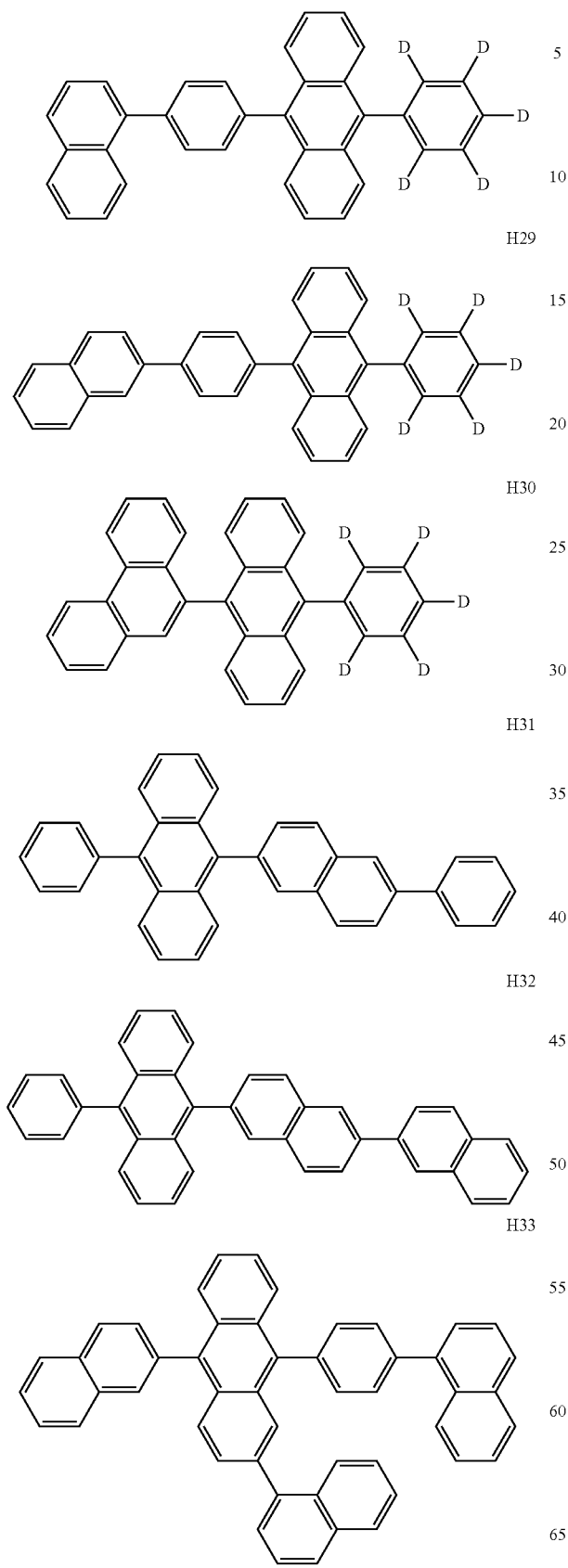
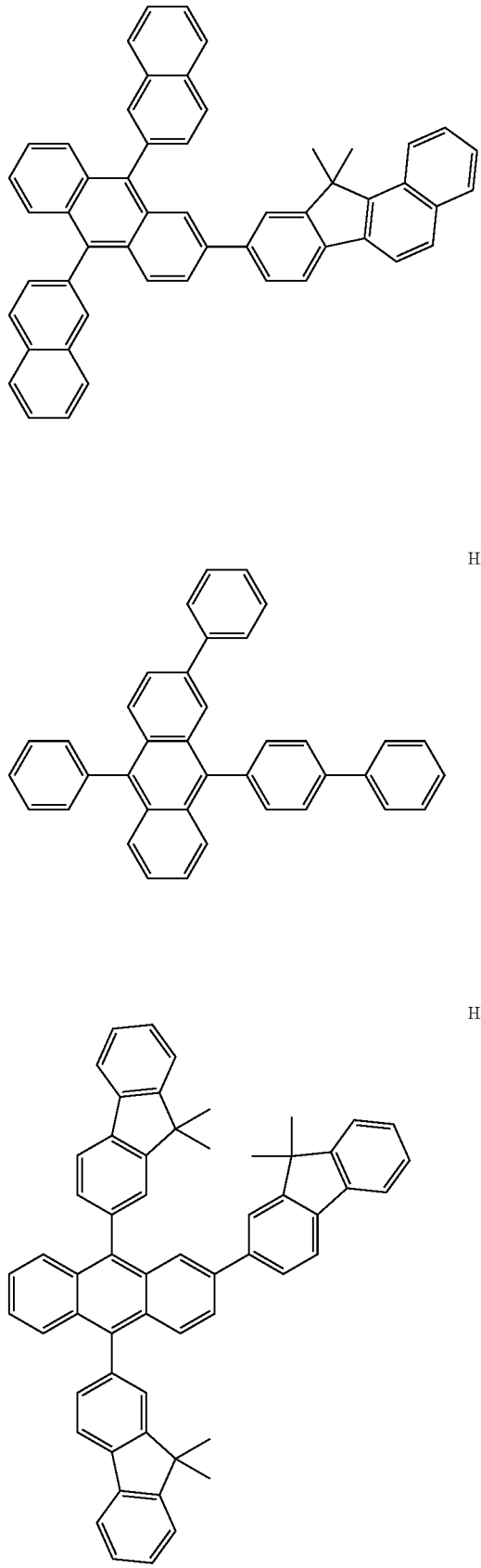

H37

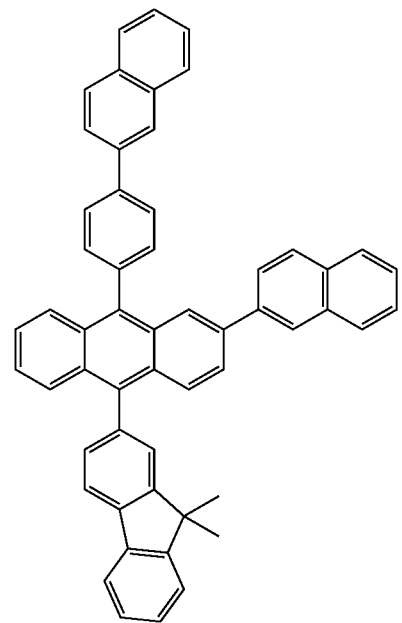

H38

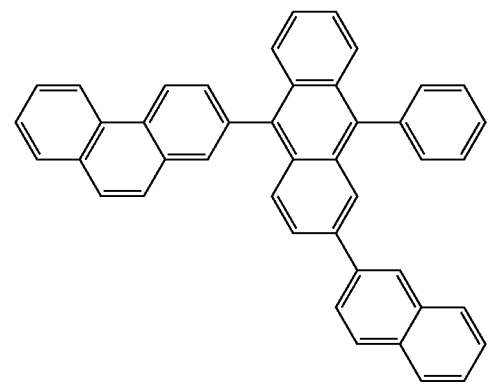

H39

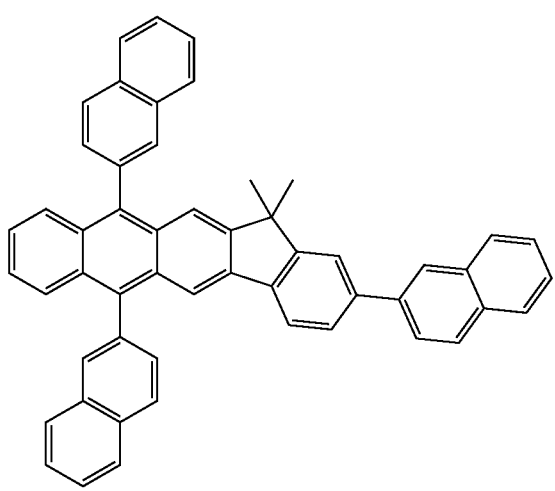

H40

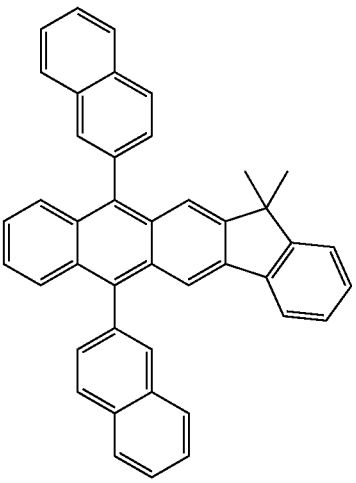

H41

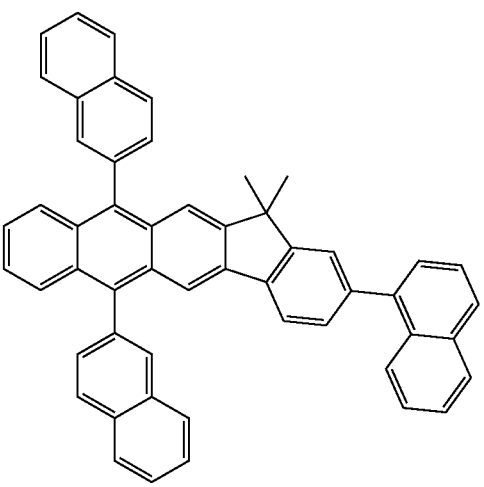

H42

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

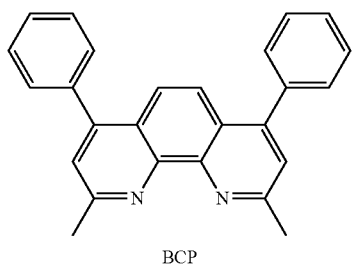

BCP

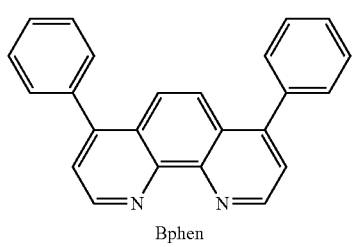

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, Bphen, Alq$_3$, BAlq, TAZ, and NTAZ.

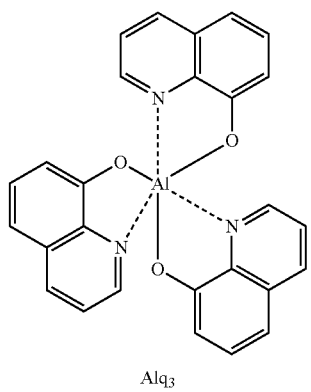

Alq$_3$

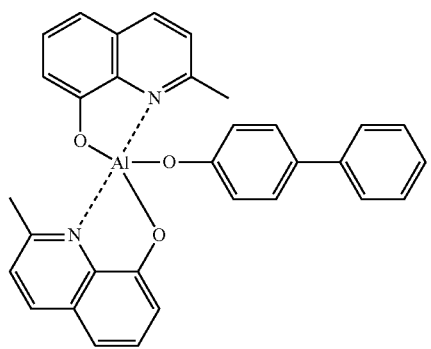

BAlq

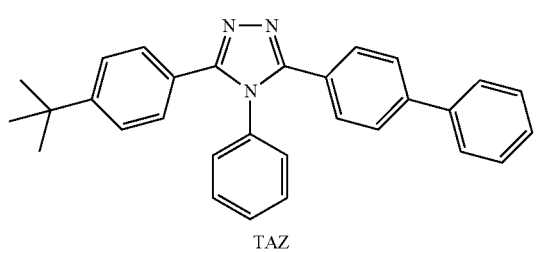

TAZ

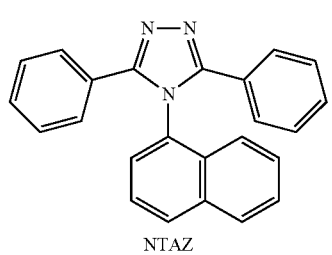

NTAZ

In one or more embodiments, the electron transport layer may include at least one of ET1 and ET2, but are not limited thereto:

ET1

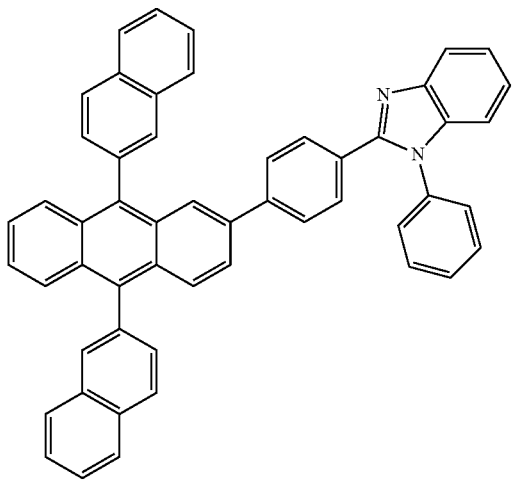

ET2

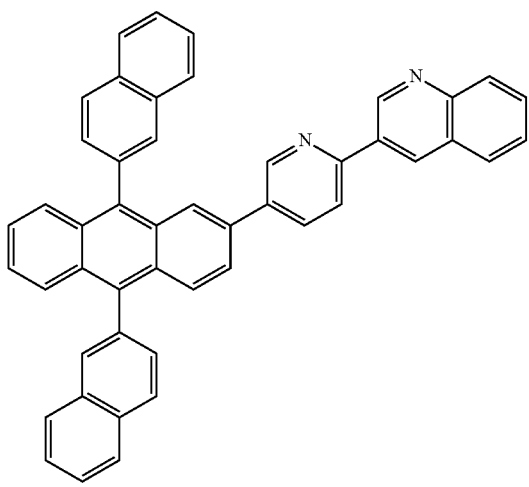

A thickness of the electron transport layer may be in a range of about 100 to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

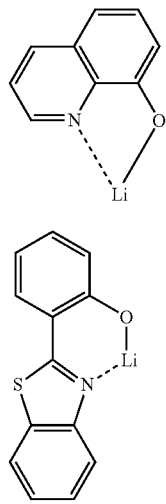

ET-D1

ET-D2

The electron transport region may include an electron injection layer) that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

Another aspect of the present disclosure provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy (isopropoxy) group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and that has no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group.

When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and a $C_6$-$C_{60}$ arylthio group as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and having no aromaticity in its entire molecular structure. Examples of the monovalent non-aromatic condensed polycyclic group include a fluorenyl group. The term "divalent non-aromatic condensed polycyclic group," as used herein, refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and having no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), and —P(=O)(Q$_{18}$)(Q$_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_1$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —B(Q$_{26}$)(Q$_{27}$), and —P(=O)(Q$_{28}$)(Q$_{29}$); and —N(Q$_{31}$)(Q$_{32}$), —Si(Q$_{33}$)(Q$_{34}$)(Q$_{35}$), —B(Q$_{36}$)(Q$_{37}$), and —P(=O)(Q$_{38}$)(Q$_{39}$), wherein $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Examples and Examples. However, the organic light-emitting device is not limited thereto. The wording "B was used instead of A" used in describing Synthesis Examples means that an amount of A used was identical to an amount of B used, in terms of molar equivalents.

EXAMPLES

Synthesis Example 1: Synthesis of Compound 1

Synthesis of Intermediate 1-2

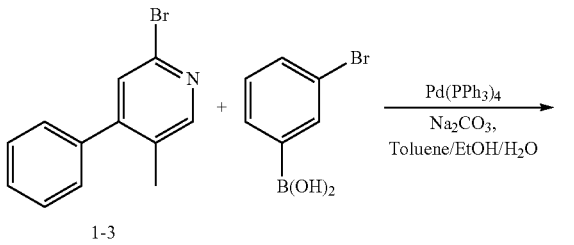

1-3

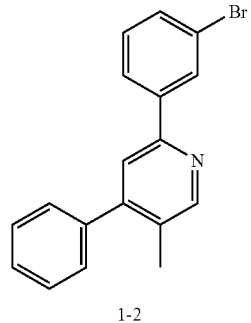

1-2

4.03 grams (g) (20.1 millimoles, mmol) of 2-bromo-5-methyl-4-phenylpyridine (Intermediate 1-3) was mixed with 100 milliliters (mL) of toluene, 30 mL of ethanol, and 30 mL of water. To this mixture, 7.20 g (20.1 mmol) of (3-bromophenyl)boronic acid, 1.62 g (1.40 mmol) of palladium catalyst, and 5.28 g (50.1 mmol) of sodium carbonate were added. The resultant mixture was heated under reflux at a temperature of 120° C. for 18 hours. The product was concentrated under reduced pressure, mixed with 400 mL of dichloromethane, and filtered by using diatomite. The organic layer was dried over magnesium sulfate, and the solvent was removed under reduced pressure. The residue was purified by liquid chromatography to obtain 4.55 g (yield: 70%) of Intermediate 1-2.

LC-MS m/z=314 (M+H)$^+$.

Synthesis of Intermediate 1-1

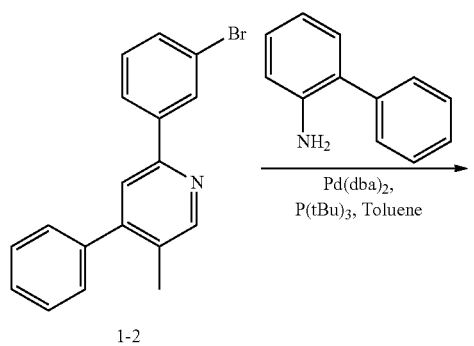

6.58 g (20.3 mmol) of Intermediate 1-2 was mixed with 100 mL of toluene. To this mixture, 1.43 g (8.45 mmol) of [1,1'-biphenyl]-2-amine, 0.49 g (0.85 mmol) of Pd(dba)$_2$, 1.1 g (2.54 mmol) of P(tBu)$_3$, and 2.03 g (21.1 mmol) of sodium butoxide were added. The resultant mixture was heated under reflux at a temperature of 130° C. for 24 hours. The product was concentrated under reduced pressure and mixed with 200 mL of dichloromethane. The organic layer was dried by using magnesium sulfate, and the solvent was removed under reduced pressure. The residue was purified by liquid (M+H)$^+$.

Synthesis of Compound 1

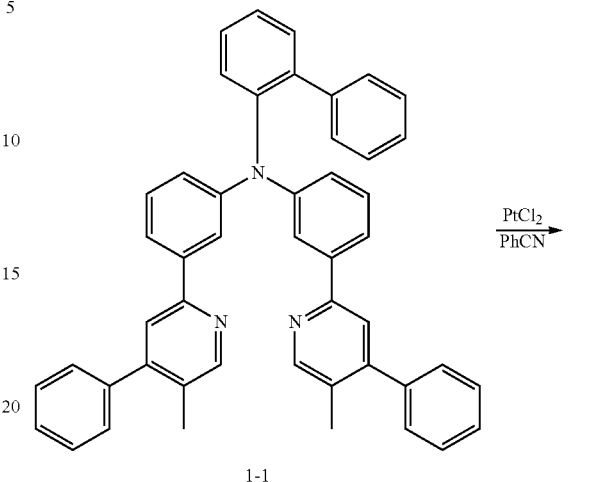

2.10 g (3.2 mmol) of Intermediate 1-1 was mixed with 130 mL of benzonitrile at room temperature, and 1.51 g (3.20 mmol) of PtCl$_2$(NCPh)$_2$ was added thereto. The resultant mixture was heated under reflux at a temperature of 150° C. for 18 hours. After the completion of reaction was confirmed by LCMS, the reaction mixture was concentrated under reduced pressure and purified by liquid chromatography to obtain 0.6 g (yield: 28%) of Compound 1. Compound 1 was identified by Mass and HPLC.

HRMS (MALDI) calcd for C$_{48}$H$_{35}$N$_3$Pt: m/z 848.2479, Found: 848.2477.

Synthesis Example 2: Synthesis of Compound 2

Synthesis of Intermediate 2-2

Synthesis of Intermediate 2-1

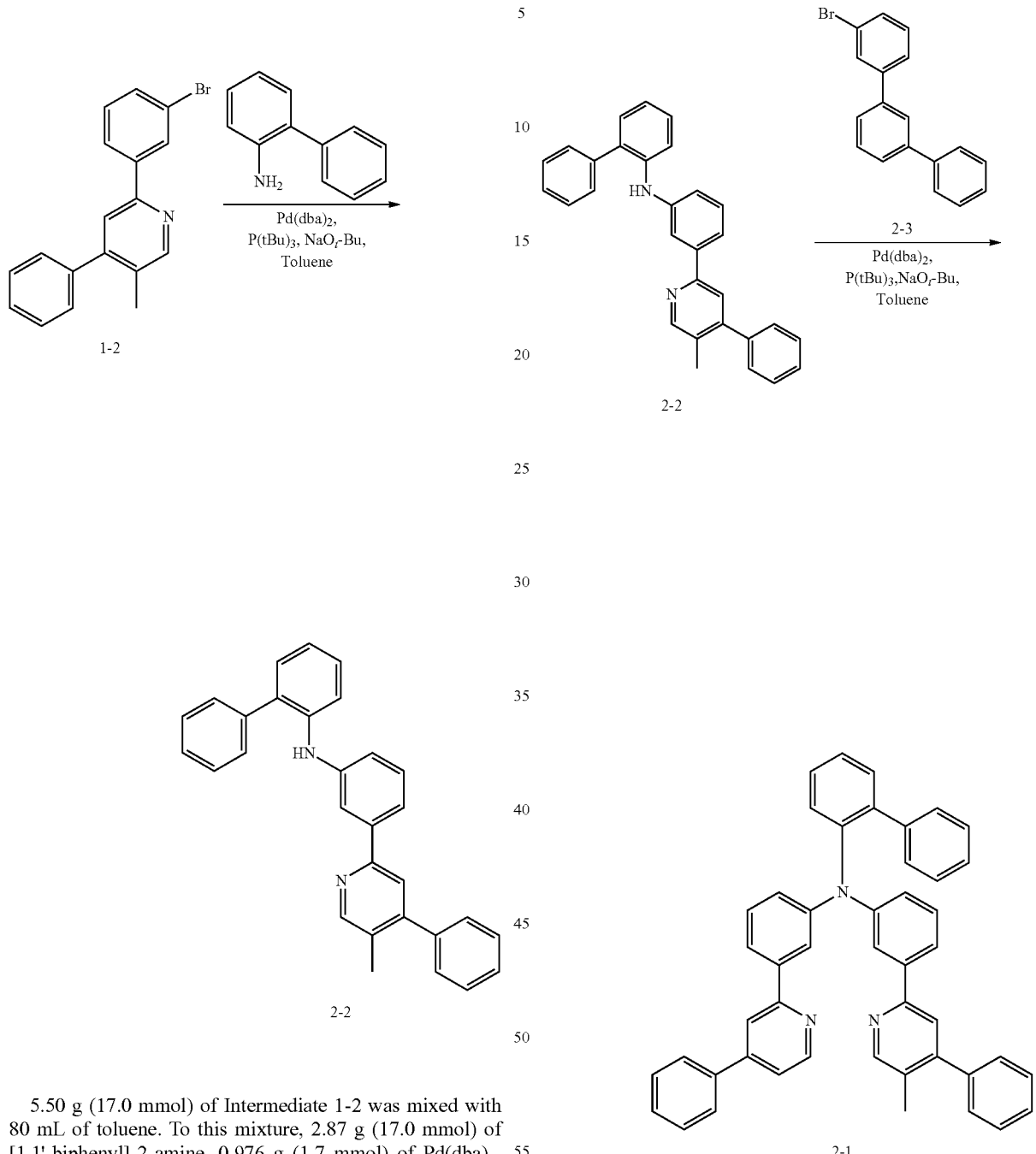

5.50 g (17.0 mmol) of Intermediate 1-2 was mixed with 80 mL of toluene. To this mixture, 2.87 g (17.0 mmol) of [1,1'-biphenyl]-2-amine, 0.976 g (1.7 mmol) of Pd(dba)$_2$, 2.06 g (0.30 mmol) of P(tBu)$_3$, and 4.89 g (50.9 mmol) of sodium butoxide were added. The resultant mixture was heated under reflux at a temperature 130° C. for 18 hours. The product was concentrated under reduced pressure, mixed with 200 mL of dichloromethane, and filtered by using diatomite. The organic layer was dried by using magnesium sulfate, and the solvent was removed under reduced pressure.

Then, the residue was purified by liquid chromatography to obtain 4.3 g (yield: 61%) of Intermediate 2-2. LC-MS m/z=413 (M+H)$^+$.

3.5 g (78%) of Intermediate 2-1 was synthesized in the same manner as Intermediate 1-1 in Synthesis Example 1, except that 2.88 g (7.00 mmol) of Intermediate 2-2 and 2.83 g (9.1 mmol) of 2-(3-bromophenyl)-4-phenylpyridine (Intermediate 2-3) were each used instead of Intermediate 1-2 and [1,1'-biphenyl]-2-amine.

LC-MS m/z=642 (M+H)$^+$.

Synthesis of Compound 2

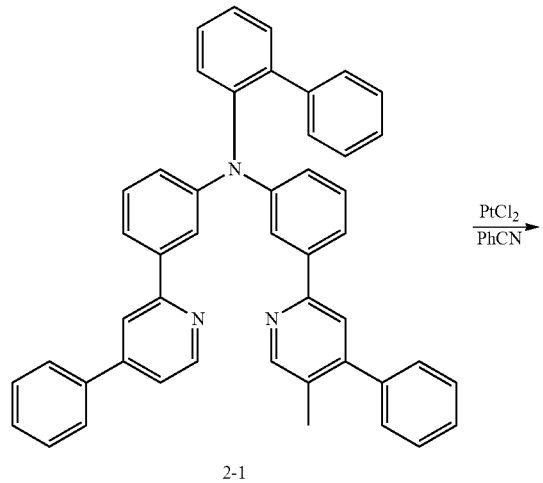

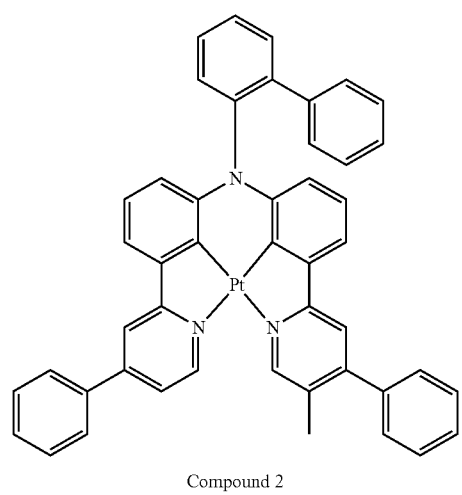

Compound 2

0.40 g (24%) of Compound 2 was synthesized in the same manner as Compound 1 in Synthesis Example 1, except that 1.28 g (2.00 mmol) of Intermediate 2-1 was used instead of Intermediate 1-1. Compound 2 was identified by Mass and HPLC.

HRMS (MALDI) calcd for $C_{47}H_{33}N_3Pt$: m/z 834.2322, Found: 834.2322.

Synthesis Example 3: Synthesis of Compound 4

Synthesis of Intermediate 4-2

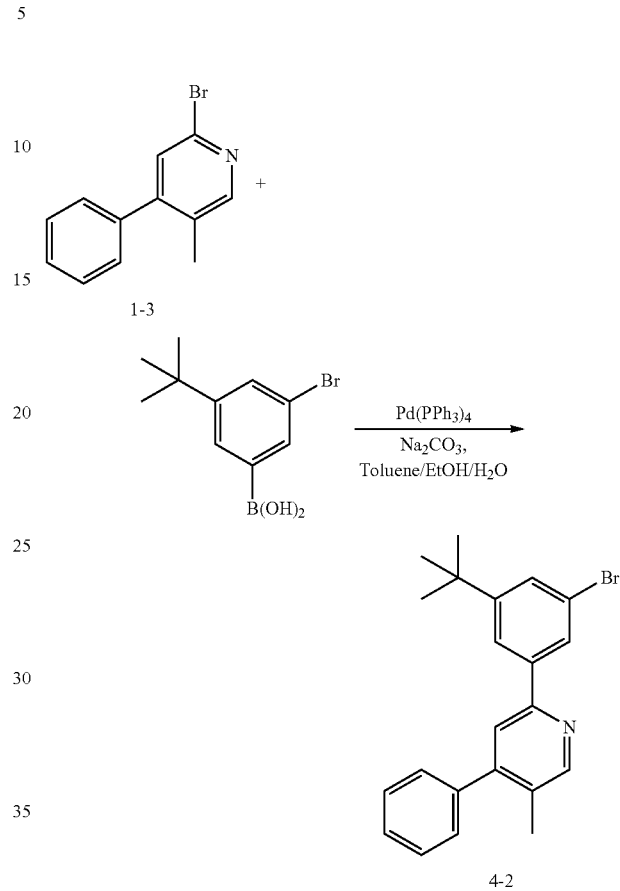

3.9 g (85%) of Intermediate 4-2 was synthesized in the same manner as Intermediate 1-2 in Synthesis Example 1, except that 3.42 g (13.3 mmol) of β-bromo-5-(tert-butyl)phenyl)boronic acid was used instead of (3-bromophenyl)boronic acid.

LC-MS m/z=380 (M+H)⁺.

Synthesis of Intermediate 4-1

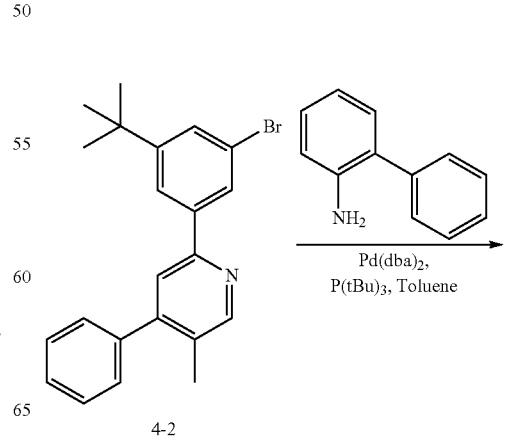

-continued

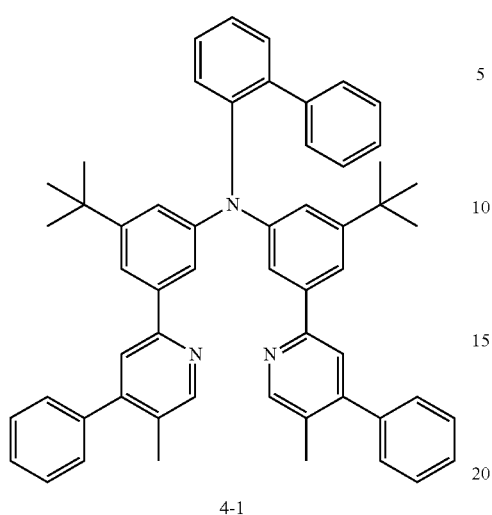

4-1

2.94 g (79%) of Intermediate 4-1 was synthesized in the same manner as Intermediate 1-1 in Synthesis Example 1, except that 0.825 g (4.88 mmol) of Intermediate 4-2 was used instead of Intermediate 1-2.

LC-MS m/z=768 (M+H)⁺.

Synthesis of Compound 4

-continued

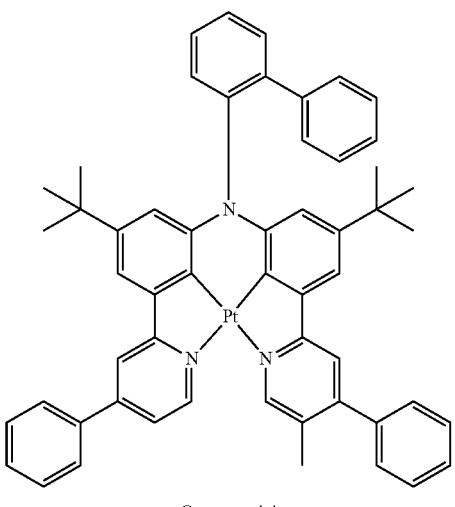

Compound 4

0.43 g (12%) of Compound 4 was synthesized in the same manner as Compound 1 in Synthesis Example 1, except that 2.94 g (3.83 mmol) of Intermediate 4-1 was used instead of Intermediate 1-1. Compound 4 was identified by Mass and HPLC.

HRMS (MALDI) calcd for $C_{56}H_{51}N_3Pt$: m/z 960.3731, Found: 960.3730.

Synthesis Example 4: Synthesis of Compound 7

Synthesis of Intermediate 7-1

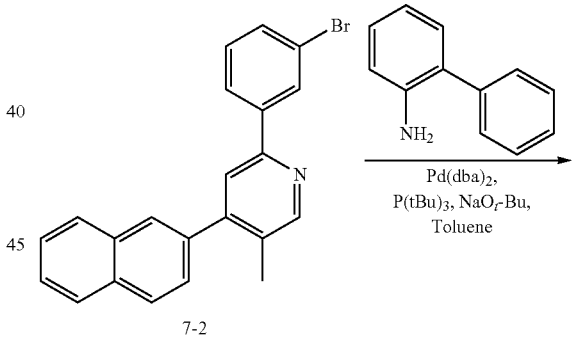

7-2

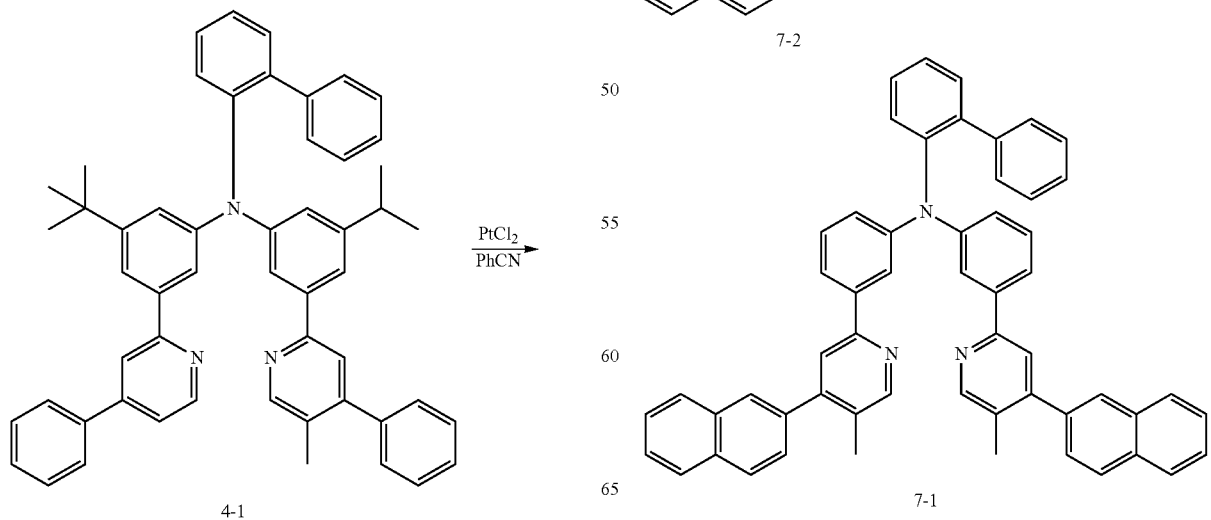

4-1

7-1

2.80 g (58%) of Intermediate 7-1 was synthesized in the same manner as Intermediate 1-1 in Synthesis Example 1, except that 5.57 g (14.9 mmol) of Intermediate 7-2 was used instead of Intermediate 1-2.

LC-MS m/z=756 (M+H)$^+$.

Synthesis of Compound 7

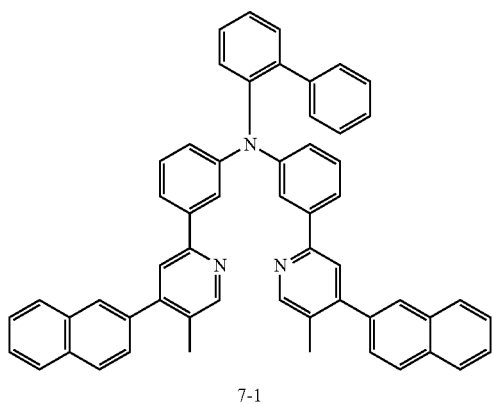

0.90 g (26%) of Compound 7 was synthesized in the same manner as Compound 1 in Synthesis Example 1, except that 2.76 g (3.65 mmol) of Intermediate 7-1 was used instead of Intermediate 1-1. Compound 7 was identified by Mass and HPLC.

HRMS (MALDI) calcd for $C_{56}H_{39}N_3Pt$: m/z 948.2792, Found: 948.2790.

Synthesis Example 5: Synthesis of Compound 9

Synthesis of Intermediate 9-3

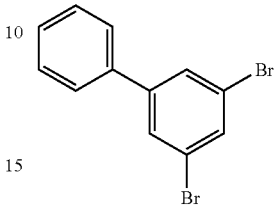

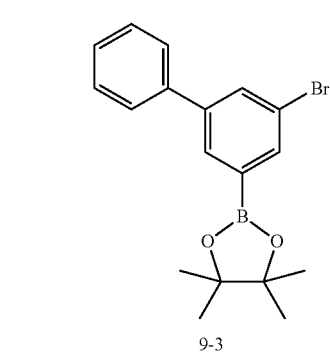

17.1 g (54.9 mmol) of Intermediate 9-4 and 550 mL of tetrahydrofuran (THF) were mixed, and the mixture was stirred at a temperature of −78° C. for 10 minutes. To this mixture, n-butyllithium (23.0 mL of a 2.5 M solution in hexanes, 57.6 mmol) was slowly added by drops for 30 minutes, and the resultant mixture was stirred at a temperature of −78° C. for 4 hours. Then, 12.3 mL (60.4 mmol) of 2-isopropoxy-4,4,5,5-tetramethyl-1,3,2-dioxaborolane was added thereto, and after 15 minutes, the resultant mixture was warmed to room temperature and stirred for 5 hours. 200 mL of distilled water was added thereto, and the resultant mixture was stirred. Then, methylene chloride (200 mL×3) was added thereto. The organic layer was dried by using MgSO$_4$, and the solvent was evaporated. The residue was purified by liquid chromatography to obtain 9.0 g (yield: 46%) of Intermediate 9-3. MALDI-TOF m/z=359 (M+H)$^+$.

Synthesis of Intermediate 9-2

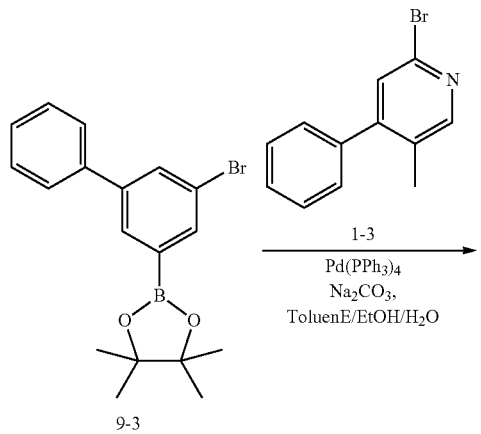

9-3

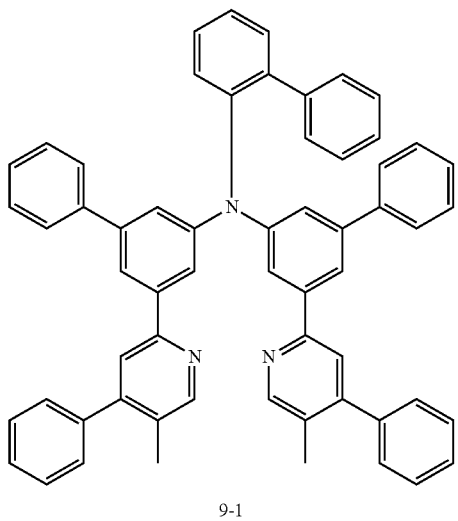

9-1

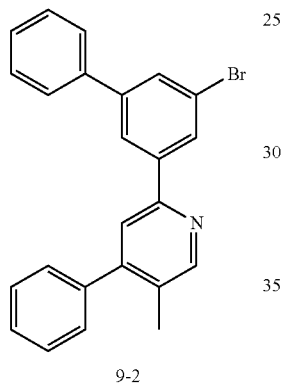

9-2

4.55 g (85%) of Intermediate 9-2 was synthesized in the same manner as Intermediate 1-2 in Synthesis Example 1, except that 5.83 g (16.2 mmol) of Intermediate 9-3 was used instead of (3-bromophenyl)boronic acid.

LC-MS m/z=400 (M+H)$^+$.

Synthesis of Intermediate 9-1

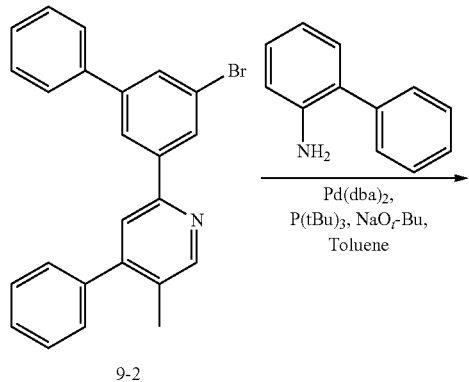

9-2

2.30 g (61%) of Intermediate 9-1 was synthesized in the same manner as Intermediate 1-1 in Synthesis Example 1, except that 4.52 g (11.3 mmol) of Intermediate 9-2 was used instead of Intermediate 1-2.

LC-MS m/z=808 (M+H)$^+$.

Synthesis of Compound 9

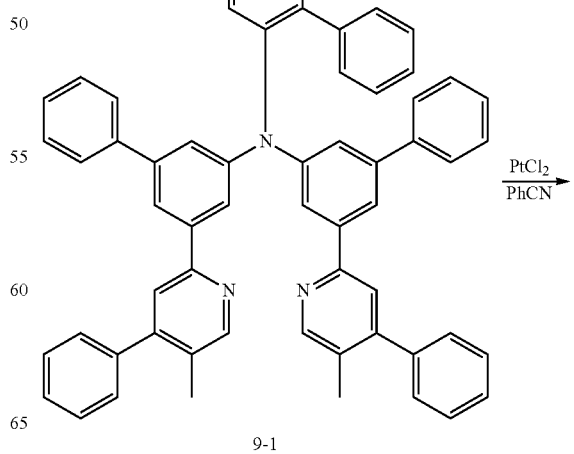

9-1

Synthesis Example 6: Synthesis of Compound 17

Synthesis of Intermediate 17-2

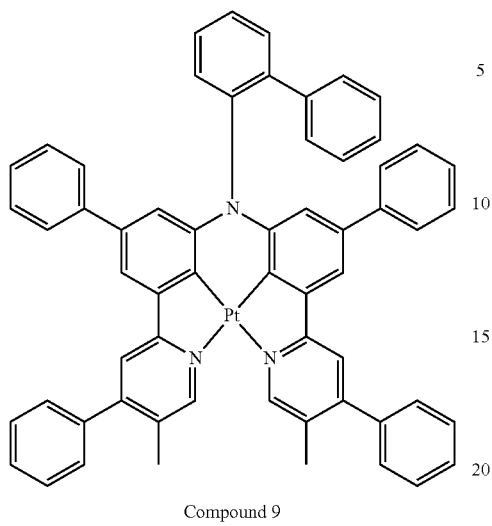

Compound 9

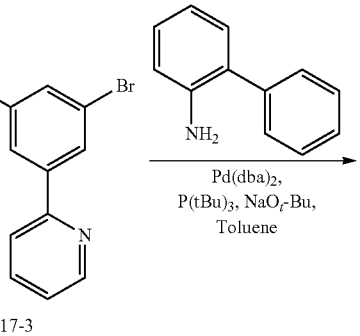

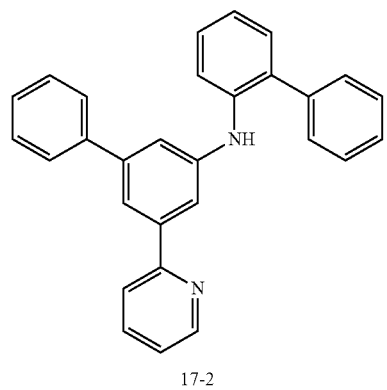

17-2

0.30 g (11%) of Compound 9 was synthesized in the same manner as Compound 1 in Synthesis Example 1, except that 2.30 g (2.87 mmol) of Intermediate 9-1 was used instead of Intermediate 1-1. Compound 9 was identified by Mass and HPLC.

HRMS (MALDI) calcd for $C_{60}H_{43}N_3Pt$: m/z 1000.3105, Found: 1000.3105.

4.11 g (59%) of Intermediate 17-2 was synthesized in the same manner as Intermediate 2-2 in Synthesis Example 2, except that 5.45 g (17.6 mmol) of Intermediate 17-3 was used instead of Intermediate 1-2.

LC-MS m/z=399 (M+H)$^+$.

Synthesis of Intermediate 17-1

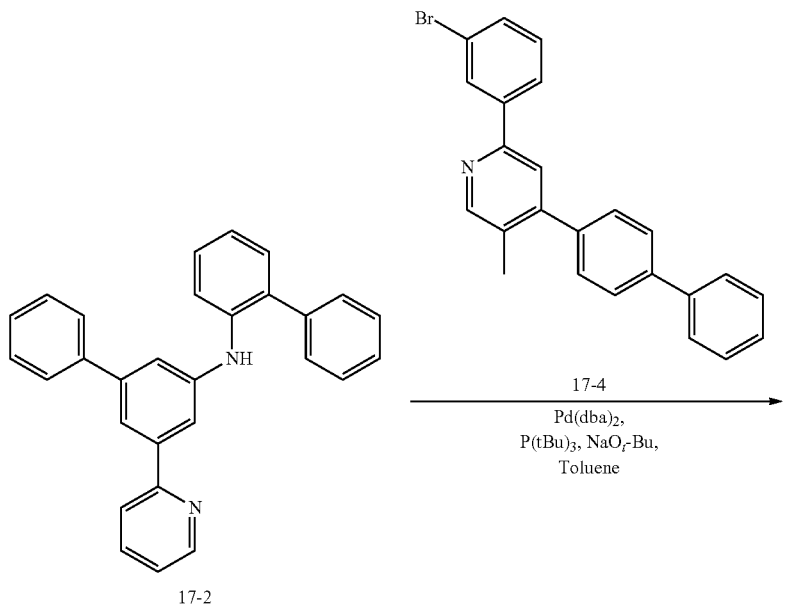

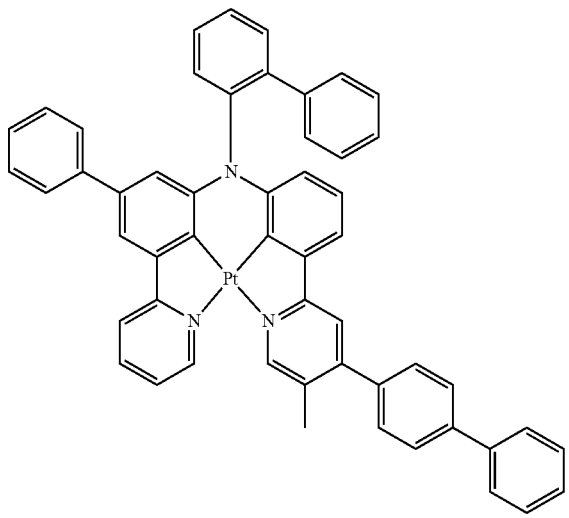

17-1

2.4 g (64%) of Intermediate 17-1 was synthesized in the same manner as Intermediate 2-1 in Synthesis Example 2, except that 2.07 g (5.20 mmol) of Intermediate 17-2 and 3.12 g (7.80 mmol) of Intermediate 17-4 were each used instead of Intermediate 2-2 and Intermediate 2-3.

LC-MS m/z=718 (M+H)$^+$.

Synthesis of Compound 17

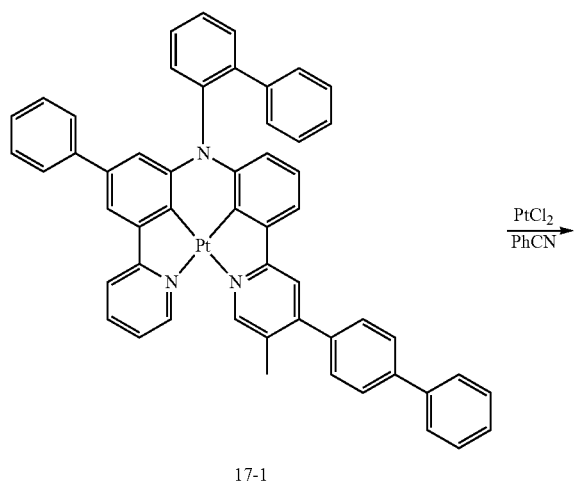

17-1

$\xrightarrow{\text{PtCl}_2/\text{PhCN}}$

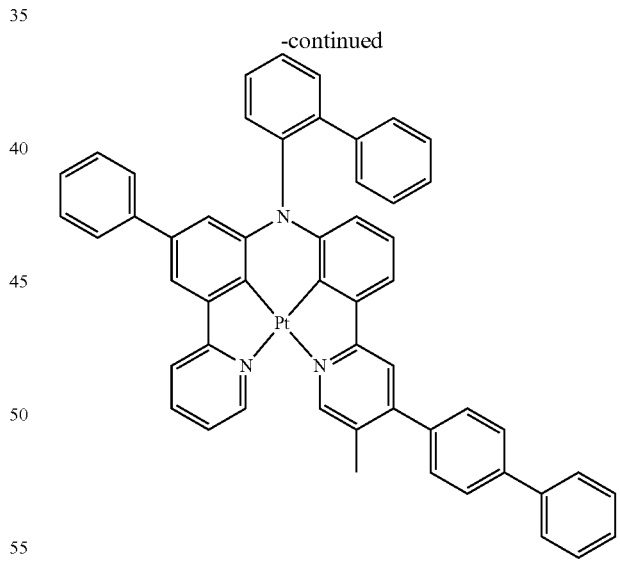

Compound 17

1.2 g (41%) of Compound 17 was synthesized in the same manner as Compound 1 in Synthesis Example 1, except that 2.30 g (2.87 mmol) of Intermediate 17-1 was used instead of Intermediate 1-1. Compound 17 was identified by Mass and HPLC.

HRMS (MALDI) calcd for $C_{53}H_{37}N_3Pt$: m/z 910.2635, Found: 910.2633.

Synthesis Example 7: Synthesis of Compound 18

Synthesis of Intermediate 18-4

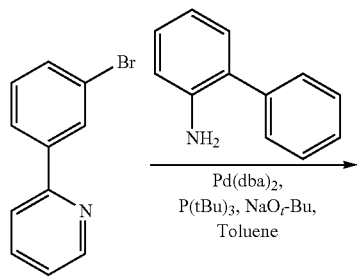

18-5

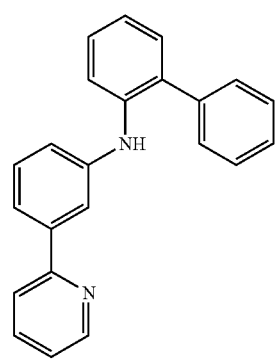

18-4

2.70 g (59%) of Intermediate 18-4 was synthesized in the same manner as Intermediate 2-2 in Synthesis Example 2, except that 4.77 g (14.3 mmol) of Intermediate 18-5 was used instead of Intermediate 1-2.

LC-MS m/z=323 (M+H)⁺.

Synthesis of Intermediate 18-2

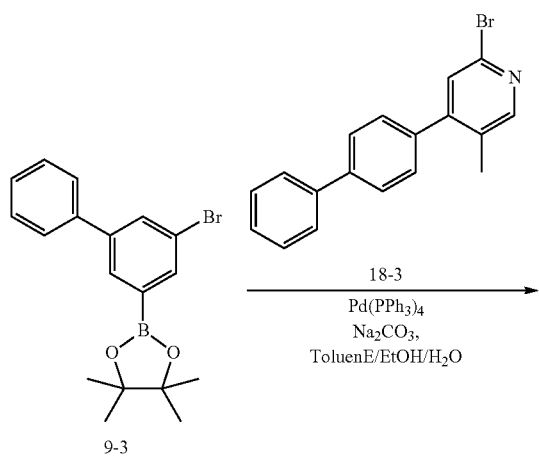

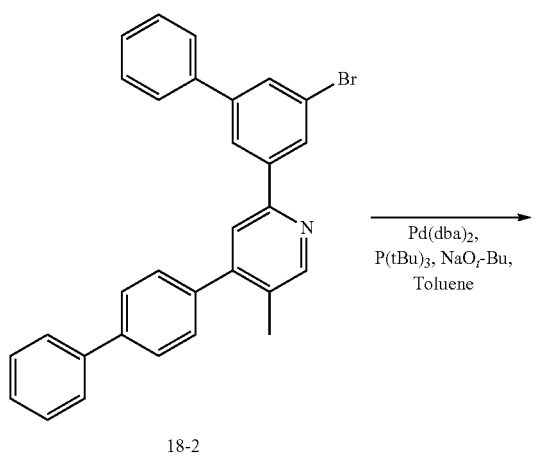

18-2

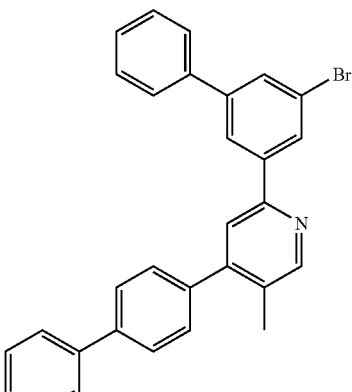

18-2

2.50 g (50%) of Intermediate 18-2 was synthesized in the same manner as Intermediate 1-2 in Synthesis Example 1, except that Intermediate 18-3 and 4.33 g (12.1 mmol) of Intermediate 9-3 were each used instead of Intermediate 1-3 and (3-bromophenyl)boronic acid.

LC-MS m/z=476 (M+H)⁺.

Synthesis of Intermediate 18-1

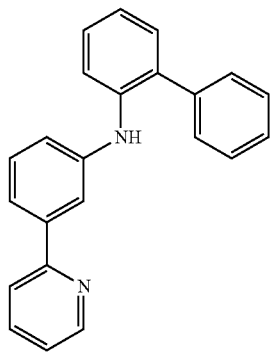

18-4

+

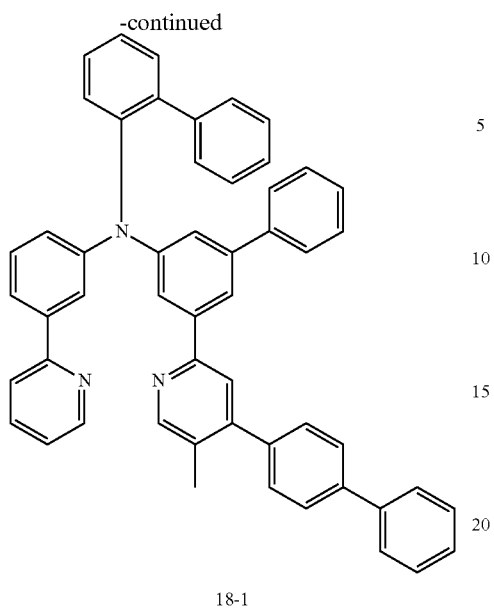

18-1

2.47 g (62%) of Intermediate 18-1 was synthesized in the same manner as Intermediate 2-1 in Synthesis Example 2, except that 1.78 g (5.57 mmol) of Intermediate 18-4 and 2.65 g (5.57 mmol) of Intermediate 18-2 were each used instead of Intermediate 2-2 and Intermediate 2-3.

LC-MS m/z=718 (M+H)$^+$.

Synthesis of Compound 18

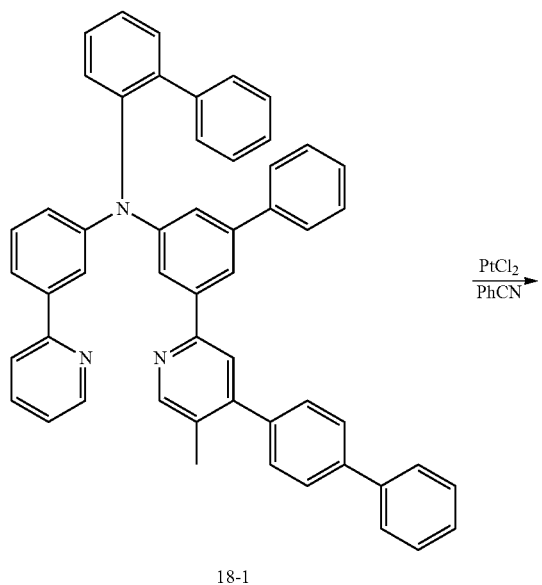

18-1

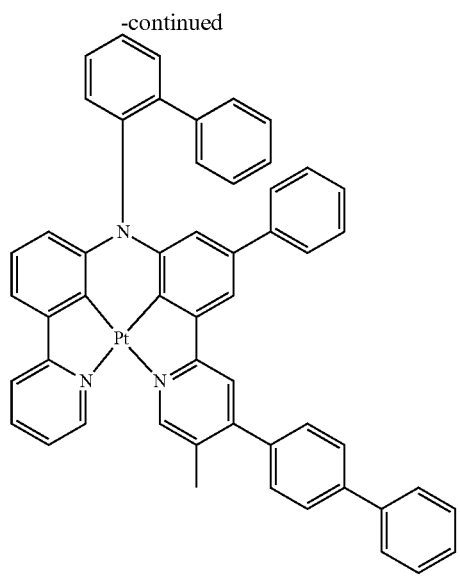

Compound 18

1.1 g (50%) of Compound 18 was synthesized in the same manner as Compound 1 in Synthesis Example 1, except that 1.73 g (2.41 mmol) of Intermediate 18-1 was used instead of Intermediate 1-1. Compound 18 was identified by Mass and HPLC.

HRMS (MALDI) calcd for $C_{53}H_{37}N_3Pt$: m/z 910.2635, Found: 910.2634.

Synthesis Example 8: Synthesis of Compound 21

Synthesis of Intermediate 21-2

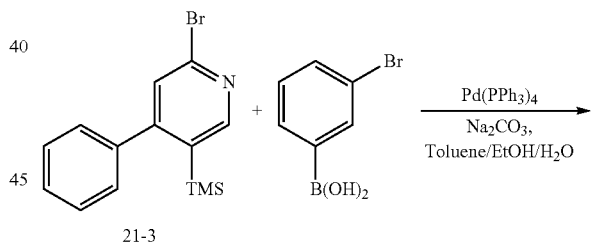

21-3

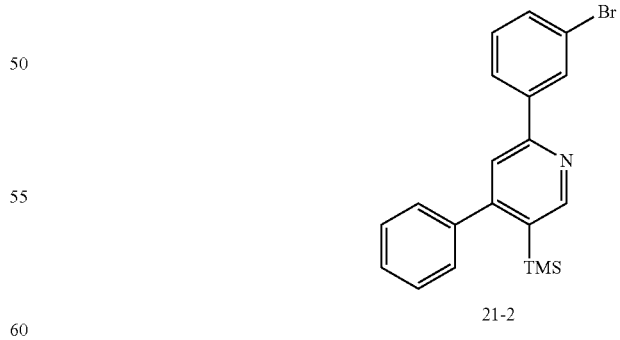

21-2

4.55 g (70%) of Intermediate 21-2 was synthesized in the same manner as Intermediate 1-2 in Synthesis Example 1, except that 2-bromo-4-phenyl-5-(trimethylsilyl)pyridine and 5.21 g (17 mmol) of Intermediate 21-3 were each used instead of 2-bromo-5-methyl-4-phenylpyridine and Intermediate 1-2.

LC-MS m/z=382 (M+H)+.

Synthesis of Intermediate 21-1

Synthesis of Compound 21

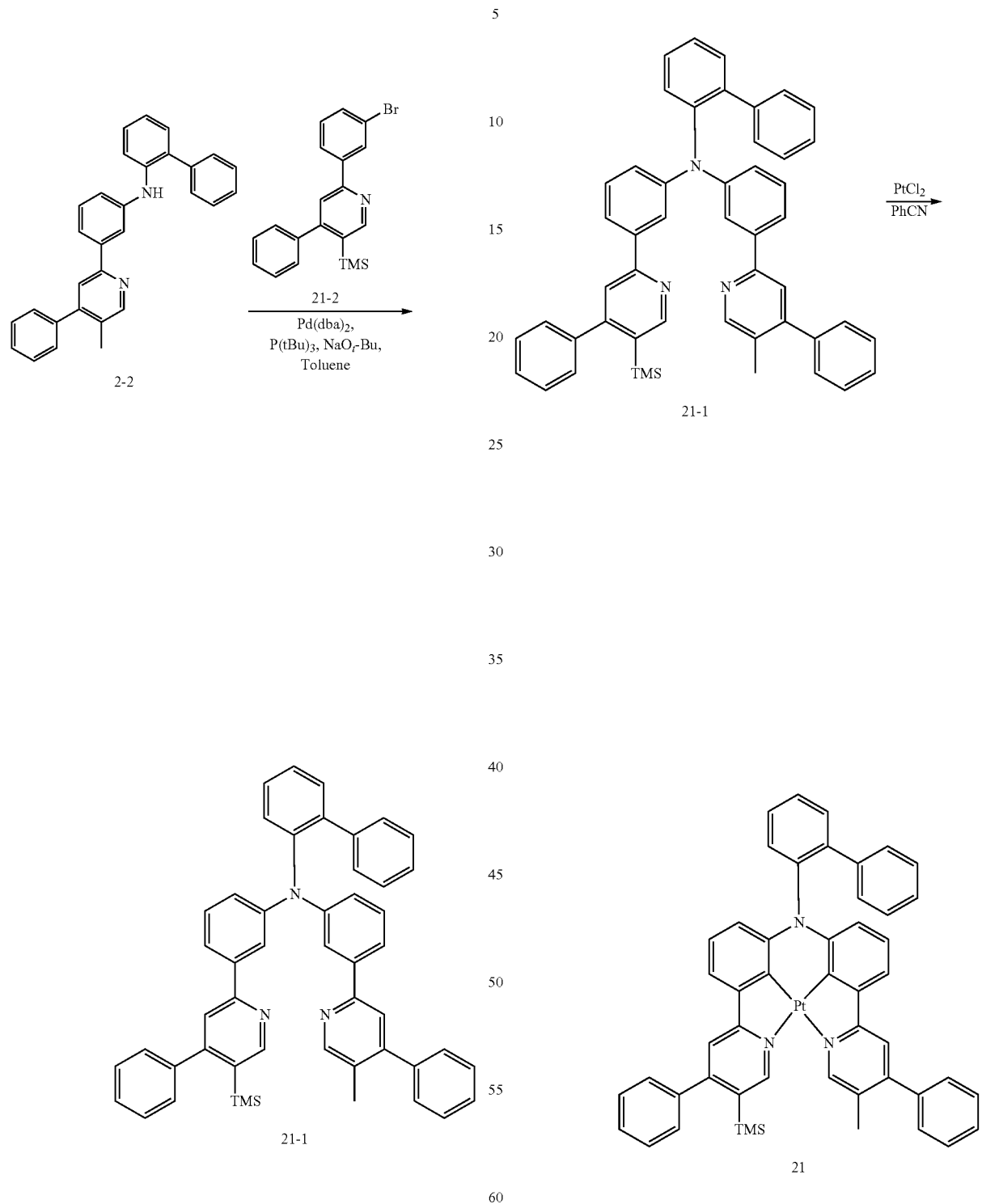

2.45 g (61%) of Intermediate 21-1 was synthesized in the same manner as Intermediate 2-1 in Synthesis Example 2, except that 2.31 g (5.60 mmol) of Intermediate 2-2 and 2.14 g (5.60 mmol) of Intermediate 21-2 were each used instead of Intermediate 2-2 and Intermediate 2-3.

LC-MS m/z=714 (M+H)+.

1.10 g (37%) of Compound 21 was synthesized in the same manner as Compound 1 in Synthesis Example 1, except that 2.31 g (3.31 mmol) of Intermediate 21-1 was used instead of Intermediate 1-1. Compound 21 was identified by Mass and HPLC.

HRMS (MALDI) calcd for $C_{48}H_{35}N_3Pt$: m/z 848.2479, Found: 848.2478.
Synthesis Example 9: Synthesis of Compound 26
Synthesis of Intermediate 26-1
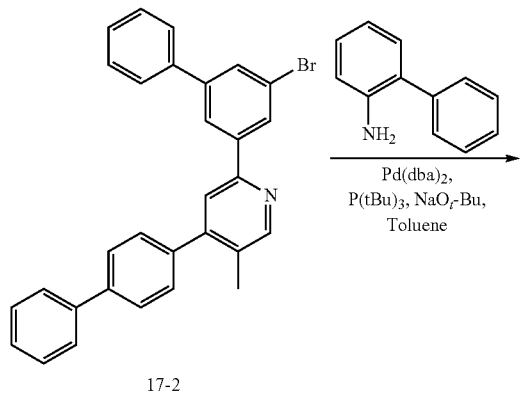
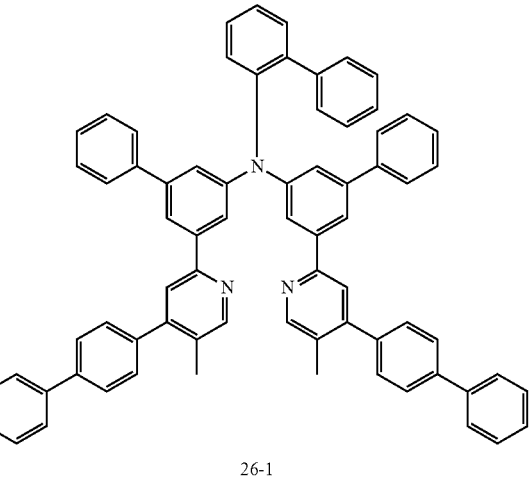
26-1
2.04 g (61%) of Intermediate 26-1 was synthesized in the same manner as Intermediate 1-1 in Synthesis Example 1, except that 4.06 g (8.52 mmol) of Intermediate 17-2 was used instead of Intermediate 1-2.
LC-MS m/z=960 $(M+H)^+$.
Synthesis of Compound 26
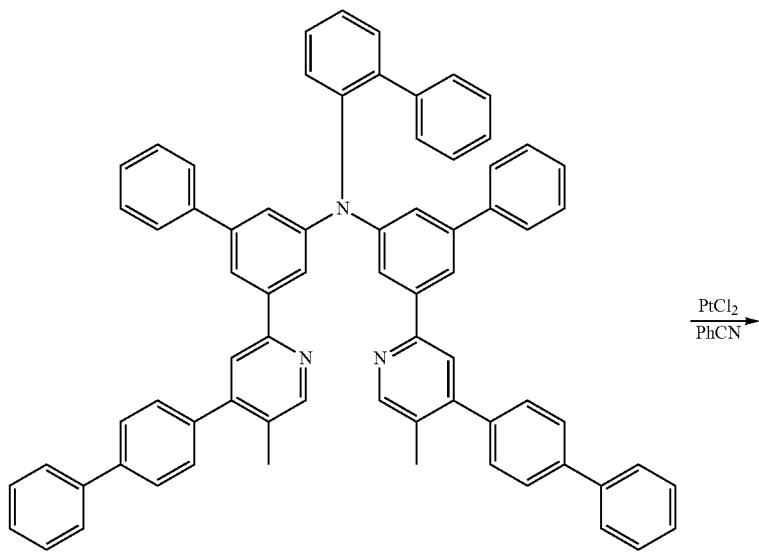
26-1

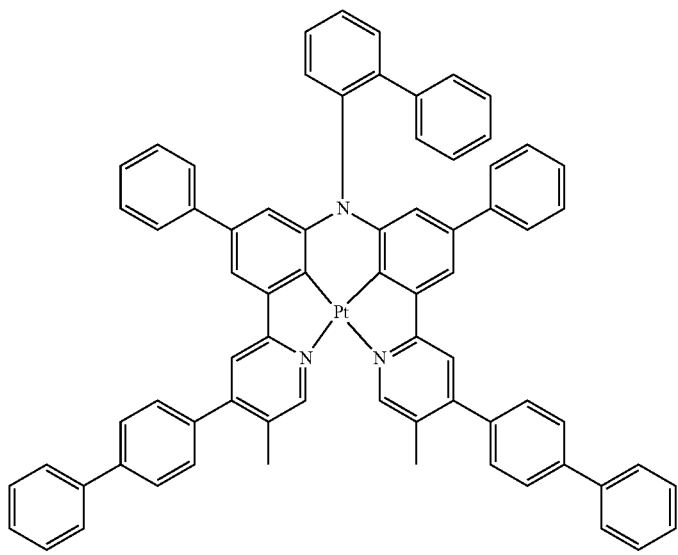

Compound 26

0.70 g (43%) of Compound 26 was synthesized in the same manner as Compound 1 in Synthesis Example 1, except that 1.34 g (1.4 mmol) of Intermediate 26-1 was used instead of Intermediate 1-1. Compound 26 was identified by Mass and HPLC.

HRMS (MALDI) calcd for $C_{72}H_{51}N_3Pt$: m/z 1152.3731, Found: 1152.3732.

Synthesis Example 10: Synthesis of Compound 55

Synthesis of Intermediate 55-2

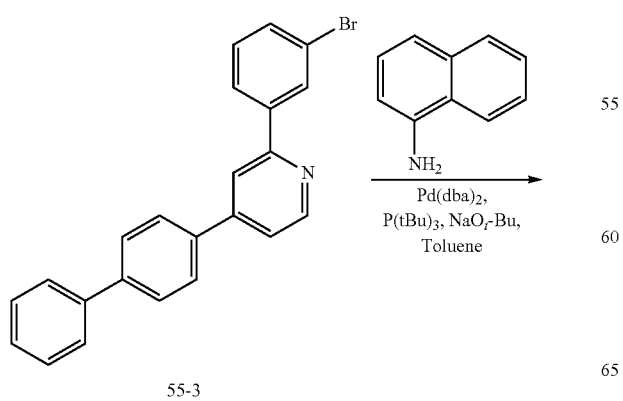

55-3

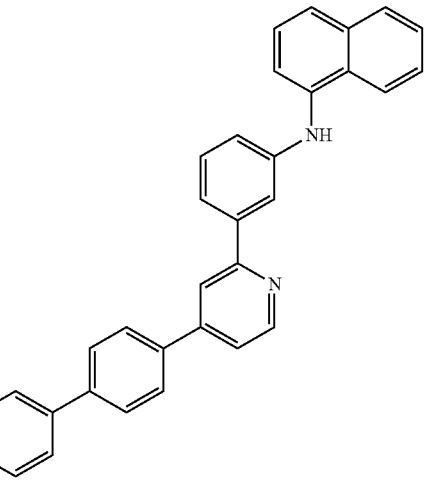

55-2

4.54 g (63%) of Intermediate 55-2 was synthesized in the same manner as Intermediate 2-2 in Synthesis Example 2, except that 4.62 g (12 mmol) of Intermediate 55-3 and 2.69 g (15.0 mmol) of naphthalen-1-amine were each used instead of Intermediate 1-2 and [1,1'-biphenyl]-2-amine.

LC-MS m/z=478 $(M+H)^+$.

Synthesis of Intermediate 55-1

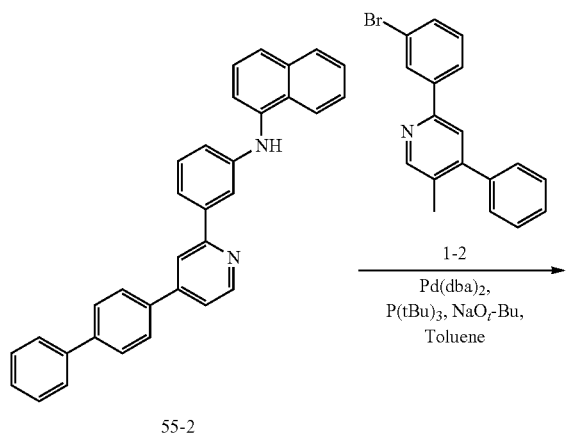

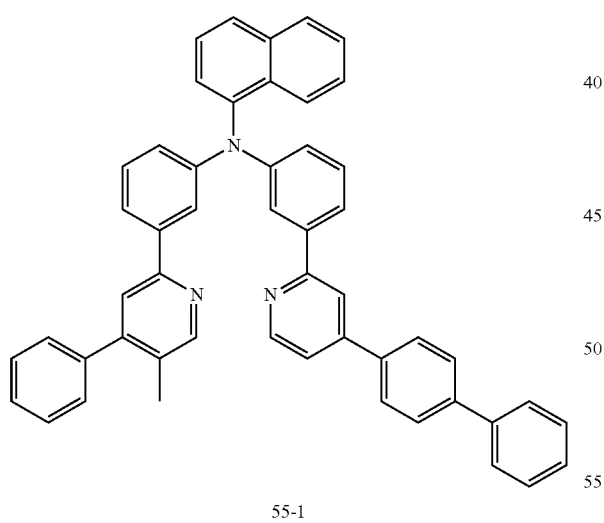

1.41 g (60%) of Intermediate 55-1 was synthesized in the same manner as Intermediate 2-1 in Synthesis Example 2, except that 1.53 g (3.40 mmol) of Intermediate 55-2 and 1.43 g (4.42 mmol) of Intermediate 1-2 were each used instead of Intermediate 2-2 and Intermediate 2-3.

LC-MS m/z=692 (M+H)$^+$.

Synthesis of Compound 55

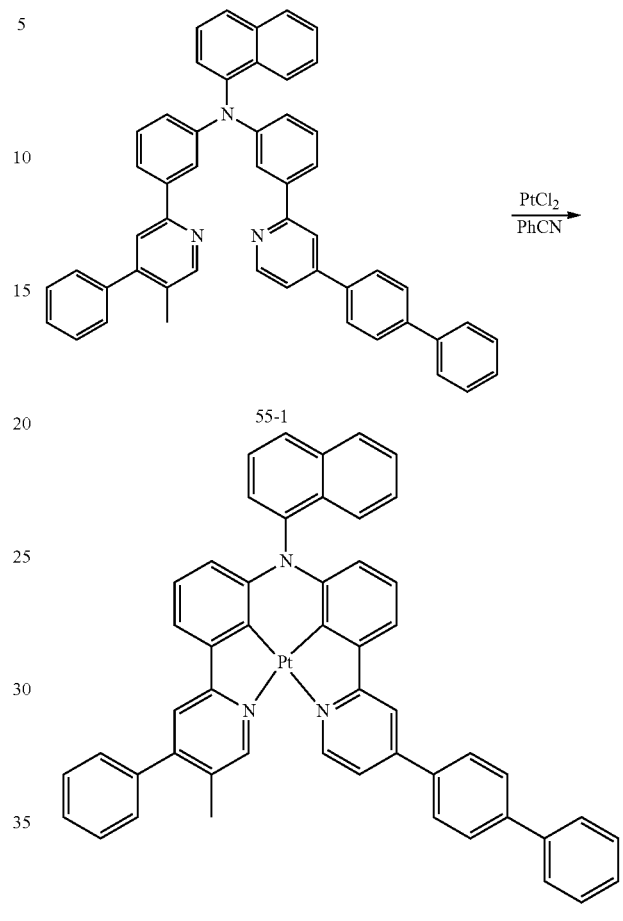

0.7 g (26%) of Compound 55 was synthesized in the same manner as Compound 1 in Synthesis Example 1, except that 2.11 g (3.05 mmol) of Intermediate 55-1 was used instead of Intermediate 1-1. Compound 55 was identified by Mass and HPLC.

HRMS (MALDI) calcd for $C_{51}H_{35}N_3Pt$: m/z 884.2479, Found: 884.2478.

Synthesis Example 11: Synthesis of Compound 59

Synthesis of Intermediate 59-1

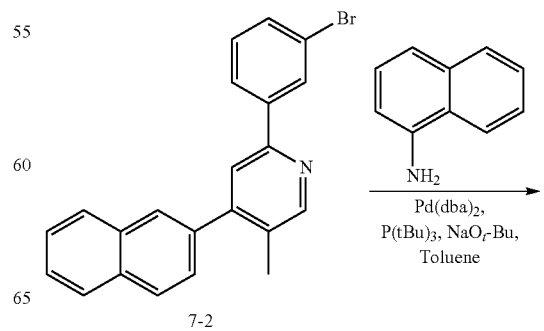

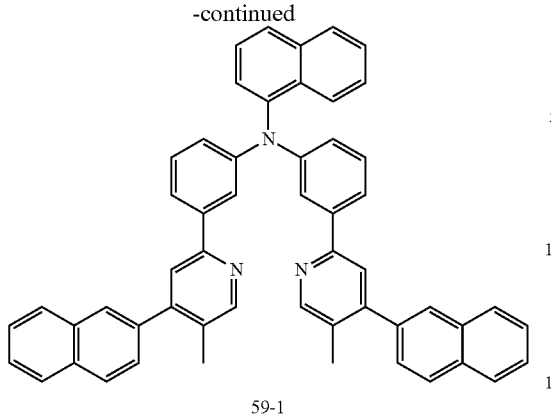

59-1

1.80 g (57%) of Intermediate 59-1 was synthesized in the same manner as Intermediate 1-1 in Synthesis Example 1, except that Intermediate 7-2 and 0.72 g (4.00 mmol) of naphthalen-1-amine were each used instead of Intermediate 1-2 and [1,1'-biphenyl]-2-amine.

LC-MS m/z=782 (M+H)$^+$.

Synthesis of Compound 59

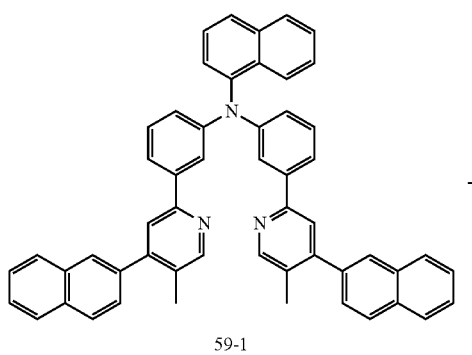

59-1

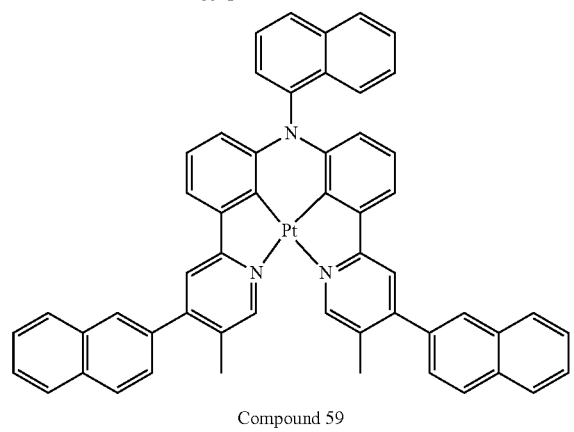

Compound 59

0.60 g (49%) of Compound 59 was synthesized in the same manner as Compound 1 in Synthesis Example 1, except that 0.98 g (1.25 mmol) of Intermediate 59-1 was used instead of Intermediate 1-1. Compound 59 was identified by Mass and HPLC.

HRMS (MALDI) calcd for $C_{54}H_{37}N_3Pt$: m/z 922.2635, Found: 922.2634.

Synthesis Example 12: Synthesis of Compound 78

Synthesis of Intermediate 78-1

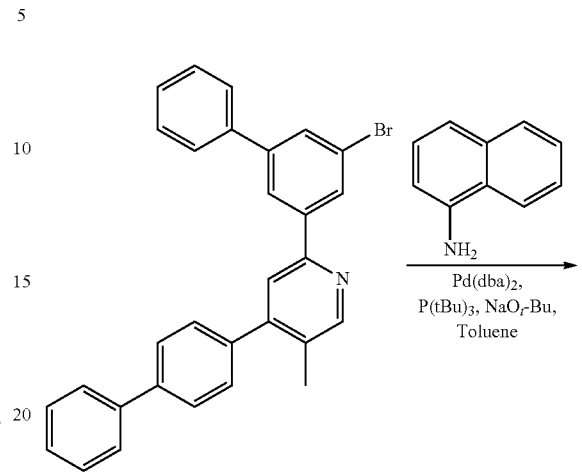

17-2

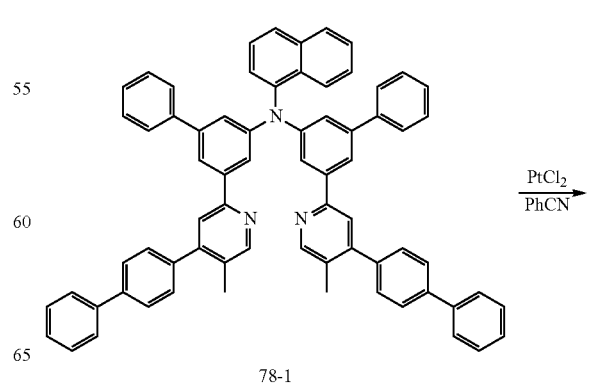

78-1

1.80 g (86%) of Intermediate 78-1 was synthesized in the same manner as Intermediate 1-1 in Synthesis Example 1, except that 2.35 g (4.96 mmol) of Intermediate 17-2 and 0.40 g (2.44 mmol) of naphthalen-1-amine were each used instead of Intermediate 1-2 and [1,1'-biphenyl]-2-amine.

LC-MS m/z=935 (M+H)$^+$.

Synthesis of Compound 78

78-1

201
-continued

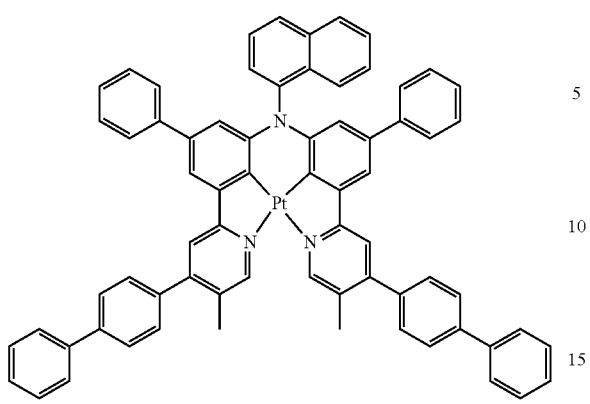

Compound 78

1.3 g (62%) of Compound 78 was synthesized in the same manner as Compound 1 in Synthesis Example 1, except that 1.74 g (1.86 mmol) of Intermediate 78-1 was used instead of Intermediate 1-1. Compound 78 was identified by Mass and HPLC.

HRMS (MALDI) calcd for $C_{70}H_{49}N_3Pt$: m/z 1126.3574, Found: 1126.3572.

Synthesis Example 13: Synthesis of Compound 127

Synthesis of Intermediate 127-1

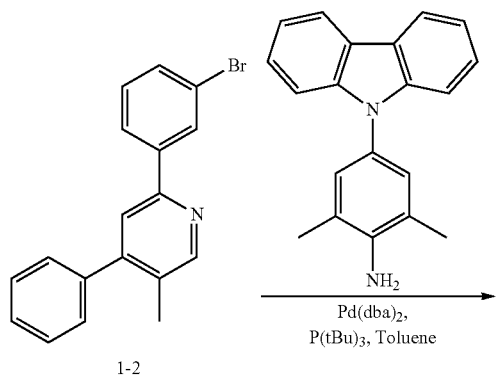

202
-continued

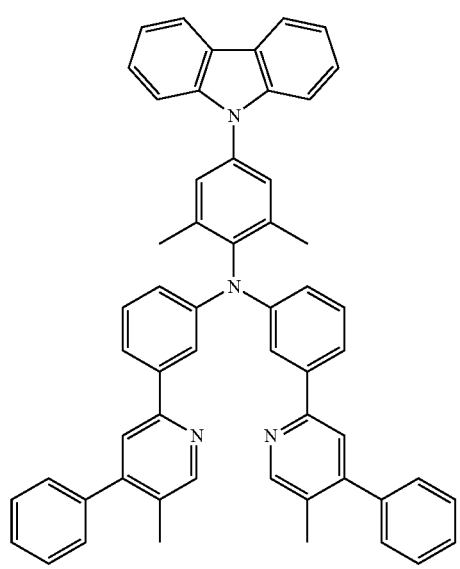

127-1

1.80 g (45%) of Intermediate 127-1 was synthesized in the same manner as Intermediate 1-1 in Synthesis Example 1, except that 1.47 g (5.18 mmol) of 4-(9H-carbazol-9-yl)-2,6-dimethylaniline was used instead of [1,1'-biphenyl]-2-amine.

LC-MS m/z=773 (M+H)$^+$.

Synthesis of Compound 127

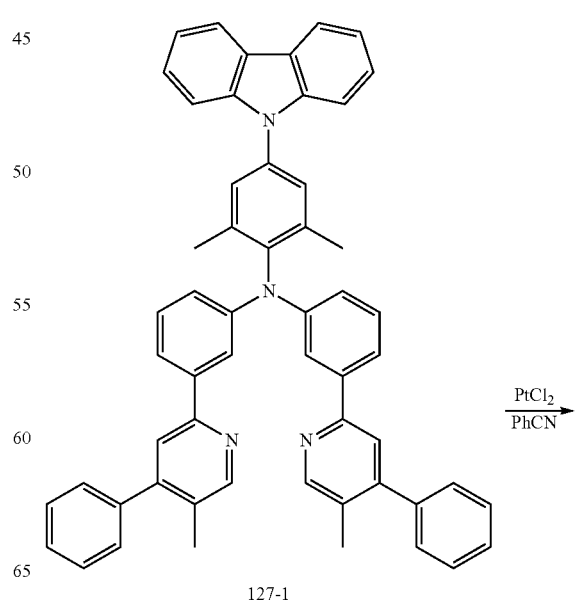

127-1

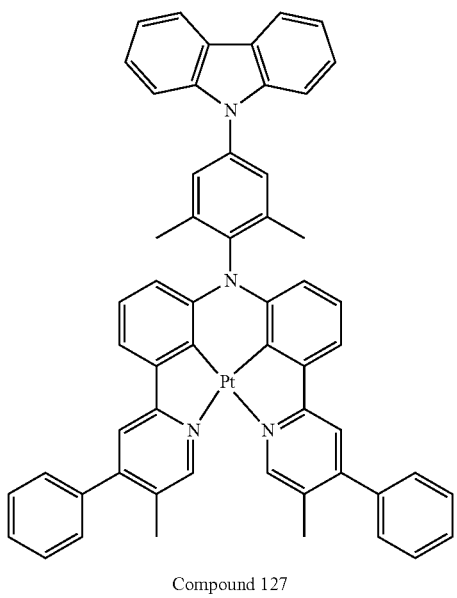

Compound 127

0.80 g (38%) of Compound 127 was synthesized in the same manner as Compound 1 in Synthesis Example 1, except that 1.73 g (2.24 mmol) of Intermediate 127-1 was used instead of Intermediate 1-1. Compound 127 was identified by Mass and HPLC.

HRMS (MALDI) calcd for $C_{55}H_{42}N_3Pt$: m/z 965.3057, Found: 965.3053.

Synthesis Example 14: Synthesis of Compound 155

Synthesis of Intermediate 155-1

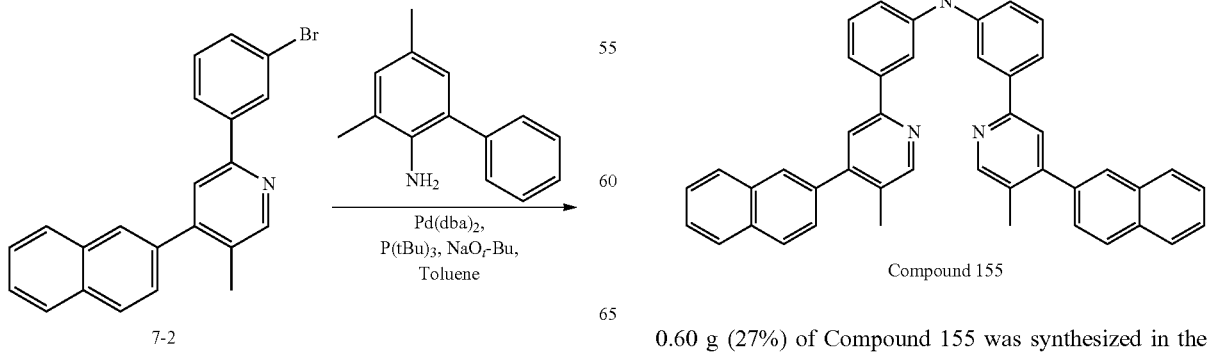

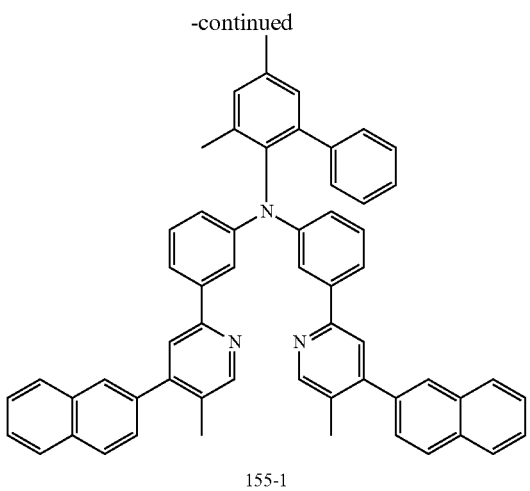

155-1

2.00 g (53%) of Intermediate 155-1 was synthesized in the same manner as Intermediate 1-1 in Synthesis Example 1, except that Intermediate 7-2 and 0.947 g (4.80 mmol) of 3,5-dimethyl-[1,1'-biphenyl]-2-amine were each used instead of Intermediate 1-2 and [1,1'-biphenyl]-2-amine.
LC-MS m/z=785 (M+H)⁺.

Synthesis of Compound 155

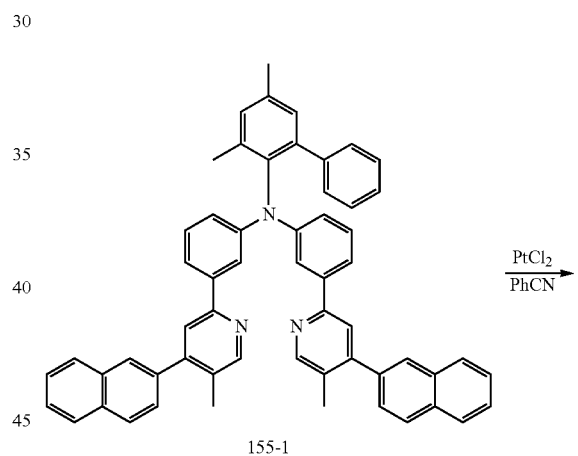

155-1

Compound 155

0.60 g (27%) of Compound 155 was synthesized in the same manner as Compound 1 in Synthesis Example 1, except that 1.83 g (2.30 mmol) of Intermediate 155-1 was used instead of Intermediate 1-1. Compound 155 was identified by Mass and HPLC.

HRMS (MALDI) calcd for $C_{58}H_{43}N_3Pt$: m/z 976.3105, Found: 976.3101.

Example 1

As an anode, a glass substrate, on which ITO/Ag/ITO were respectively deposited to have thicknesses of 70 Å/1,000 Å/70 Å, was cut to a size of 50 mm×50 mm×0.5 mm (mm=millimeters), sonicated with iso-propyl alcohol and pure water each for 5 minutes, and then cleaned by exposure to ultraviolet (UV) rays and ozone for 30 minutes. Then, the glass substrate was provided to a vacuum deposition apparatus.

2-TNATA was deposited on the anode to form a hole injection layer having a thickness of 600 Å, and 4,4'-bis[N-(1-naphthyl)-N-phenylamino]biphenyl (NPB) was deposited on the hole injection layer to form a hole transport layer having a thickness of 1,350 Å.

CBP (host) and Compound 1 (dopant) were co-deposited on the hole transport layer at a weight ratio of 98:2 to form an emission layer having a thickness of 400 Å, and BCP was deposited on the emission layer to form a hole blocking layer having a thickness of 50 Å. Then, $Alq_3$ was deposited on the hole blocking layer to form an electron transport layer having a thickness of 350 Å, LiF was deposited on the electron transport layer to form an electron injection layer having a thickness of 10 Å, and MgAg was deposited on the electron injection layer at a weight ratio of 90:10 to form a cathode having a thickness of 120 Å, thereby completing the manufacture of an organic light-emitting device.

Examples 2 to 14 and Comparative Examples 1 to 3

Organic light-emitting devices were manufactured in the same manner as in Example 1, except that Compounds shown in Table 2 were each used instead of Compound 1 as a dopant in forming an emission layer.

Evaluation Example 1: Evaluation of Characteristics of Organic Light-Emitting Devices The driving voltage, quantum emission efficiency, lifespan characteristics, and maximum emission wavelength of organic light-emitting devices manufactured according to Examples 1 to 14 and Comparative Examples 1 to 3 were evaluated by using a current-voltage meter (Keithley 2400) and a luminance meter (Minolta Cs-1000A), and results thereof are shown in Table 2. The lifespan ($T_{97}$) indicates an amount of time that lapsed when luminance was 97% of initial luminance (100%). The driving voltage, quantum emission efficiency, and lifespan of Examples 1 to 14 and Comparative Examples 1 and 2 are relative values when the driving voltage, quantum emission efficiency, and lifespan of Comparative Example 3 were 100%.

TABLE 2

| No. | Dopant compound No. | Driving voltage (%, relative value) | Quantum emission efficiency (EQE) (%, relative value) | Lifespan ($T_{97}$) (%, relative value) | Maximum emission wavelength (nm) |
|---|---|---|---|---|---|
| Example 1 | 1 | 83 | 126 | 556 | 615 |
| Example 2 | 2 | 87 | 125 | 483 | 629 |
| Example 3 | 4 | 69 | 125 | 250 | 620 |
| Example 4 | 7 | 78 | 133 | 500 | 621 |
| Example 5 | 9 | 78 | 136 | 556 | 623 |
| Example 6 | 17 | 88 | 126 | 400 | 617 |
| Example 7 | 18 | 70 | 123 | 294 | 618 |
| Example 8 | 21 | 75 | 123 | 211 | 623 |
| Example 9 | 26 | 72 | 144 | 444 | 625 |
| Example 10 | 55 | 71 | 132 | 389 | 627 |
| Example 11 | 59 | 70 | 140 | 633 | 619 |
| Example 12 | 78 | 70 | 137 | 361 | 630 |
| Example 13 | 127 | 74 | 126 | 339 | 612 |
| Example 14 | 155 | 77 | 133 | 222 | 623 |
| Comparative Example 1 | A | 84 | 122 | 170 | 607 |
| Comparative Example 2 | B | 97 | 121 | 167 | 645 |
| Comparative Example 3 | C | 100 | 100 | 100 | 604 |

TABLE 2-continued
| No. | Dopant compound No. | Driving voltage (%, relative value) | Quantum emission efficiency (EQE) (%, relative value) | Lifespan (T$_{97}$) (%, relative value) | Maximum emission wavelength (nm) |
|---|---|---|---|---|---|
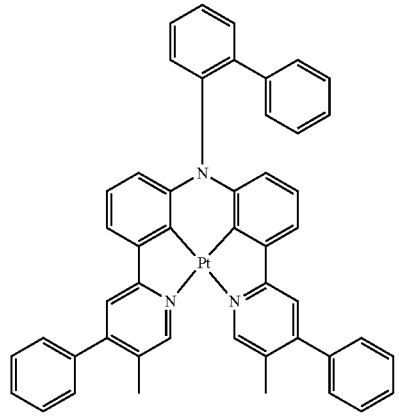
1
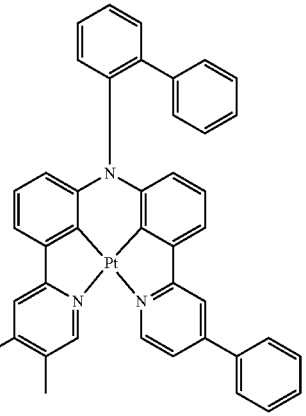
2
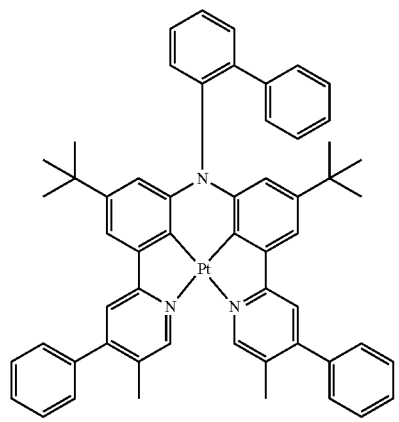
4
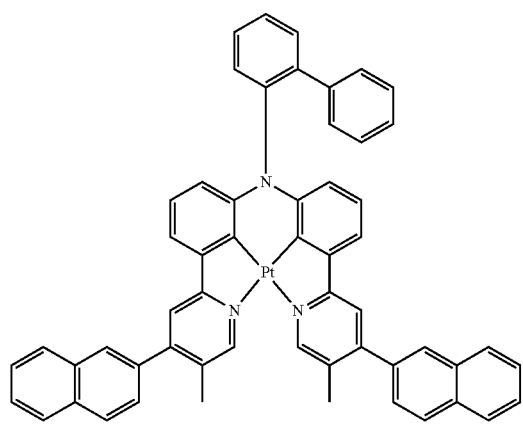
7

TABLE 2-continued

| No. | Dopant compound No. | Driving voltage (%, relative value) | Quantum emission efficiency (EQE) (%, relative value) | Lifespan ($T_{97}$) (%, relative value) | Maximum emission wavelength (nm) |
|---|---|---|---|---|---|
| | 9 | | | | |
| | 17 | | | | |
| | 18 | | | | |
| | 21 | | | | |

TABLE 2-continued
| | Dopant compound | Driving voltage | Quantum emission efficiency (EQE) | Lifespan ($T_{97}$) | Maximum emission |
|No.|No.|(%, relative value)|(%, relative value)|(%, relative value)|wavelength (nm)|
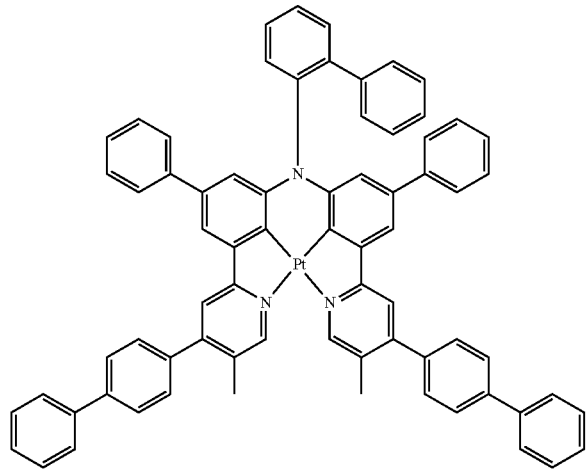
26
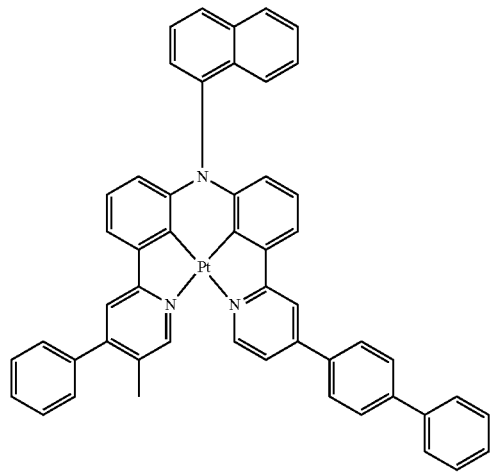
55
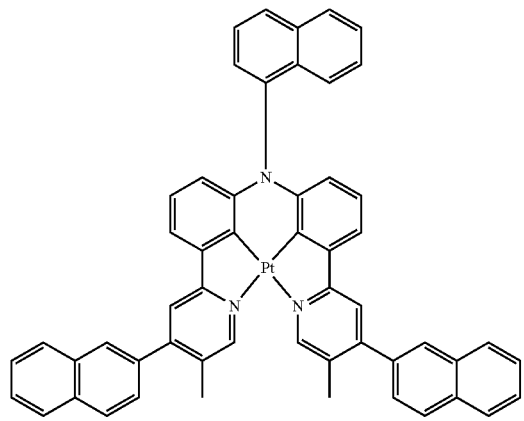
59

TABLE 2-continued
| No. | Dopant compound No. | Driving voltage (%, relative value) | Quantum emission efficiency (EQE) (%, relative value) | Lifespan (T$_{97}$) (%, relative value) | Maximum emission wavelength (nm) |
|---|---|---|---|---|---|
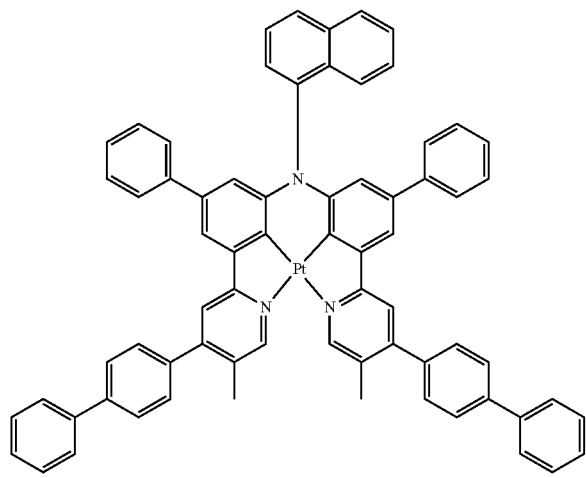
78
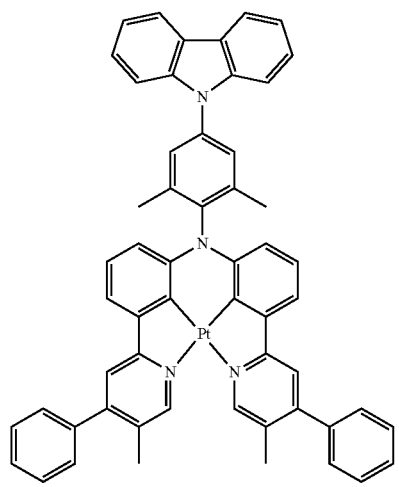
127
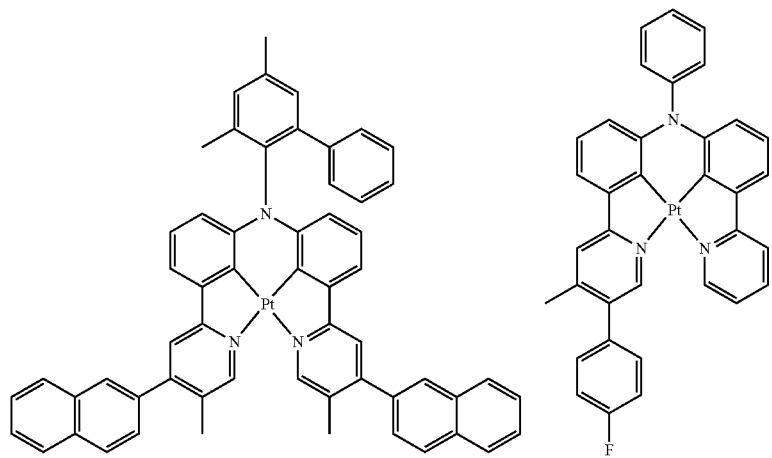
155
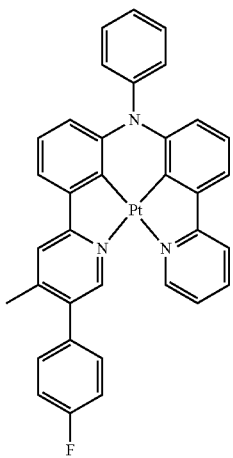
A

TABLE 2-continued

| No. | Dopant compound No. | Driving voltage (%, relative value) | Quantum emission efficiency (EQE) (%, relative value) | Lifespan (T$_{97}$) (%, relative value) | Maximum emission wavelength (nm) |
|---|---|---|---|---|---|

[Structures B and C shown]

Referring to Table 2, it has been determined that the organic light-emitting devices of Examples 1 to 14 have improved driving voltage, quantum emission efficiency, and lifespan characteristics, as compared with those of the organic light-emitting devices of Comparative Examples 1 to 3.

Since the organometallic compounds have excellent electrical characteristics and thermal stability, organic light-emitting devices including such organometallic compounds may have excellent driving voltage, efficiency, power, color purity, and lifespan characteristics. Also, due to excellent phosphorescent luminescence characteristics, such organometallic compounds may provide a diagnostic composition having high diagnostic efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope of the present description as defined by the following claims.

What is claimed is:

1. An organometallic compound represented by Formula 1:

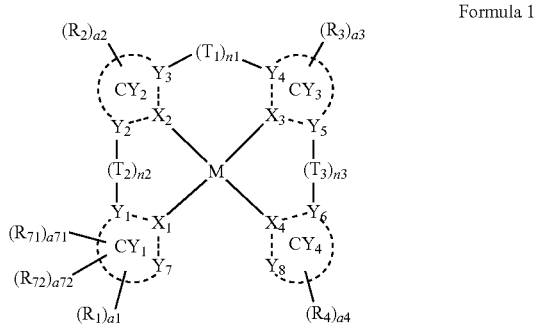

Formula 1 wherein, in Formula 1,

M is a first-row transition metal of the Periodic Table of Elements, a second-row transition metal of the Periodic Table of Elements, or a third-row transition metal of the Periodic Table of Elements, $X_1$ is N, $X_2$ to $X_4$ are each independently C or N, two bonds selected from a bond between $X_1$ and M, a bond between $X_2$ and M, a bond between $X_3$ and M, and a bond between $X_4$ and M are each a coordinate bond, and the others thereof are each a covalent bond, $Y_1$ to $Y_6$ are each independently C or N, $Y_7$ and $Y_8$ are each independently C, N, O, Si, or S, $X_1$ and $Y_7$, $X_1$ and $Y_1$, $X_2$ and $Y_2$, $X_2$ and $Y_3$, $X_3$ and $Y_4$, $X_3$ and $Y_5$, $X_4$ and $Y_6$, and $X_4$ and $Y_8$ are each linked via a chemical bond, $CY_1$ is a $C_1$-$C_{30}$ heterocyclic group, $CY_2$ to $CY_4$ are each independently a $C_5$-$C_{30}$ carbocyclic group or a $C_1$-$C_{30}$ heterocyclic group, $T_1$ to $T_3$ are each independently selected from *—N[($L_5$)$_{b5}$-($R_5$)]—*', *—B($R_5$)—*', *—P($R_5$)—*', *—C($R_5$)($R_6$)—*', *—Si($R_5$)($R_6$)—*', *—Ge($R_5$)($R_6$)—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', and *—C≡C—*', $L_5$ is selected from a single bond, a substituted or unsubstituted $C_5$-$C_{30}$ carbocyclic group, and a substituted or unsubstituted $C_1$-$C_{30}$ heterocyclic group, b5 is selected from 1 to 3, wherein, when b5 is two or more, two or more groups $L_5$ are identical to or different from each other, $R_5$ and $R_6$ are optionally linked via a first linking group to form a substituted or unsubstituted $C_5$-$C_{30}$ carbocyclic group or a substituted or unsubstituted $C_1$-$C_{30}$ heterocyclic group, n1 to n3 are each independently 0, 1, 2, or 3, wherein, when n1 is zero, *-($T_1$)$_{n1}$—*' is a single bond, when n2 is zero, *-($T_2$)$_{n2}$-*' is a single bond, and when n3 is zero, *-($T_3$)$_{n3}$-*' is a single bond, provided that at least one of n1 to n3 is zero, $R_{71}$ in Formula 1 is a group represented by Formula 71, $$*-(L_{71})_{b71}-(T_{71})_{c71} \qquad \text{Formula 71}$$

wherein, in Formula 71, $L_{71}$ is selected from:

a $C_2$-$C_{60}$ alkylene group; and a $C_2$-$C_{60}$ alkylene group substituted with at least one selected from deuterium, a deuterated $C_1$-$C_{60}$ alkyl group, a $C_3$-$C_{10}$ cycloalkyl group, and a $C_3$-$C_{10}$ cycloalkenyl group, b71 is 0, 1, or 2, $T_{71}$ is selected from:

a $C_1$-$C_{60}$ alkyl group; and a $C_1$-$C_{60}$ alkyl group substituted with at least one selected from deuterium, a deuterated $C_1$-$C_{60}$ alkyl group, a $C_3$-$C_{10}$ cycloalkyl group, and a $C_3$-$C_{10}$ cycloalkenyl group, c71 is an integer from 1 to 10, $R_{72}$ in Formula 1 is a group represented by Formula 72, $$*-(L_{72})_{b72}-(T_{72})_{c72}, \qquad \text{Formula 72}$$

wherein, in Formula 72, $L_{72}$ is selected from:

a $C_6$-$C_{60}$ arylene group, a $C_1$-$C_{60}$ heteroarylene group, a divalent non-aromatic condensed polycyclic group, and a divalent non-aromatic condensed heteropolycyclic group; and a $C_6$-$C_{60}$ arylene group, a $C_1$-$C_{60}$ heteroarylene group, a divalent non-aromatic condensed polycyclic group, and a divalent non-aromatic condensed heteropolycyclic group, each substituted with at least one selected from deuterium, a $C_1$-$C_{60}$ alkyl group, a deuterated $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, b72 is 0, 1, or 2, $T_{72}$ is selected from:

a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, a $C_1$-$C_{60}$ alkyl group, a deuterated $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, c72 is an integer from 1 to 10, wherein, in Formula 1, a71 and a72 are each independently an integer from 1 to 5, $R_1$ to $R_6$ are each independently selected from hydrogen, deuterium, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted alkyl group, a substituted or unsubstituted $C_2$-$C_{60}$ alkenyl group, a substituted or unsubstituted $C_2$-$C_{60}$ alkynyl group, a substituted or unsubstituted alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), a1 to a4 are each independently 0, 1, 2, 3, 4, or 5, Formula 1 does not include fluorine (—F), two of groups $R_1$ in the number of a1 are optionally linked to form a substituted or unsubstituted $C_5$-$C_{30}$ carbocyclic group or a substituted or unsubstituted $C_1$-$C_{30}$ heterocyclic group, two of groups $R_2$ in the number of a2 are optionally linked to form a substituted or unsubstituted $C_5$-$C_{30}$ carbocyclic group or a substituted or unsubstituted $C_1$-$C_{30}$ heterocyclic group, two of groups $R_3$ in the number of a3 are optionally linked to form a substituted or unsubstituted $C_5$-$C_{30}$ carbocyclic group or a substituted or unsubstituted $C_1$-$C_{30}$ heterocyclic group, two of groups $R_4$ in the number of a4 are optionally linked to form a substituted or unsubstituted $C_5$-$C_{30}$ carbocyclic group or a substituted or unsubstituted $C_1$-$C_{30}$ heterocyclic group, two or more neighboring groups selected from $R_1$ to $R_4$ are optionally linked to form a substituted or unsubstituted $C_5$-$C_{30}$ carbocyclic group or a substituted or unsubstituted $C_1$-$C_{30}$ heterocyclic group, one of $R_5$ and $R_6$ and one of $R_1$ to $R_4$ are optionally linked to form a substituted or unsubstituted $C_5$-$C_{30}$ carbocyclic group or a substituted or unsubstituted $C_1$-$C_{30}$ heterocyclic group, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is selected from:

deuterium, —Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

2. The organometallic compound of claim 1, wherein M is Pt or Pd.

3. The organometallic compound of claim 1, wherein $CY_1$ is selected from a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, and $CY_2$ to $CY_4$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a pyrrole group, a thiophene group, a furan group, an indole group, a benzoborol group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-on group, a dibenzothiophene 5,5-dioxide group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

4. The organometallic compound of claim 1, wherein, in Formula 1,
a moiety represented by

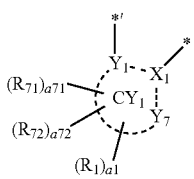

and a moiety represented by

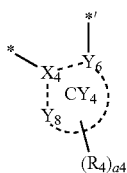

are identical to each other, and a moiety represented by

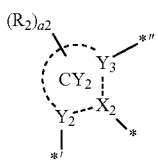

and a moiety represented by

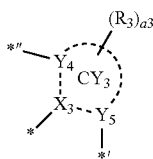

are identical to each other.

5. The organometallic compound of claim 1, wherein $T_1$ to $T_3$ are each independently selected from *—N[$(L_5)_{b5}$-($R_5$)]—*', *—C($R_5$)($R_6$)—*', *—Si($R_5$)($R_6$)—*', *—S—*', and *—O—*', and
the sum of n1, n2, and n3 is 1.

6. The organometallic compound of claim 1, wherein $L_{71}$ is selected from:
a $C_2$-$C_{10}$ alkylene group; and
a $C_2$-$C_{10}$ alkylene group substituted with at least one selected from deuterium, a deuterated $C_1$-$C_{20}$ alkyl group, a cyclopentyl group, a cyclohexyl group, a cycloheptyl group, a cyclooctyl group, an adamantanyl group, a norbonanyl group, a norbonenyl group, a cyclopentenyl group, a cyclohexenyl group, and a cycloheptenyl group,
b71 is 0 or 1,
$T_{71}$ is selected from:
a $C_1$-$C_{10}$ alkyl group; and
a $C_1$-$C_{10}$ alkyl group substituted with at least one selected from deuterium, a deuterated $C_1$-$C_{20}$ alkyl group, a cyclopentyl group, a cyclohexyl group, a cycloheptyl group, a cyclooctyl group, an adamantanyl group, a norbonanyl group, a norbonenyl group, a cyclopentenyl group, a cyclohexenyl group, and a cycloheptenyl group, and
c71 is 1 or 2.

7. The organometallic compound of claim 1, wherein $L_{72}$ is selected from:
a phenylene group, a naphthylene group, a pyridinylene group, a pyrimidinylene group, a triazinylene group, a quinolinylene group, an isoquinolinylene group, a quinoxalinylene group, a quinazolinylene group, a fluorenylene group, a carbazolylene group, a dibenzofuranylene group, and a dibenzothiophenylene group; and
a phenylene group, a naphthylene group, a pyridinylene group, a pyrimidinylene group, a triazinylene group, a quinolinylene group, an isoquinolinylene group, a quinoxalinylene group, a quinazolinylene group, a fluorenylene group, a carbazolylene group, a dibenzofuranylene group, and a dibenzothiophenylene group, each substituted with at least one selected from deuterium, a $C_1$-$C_{20}$ alkyl group, a deuterated $C_1$-$C_{20}$ alkyl group, a phenyl group, a naphthyl group, a pyridinyl group, a pyrimidinyl group, a triazinyl group, a quinolinyl group, an isoquinolinyl group, a quinoxalinyl group, a quinazolinyl group, a fluorenyl group, a carbazolyl group, a dibenzofuranyl group, and a dibenzothiophenyl group,
b72 is 0 or 1,
$T_{72}$ is selected from:
a phenyl group, a naphthyl group, a pyridinyl group, a pyrimidinyl group, a triazinyl group, a quinolinyl group, an isoquinolinyl group, a quinoxalinyl group, a quinazolinyl group, a fluorenyl group, a carbazolyl group, a dibenzofuranyl group, and a dibenzothiophenyl group; and
a phenyl group, a naphthyl group, a pyridinyl group, a pyrimidinyl group, a triazinyl group, a quinolinyl group, an isoquinolinyl group, a quinoxalinyl group, a quinazolinyl group, a fluorenyl group, a carbazolyl group, a dibenzofuranyl group, and a dibenzothiophenyl group, each substituted with at least one selected from deuterium, a $C_1$-$C_{20}$ alkyl group, a deuterated $C_1$-$C_{20}$ alkyl group, a phenyl group, a naphthyl group, a pyridinyl group, a pyrimidinyl group, a triazinyl group, a quinolinyl group, an isoquinolinyl group, a quinoxalinyl group, a quinazolinyl group, a fluorenyl group, a carbazolyl group, a dibenzofuranyl group, and a dibenzothiophenyl group, and
c72 is 1 or 2.

8. The organometallic compound of claim 1, wherein $R_1$ to $R_6$ are each independently selected from:
hydrogen, deuterium, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —Cl, —Br, —I, —$CD_3$, —$CD_2H$, —$CDH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —Cl, —Br, —I, —$CD_3$, —$CD_2H$, —$CDH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —$N(Q_{31})(Q_{32})$, and —$Si(Q_{33})(Q_{34})(Q_{35})$; and —$N(Q_1)(Q_2)$, —$Si(Q_3)(Q_4)(Q_5)$, —$B(Q_6)(Q_7)$, and —$P(=O)(Q_8)(Q_9)$, and $Q_1$ to $Q_9$ and $Q_{31}$ to $Q_{35}$ are each independently selected from:
$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

9. The organometallic compound of claim 1, wherein $R_1$ to $R_6$ are each independently selected from hydrogen, deuterium, a cyano group, a nitro group, —$CH_3$, —$CD_3$, —$CD_2H$, —$CDH_2$, —$OCH_3$, groups represented by Formulae 9-1 to 9-19, groups represented by Formulae 10-1 to 10-168, —$N(Q_1)(Q_2)$, and —$Si(Q_3)(Q_4)(Q_5)$, $R_{71}$ is selected from —$CH_3$, —$CD_3$, —$CD_2H$, —$CDH_2$, groups represented by Formulae 9-1 to 9-19, and groups represented by Formulae 10-5 to 10-8, 10-11, and 10-12, and $R_{72}$ is selected from groups represented by Formulae 10-13 to 10-152 and 10-159 to 10-168:

Formula 9-1

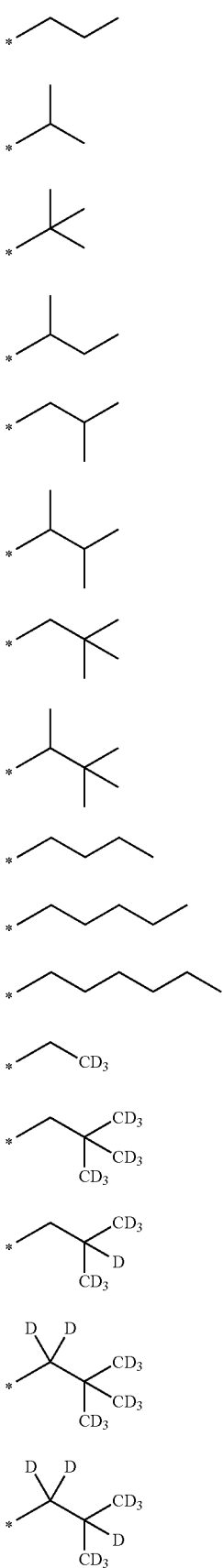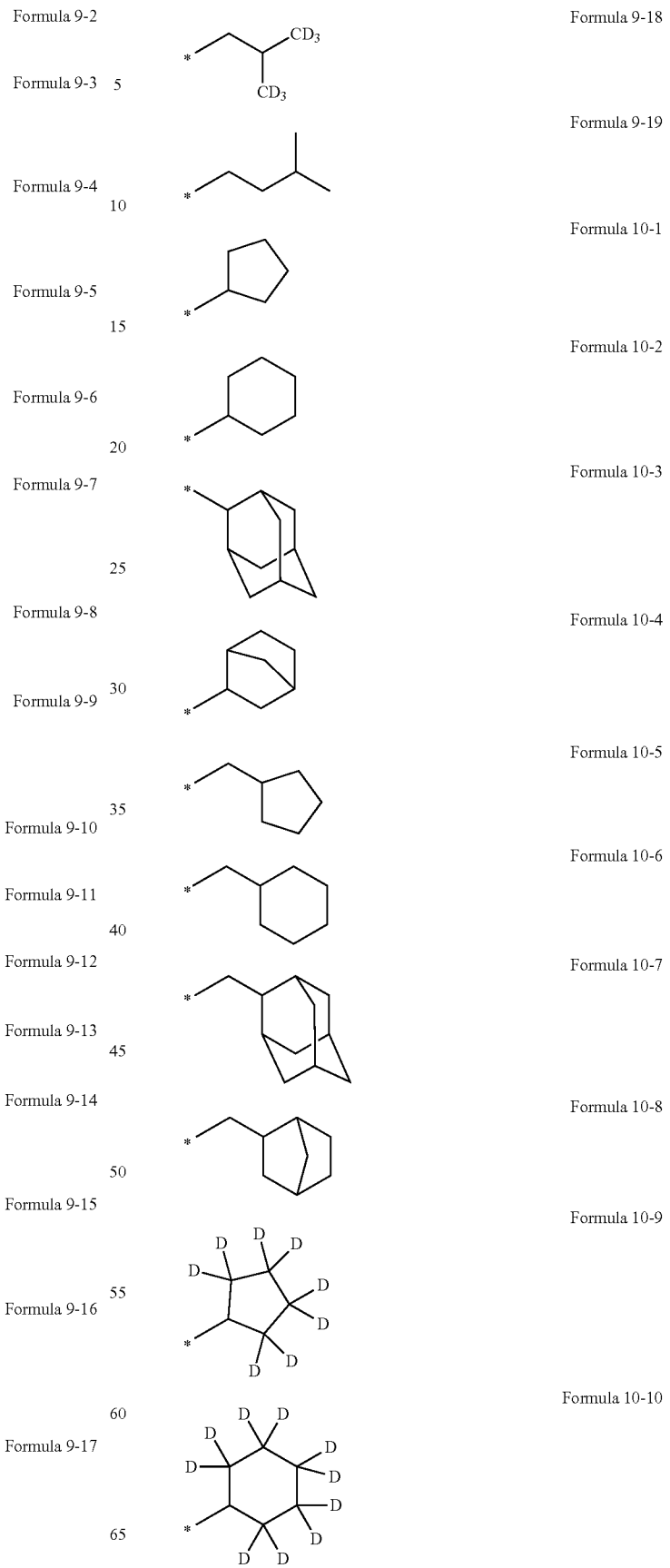

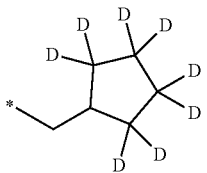
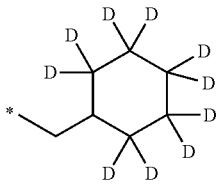
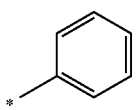
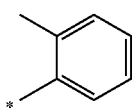
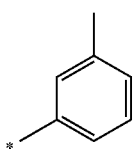
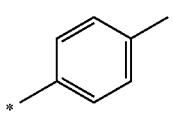
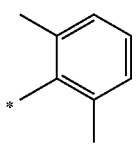
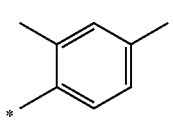
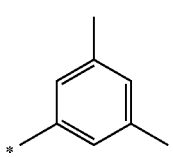
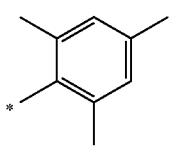
Formula 10-11
Formula 10-12
Formula 10-13
Formula 10-14
Formula 10-15
Formula 10-16
Formula 10-17
Formula 10-18
Formula 10-19
Formula 10-20
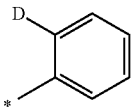
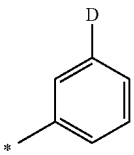
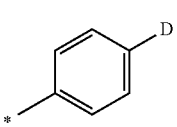
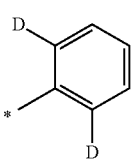
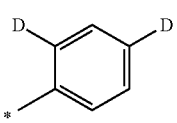
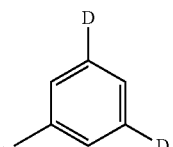
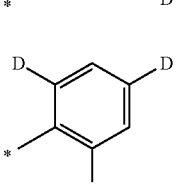
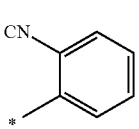
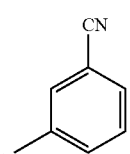
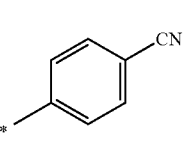
Formula 10-21
Formula 10-22
Formula 10-23
Formula 10-24
Formula 10-25
Formula 10-26
Formula 10-27
Formula 10-28
Formula 10-29
Formula 10-30

-continued
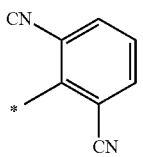
Formula 10-31
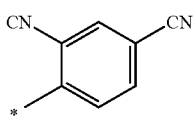
Formula 10-32
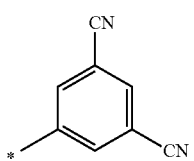
Formula 10-33
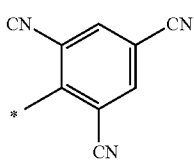
Formula 10-34
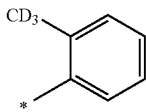
Formula 10-35
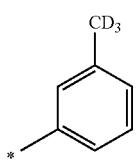
Formula 10-36
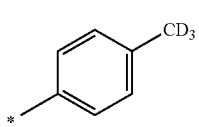
Formula 10-37
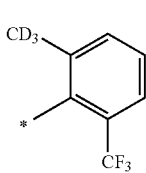
Formula 10-38
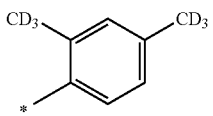
Formula 10-39
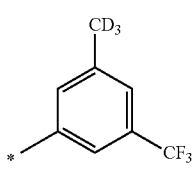
Formula 10-40
-continued
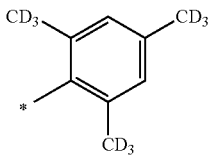
Formula 10-41
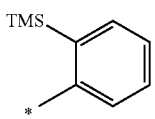
Formula 10-42
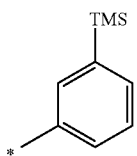
Formula 10-43
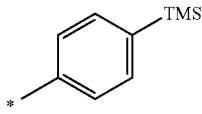
Formula 10-44
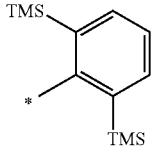
Formula 10-45
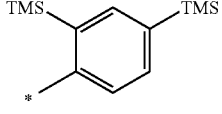
Formula 10-46
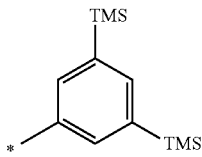
Formula 10-47
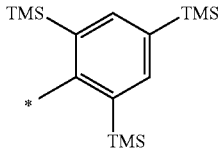
Formula 10-48
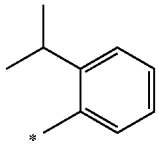
Formula 10-49
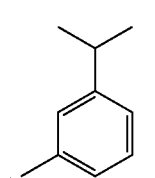
Formula 10-50
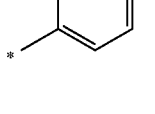

-continued
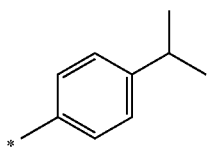
Formula 10-51
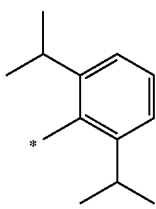
Formula 10-52
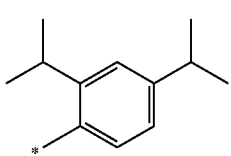
Formula 10-53
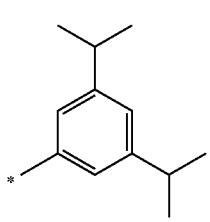
Formula 10-54
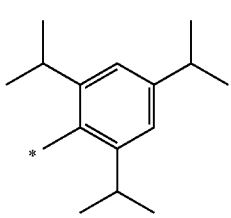
Formula 10-55
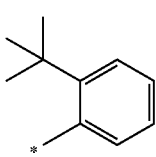
Formula 10-56
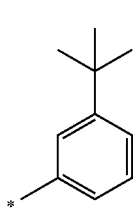
Formula 10-57
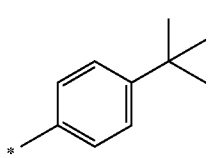
Formula 10-58
-continued
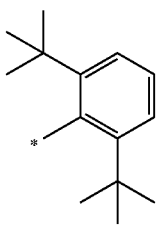
Formula 10-59
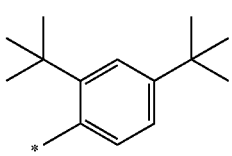
Formula 10-60
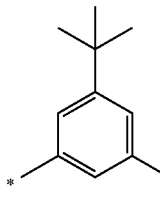
Formula 10-61
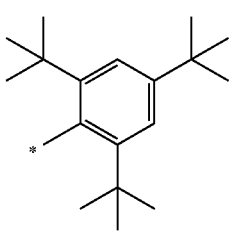
Formula 10-62
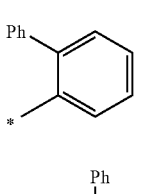
Formula 10-63
Formula 10-64
Formula 10-65
Formula 10-66
Formula 10-67

Formula 10-68
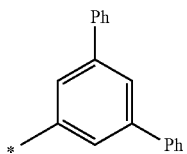
Formula 10-69
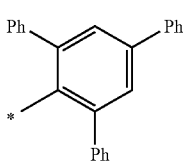
Formula 10-70
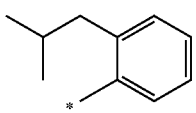
Formula 10-71
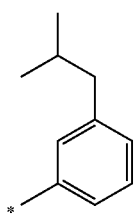
Formula 10-72
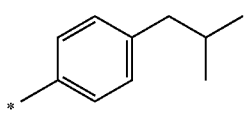
Formula 10-73
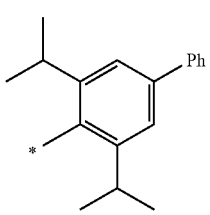
Formula 10-74
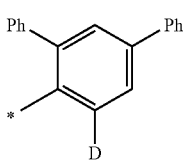
Formula 10-75
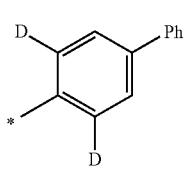
Formula 10-76
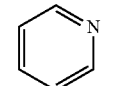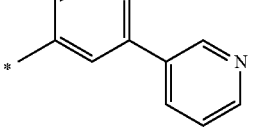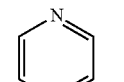
Formula 10-77
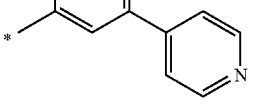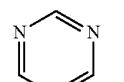
Formula 10-78
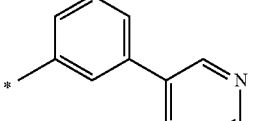
Formula 10-79
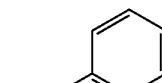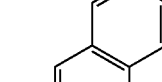
Formula 10-80
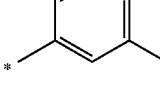

| | |
|---|---|
| 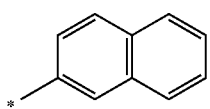 Formula 10-81 | 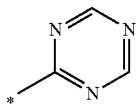 Formula 10-92 |
| 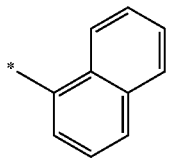 Formula 10-82 | 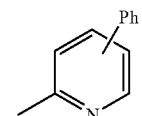 Formula 10-93 |
| 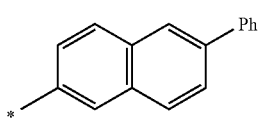 Formula 10-83 | 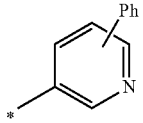 Formula 10-94 |
| 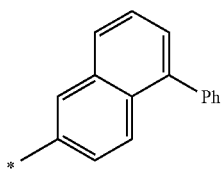 Formula 10-84 | 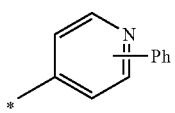 Formula 10-95 |
| 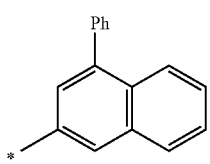 Formula 10-85 | 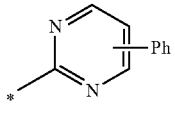 Formula 10-96 |
| 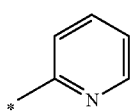 Formula 10-86 | 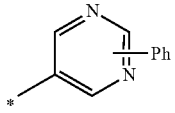 Formula 10-97 |
| 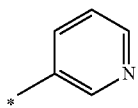 Formula 10-87 | 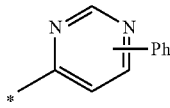 Formula 10-98 |
| 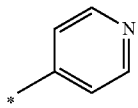 Formula 10-88 | 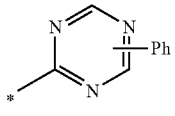 Formula 10-99 |
| 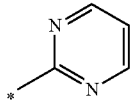 Formula 10-89 | 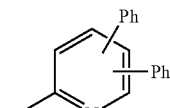 Formula 10-100 |
| 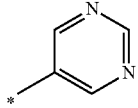 Formula 10-90 | 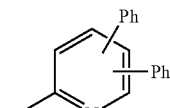 Formula 10-101 |
| 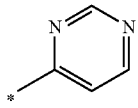 Formula 10-91 | 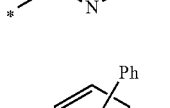 Formula 10-102 |

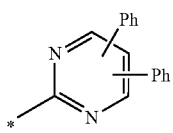
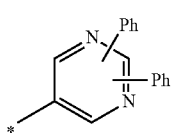
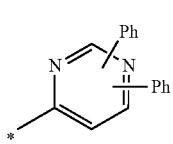
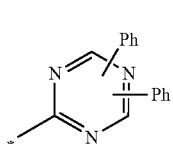
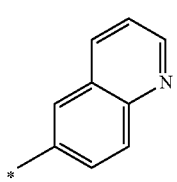
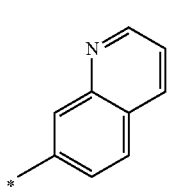
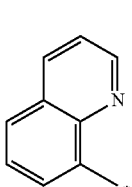
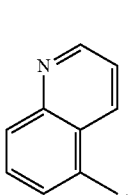
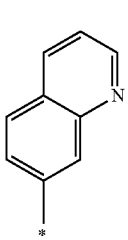
Formula 10-103
Formula 10-104
Formula 10-105
Formula 10-106
Formula 10-107
Formula 10-108
Formula 10-109
Formula 10-110
Formula 10-111
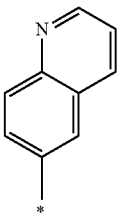
Formula 10-112
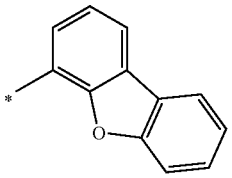
Formula 10-113
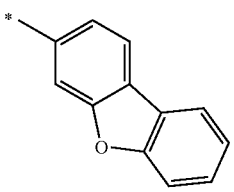
Formula 10-114
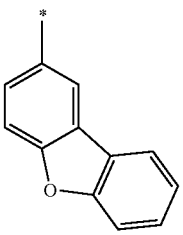
Formula 10-115
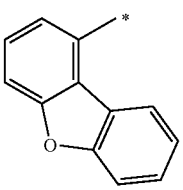
Formula 10-116
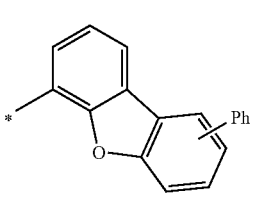
Formula 10-117
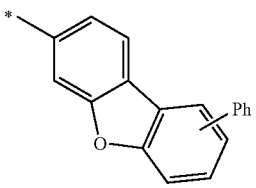
Formula 10-118

Formula 10-119

Formula 10-120

Formula 10-121

Formula 10-122

Formula 10-123

Formula 10-124

Formula 10-125

Formula 10-126

Formula 10-127

Formula 10-128

Formula 10-129

Formula 10-130

Formula 10-131

Formula 10-132

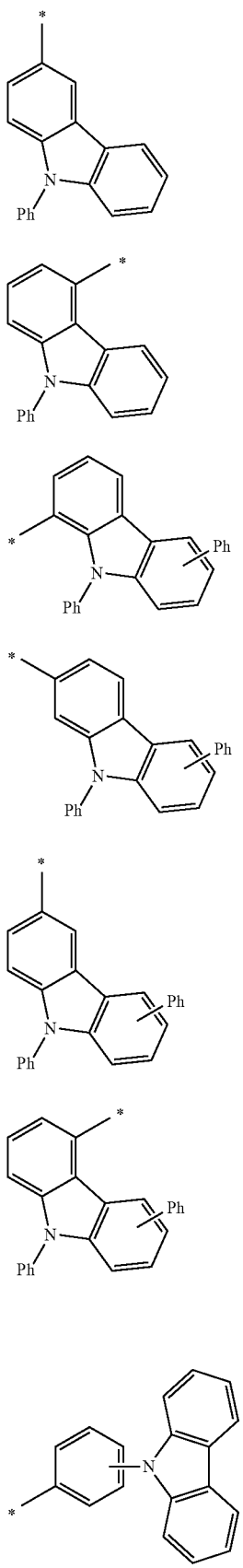
Formula 10-133
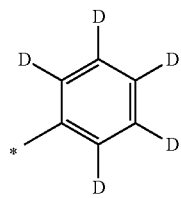
Formula 10-134
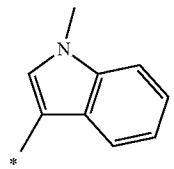
Formula 10-135
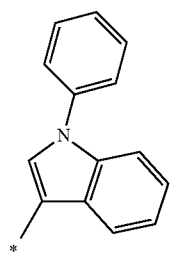
Formula 10-136
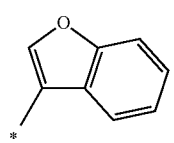
Formula 10-137
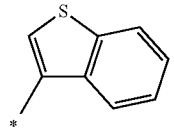
Formula 10-138
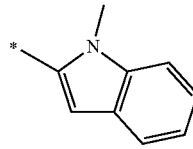
Formula 10-139
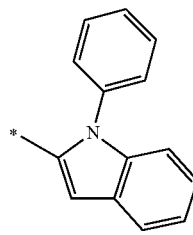
Formula 10-140
Formula 10-141
Formula 10-142
Formula 10-143
Formula 10-144
Formula 10-145
Formula 10-146
Formula 10-147
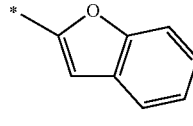
Formula 10-148
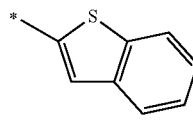

-continued
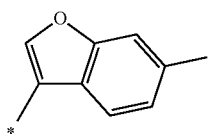
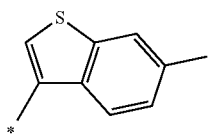
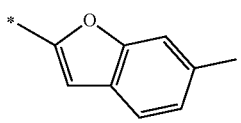
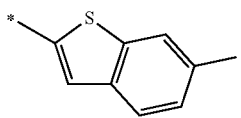
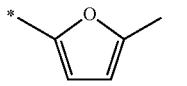
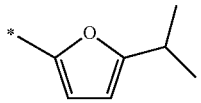
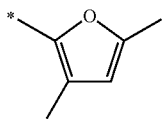
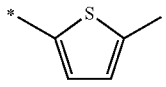
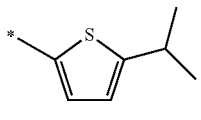
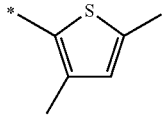
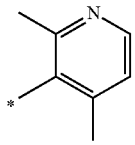
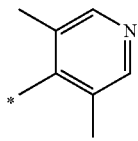
-continued
Formula 10-149
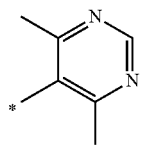
Formula 10-150
Formula 10-151
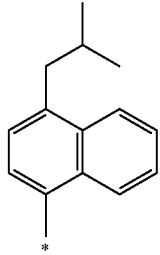
Formula 10-152
Formula 10-153
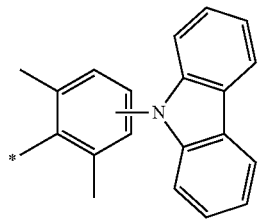
Formula 10-154
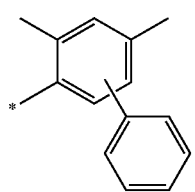
Formula 10-155
Formula 10-156
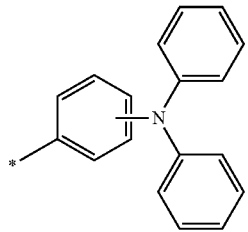
Formula 10-157
Formula 10-158
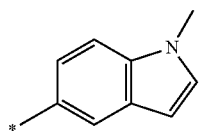
Formula 10-159
Formula 10-160
Formula 10-161
Formula 10-162
Formula 10-163
Formula 10-164
Formula 10-165
Formula 10-166
Formula 10-167
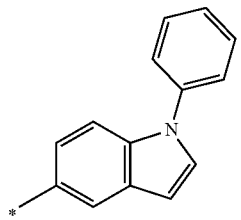

Formula 10-168

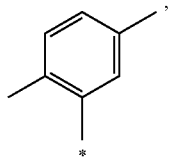

wherein, in Formulae 9-1 to 9-19 and 10-1 to 10-168, * indicates a binding site to a neighboring atom, "Ph" indicates a phenyl group, "Cz" indicates a carbazolyl group, and "TMS" indicates a trimethylsilyl group.

10. The organometallic compound of claim 1, wherein a moiety represented by

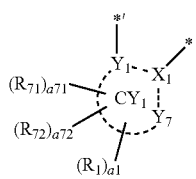

in Formula 1 is selected from groups represented by Formulae CY1-1 to CY1-6:

Formula CY1-1

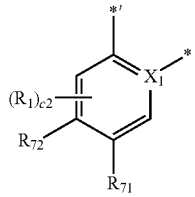

Formula CY1-2

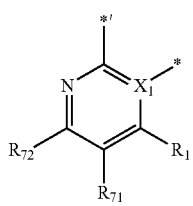

Formula CY1-3

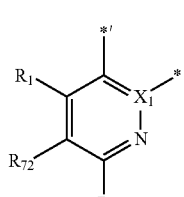

Formula CY1-4

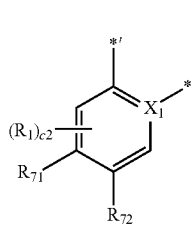

Formula CY1-5

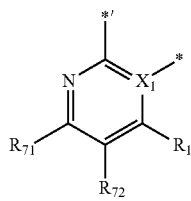

Formula CY1-6

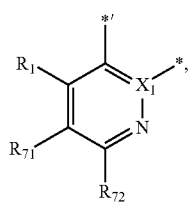

wherein, in Formulae CY1-1 to CY1-6, $X_1$, $R_{71}$, $R_{72}$, and $R_1$ are each independently the same as described in claim 1, c2 is an integer from 0 to 2, and

* and *' each indicate a binding site to a neighboring atom.

11. The organometallic compound of claim 1, wherein, a moiety represented by

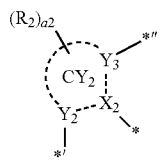

Formula 1 is selected from groups represented by Formulae CY2-1 to CY2-25:

Formula CY2-1

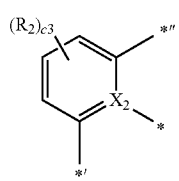

Formula CY2-2

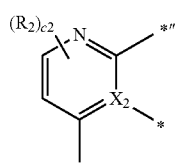

Formula CY2-3

-continued
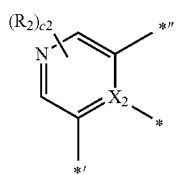
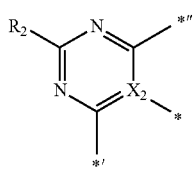
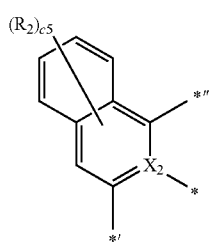
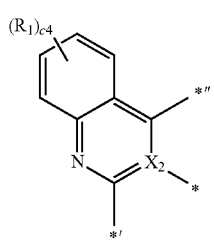
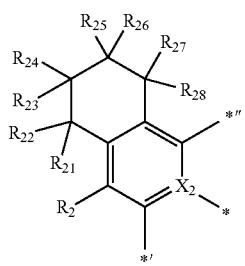
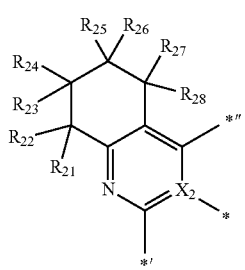
Formula CY2-4
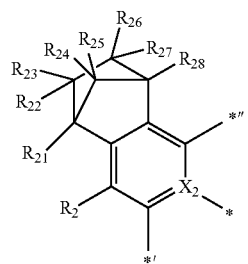
Formula CY2-5
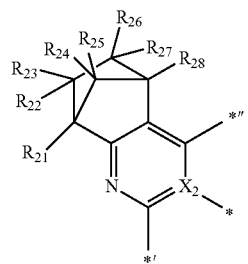
Formula CY2-6
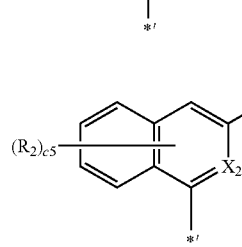
Formula CY2-7
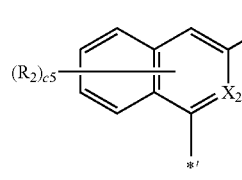
Formula CY2-8
Formula CY2-9
-continued
Formula CY2-10
Formula CY2-11
Formula CY2-12
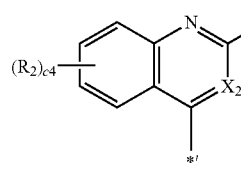
Formula CY2-13
Formula CY2-14
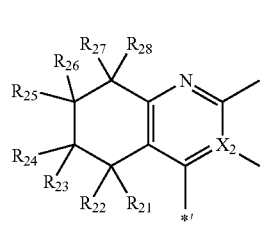
Formula CY2-15
Formula CY2-16
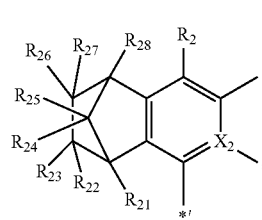

-continued

Formula CY2-17
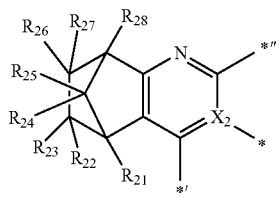

Formula CY2-18
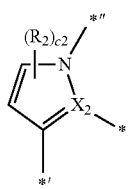

Formula CY2-19
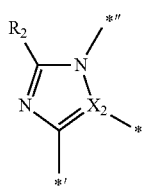

Formula CY2-20
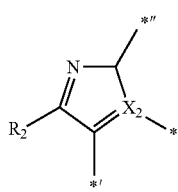

Formula CY2-21
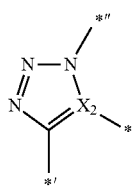

Formula CY2-22
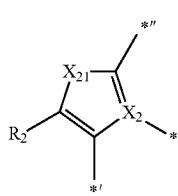

Formula CY2-23
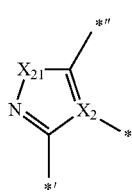

Formula CY2-24
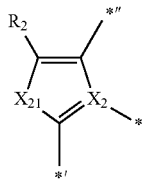

Formula CY2-25
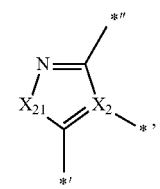

wherein, in Formulae CY2-1 to CY2-25, $X_2$ and $R_2$ are each independently the same as described in claim 1, $X_{21}$ is O, S, $N(R_{21})$, or $C(R_{21})(R_{22})$, $R_{21}$ to $R_{28}$ are each independently the same as described in connection with $R_2$ in claim 1, c5 is an integer from 0 to 5, c4 is an integer from 0 to 4, c3 is an integer from 0 to 3, c2 is an integer from 0 to 2, and

*, *', and *" each indicate a binding site to a neighboring atom.

12. The organometallic compound of claim 1, wherein a moiety represented by

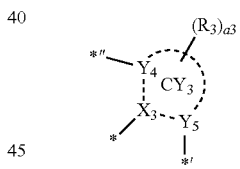

in Formula 1 is selected from groups represented by Formulae CY3-1 to CY3-25:

Formula CY3-1
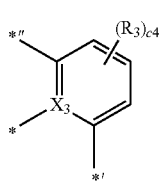

Formula CY3-2
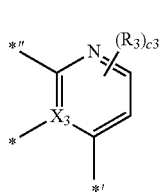

-continued
Formula CY3-3
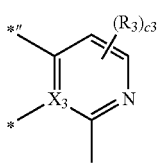
Formula CY3-4
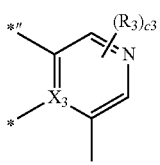
Formula CY3-5
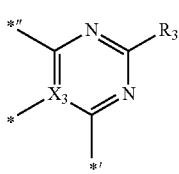
Formula CY3-6
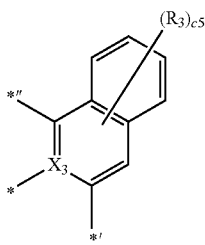
Formula CY3-7
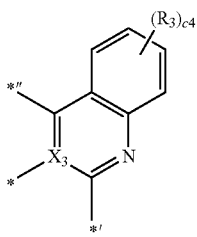
Formula CY3-8
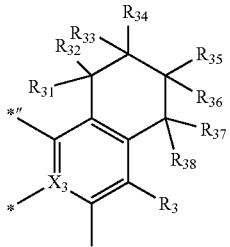
Formula CY3-9
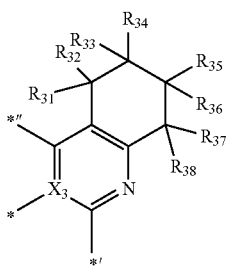
Formula CY3-10
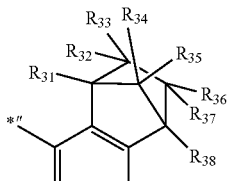
Formula CY3-11
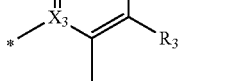
Formula CY3-12
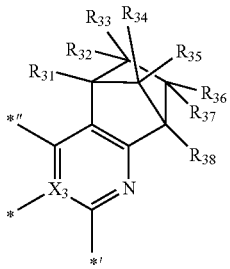
Formula CY3-13
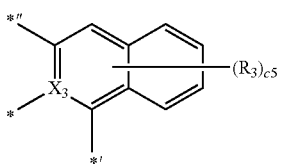
Formula CY3-14
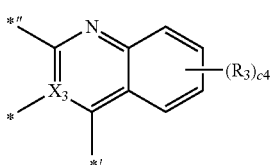
Formula CY3-15
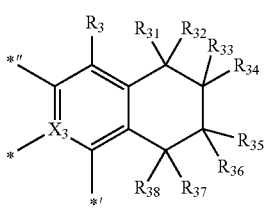
Formula CY3-16
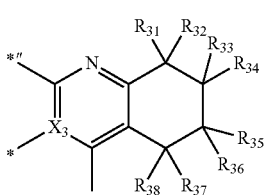

-continued

Formula CY3-17
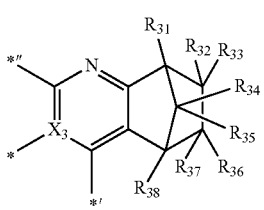

Formula CY3-18
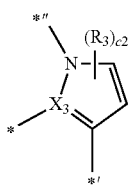

Formula CY3-19
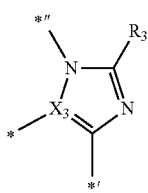

Formula CY3-20
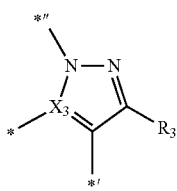

Formula CY3-21
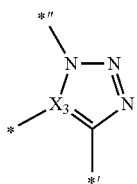

Formula CY3-22
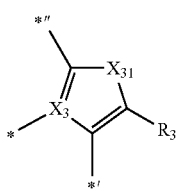

Formula CY3-23
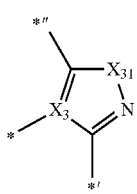

-continued

Formula CY3-24
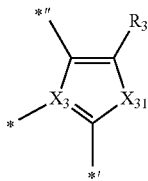

Formula CY3-25
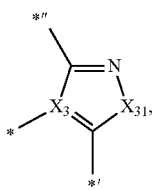

wherein, in Formulae CY3-1 to CY3-25,
$X_3$ and $R_3$ are each independently the same as described in claim 1,
$X_{31}$ is O, S, $N(R_{31})$, or $C(R_{31})(R_{32})$,
$R_{31}$ to $R_{38}$ are each independently the same as described in connection with $R_3$ in claim 1,
c5 is an integer from 0 to 5,
c4 is an integer from 0 to 4,
c3 is an integer from 0 to 3,
c2 is an integer from 0 to 2, and
*, *', and *" each indicate a binding site to a neighboring atom.

13. The organometallic compound of claim 1, wherein a moiety represented by

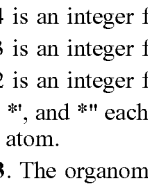

in Formula 1 is selected from groups represented by Formulae CY4-1 to CY4-35:

Formula CY4-1
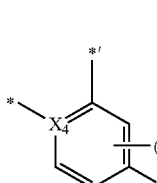

Formula CY4-2
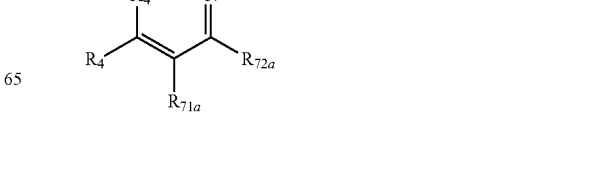

Formula CY4-3
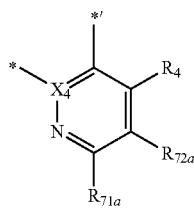
Formula CY4-4
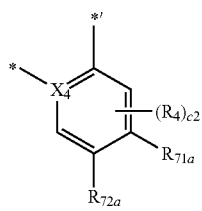
Formula CY4-5
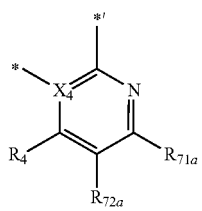
Formula CY4-6
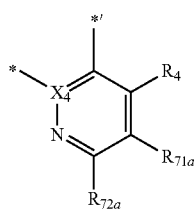
Formula CY4-7
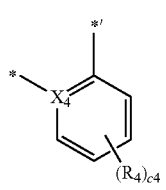
Formula CY4-8
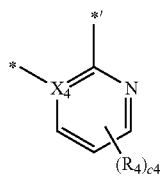
Formula CY4-9
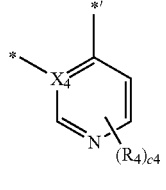
Formula CY4-10
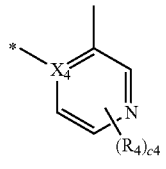
Formula CY4-11
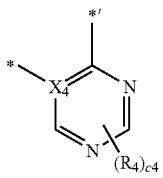
Formula CY4-12
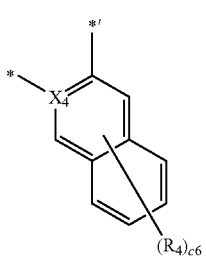
Formula CY4-13
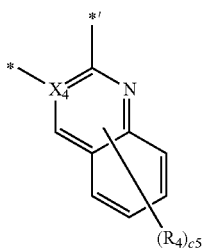
Formula CY4-14
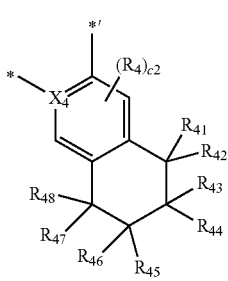
Formula CY4-15
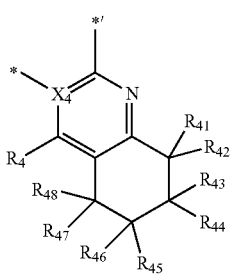
Formula CY4-16
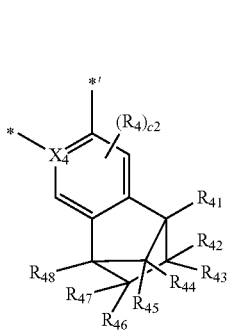

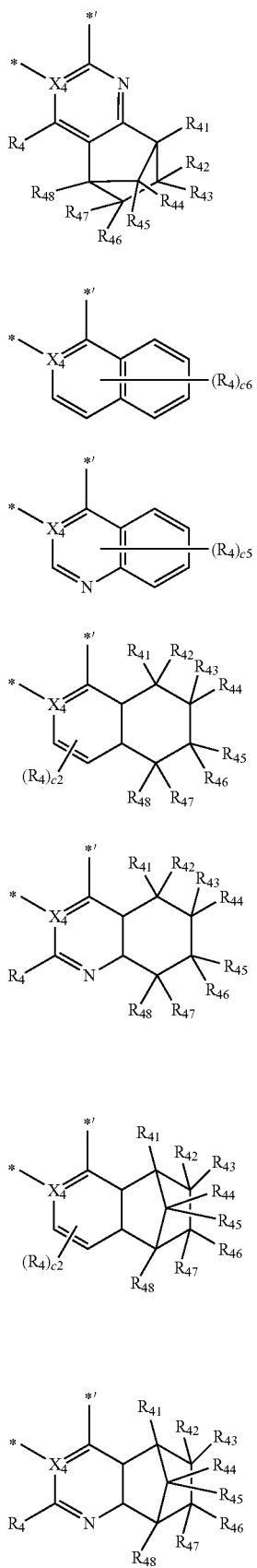
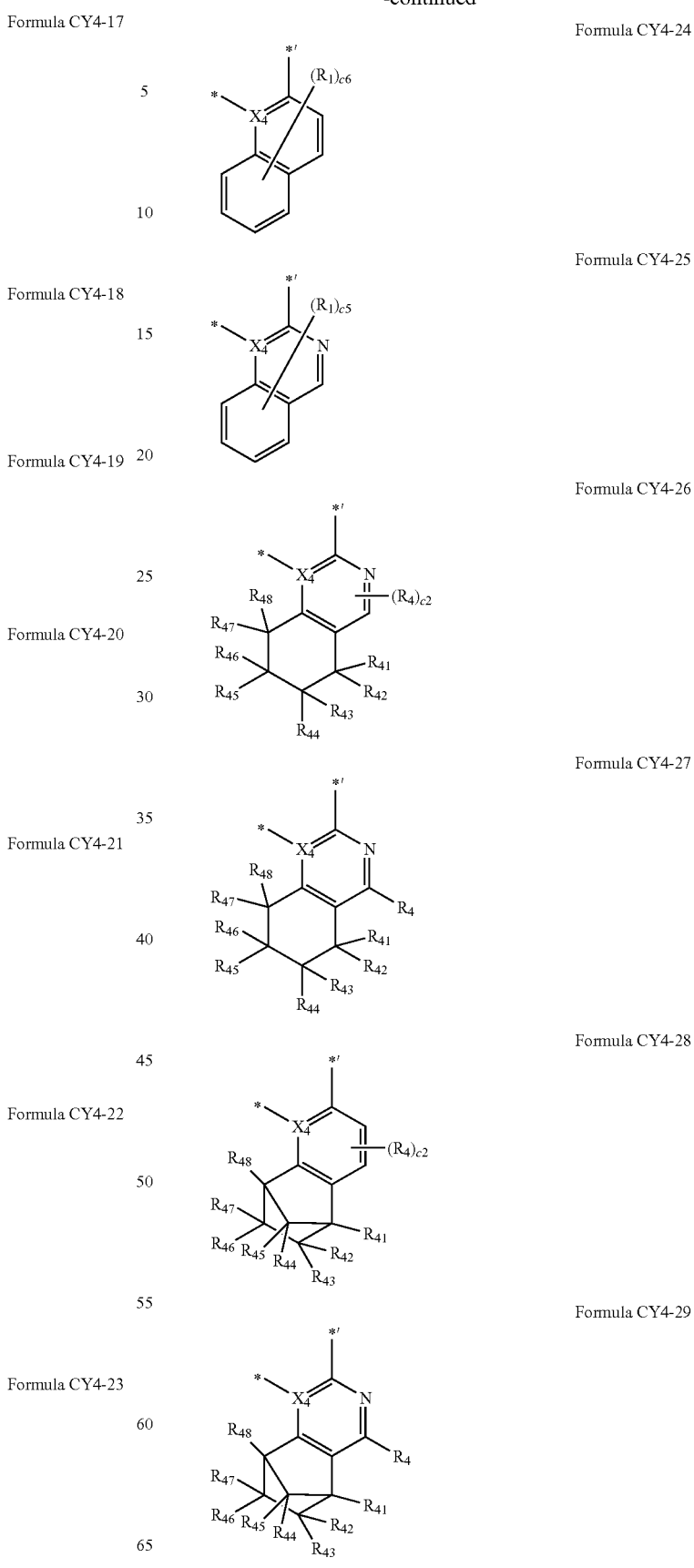

Formula CY4-30

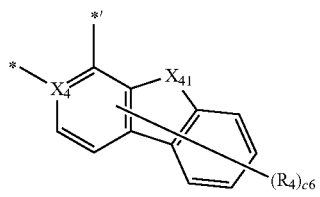

Formula CY4-31

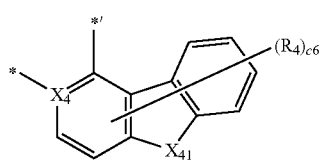

Formula CY4-32

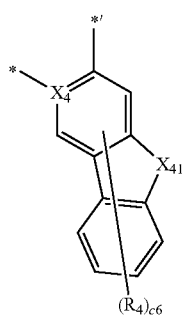

Formula CY4-33

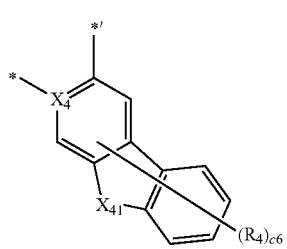

Formula CY4-34

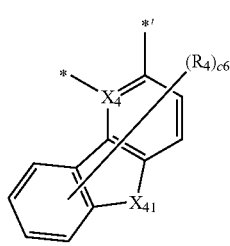

Formula CY4-35

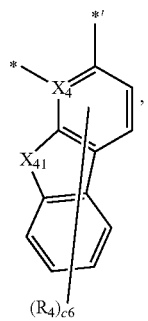

wherein, in Formulae CY4-1 to CY4-35, $X_4$ and $R_4$ are each independently the same as described in claim 1, $X_{41}$ is O, S, $N(R_{41})$, or $C(R_{41})(R_{42})$, $R_{71a}$ is the same as described in connection with $R_{71}$ in claim 1, $R_{72a}$ is the same as described in connection with $R_{72}$ in claim 1, $R_{41}$ to $R_{48}$ are each independently the same as described in connection with $R_4$ in claim 1, c6 is an integer from 0 to 6, c5 is an integer from 0 to 5, c4 is an integer from 0 to 4, c3 is an integer from 0 to 3, c2 is an integer from 0 to 2, and \* and \*' each indicate a binding site to a neighboring atom.

14. The organometallic compound of claim 1, wherein a moiety represented by

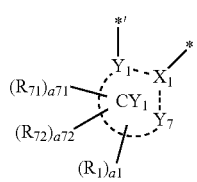

in Formula 1 is selected from groups represented by Formulae CY1(1) and CY1(2), a moiety represented by

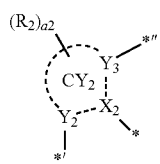

in Formula 1 is selected from groups represented by Formulae CY2(1) to CY2(4), a moiety represented by

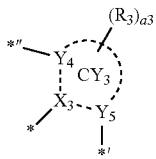

in Formula 1 is selected from groups represented by Formulae CY3(1) to CY3(4), and a moiety represented by

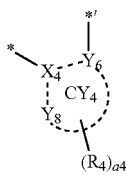

in Formula 1 is selected from groups represented by Formulae CY4(1) to CY4(19):

Formula CY1(1)

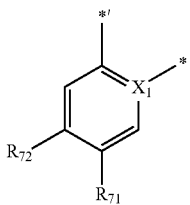

Formula CY1(2)

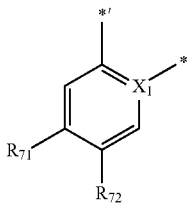

Formula CY2(1)

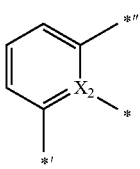

Formula CY2(2)

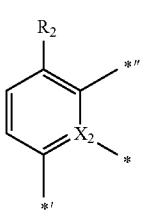

-continued

Formula CY2(3)

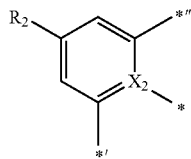

Formula CY2(4)

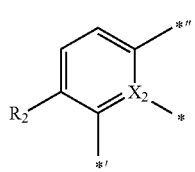

Formula CY3(1)

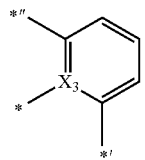

Formula CY3(2)

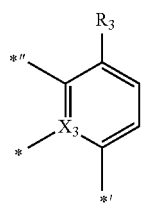

Formula CY3(3)

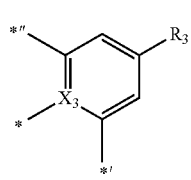

Formula CY3(4)

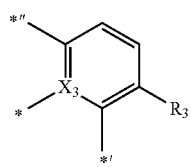

Formula CY4(1)

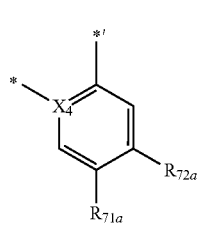

Formula CY4(2)

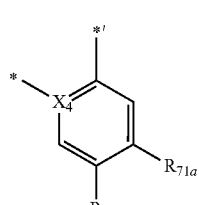

-continued
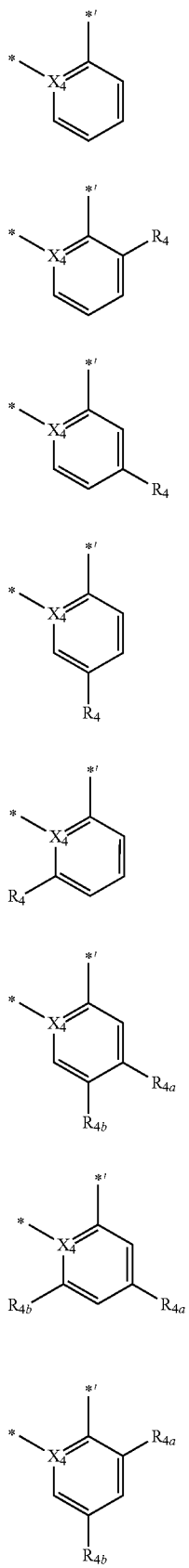
-continued
Formula CY4(3)
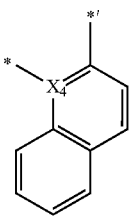
Formula CY4(4)
Formula CY4(5)
Formula CY4(6)
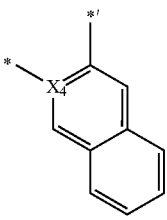
Formula CY4(7)
Formula CY4(8)
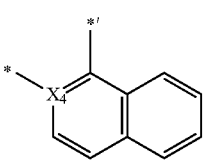
Formula CY4(9)
Formula CY4(10)
Formula CY4(11)
Formula CY4(12)
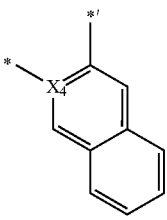
Formula CY4(13)
Formula CY4(14)
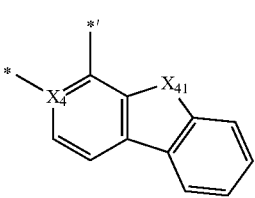
Formula CY4(15)
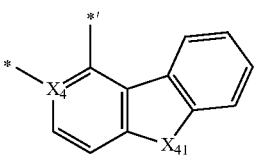
Formula CY4(16)
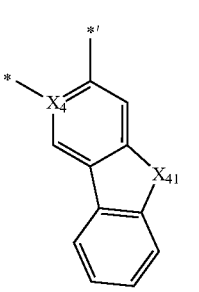
Formula CY4(17)
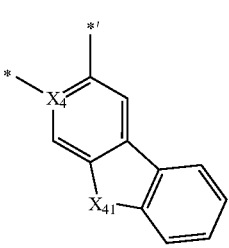

-continued

Formula CY4(18)

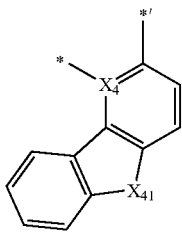

Formula CY4(19)

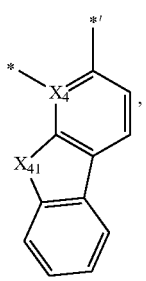

wherein, in Formulae CY1(1), CY1(2), CY2(1) to CY2(4), CY3(1) to CY3(4), and CY4(1) to CY4(19), $X_1$, $R_1$, $R_{71}$, $R_{72}$, $X_2$, $R_2$, $X_3$, $R_3$, $X_4$, and $R_4$ are each independently the same as described in claim 1, $X_{41}$ is O, S, $N(R_{41})$, or $C(R_{41})(R_{42})$, $R_{4a}$, $R_{4b}$, $R_{41}$, and $R_{42}$ are each independently the same as described in connection with $R_4$ in claim 1, $R_{71a}$ is the same as described in connection with $R_{71}$ in claim 1, $R_{72a}$ is the same as described in connection with $R_{72}$ in claim 1, and

*, *', and *" each indicate a binding site to a neighboring atom.

15. An organometallic compound represented by Formula 1(1):

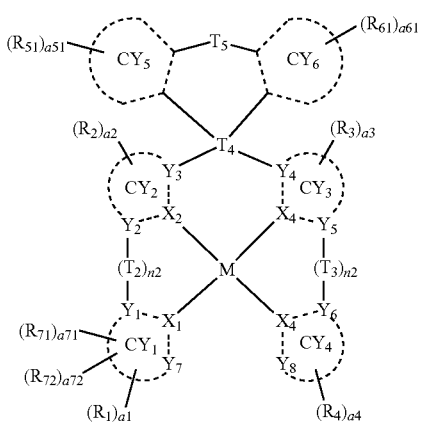

Formula 1(1)

wherein, in Formula 1(1),

M is a first-row transition metal of the Periodic Table of Elements, a second-row transition metal of the Periodic Table of Elements, or a third-row transition metal of the Periodic Table of Elements, $X_1$ is N, $X_2$ to $X_4$ are each independently C or N, two bonds selected from a bond between $X_1$ and M, a bond between $X_2$ and M, a bond between $X_3$ and M, and a bond between $X_4$ and M are each a coordinate bond, and the others thereof are each a covalent bond, $Y_1$ to $Y_6$ are each independently C or N, $Y_7$ and $Y_8$ are each independently C, N, O, Si, or S, $X_1$ and $Y_7$, $X_1$ and $Y_1$, $X_2$ and $Y_2$, $X_2$ and $Y_3$, $X_3$ and $Y_4$, $X_3$ and $Y_5$, $X_4$ and $Y_6$, and $X_4$ and $Y_8$ are each linked via a chemical bond, $CY_1$ is a $C_1$-$C_{30}$ heterocyclic group, $CY_2$ to $CY_4$ are each independently a $C_5$-$C_{30}$ carbocyclic group or a $C_1$-$C_{30}$ heterocyclic group, $T_2$ and $T_3$ are each independently selected from *—N$[(L_5)_{b5}$-$(R_5)]$—*', *—B$(R_5)$—*', *—P$(R_5)$—*', *—C$(R_5)(R_6)$—*', *—Si$(R_5)(R_6)$—*', *—Ge$(R_5)(R_6)$—*', *—S—*', *—O—*', *—C(=O)—*', *—S(=O)—*', *—S(=O)$_2$—*', *—C$(R_5)$=*', *=C$(R_5)$—*', *—C$(R_5)$=C$(R_6)$—*', *—C(=S)—*', and *—C≡C—*', $L_5$ is selected from a single bond, a substituted or unsubstituted $C_5$-$C_{30}$ carbocyclic group, and a substituted or unsubstituted $C_1$-$C_{30}$ heterocyclic group, b5 is selected from 1 to 3, wherein, when b5 is two or more, two or more groups $L_5$ are identical to or different from each other, $R_5$ and $R_6$ are optionally linked via a first linking group to form a substituted or unsubstituted $C_5$-$C_{30}$ carbocyclic group or a substituted or unsubstituted $C_1$-$C_{30}$ heterocyclic group, n2 and n3 are each independently 0, 1, 2, or 3, wherein, when n2 is zero, *-$(T_2)_{n2}$—*' is a single bond, and when n3 is zero, *-$(T_3)_{n3}$—*' is a single bond, $R_{71}$ in Formula 1(1) is a group represented by Formula 71, $$*-(L_{71})_{b71}-(T_{71})_{c71} \quad \text{Formula 71}$$

wherein, in Formula 71, $L_{71}$ is selected from:

a $C_2$-$C_{60}$ alkylene group; and a $C_2$-$C_{60}$ alkylene group substituted with at least one selected from deuterium, a deuterated $C_1$-$C_{60}$ alkyl group, a $C_3$-$C_{10}$ cycloalkyl group, and a $C_3$-$C_{10}$ cycloalkenyl group, b71 is 0, 1, or 2, $T_{71}$ is selected from:

a $C_1$-$C_{60}$ alkyl group; and a $C_1$-$C_{60}$ alkyl group substituted with at least one selected from deuterium, a deuterated $C_1$-$C_{60}$ alkyl group, a $C_3$-$C_{10}$ cycloalkyl group, and a $C_3$-$C_{10}$ cycloalkenyl group, c71 is an integer from 1 to 10, $R_{72}$ in Formula 1(1) is a group represented by Formula 72, $$*-(L_{72})_{b72}-(T_{72})_{c72}, \quad \text{Formula 72}$$

wherein, in Formula 72, $L_{72}$ is selected from:

a $C_6$-$C_{60}$ arylene group, a $C_1$-$C_{60}$ heteroarylene group, a divalent non-aromatic condensed polycyclic group, and a divalent non-aromatic condensed heteropolycyclic group; and a $C_6$-$C_{60}$ arylene group, a $C_1$-$C_{60}$ heteroarylene group, a divalent non-aromatic condensed polycyclic group, and a divalent non-aromatic condensed heteropolycyclic group, each substituted with at least one selected from deuterium, a $C_1$-$C_{60}$ alkyl group, a deuterated $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, b72 is 0, 1, or 2, $T_{72}$ is selected from:

a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, a $C_1$-$C_{60}$ alkyl group, a deuterated $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, c72 is an integer from 1 to 10, wherein, in Formula 1(1), a71 and a72 are each independently an integer from 1 to 5, $R_1$ to $R_6$ are each independently selected from hydrogen, deuterium, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), a1 to a4 are each independently 0, 1, 2, 3, 4, or 5, Formula 1(1) does not include flourine (—F), $CY_5$ and $CY_6$ are each independently be a $C_5$-$C_{30}$ carbocyclic group or a $C_1$-$C_{30}$ heterocyclic group, $R_{51}$ and $R_{61}$ are each independently the same as described in connection with $R_1$ described above, a51 and a61 are each independently be 0, 1, 2, or 3, $T_4$ is C, Si, or Ge, $T_5$ is selected from a single bond, *—N[($L_7$)$_{b7}$-($R_7$)]—*', *—C($R_7$)($R_8$)—*', *—Si($R_7$)($R_8$)—*', *—Ge($R_7$)($R_8$)—*', *—S—*', *—Se—*', *—O—*', *—C(=O)—*', *—S(=O)—*', *—S(=O)$_2$—*', *—C($R_7$)=C($R_8$)—*', *—C(=S)—*', and *—C≡C—*', $L_7$ and b7 are each independently the same as described in connection with $L_5$ and b5 described above, $R_7$ and $R_8$ are each independently the same as described in connection with $R_5$, and

* and *' each indicate a binding site to a neighboring atom, two of groups $R_1$ in the number of a1 are optionally linked to form a substituted or unsubstituted $C_5$-$C_{30}$ carbocyclic group or a substituted or unsubstituted $C_1$-$C_{30}$ heterocyclic group, two of groups $R_2$ in the number of a2 are optionally linked to form a substituted or unsubstituted $C_5$-$C_{30}$ carbocyclic group or a substituted or unsubstituted $C_1$-$C_{30}$ heterocyclic group, two of groups $R_3$ in the number of a3 may optionally be linked to form a substituted or unsubstituted $C_5$-$C_{30}$ carbocyclic group or a substituted or unsubstituted $C_1$-$C_{30}$ heterocyclic group, two of groups $R_4$ in the number of a4 may optionally be linked to form a substituted or unsubstituted $C_5$-$C_{30}$ carbocyclic group or a substituted or unsubstituted $C_1$-$C_{30}$ heterocyclic group, two or more neighboring groups selected from $R_1$ to $R_4$ may optionally be linked to form a substituted or unsubstituted $C_5$-$C_{30}$ carbocyclic group or a substituted or unsubstituted $C_1$-$C_{30}$ heterocyclic group, one of $R_5$ and $R_6$ and one of $R_1$ to $R_4$ may optionally be linked to form a substituted or unsubstituted $C_5$-$C_{30}$ carbocyclic group or a substituted or unsubstituted $C_1$-$C_{30}$ heterocyclic group, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —Cl, —Br, —I, —CD$_3$, —CD$_2$H, —CDH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —Cl, —Br, —I, —CD$_3$, —CD$_2$H, —CDH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —Cl, —Br, —I, —CD$_3$, —CD$_2$H, —CDH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

16. The organometallic compound of claim 1, wherein the organometallic compound is selected from Compounds 1 to 201:

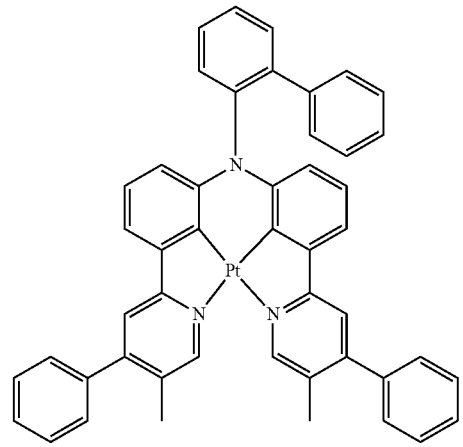

1

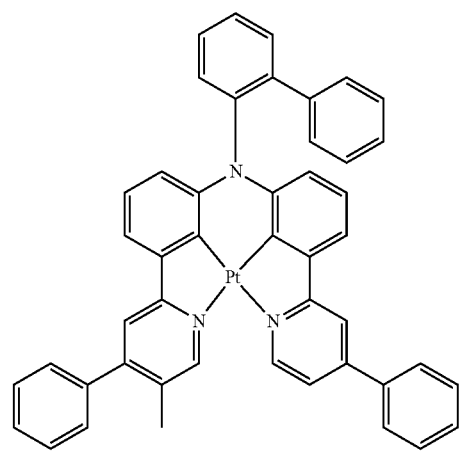

2

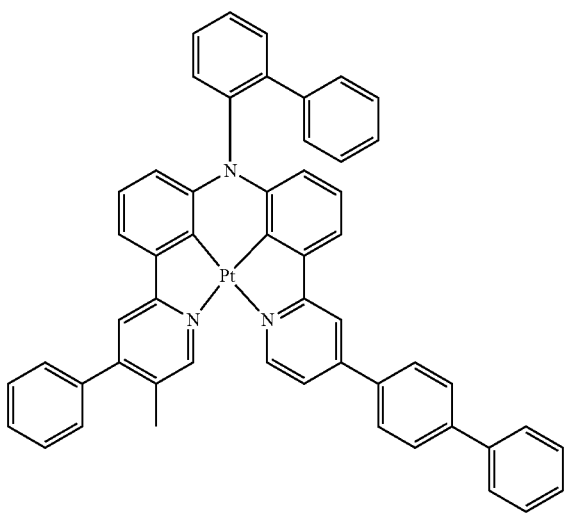

3

4
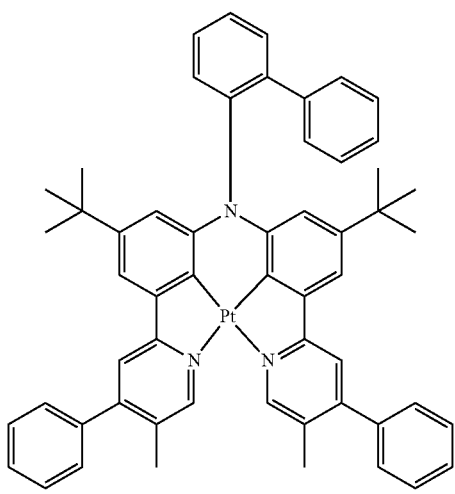
5
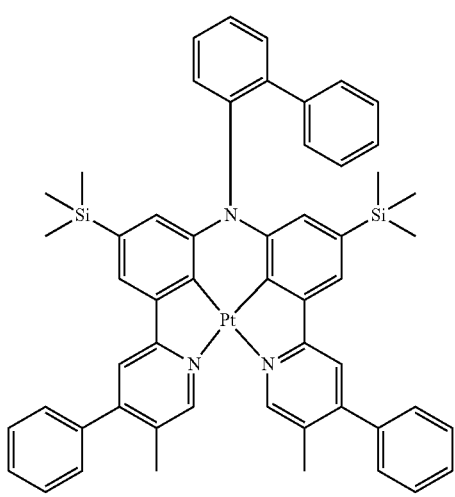
6
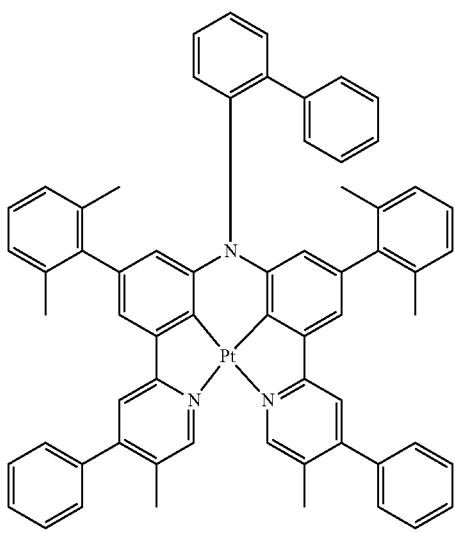
7
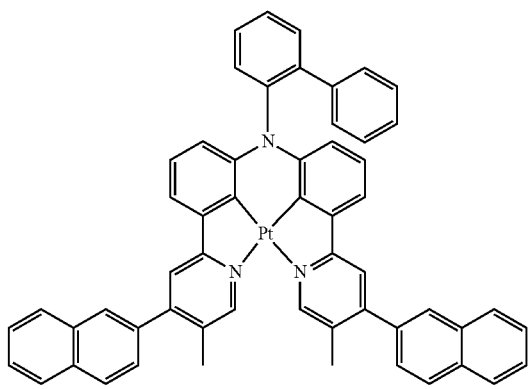
8
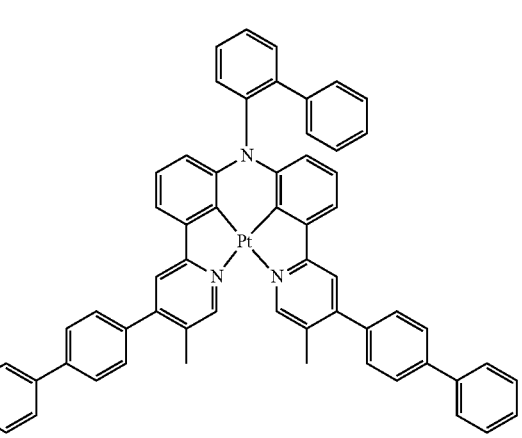
9
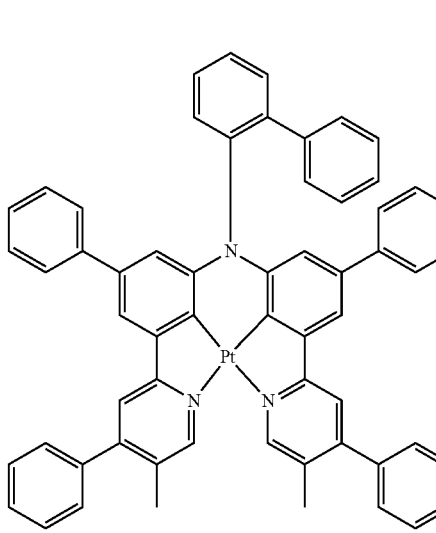

273
-continued
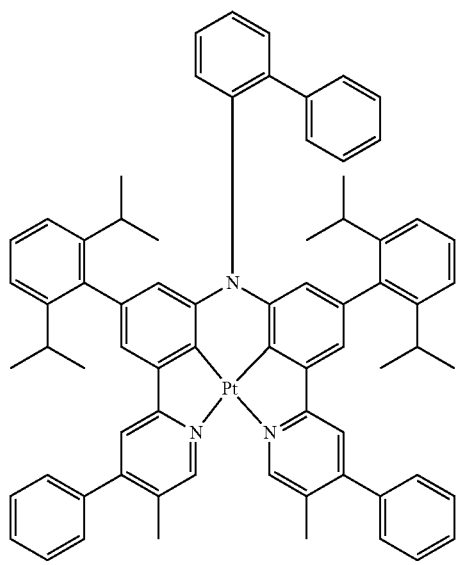
10
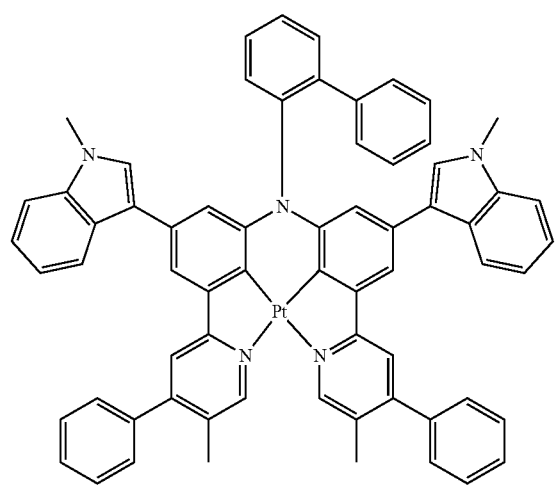
11
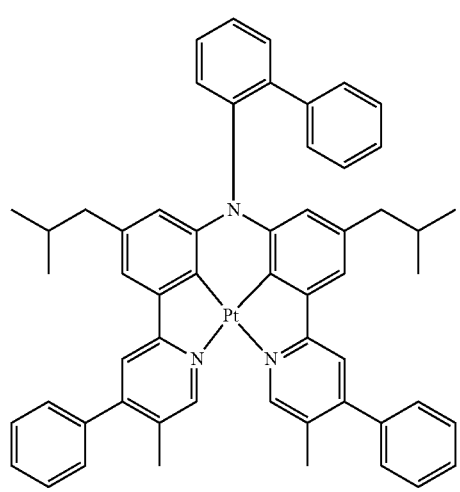
12
274
-continued
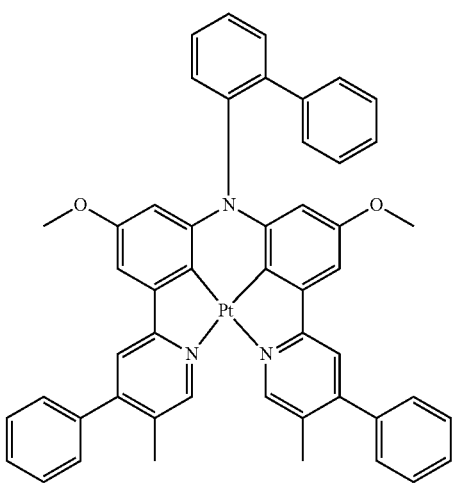
13
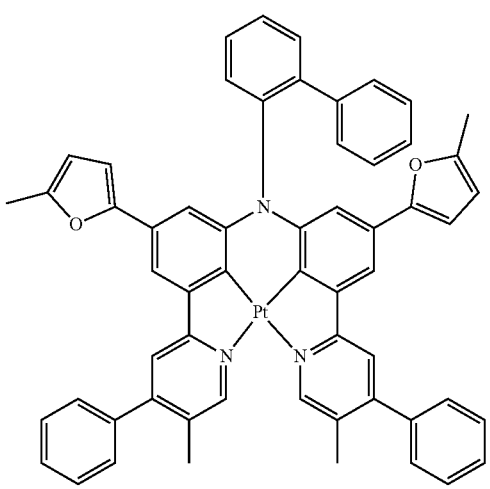
14
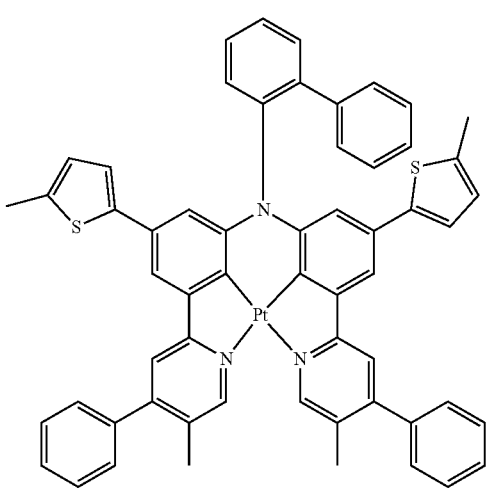
15

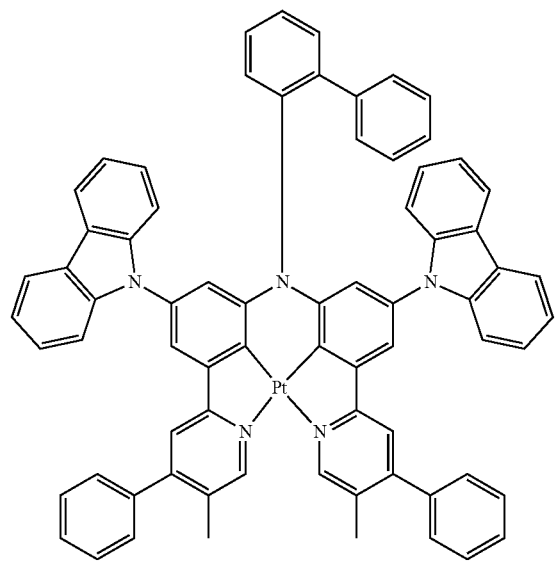
16
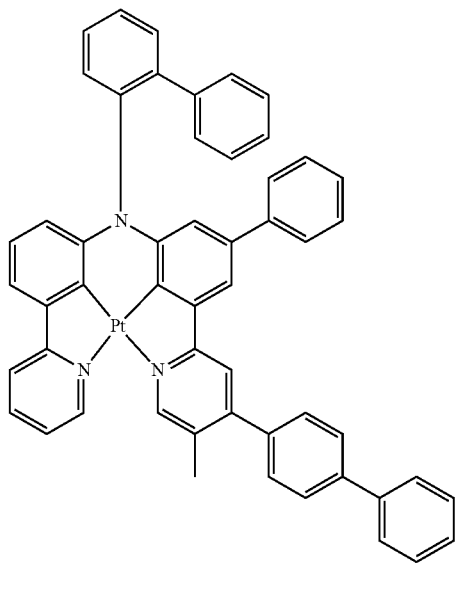
18
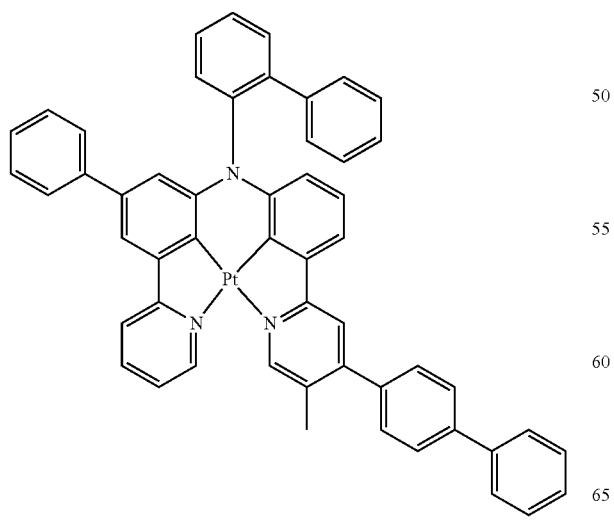
17
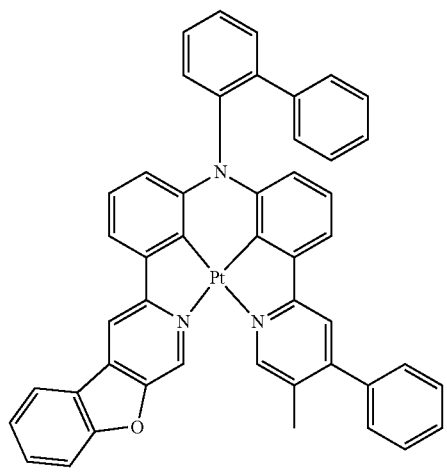
19
20

-continued
21
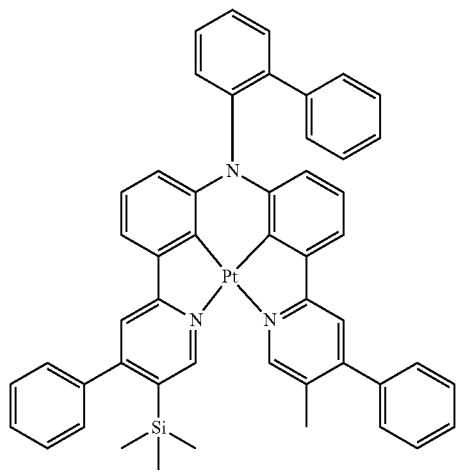
22
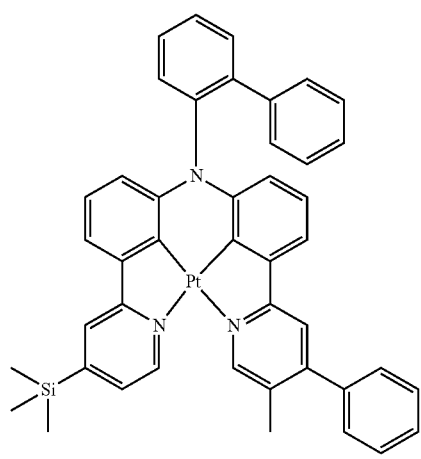
23
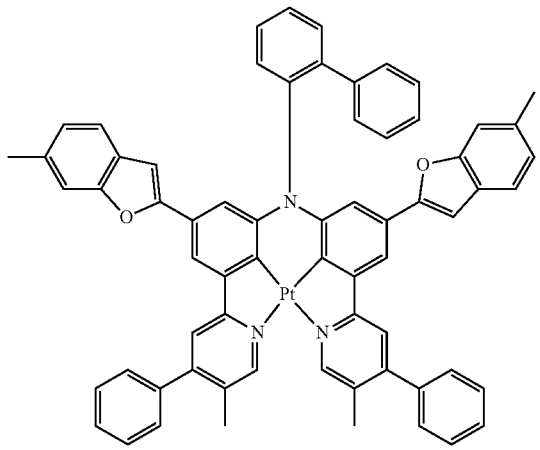
-continued
24
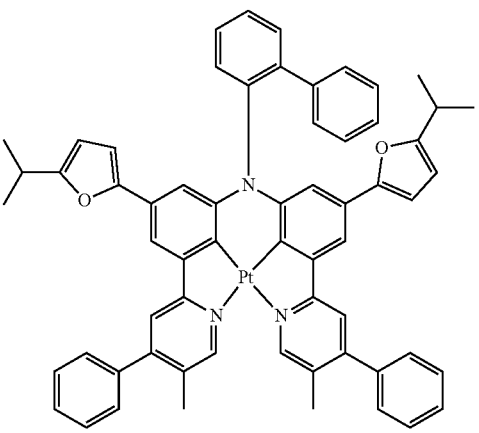
25
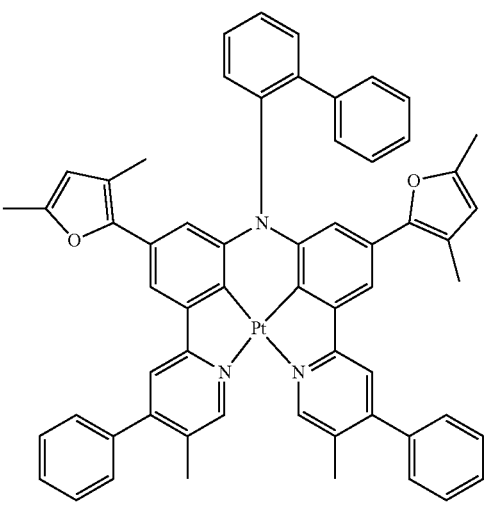
26
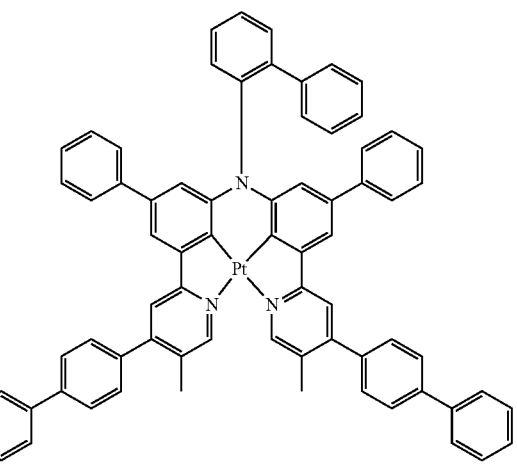

27
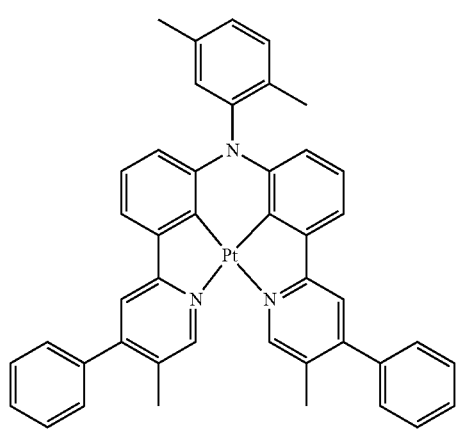
28
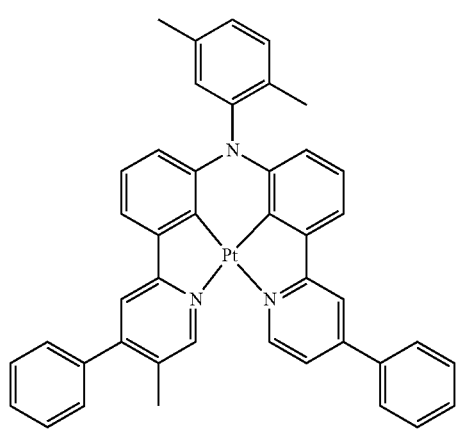
29
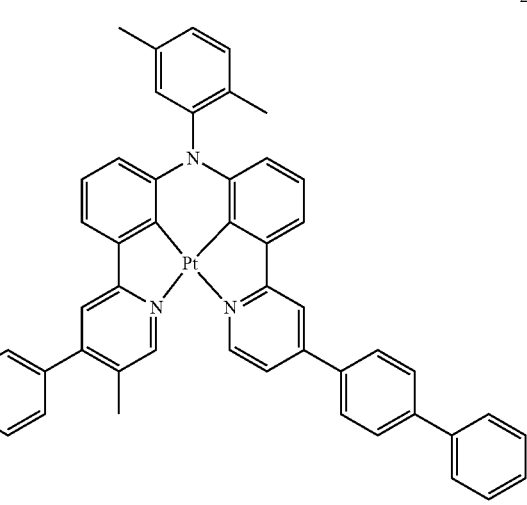
30
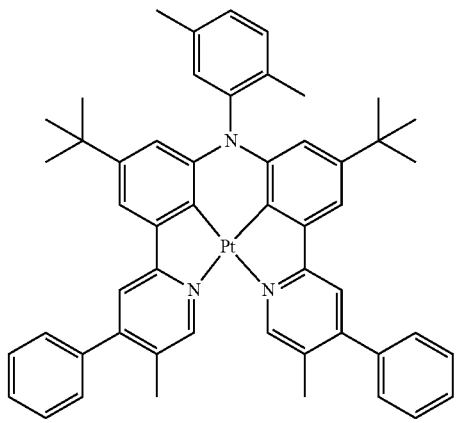
31
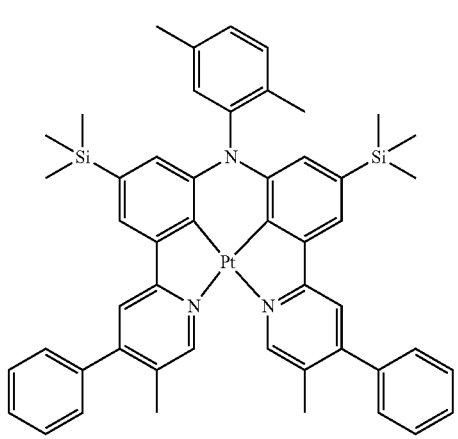
32
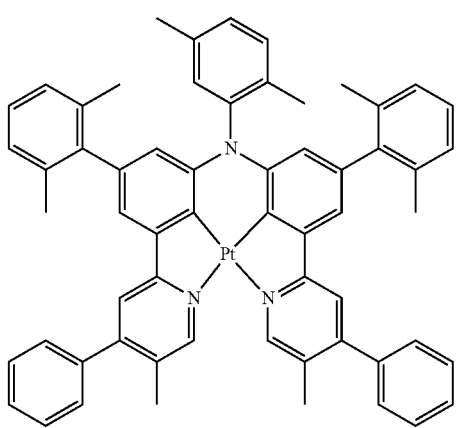

-continued
33
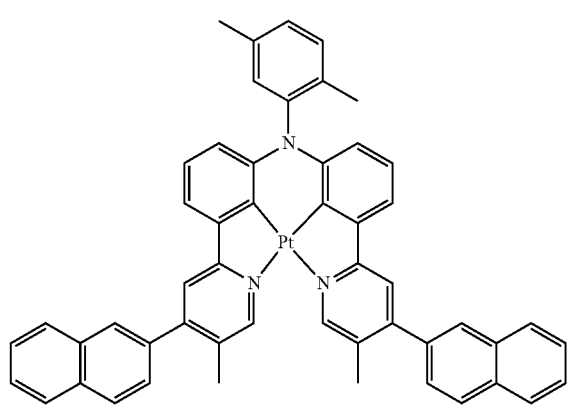
34
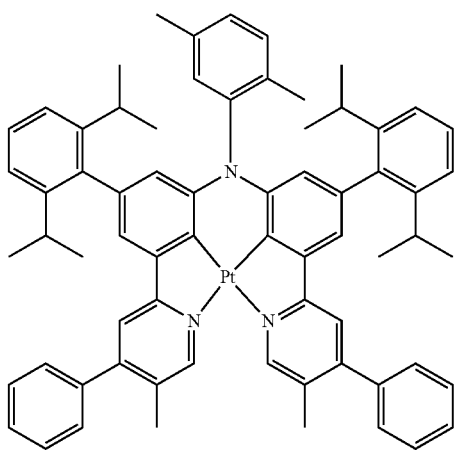
35
36
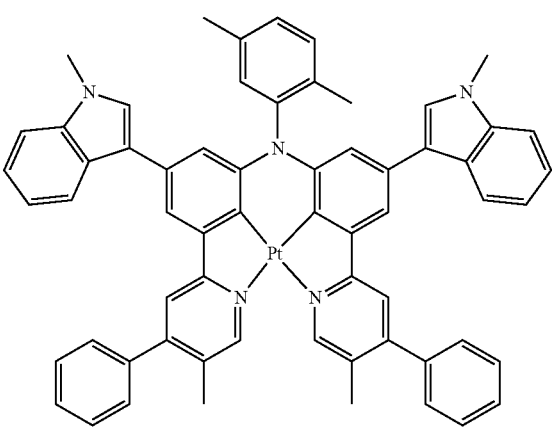
37
38
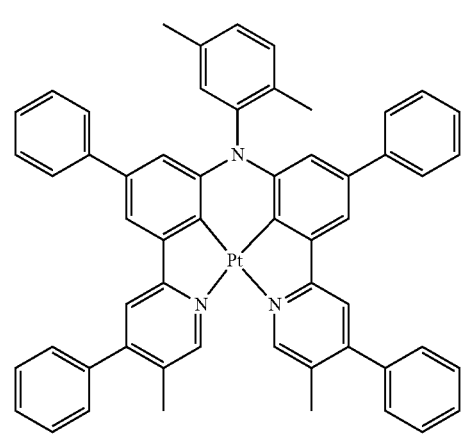
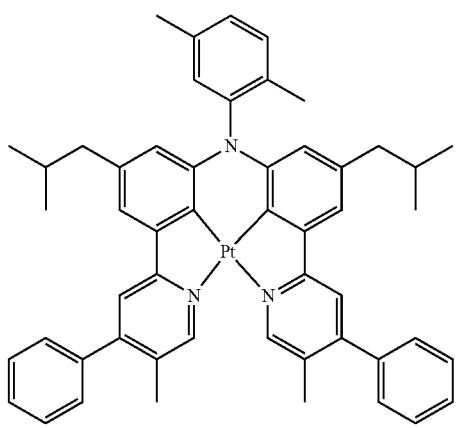

283
-continued
39
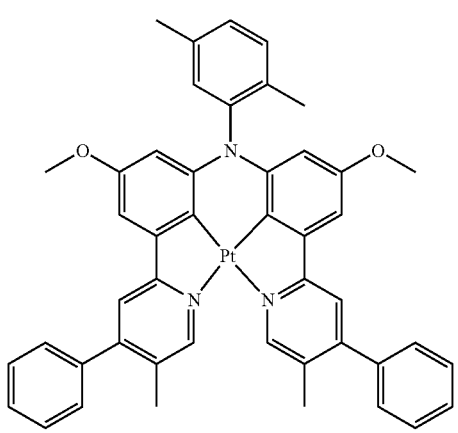
40
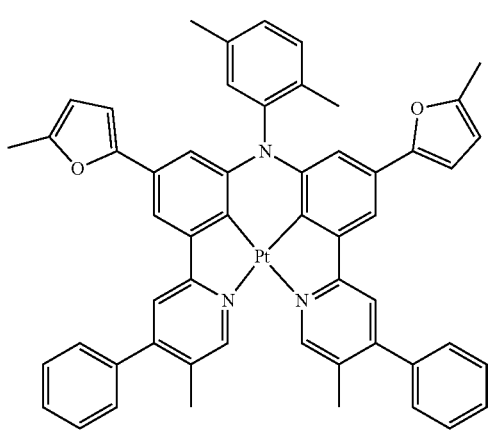
41
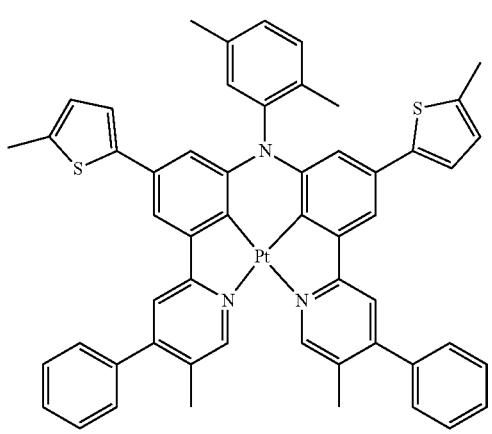
284
-continued
42
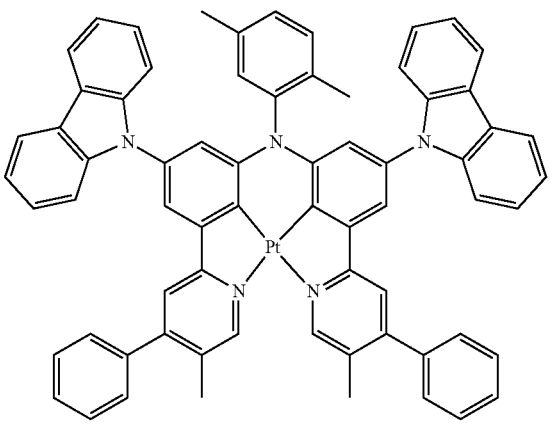
43
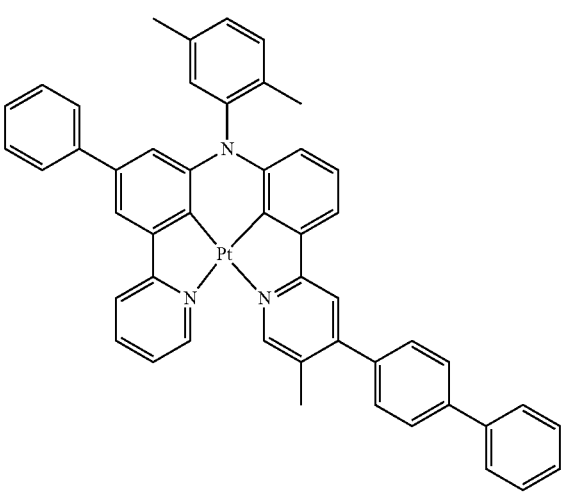
44
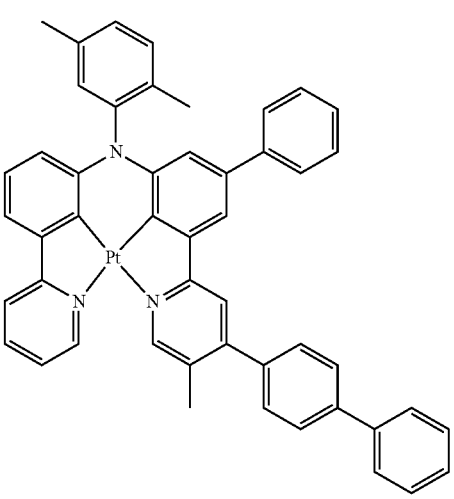

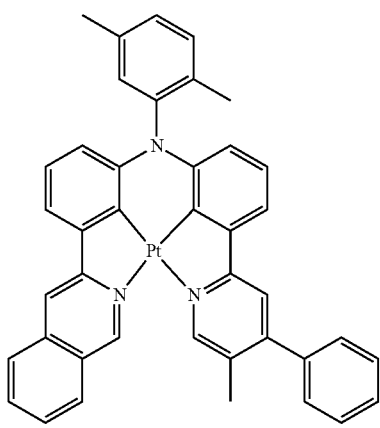
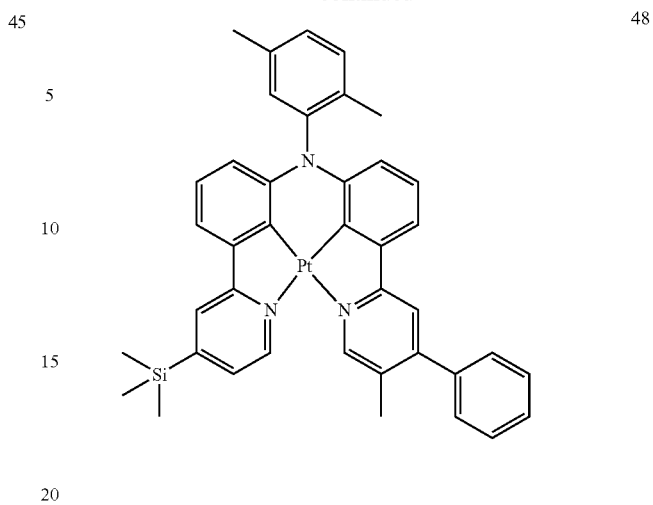
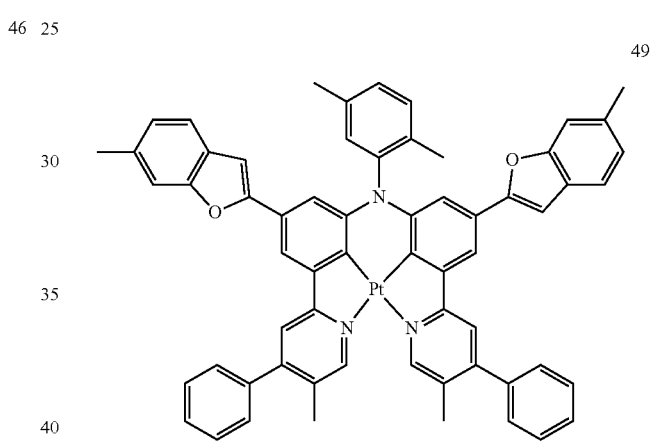

287
-continued
288
-continued
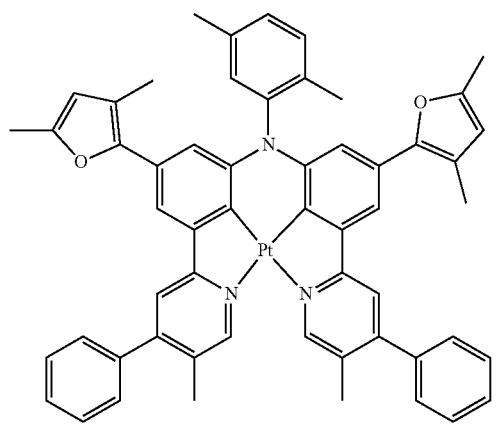
51
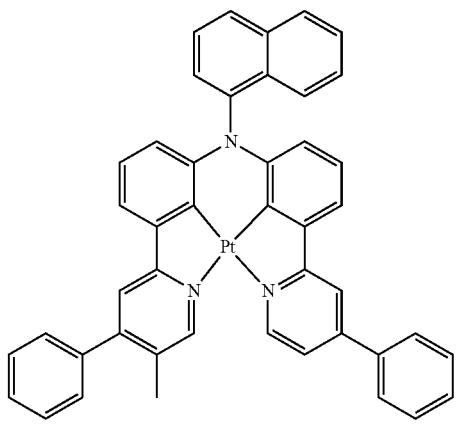
54
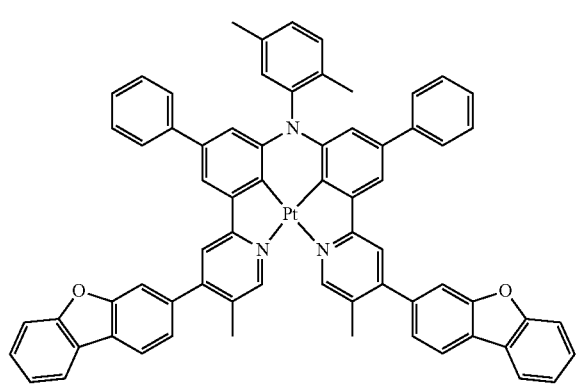
52
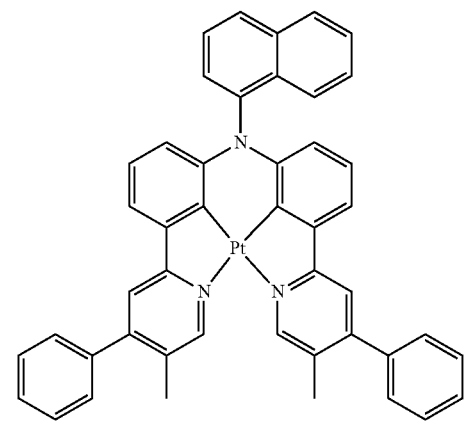
53
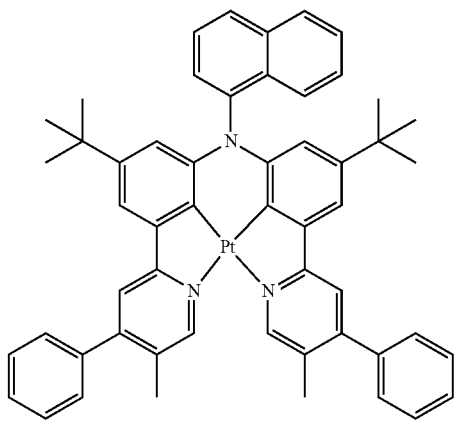
56

57
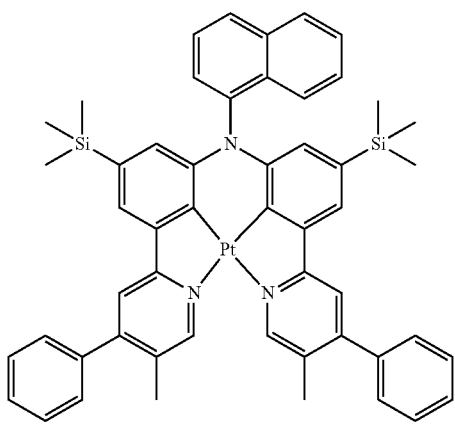
58
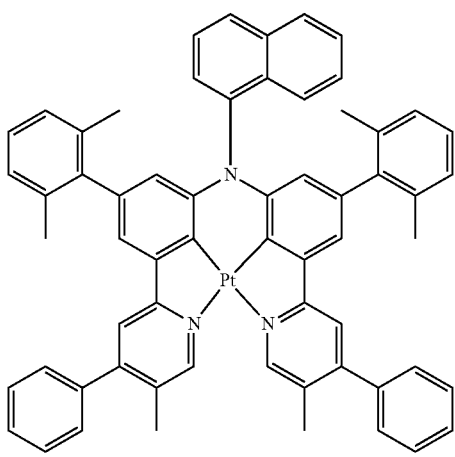
59
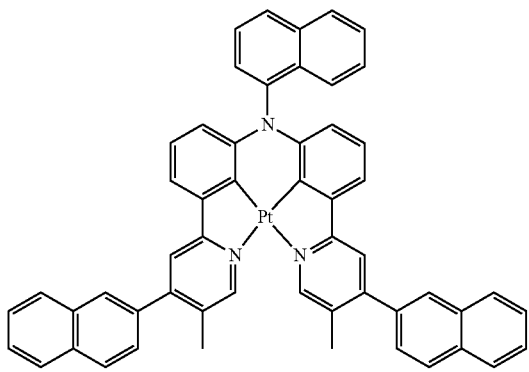
60
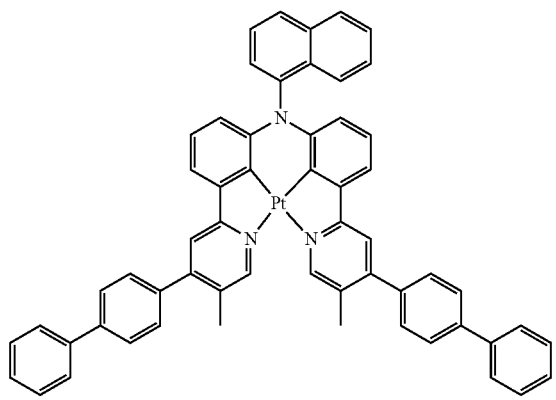
61
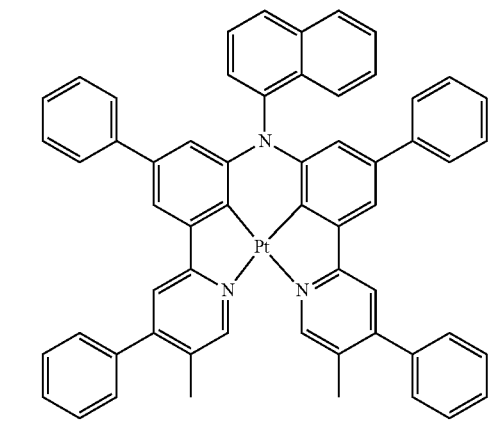
62
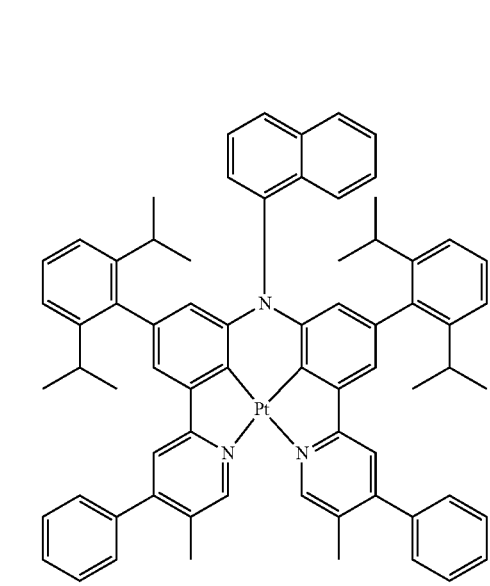

291
-continued
63
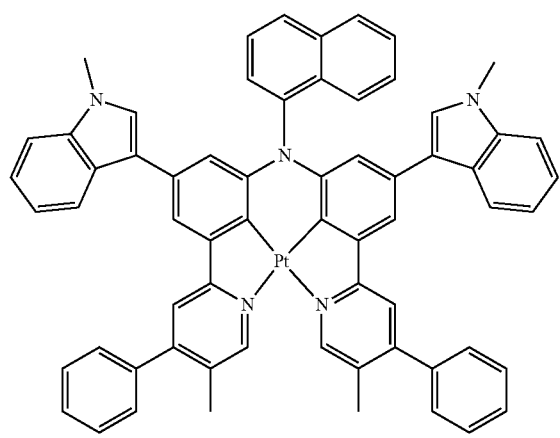
64
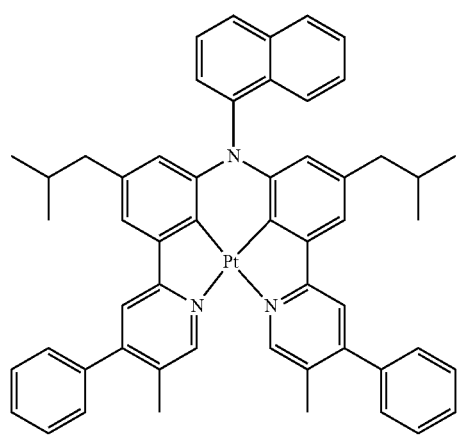
65
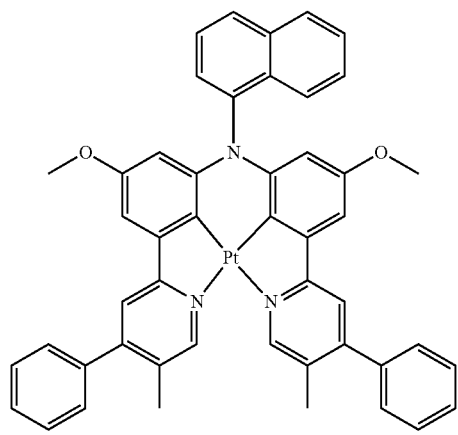
292
-continued
66
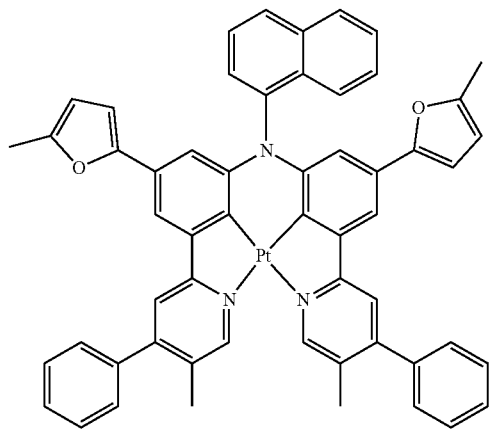
67
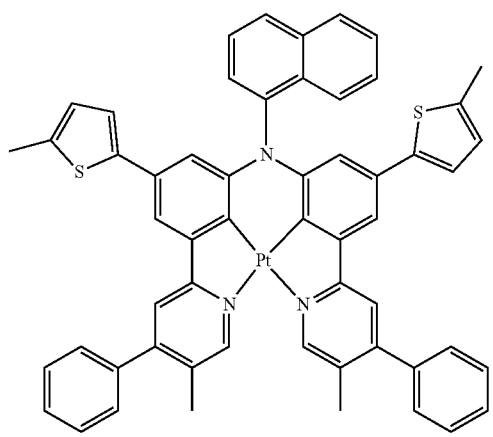
68
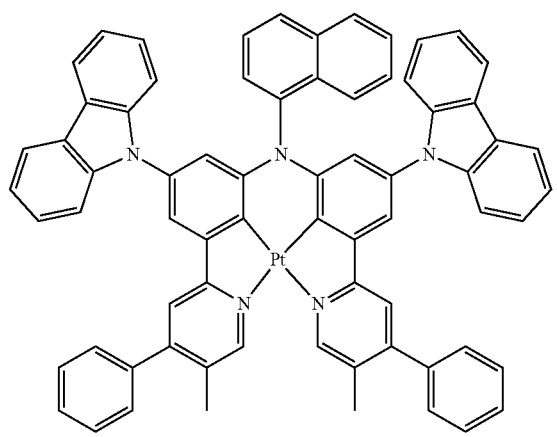

293 -continued
69
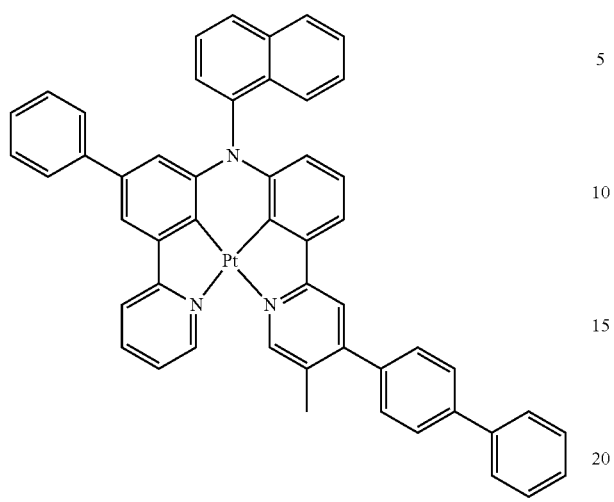
70
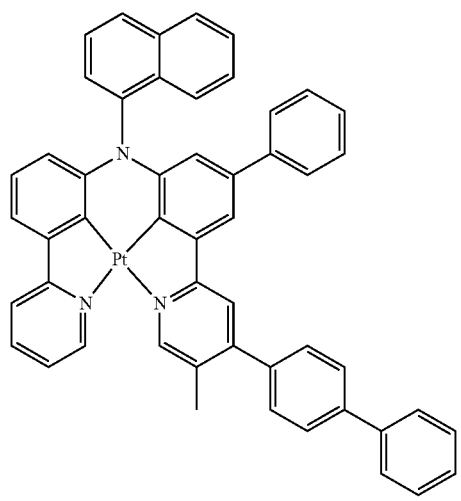
71
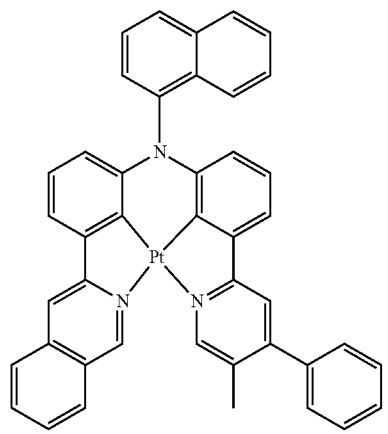
294 -continued
72
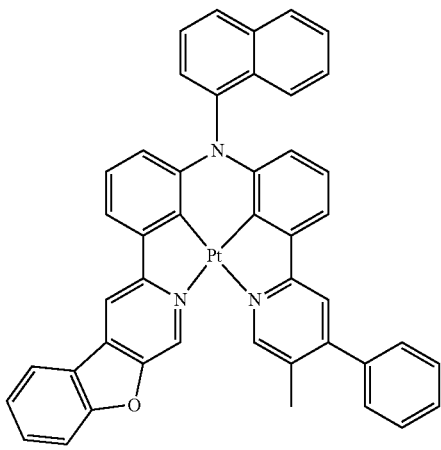
73
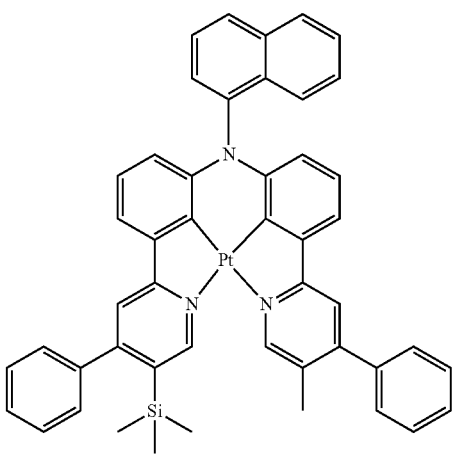
74
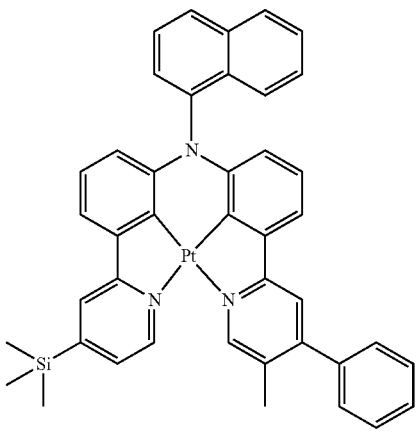

295
-continued
296
-continued
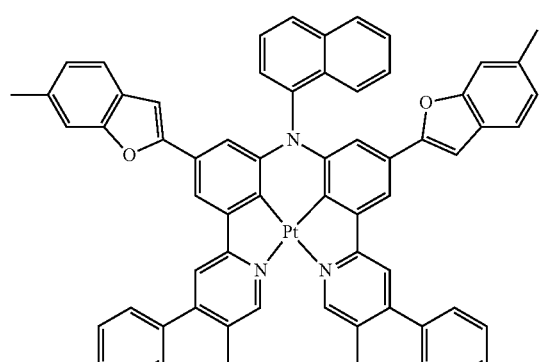
75
76
77
78
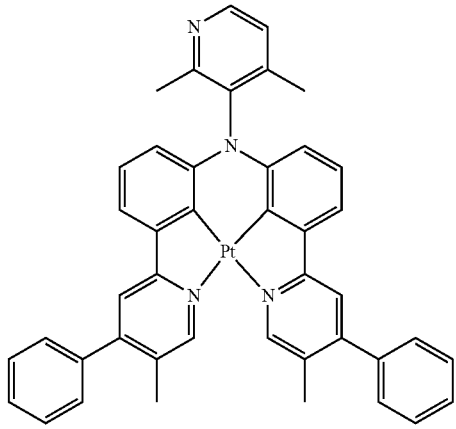
79
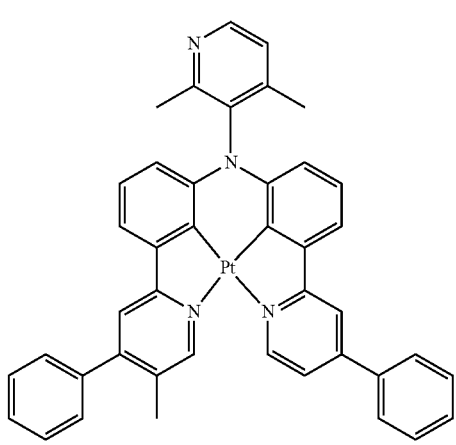
80
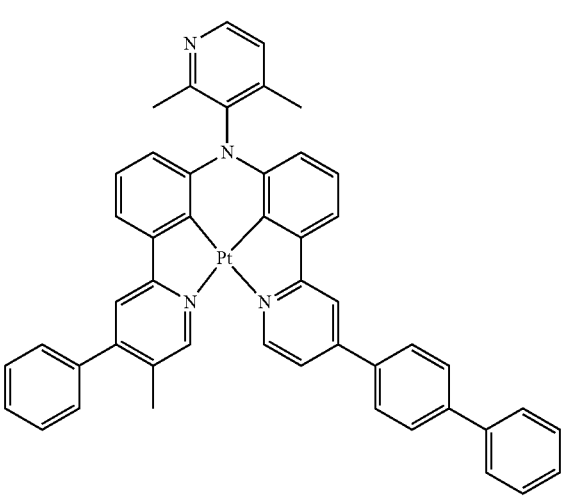
81

297
-continued
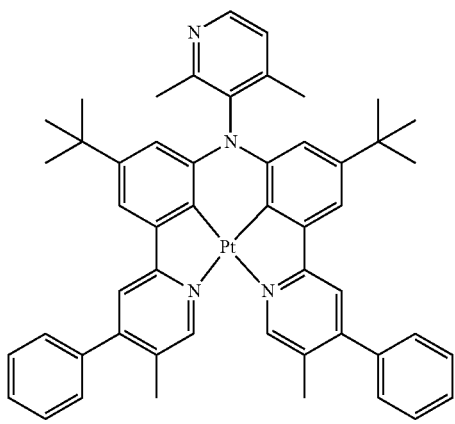
82
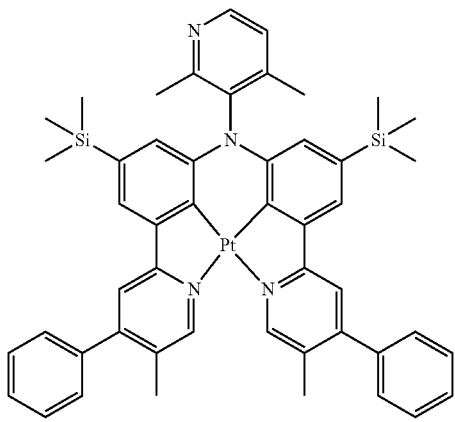
83
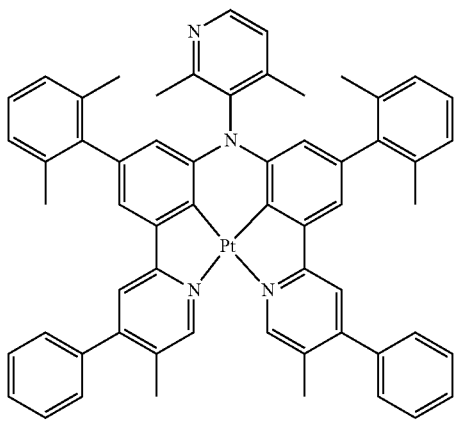
84
298
-continued
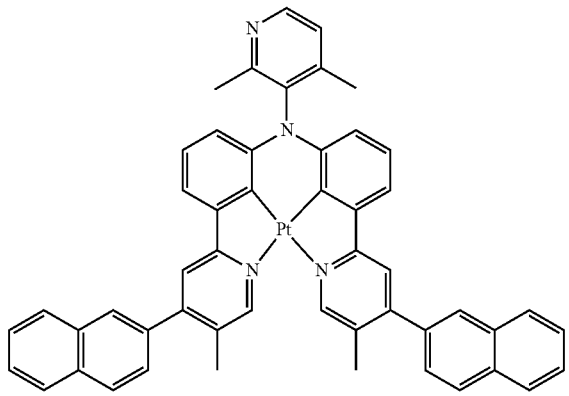
85
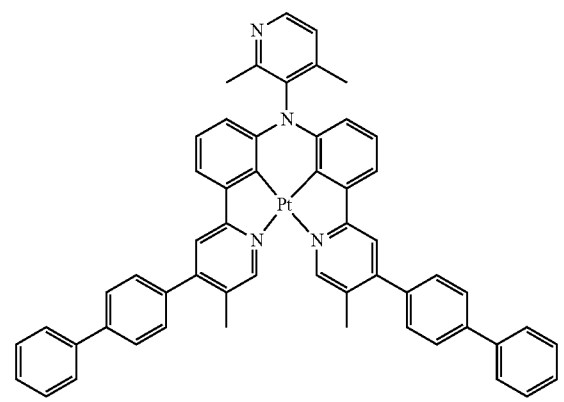
86
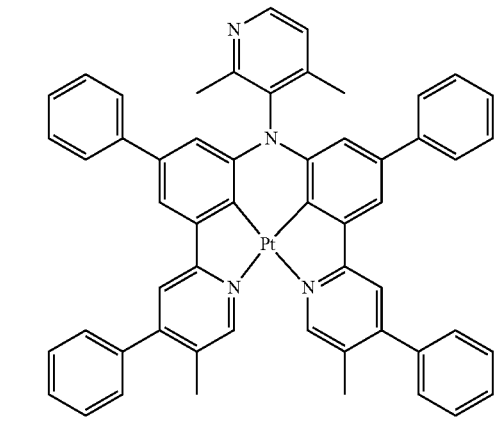
87

299
-continued
88
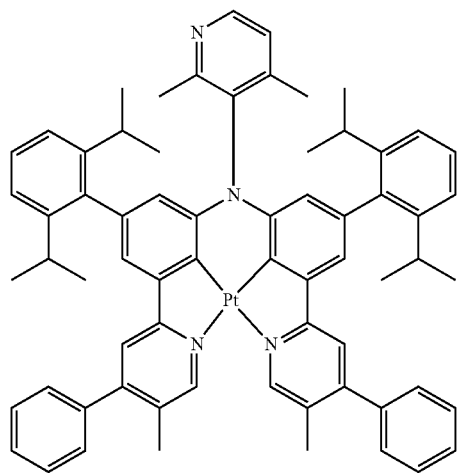
89
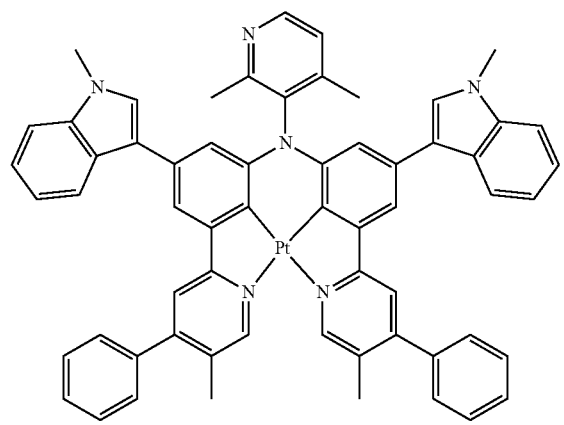
90
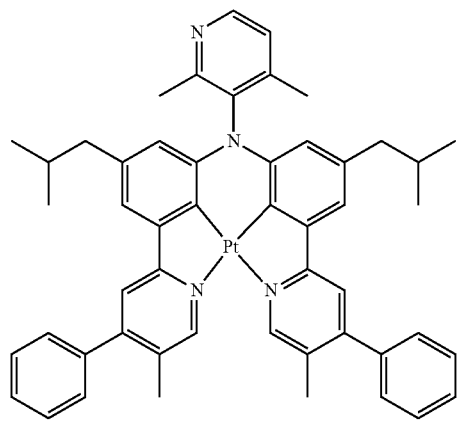
300
-continued
91
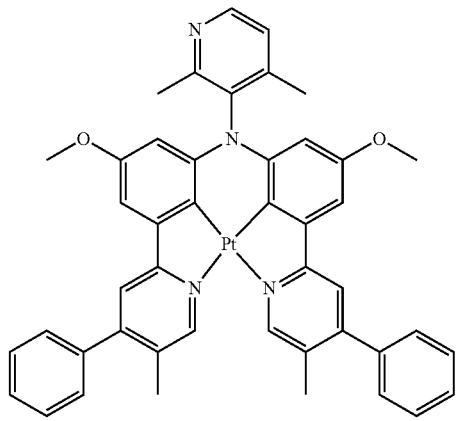
92
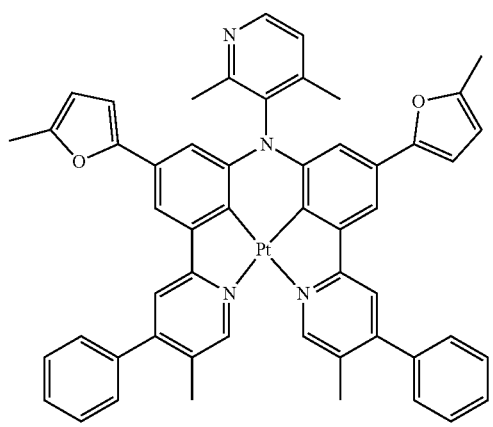
93
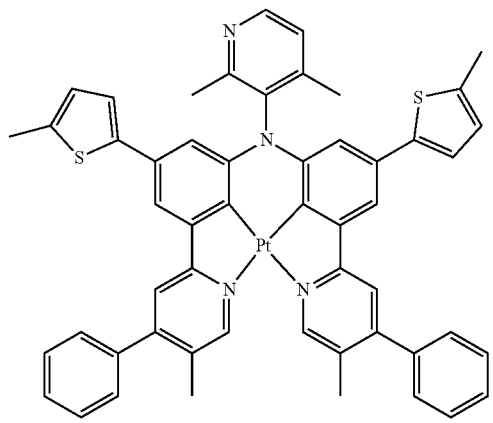

301
-continued
94
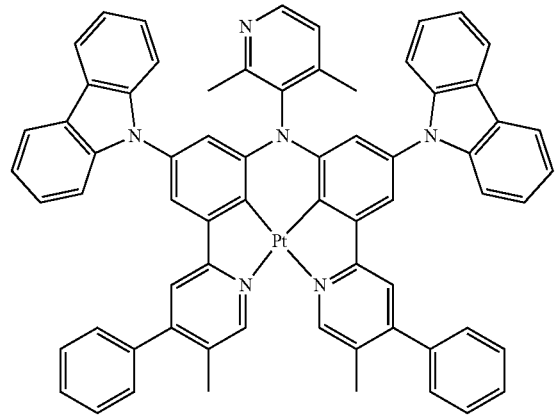
95
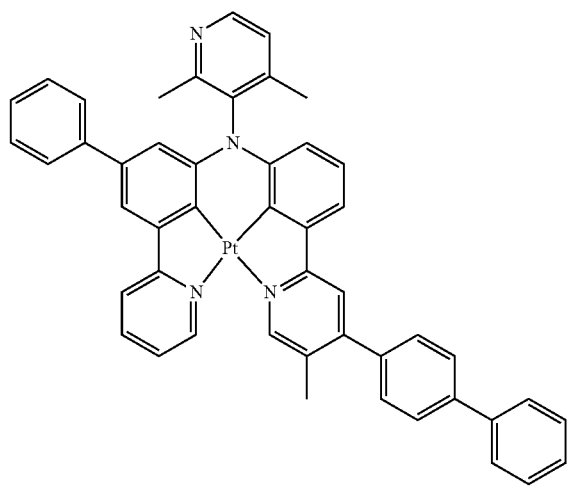
96
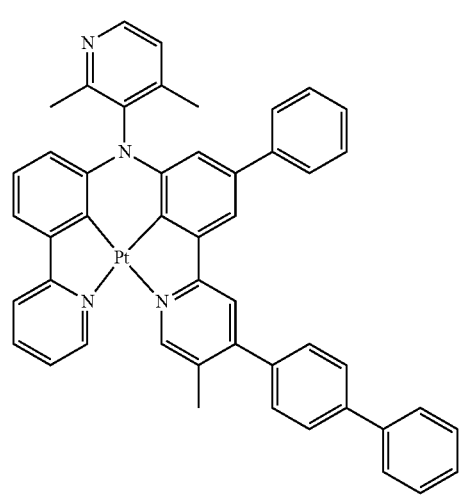
302
-continued
97
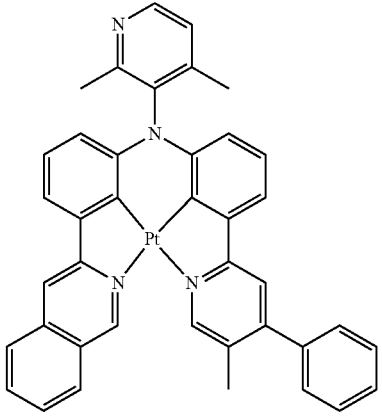
98
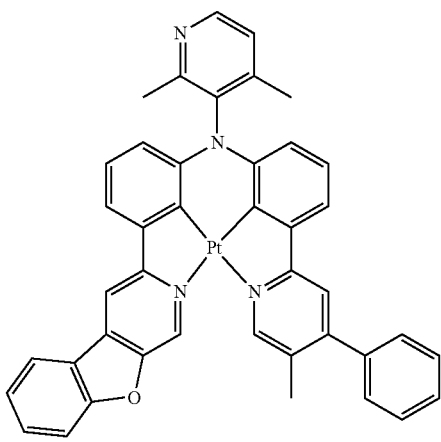
99
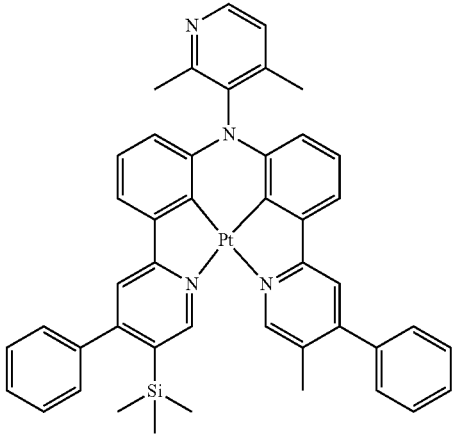

303
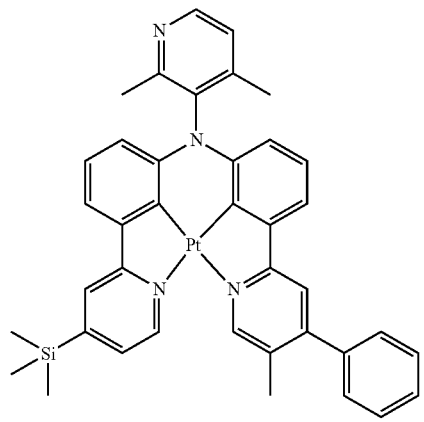
100
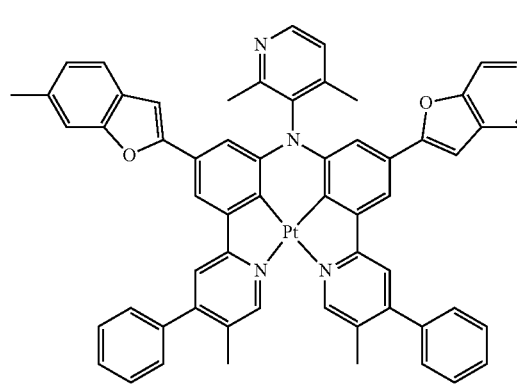
101
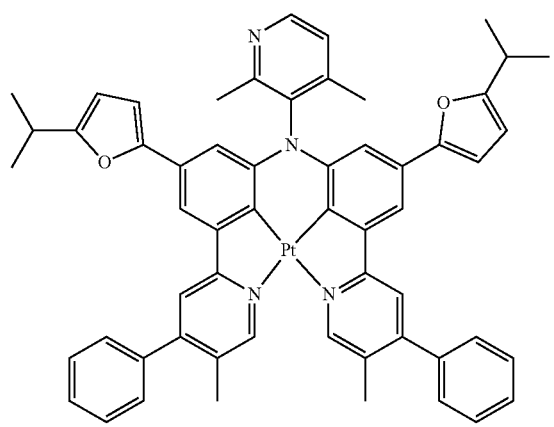
102
304
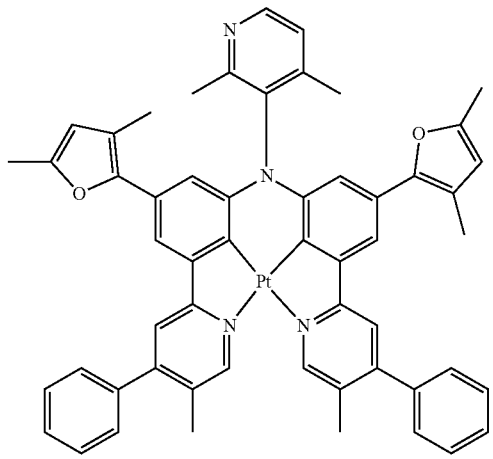
103
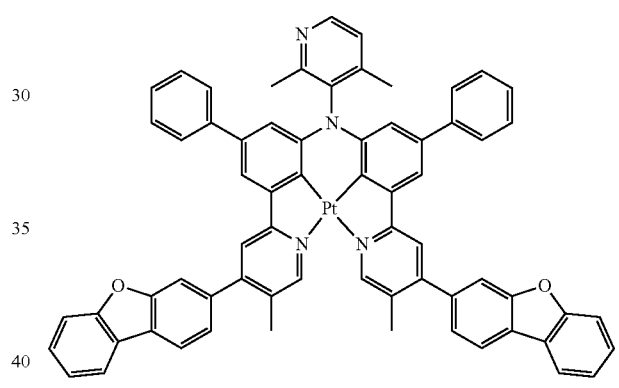
104
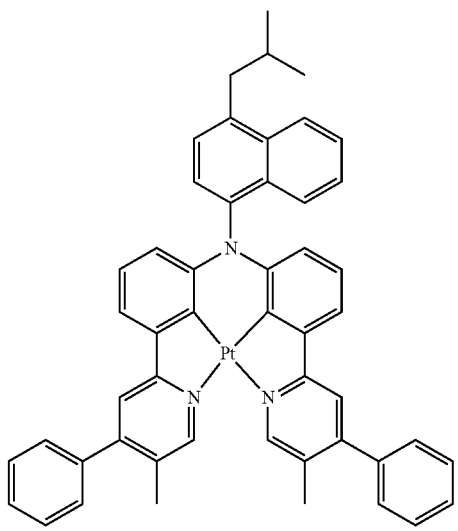
105

-continued
106
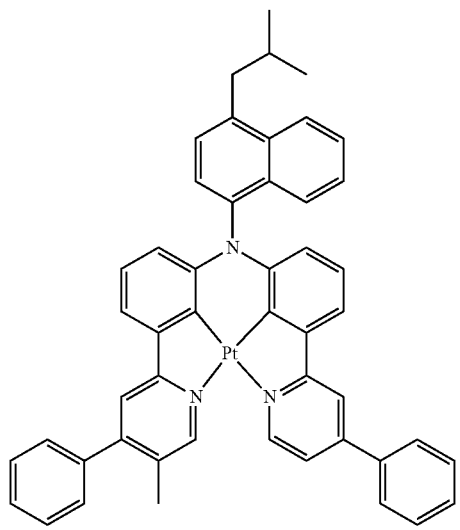
107
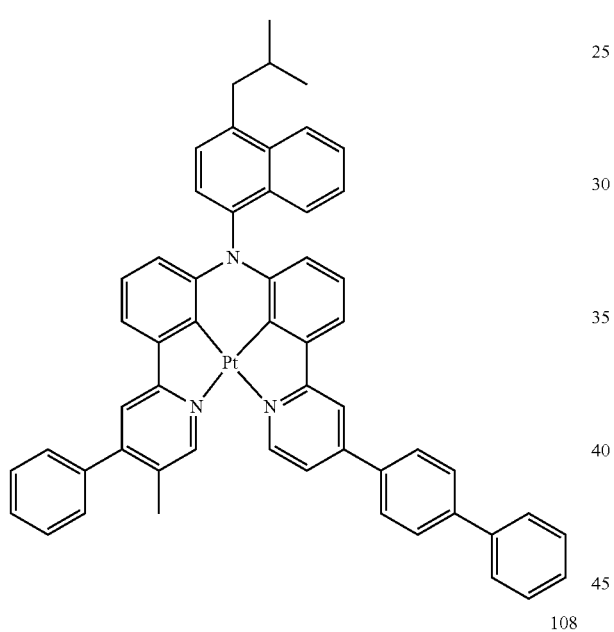
108
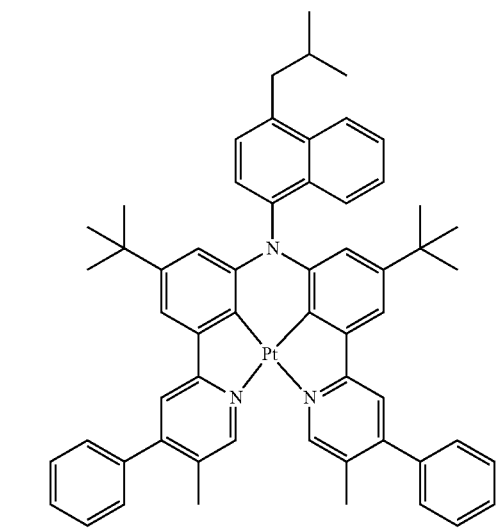
-continued
109
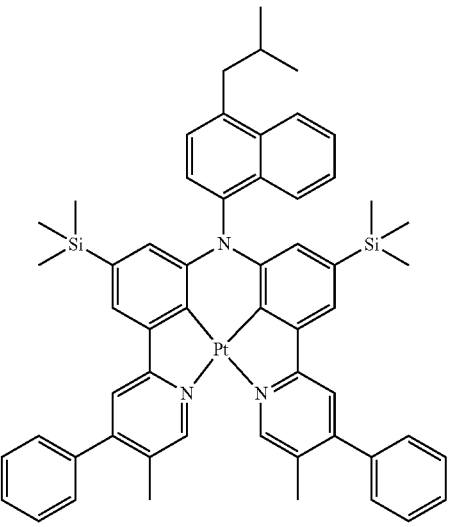
110
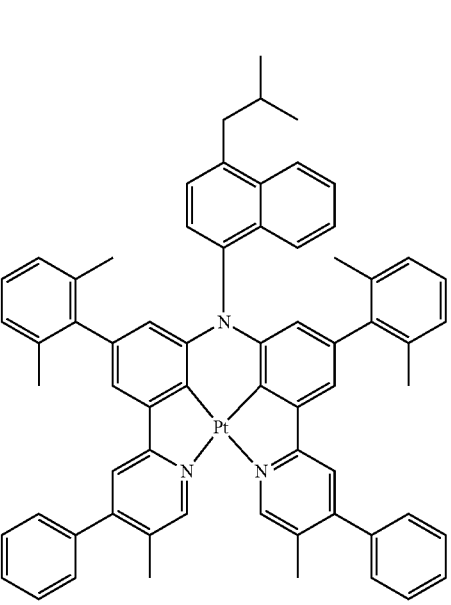
111
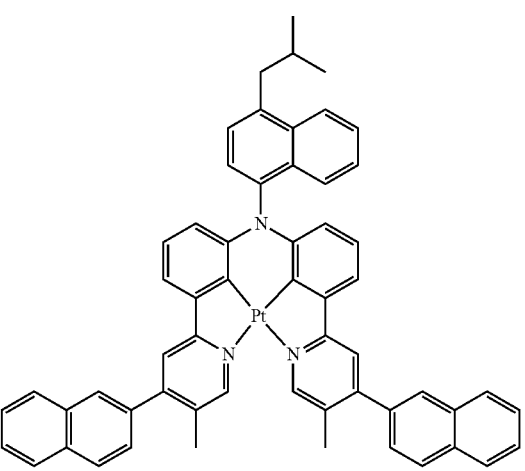

307
-continued
112
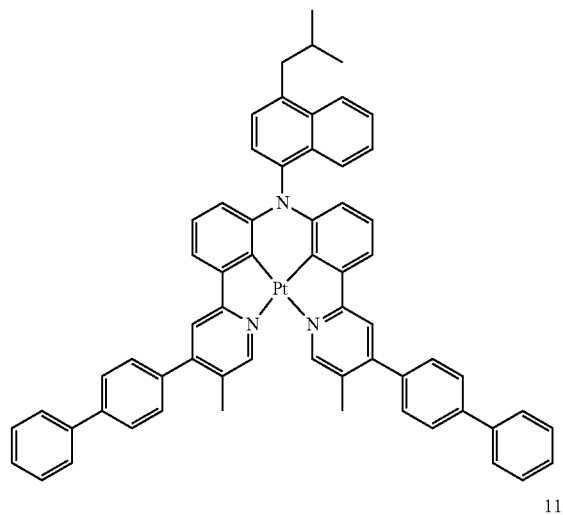
113
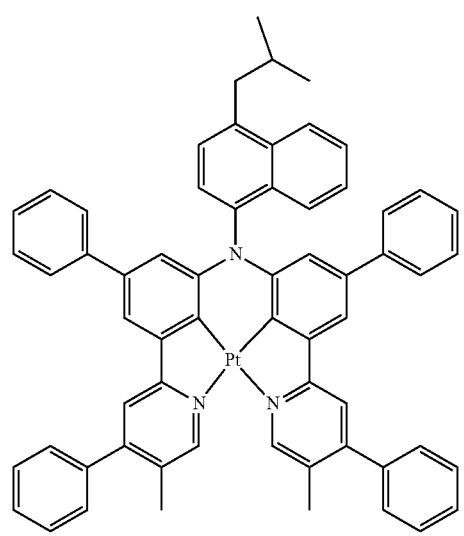
114
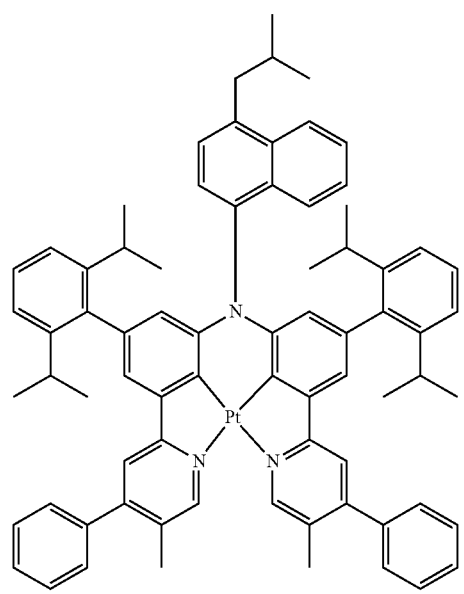
308
-continued
115
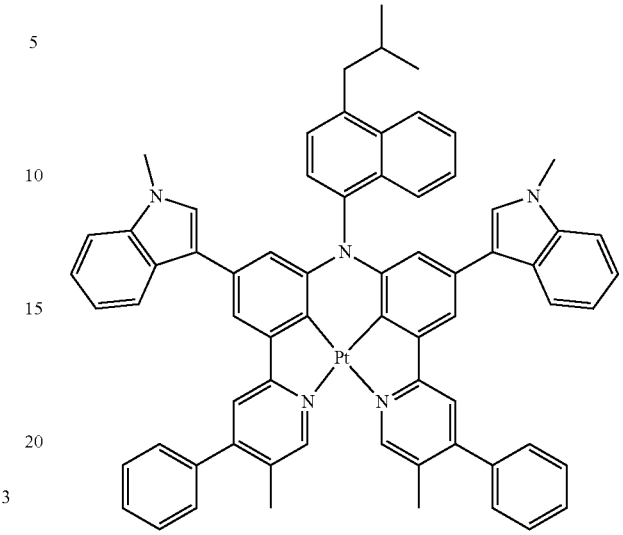
116
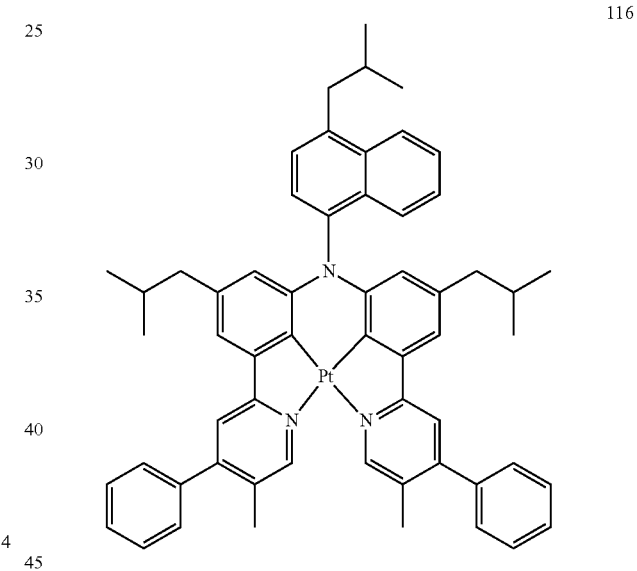
117
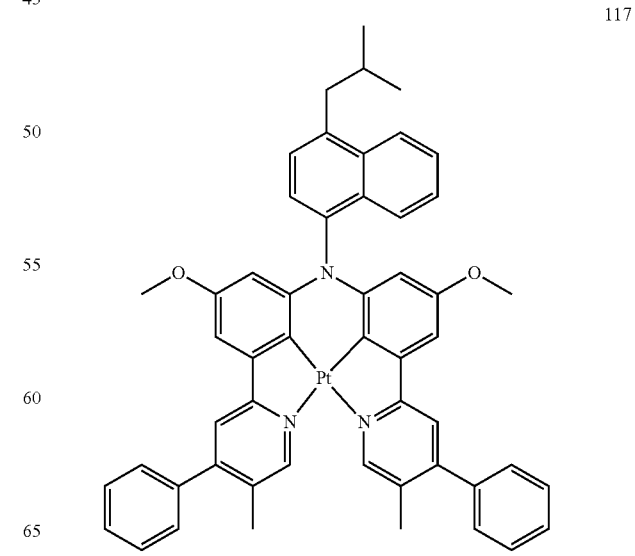

309
-continued
118
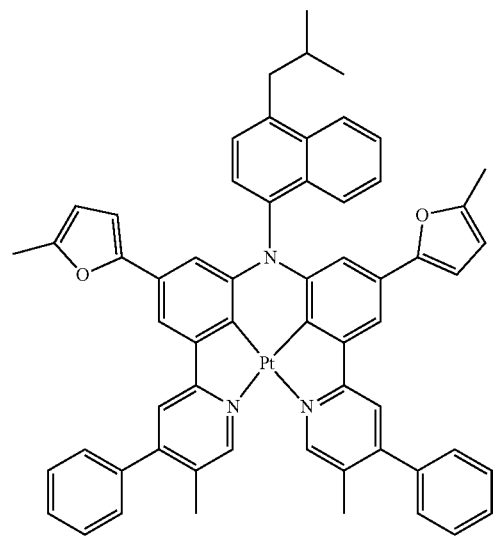
119
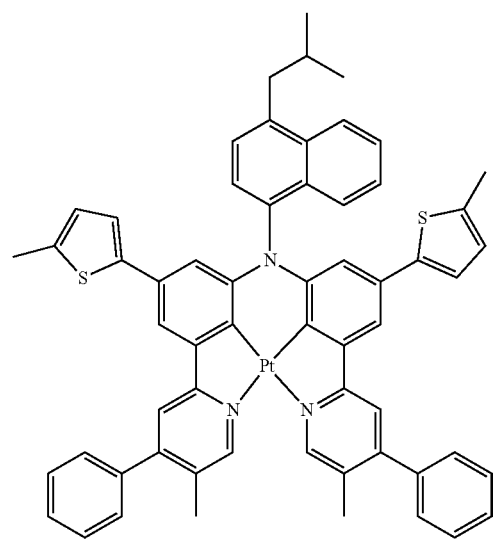
120
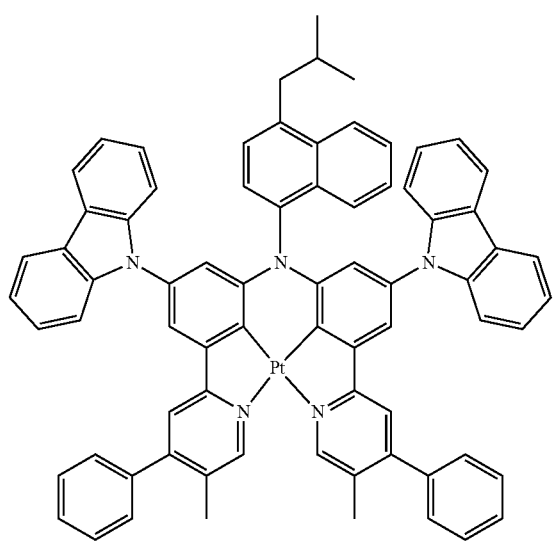
310
-continued
121
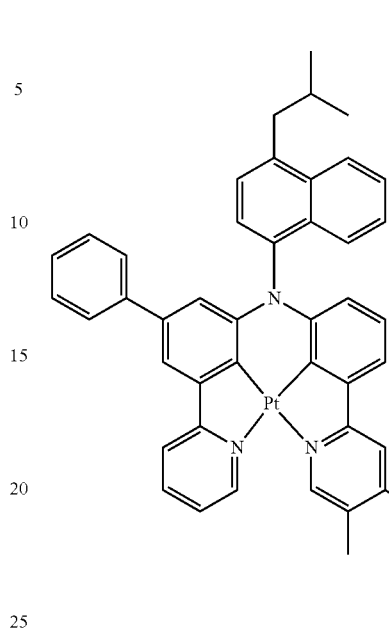
122
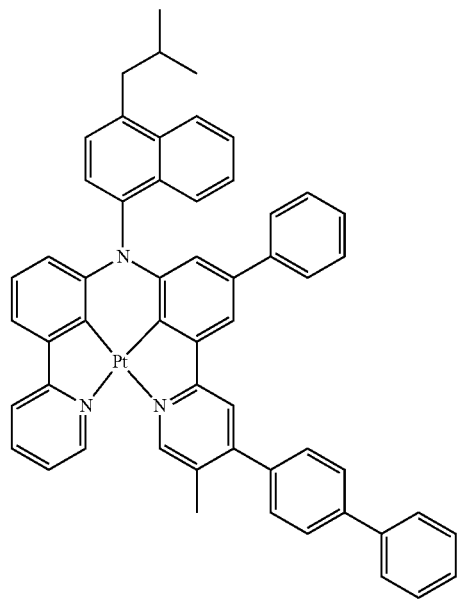

311
-continued
123
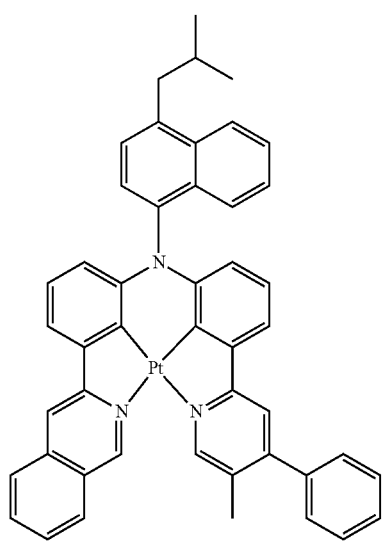
124
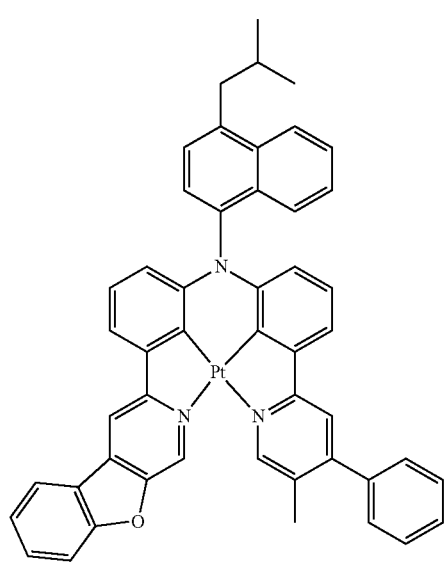
125
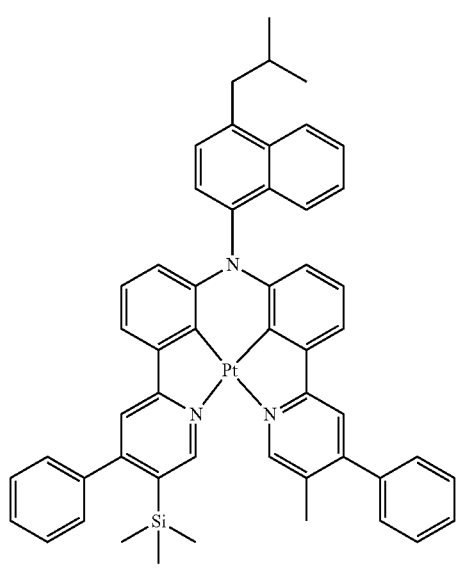
312
-continued
126
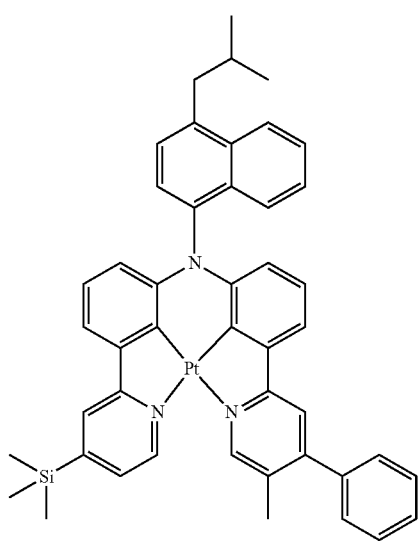
127
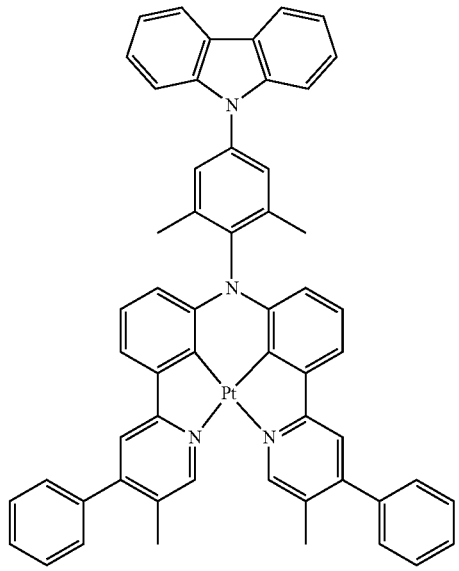

313
-continued
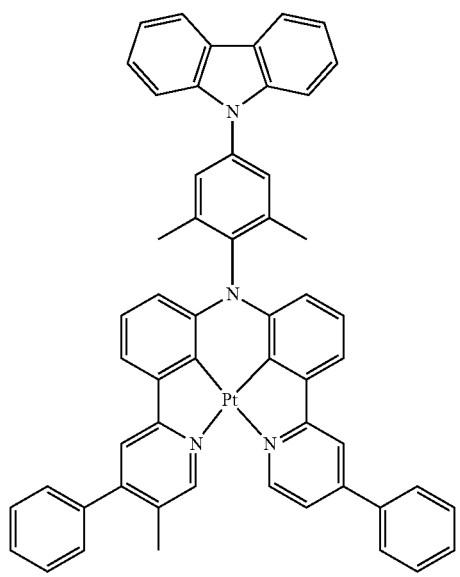
128
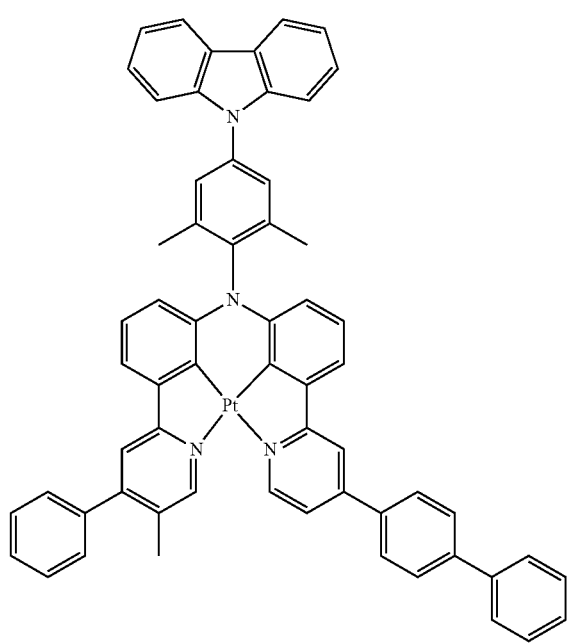
129
314
-continued
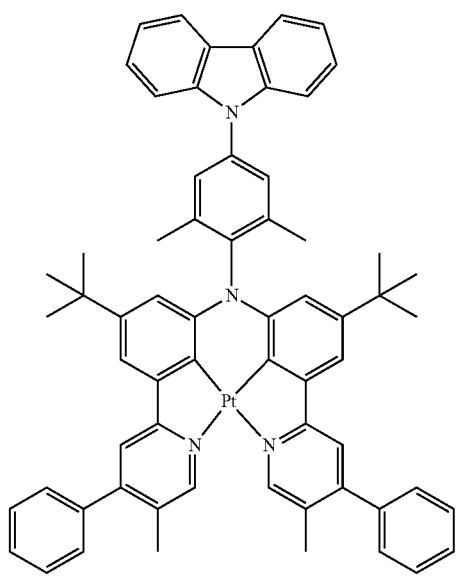
130
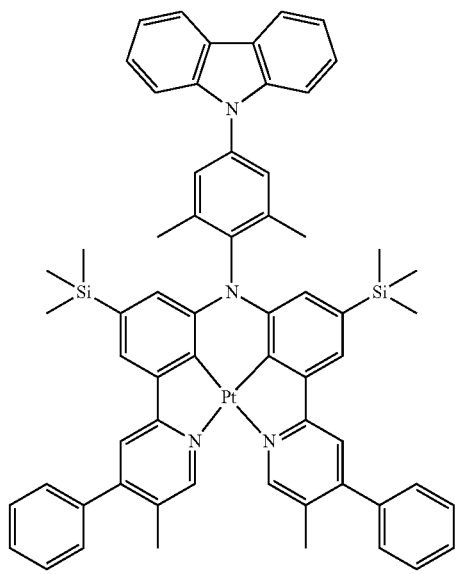
131

315
-continued
132
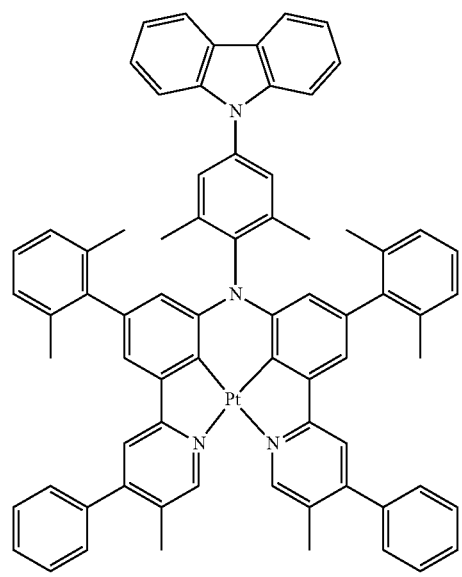
133
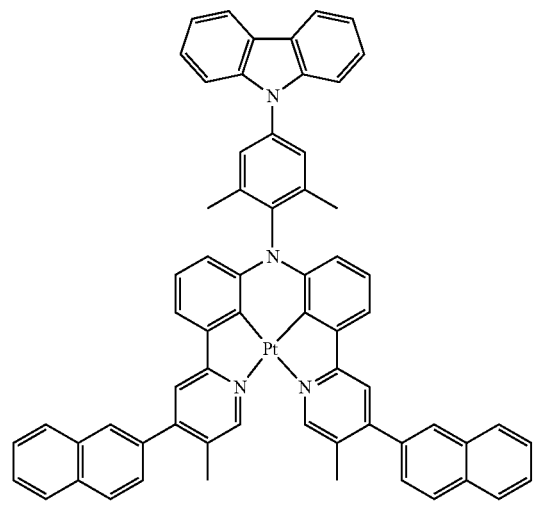
134
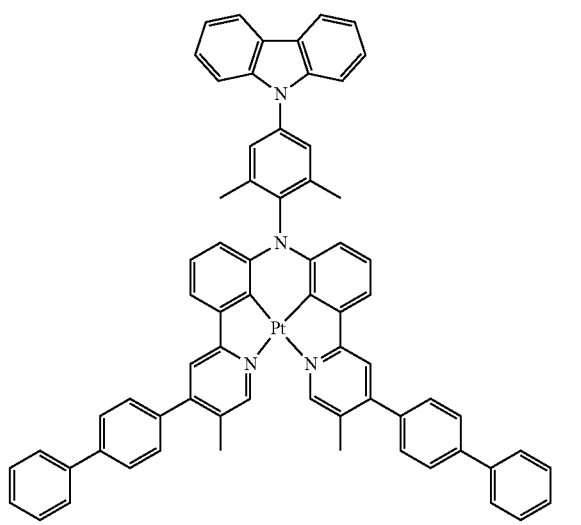
316
-continued
135
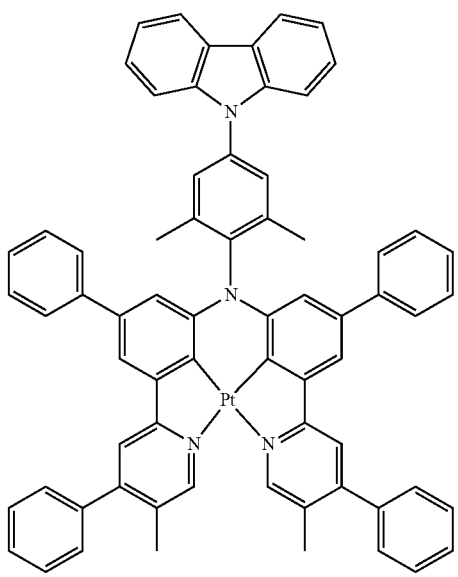
136
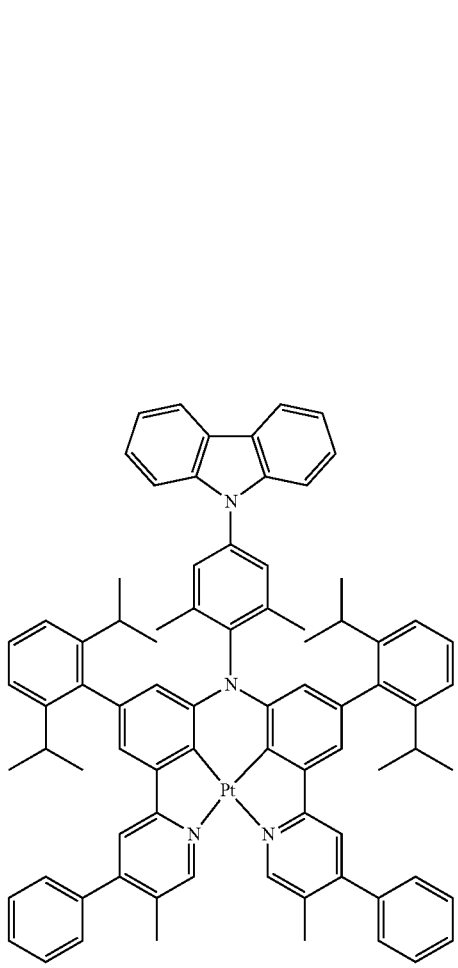

317
-continued
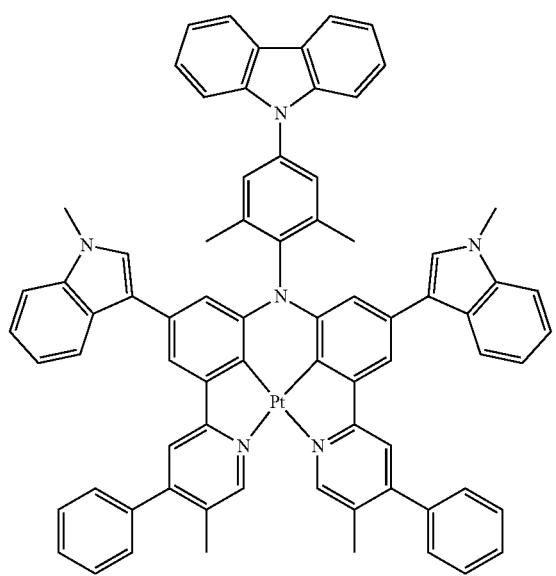
137
318
-continued
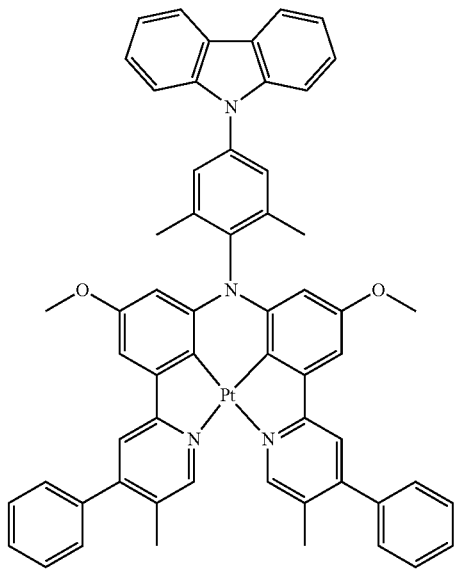
139
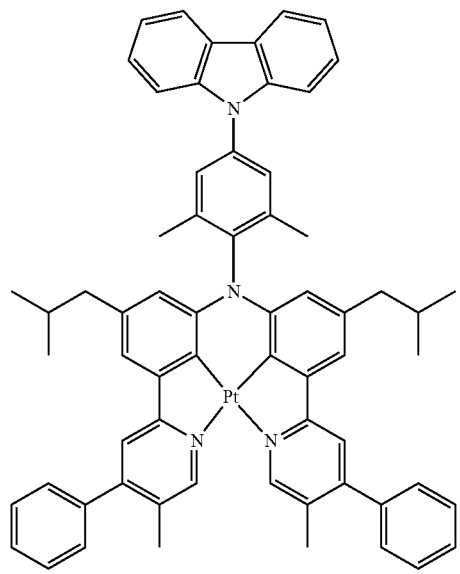
138
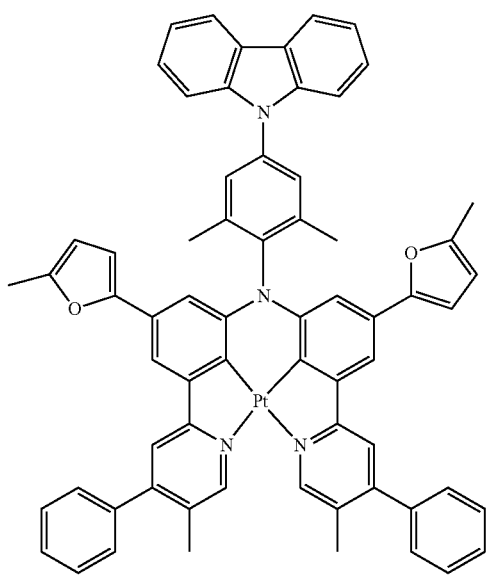
140

319
-continued
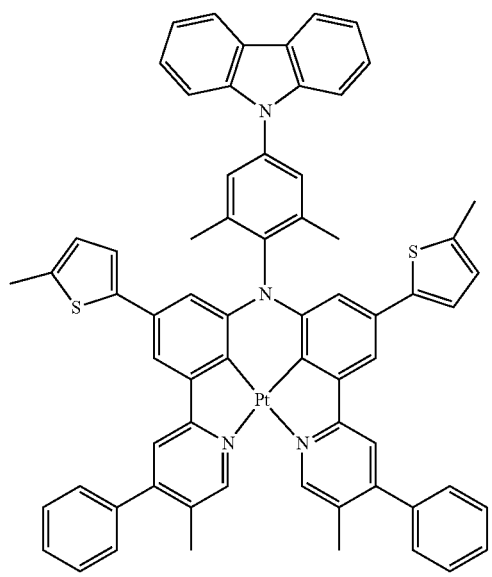
141
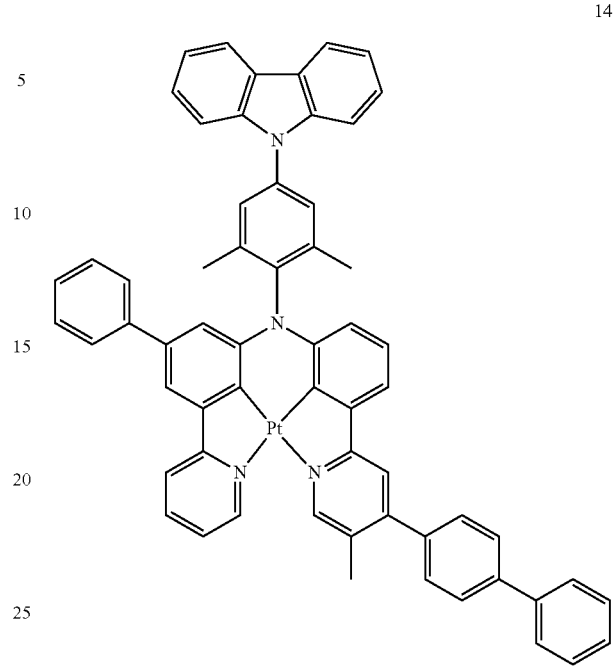
143
142
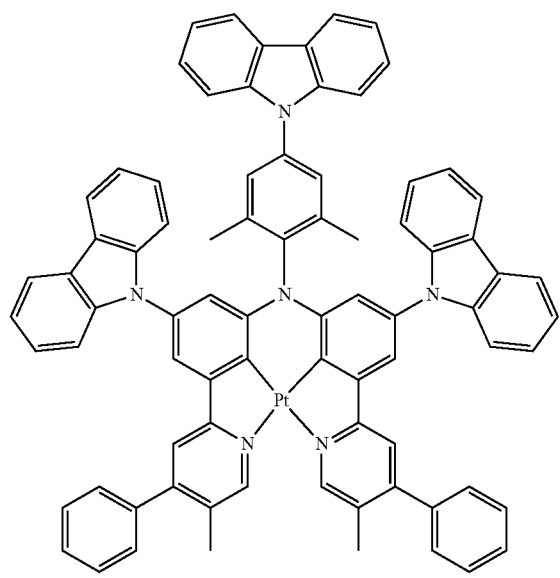
320
-continued
144
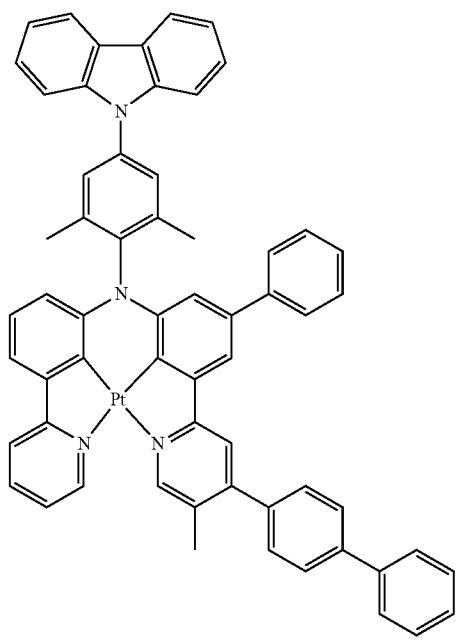

321
-continued
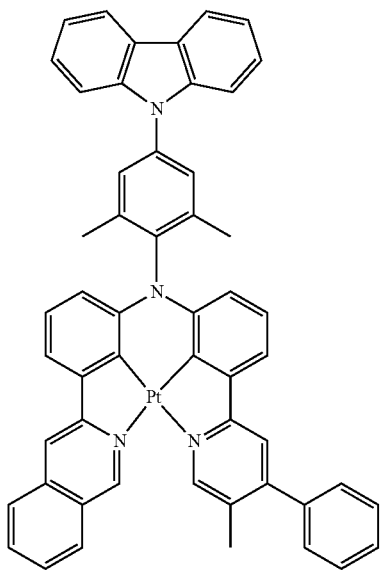
145
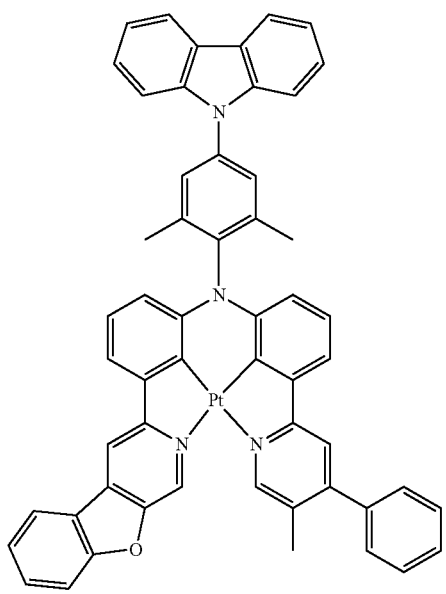
146
322
-continued
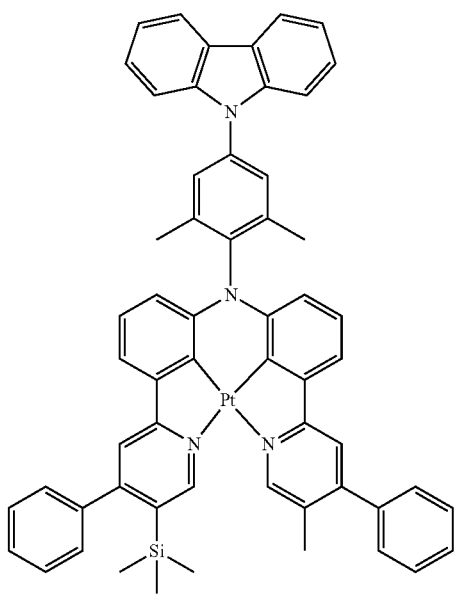
147
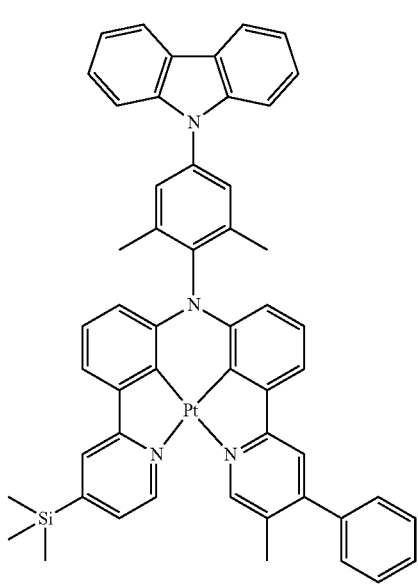
148
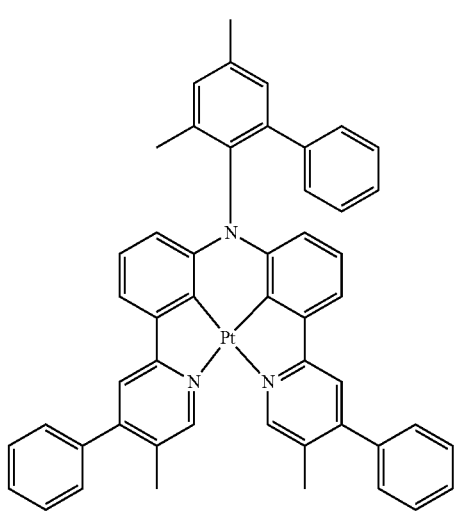
149

323
-continued
150
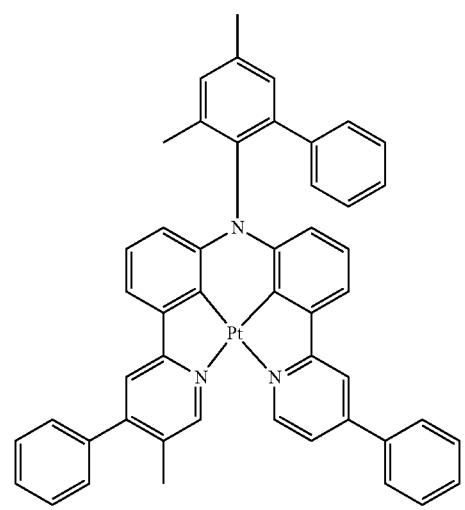
151
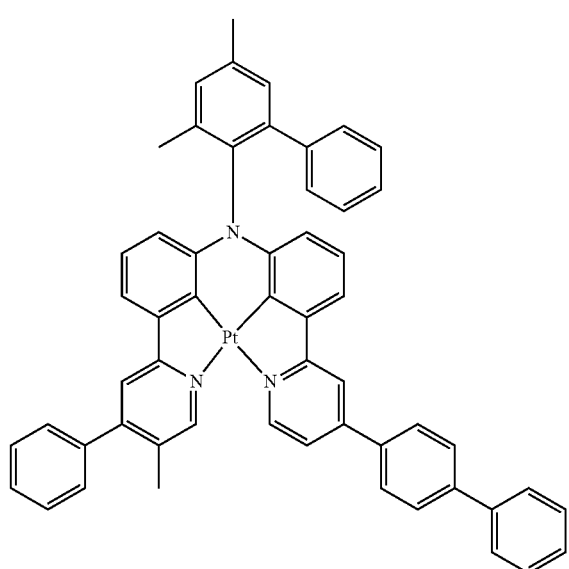
152
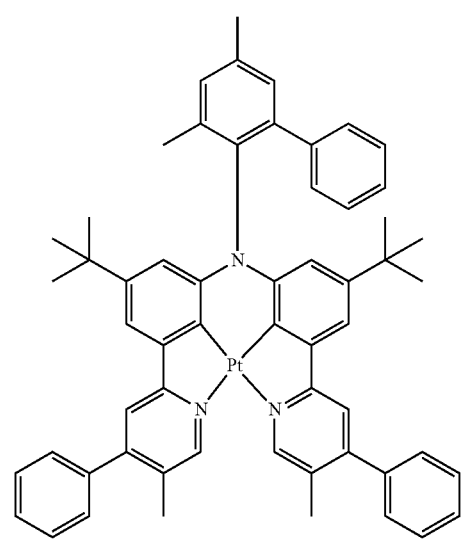
324
-continued
153
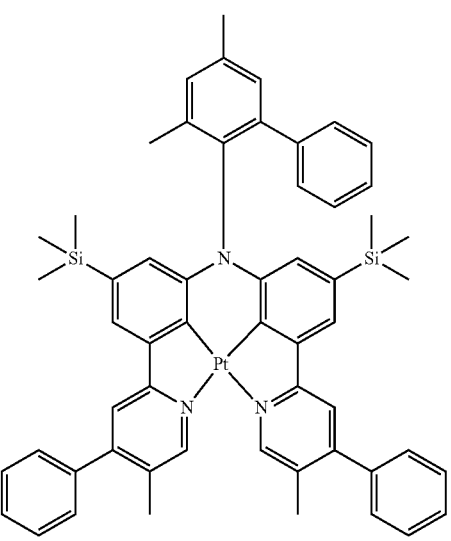
154
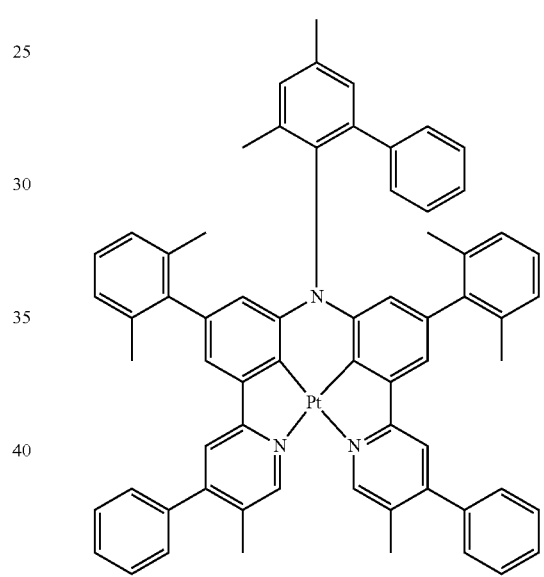
155

325
-continued
156
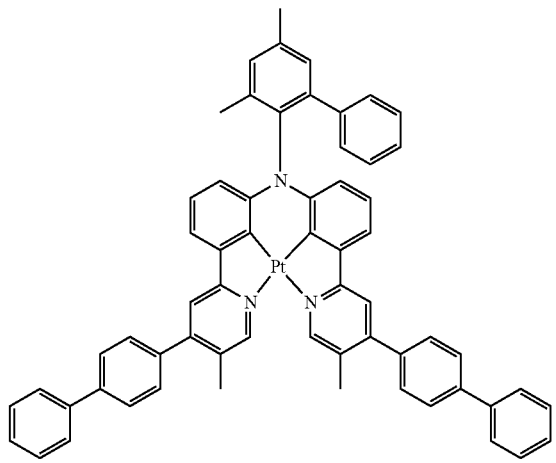
157
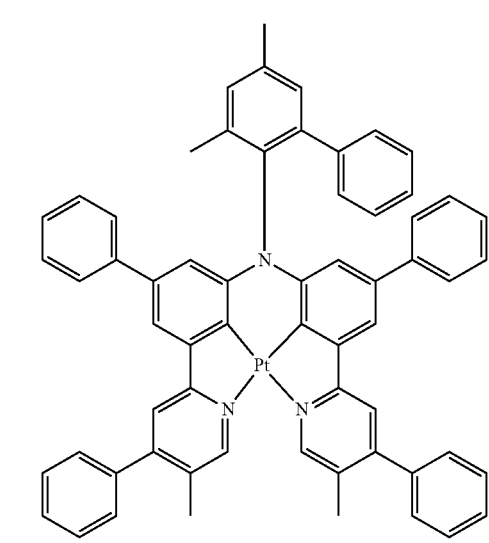
158
326
-continued
159
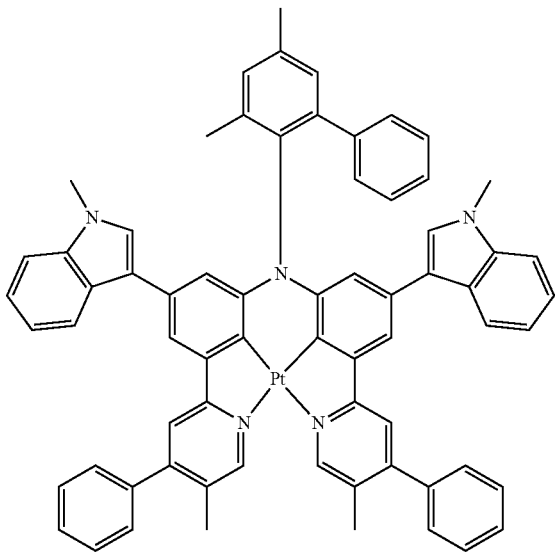
160
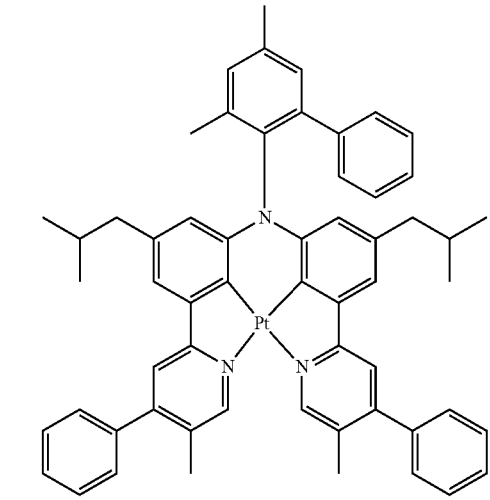
161
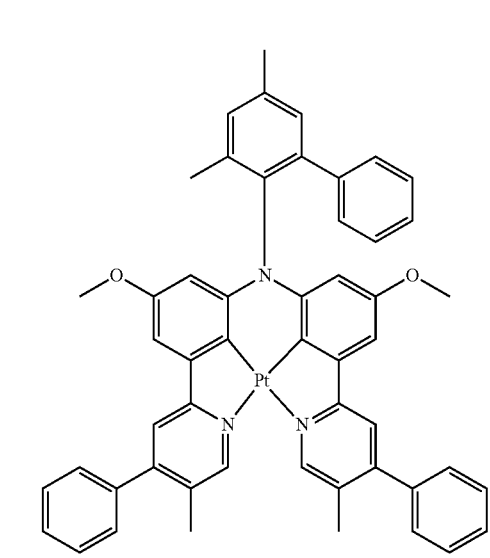

327
-continued
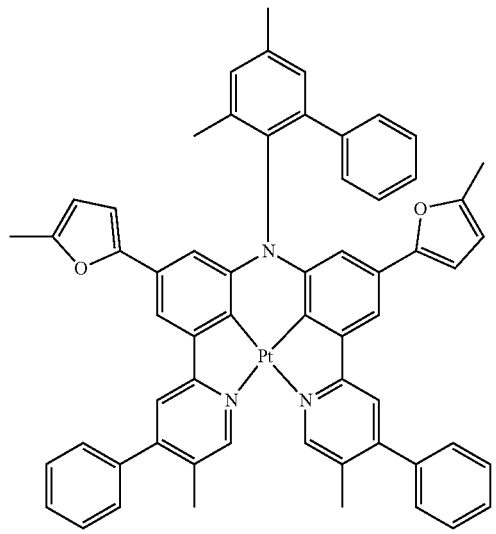
162
328
-continued
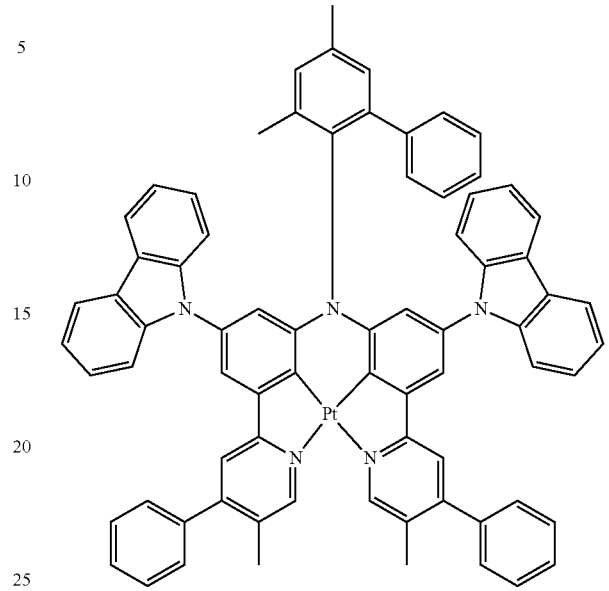
164
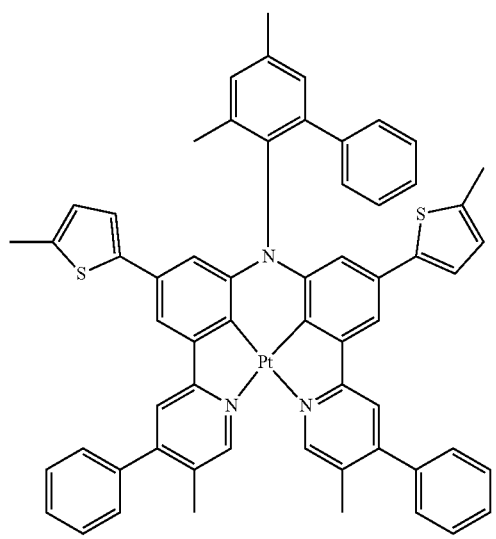
163
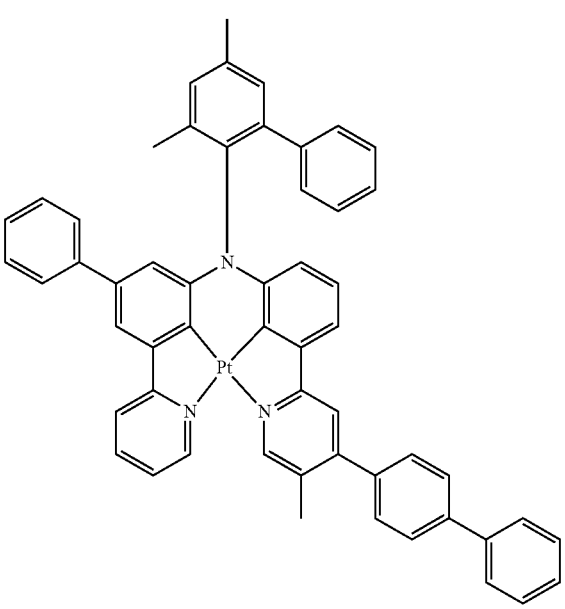
165

166 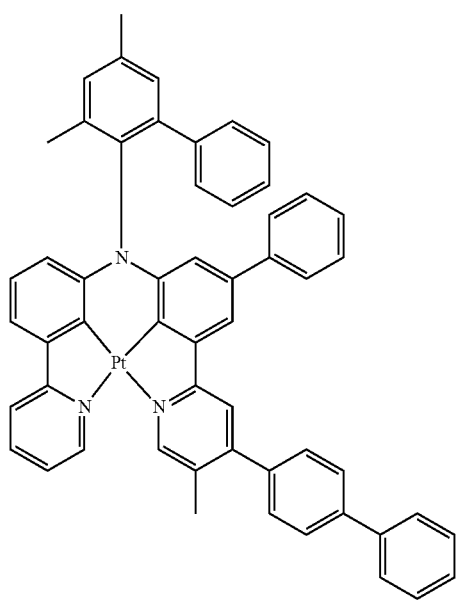
167 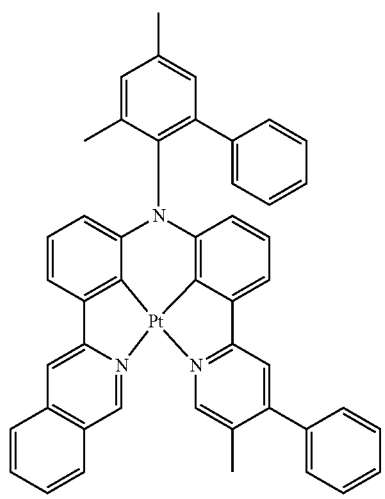
168 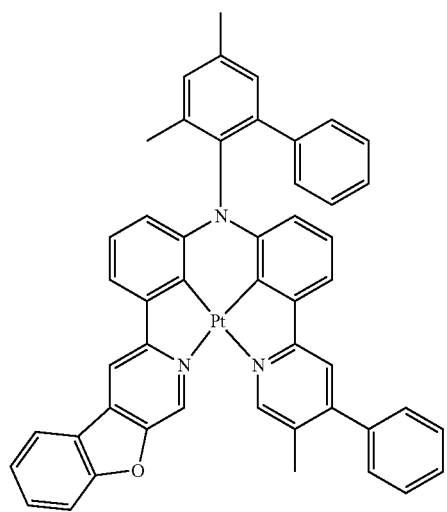
169 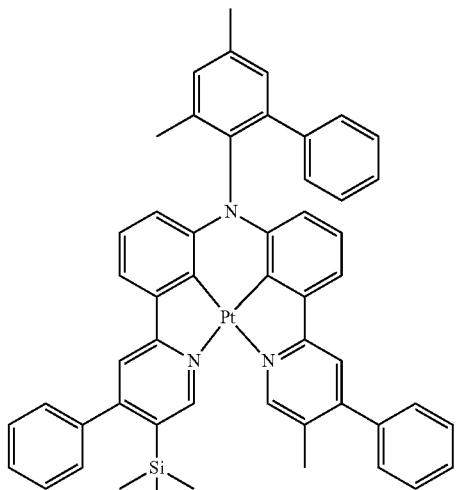
170 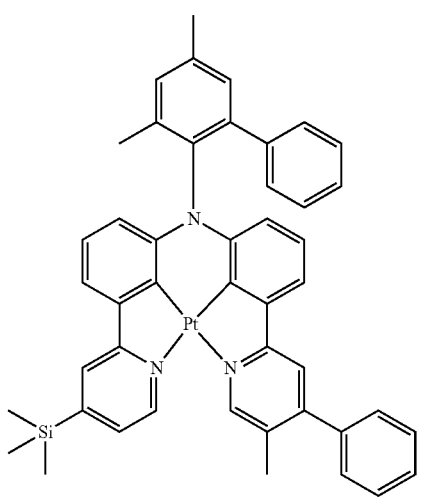
171 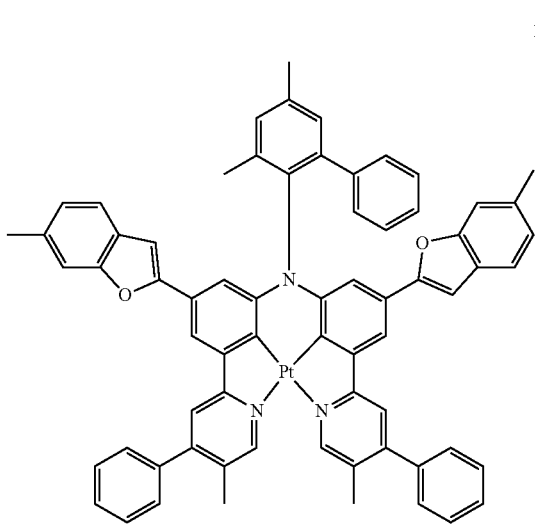

US 10,825,999 B2
331 -continued
172
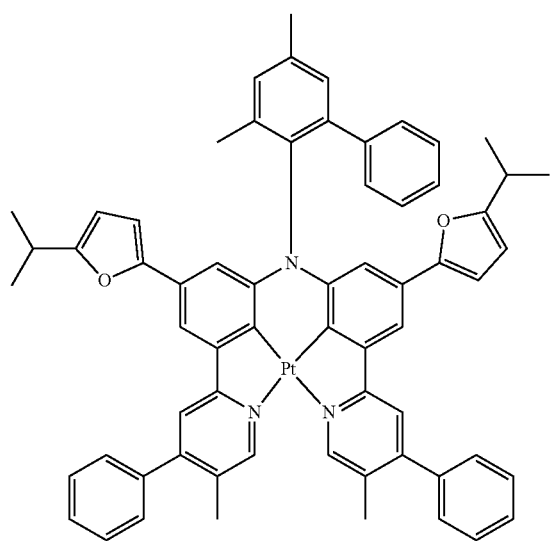
173
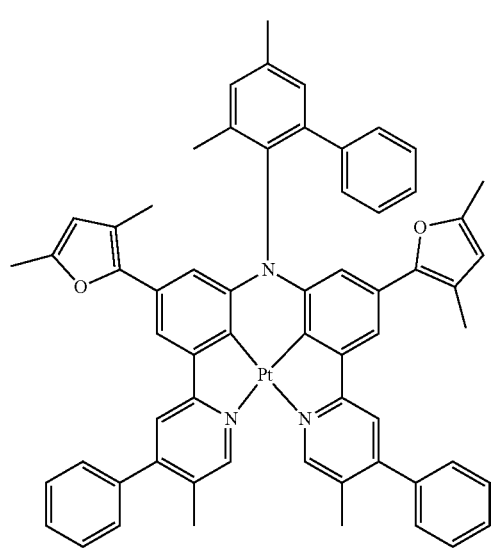
174
332 -continued
175
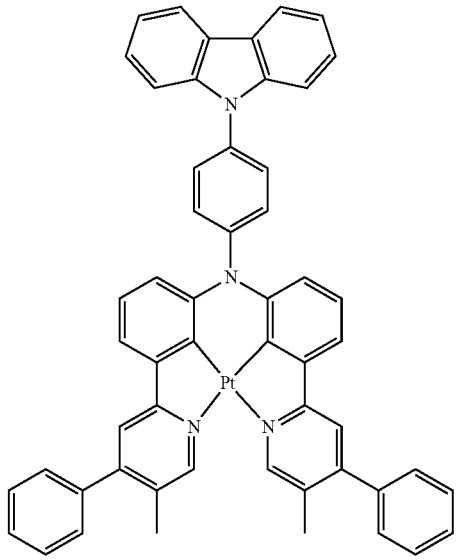
176
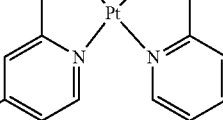

333
-continued
177
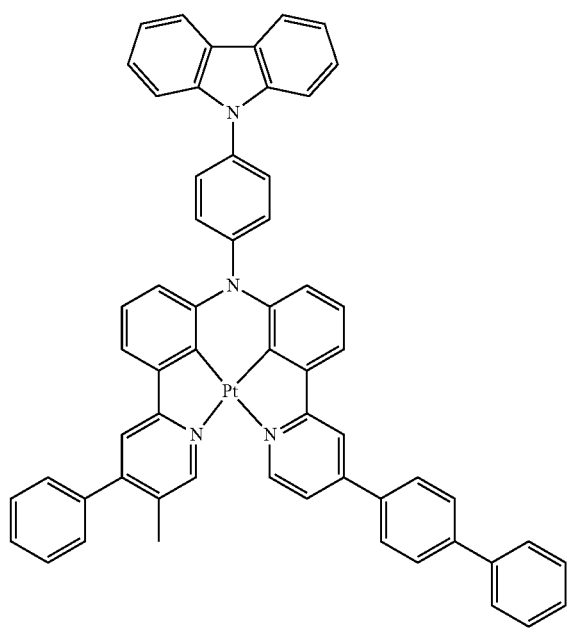
178
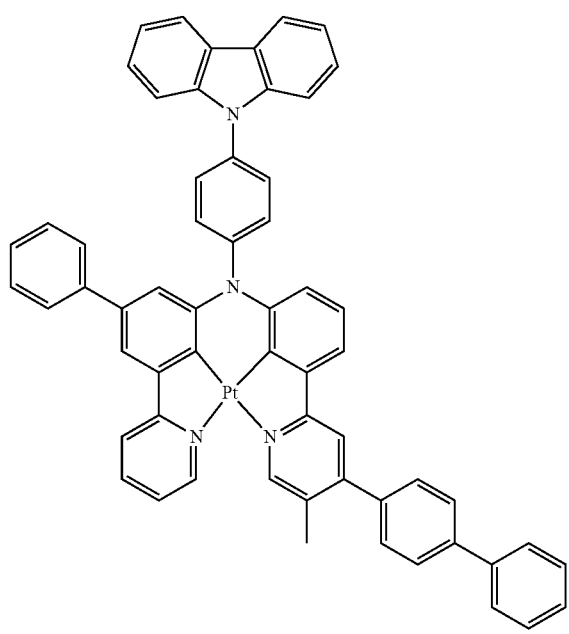
334
-continued
179
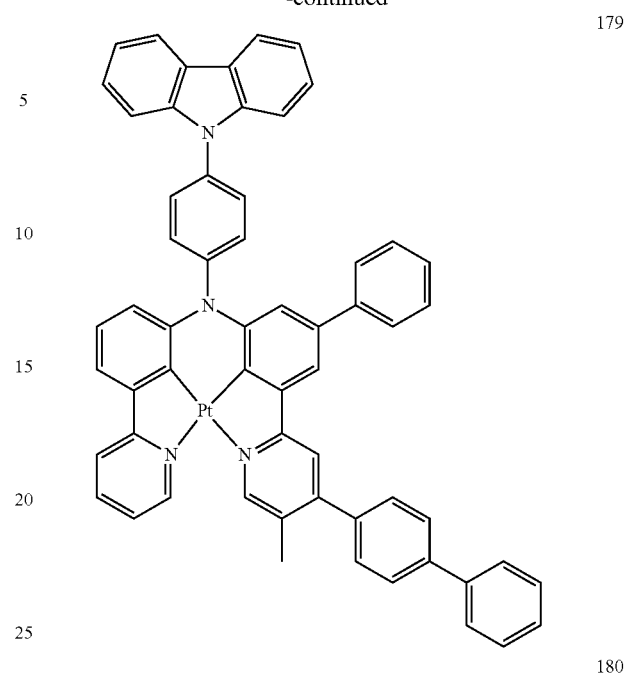
180
181
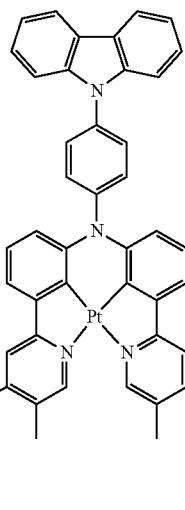

335
-continued
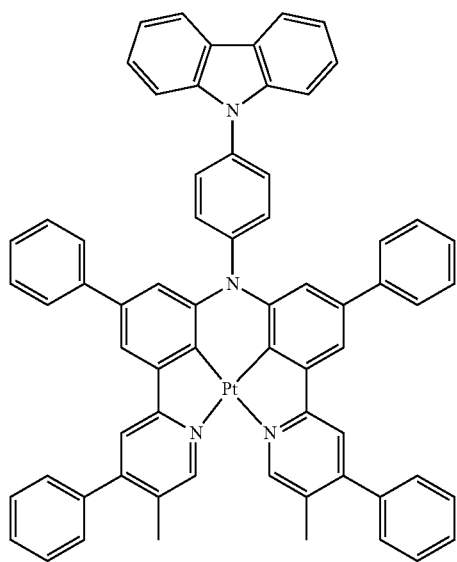
182
336
-continued
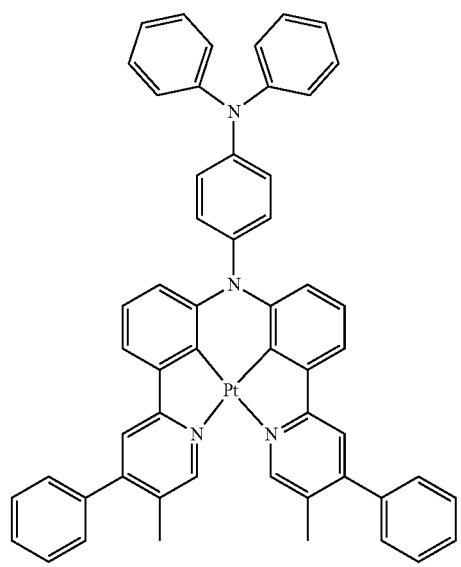
184
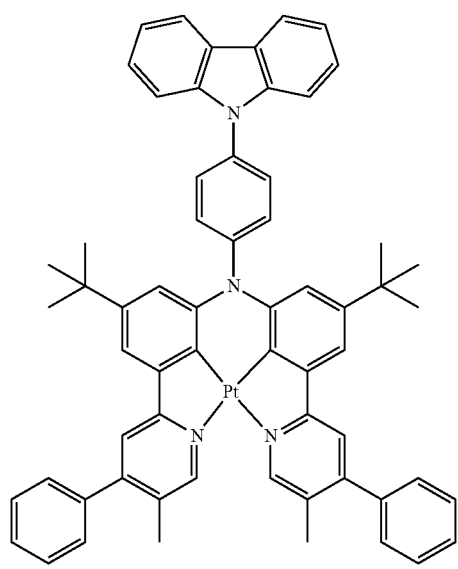
183
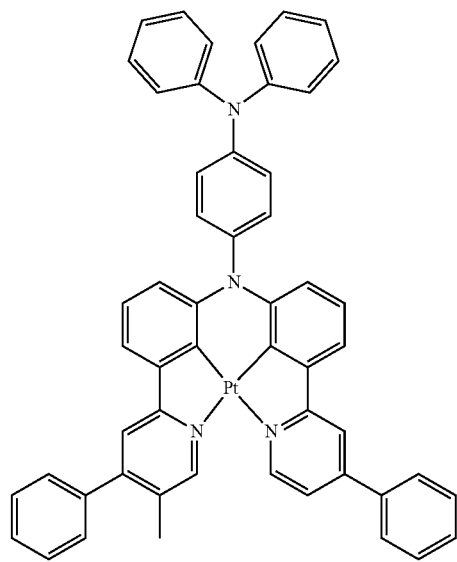
185

186
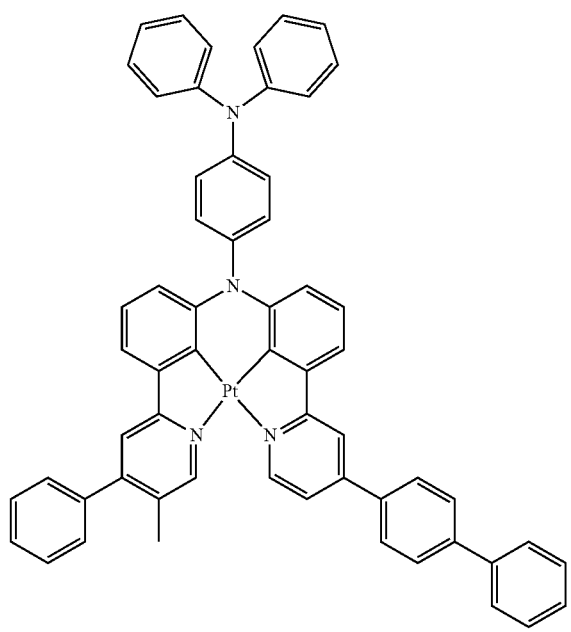
187
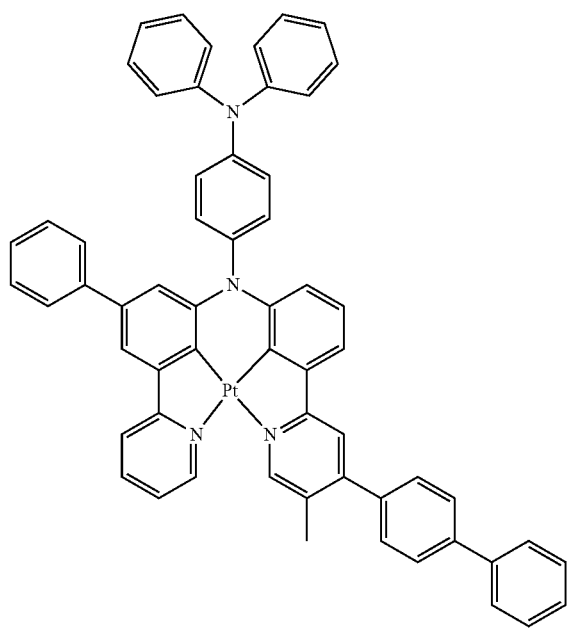
188
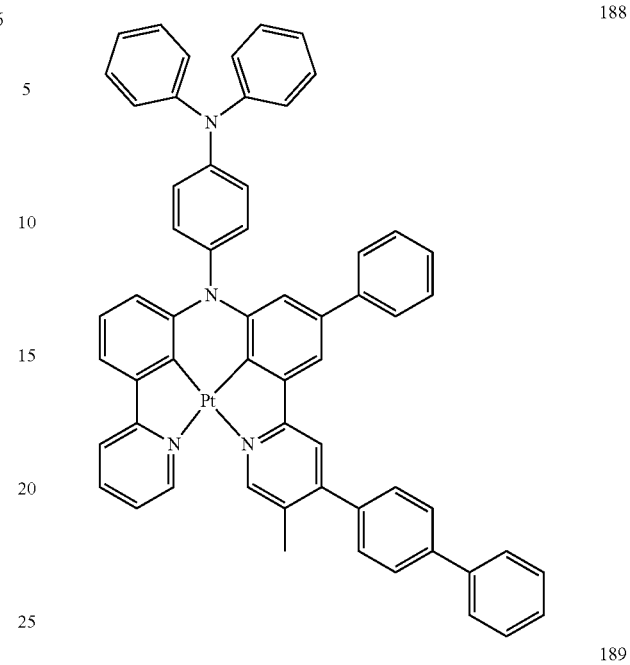
189
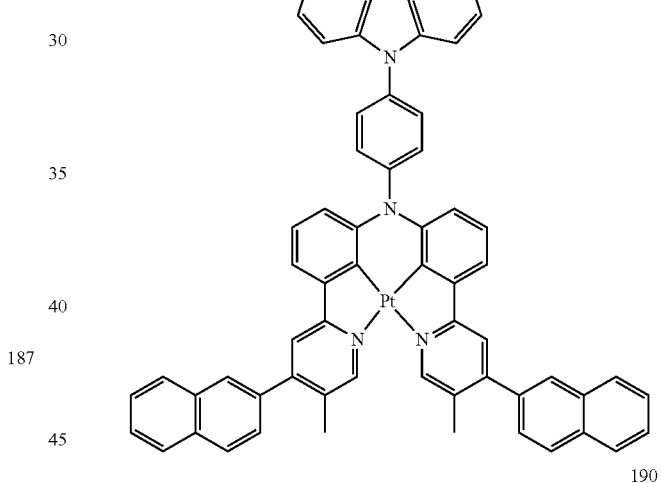
190
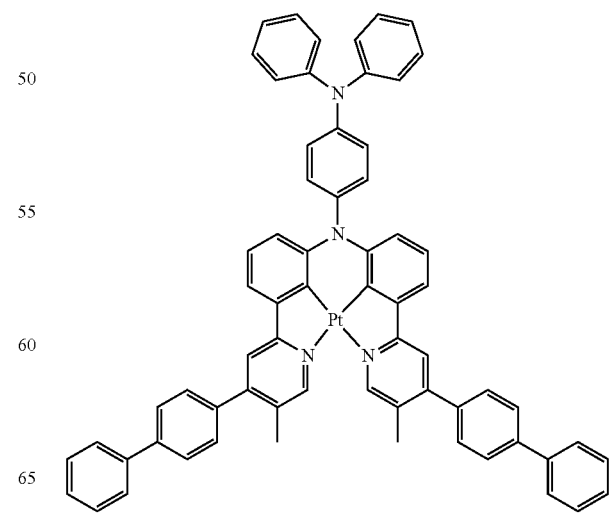

| 339 -continued | 340 -continued |
|---|---|
| 191 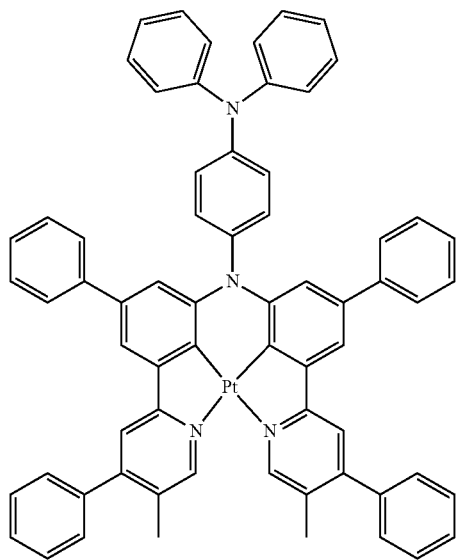 | 194 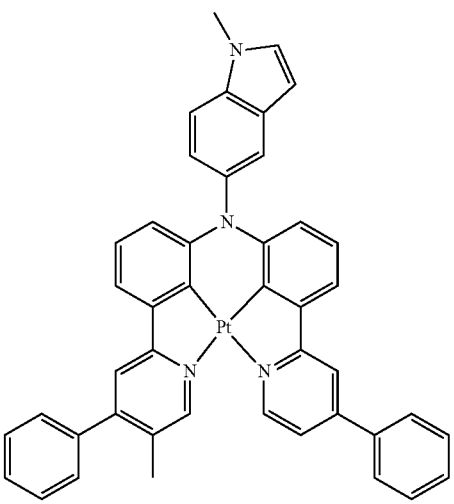 |
| 192 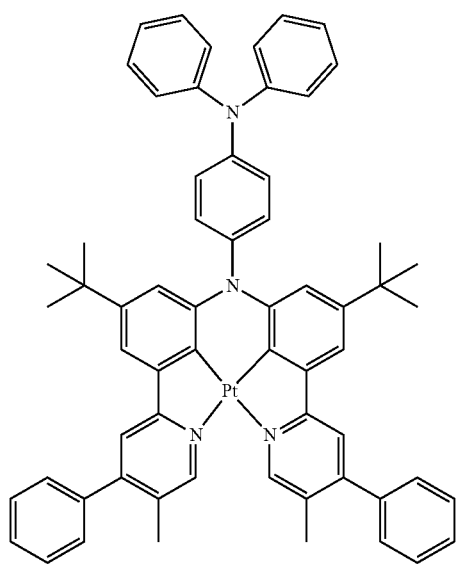 | 195 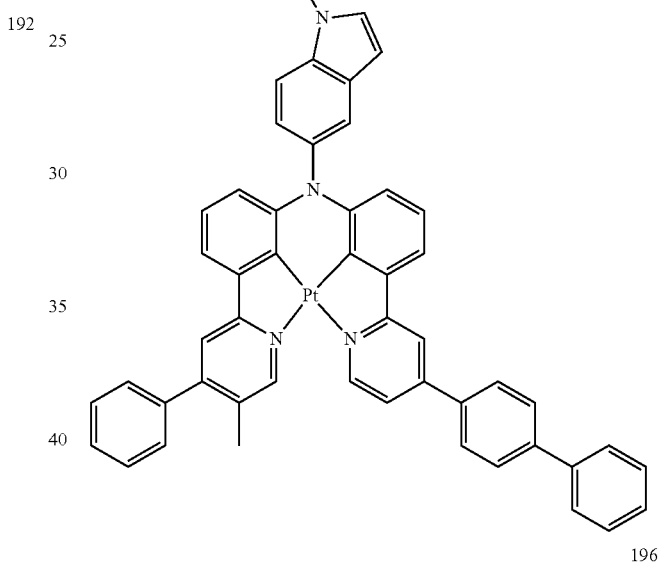 |
| 193 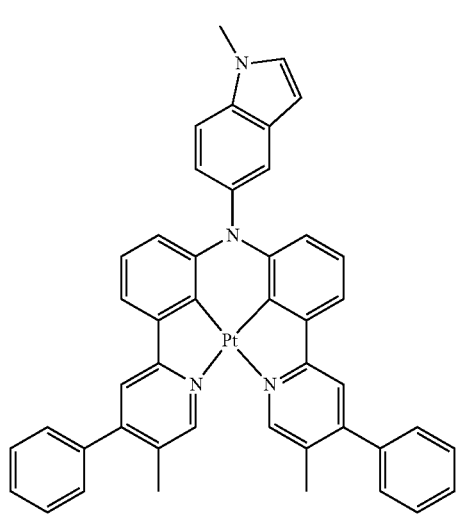 | 196 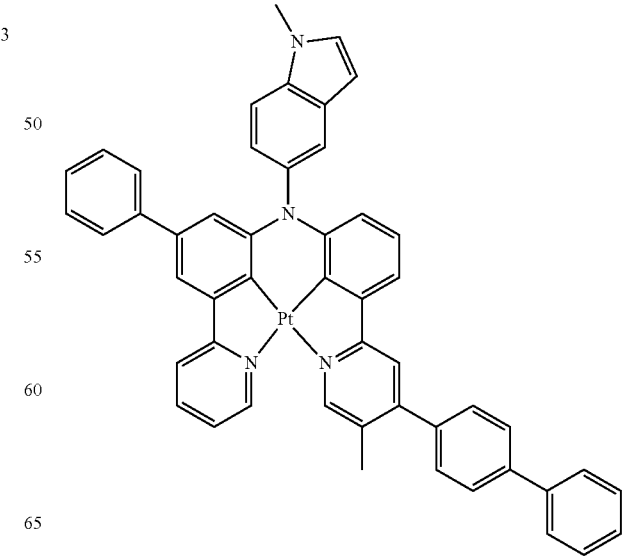 |

341
-continued

197

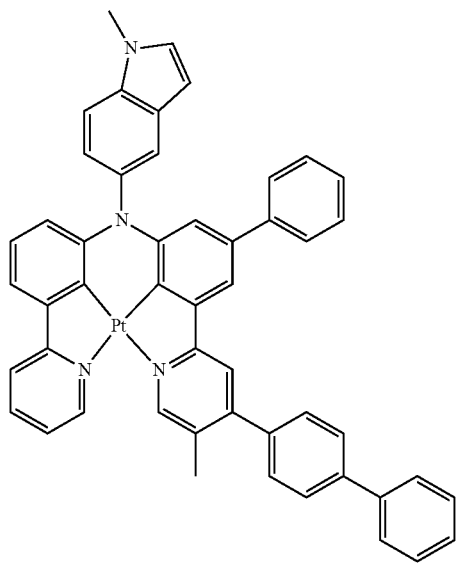

198

199

342
-continued

200

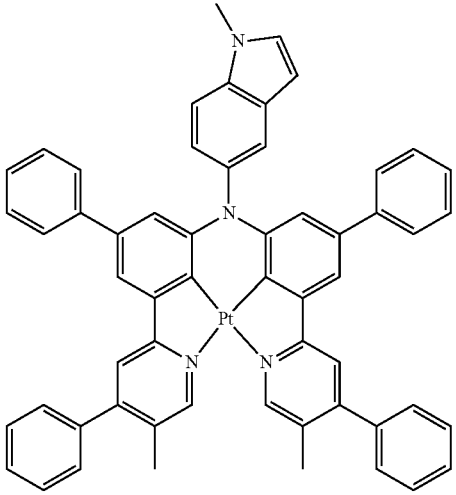

201

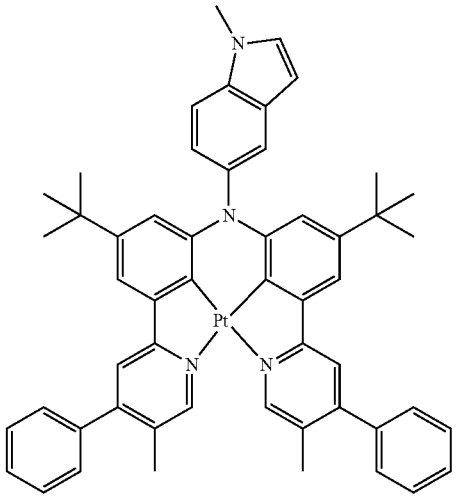

17. An organic light-emitting device comprising:
a first electrode;
a second electrode; and
an organic layer that is disposed between the first electrode and the second electrode,
wherein the organic layer comprises an emission layer and at least one of the organometallic compound of claim 1.

18. The organic light-emitting device of claim 17, wherein
the first electrode is an anode,
the second electrode is a cathode,
the organic layer further comprises a hole transport region disposed between the first electrode and the emission layer and an electron transport region disposed between the emission layer and the second electrode,
wherein the hole transport region comprises a hole injection layer, a hole transport layer, an electron blocking layer, or any combination thereof, and
wherein the electron transport region comprises a hole blocking layer, an electron transport layer, an electron injection layer, or any combination thereof.

19. The organic light-emitting device of claim 17, wherein the emission layer comprises the organometallic compound.

20. The organic light-emitting device of claim 19, wherein the emission layer further comprises a host, and
an amount of the host in the emission layer is larger than an amount of the organometallic compound in the emission layer.

21. A diagnostic composition comprising at least one of the organometallic compound of claim 1.

* * * * *